(12) United States Patent
Helander et al.

(10) Patent No.: US 12,389,742 B2
(45) Date of Patent: *Aug. 12, 2025

(54) LIGHT EMITTING DEVICE INCLUDING CAPPING LAYERS ON RESPECTIVE EMISSIVE REGIONS

(71) Applicant: OTI Lumionics Inc.

(72) Inventors: Michael Helander, Mississauga (CA); Zhibin Wang, Mississauga (CA)

(73) Assignee: OTI Lumionics Inc., Mississauga (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/349,505

(22) Filed: Jul. 10, 2023

(65) Prior Publication Data

US 2023/0354633 A1    Nov. 2, 2023

Related U.S. Application Data

(63) Continuation of application No. 17/789,127, filed as application No. PCT/IB2020/062423 on Dec. 24, 2020, now Pat. No. 11,737,298.

(Continued)

(51) Int. Cl.
*H10K 50/13* (2023.01)
*H10K 50/858* (2023.01)
(Continued)

(52) U.S. Cl.
CPC .......... *H10K 50/13* (2023.02); *H10K 50/858* (2023.02); *H10K 59/12* (2023.02)

(58) Field of Classification Search
CPC ....... H10K 50/13; H10K 50/858; H10K 59/12
See application file for complete search history.

(56) References Cited

U.S. PATENT DOCUMENTS 3,928,480 A   12/1975   Tabushi et al.
4,022,928 A    5/1977   Piwcyzk
(Continued)

FOREIGN PATENT DOCUMENTS

CA   2890253 A1    5/2014
CN   101299419 A   11/2008
(Continued)

OTHER PUBLICATIONS

Foreign Action in Japanese Application No. 2022-539169 dated Jan. 16, 2023.
(Continued)

*Primary Examiner* — Michael Jung
(74) *Attorney, Agent, or Firm* — Foley & Lardner LLP

(57) ABSTRACT

An opto-electronic device having a plurality of layers, comprising a first capping layer (CPL) comprising a first CPL material and disposed in a first emissive region configured to emit photons having a first wavelength spectrum that is characterized by a first onset wavelength; and a second CPL comprising a second CPL material and disposed in a second emissive region configured to emit photons having a second wavelength spectrum that is characterized by a second onset wavelength; wherein at least one of the first CPL and the first CPL material (CPL(m)1) exhibits a first absorption edge at a first absorption edge wavelength that is shorter than the first onset wavelength; and at least one of the second CPL and the second CPL material (CPL (m)2) exhibits a second absorption edge at a second absorption edge wavelength that is shorter than the second onset wavelength.

57 Claims, 82 Drawing Sheets

Related U.S. Application Data

(60) Provisional application No. 62/953,442, filed on Dec. 24, 2019.

(51) Int. Cl.
  *H10K 59/12* (2023.01)
  *H10K 50/12* (2023.01)

(56) References Cited

U.S. PATENT DOCUMENTS

| | | |
|---|---|---|
| 4,832,983 A | 5/1989 | Nagatomi et al. |
| 5,015,758 A | 5/1991 | Pilgrim et al. |
| 5,399,936 A | 3/1995 | Namiki et al. |
| 6,016,033 A | 1/2000 | Jones et al. |
| 6,407,408 B1 | 6/2002 | Zhou et al. |
| 6,465,115 B2 | 10/2002 | Shi et al. |
| 6,472,468 B1 | 10/2002 | Omura |
| 6,538,374 B2 | 3/2003 | Hosokawa |
| 6,787,468 B2 | 9/2004 | Kim et al. |
| 6,835,950 B2 | 12/2004 | Brown et al. |
| 6,900,470 B2 | 5/2005 | Kobayashi et al. |
| 6,927,270 B2 | 8/2005 | Lichtenhan et al. |
| 6,995,035 B2 | 2/2006 | Cok et al. |
| 7,018,713 B2 | 3/2006 | Padiyath |
| 7,099,299 B2 | 8/2006 | Liang et al. |
| 7,105,298 B2 | 9/2006 | Liu et al. |
| 7,175,815 B2 | 2/2007 | Yamasaki et al. |
| 7,193,015 B1 | 3/2007 | Mabry et al. |
| 7,217,683 B1 | 5/2007 | Blanski et al. |
| 7,319,129 B2 | 1/2008 | Yoshida et al. |
| 7,363,308 B2 | 4/2008 | Dillon et al. |
| 7,402,948 B2 | 7/2008 | Yamazaki et al. |
| 7,427,783 B2 | 9/2008 | Lee et al. |
| 7,449,539 B2 | 11/2008 | Morimoto et al. |
| 7,491,975 B2 | 2/2009 | Kubota |
| 7,495,389 B2 | 2/2009 | Noguchi et al. |
| 7,701,132 B2 | 4/2010 | Oh |
| 7,728,510 B2 | 6/2010 | Oh |
| 7,816,861 B2 | 10/2010 | Choi et al. |
| 7,839,083 B2 | 11/2010 | Kubota |
| 7,897,667 B2 | 3/2011 | Mabry et al. |
| 7,947,519 B2 | 5/2011 | Lee et al. |
| 7,956,351 B2 | 6/2011 | Choi |
| 7,986,672 B2 | 7/2011 | Tiedemann et al. |
| 8,004,180 B2 | 8/2011 | Seo |
| 8,030,838 B2 | 10/2011 | Kwak et al. |
| 8,044,580 B2 | 10/2011 | Yamazaki et al. |
| 8,089,066 B2 | 1/2012 | Yamazaki et al. |
| 8,115,376 B2 | 2/2012 | Fujioka et al. |
| 8,232,350 B2 | 7/2012 | Fujita et al. |
| 8,237,351 B2 | 8/2012 | Sung et al. |
| 8,310,149 B2 | 11/2012 | Lifka et al. |
| 8,318,878 B2 | 11/2012 | Sudo et al. |
| 8,343,637 B2 | 1/2013 | Parham et al. |
| 8,362,469 B2 | 1/2013 | Suh |
| 8,679,647 B2 | 3/2014 | Pflumm et al. |
| 8,703,303 B2 | 4/2014 | Yamamoto et al. |
| 8,766,306 B2 | 7/2014 | Lifka et al. |
| 8,795,847 B2 | 8/2014 | Heil et al. |
| 8,809,838 B2 | 8/2014 | Jeong et al. |
| 8,852,756 B2 | 10/2014 | Vestweber et al. |
| 8,872,206 B2 | 10/2014 | Chung et al. |
| 8,895,972 B2 | 11/2014 | Chung et al. |
| 8,940,568 B2 | 1/2015 | Mohan et al. |
| 8,957,413 B2 | 2/2015 | Song et al. |
| 8,963,137 B2 | 2/2015 | Lee et al. |
| 8,963,414 B2 | 2/2015 | Sawabe |
| 8,986,852 B2 | 3/2015 | Stoessel et al. |
| 8,994,010 B2 | 3/2015 | Choi et al. |
| 9,018,621 B2 | 4/2015 | Park et al. |
| 9,024,307 B2 | 5/2015 | Lee |
| 9,040,962 B2 | 5/2015 | Adamovich et al. |
| 9,051,344 B2 | 6/2015 | Lin et al. |
| 9,064,755 B2 | 6/2015 | Park et al. |
| 9,076,993 B2 | 7/2015 | Kim et al. |
| 9,088,004 B2 | 7/2015 | Chung et al. |
| 9,093,403 B2 | 7/2015 | Kim et al. |
| 9,093,669 B2 | 7/2015 | Park et al. |
| 9,095,033 B2 | 7/2015 | Naraoka et al. |
| 9,105,865 B2 | 8/2015 | Chung et al. |
| 9,105,867 B2 | 8/2015 | Verschuuren et al. |
| 9,126,970 B2 | 9/2015 | Pflumm |
| 9,231,030 B2 | 1/2016 | Choi et al. |
| 9,245,934 B2 | 1/2016 | Chung et al. |
| 9,246,123 B2 | 1/2016 | Kim et al. |
| 9,287,339 B2 | 3/2016 | Lee et al. |
| 9,293,515 B2 | 3/2016 | Choi |
| 9,331,308 B2 | 5/2016 | Choi et al. |
| 9,444,064 B2 | 9/2016 | Kaiser et al. |
| 9,450,027 B2 | 9/2016 | Pang et al. |
| 9,478,591 B2 | 10/2016 | Nam et al. |
| 9,570,471 B2 | 2/2017 | Heo et al. |
| 9,595,681 B2 | 3/2017 | Mujica-Fernaud |
| 9,624,193 B2 | 4/2017 | Aihara |
| 9,660,195 B2 | 5/2017 | Kawamura et al. |
| 9,711,751 B2 | 7/2017 | Prushinskiy et al. |
| 9,748,318 B2 | 8/2017 | Shim et al. |
| 9,776,983 B2 | 10/2017 | Marchionni et al. |
| 9,859,520 B2 | 1/2018 | Kim |
| 9,954,039 B2 | 4/2018 | Im et al. |
| 9,960,216 B2 | 5/2018 | Lee et al. |
| 9,966,554 B2 | 5/2018 | Lee et al. |
| 10,032,843 B2 | 7/2018 | Lee et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,177,206 B2 | 1/2019 | Jung et al. |
| 10,181,573 B2 | 1/2019 | Im |
| 10,186,568 B2 | 1/2019 | Kim et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,276,641 B2 | 4/2019 | Lou |
| 10,297,762 B2 | 5/2019 | Zeng et al. |
| 10,361,375 B2 | 7/2019 | Zeng et al. |
| 10,501,583 B2 | 12/2019 | Song et al. |
| 10,700,304 B2 | 6/2020 | Helander et al. |
| 2002/0090811 A1 | 7/2002 | Kim et al. |
| 2002/0189392 A1 | 12/2002 | Molstad |
| 2003/0196987 A1 | 10/2003 | Kung et al. |
| 2006/0125390 A1 | 6/2006 | Oh |
| 2007/0077349 A1 | 4/2007 | Newman et al. |
| 2007/0178405 A1 | 8/2007 | Kanda et al. |
| 2009/0033208 A1 | 2/2009 | Nagayama et al. |
| 2009/0199903 A1 | 8/2009 | Oyamada et al. |
| 2010/0078628 A1 | 4/2010 | Chi et al. |
| 2010/0193768 A1 | 8/2010 | Habib |
| 2010/0244197 A1 | 9/2010 | Arena et al. |
| 2011/0006289 A1 | 1/2011 | Mizuki et al. |
| 2011/0094889 A1 | 4/2011 | Shin et al. |
| 2011/0175031 A1 | 7/2011 | Matsunami et al. |
| 2011/0186820 A1 | 8/2011 | Kim et al. |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0104422 A1 | 5/2012 | Lee et al. |
| 2012/0146030 A1 | 6/2012 | You et al. |
| 2012/0187541 A1 | 7/2012 | Arena et al. |
| 2013/0049024 A1 | 2/2013 | Choi et al. |
| 2013/0056784 A1 | 3/2013 | Lee et al. |
| 2013/0112952 A1 | 5/2013 | Adamovich et al. |
| 2014/0070236 A1 | 3/2014 | Chen et al. |
| 2014/0103306 A1 | 4/2014 | Moon et al. |
| 2014/0110680 A1 | 4/2014 | Choe |
| 2014/0186983 A1 | 7/2014 | Kim et al. |
| 2014/0231761 A1 | 8/2014 | Kim et al. |
| 2014/0299866 A1 | 10/2014 | Ruske et al. |
| 2014/0312325 A1 | 10/2014 | Jang et al. |
| 2014/0353601 A1 | 12/2014 | Cho et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |

(56) References Cited

U.S. PATENT DOCUMENTS

| | | |
|---|---|---|
| 2015/0287846 A1 | 10/2015 | Helander et al. |
| 2015/0376768 A1 | 12/2015 | Veres et al. |
| 2016/0013438 A1 | 1/2016 | Im et al. |
| 2016/0104859 A1 | 4/2016 | Kim et al. |
| 2016/0149156 A1 | 5/2016 | Kim et al. |
| 2016/0180763 A1 | 6/2016 | Park et al. |
| 2016/0211454 A1 | 7/2016 | Kim et al. |
| 2016/0293888 A1 | 10/2016 | Shim et al. |
| 2016/0351638 A1 | 12/2016 | Im et al. |
| 2017/0018733 A1 | 1/2017 | Jin et al. |
| 2017/0033166 A1 | 2/2017 | Shim et al. |
| 2017/0062755 A1 | 3/2017 | Im et al. |
| 2017/0125495 A1 | 5/2017 | Lee et al. |
| 2017/0125506 A1 | 5/2017 | Kim |
| 2017/0155078 A1 | 6/2017 | Lee |
| 2017/0170246 A1 | 6/2017 | Im et al. |
| 2017/0186831 A1 | 6/2017 | Nam et al. |
| 2017/0294493 A1* | 10/2017 | Yoo ............... H10K 50/844 |
| 2017/0317154 A1 | 11/2017 | Heo |
| 2017/0338438 A1 | 11/2017 | Kwon et al. |
| 2018/0006264 A1 | 1/2018 | Lee et al. |
| 2018/0040685 A1 | 2/2018 | Yeo et al. |
| 2018/0061323 A1 | 3/2018 | Kwon et al. |
| 2018/0083217 A1 | 3/2018 | Chung et al. |
| 2018/0090063 A1 | 3/2018 | Ying et al. |
| 2018/0102499 A1 | 4/2018 | Pyo et al. |
| 2018/0123078 A1 | 5/2018 | Byun et al. |
| 2018/0158881 A1 | 6/2018 | Lim et al. |
| 2018/0166518 A1 | 6/2018 | Kim |
| 2018/0182990 A1* | 6/2018 | Youn ............... H10K 50/844 |
| 2018/0198080 A1 | 7/2018 | Noh et al. |
| 2018/0212060 A1 | 7/2018 | Kang et al. |
| 2018/0219058 A1 | 8/2018 | Xiang et al. |
| 2018/0226455 A1 | 8/2018 | Kim et al. |
| 2018/0261797 A1 | 9/2018 | Lee |
| 2018/0294436 A1 | 10/2018 | Choi et al. |
| 2018/0309085 A1 | 10/2018 | Park et al. |
| 2018/0337219 A1 | 11/2018 | Rhee et al. |
| 2018/0366678 A1 | 12/2018 | Chi et al. |
| 2019/0081111 A1 | 3/2019 | Lee et al. |
| 2019/0088204 A1 | 3/2019 | Zhang et al. |
| 2019/0130822 A1 | 5/2019 | Jung et al. |
| 2019/0237517 A1 | 8/2019 | Hack |
| 2019/0250450 A1 | 8/2019 | Li |
| 2019/0253591 A1 | 8/2019 | Chen et al. |
| 2019/0273125 A1 | 9/2019 | Takechi |
| 2019/0279548 A1 | 9/2019 | Gao et al. |
| 2019/0305246 A1 | 10/2019 | Helander et al. |
| 2019/0317629 A1 | 10/2019 | Jung et al. |
| 2019/0325805 A1 | 10/2019 | Moon et al. |
| 2019/0326363 A1 | 10/2019 | Weaver et al. |
| 2019/0340980 A1 | 11/2019 | Yum et al. |
| 2019/0341435 A1 | 11/2019 | Chang et al. |
| 2019/0341575 A1 | 11/2019 | Chung et al. |
| 2019/0348627 A1 | 11/2019 | Lee et al. |
| 2020/0035951 A1 | 1/2020 | Cheon et al. |
| 2020/0044197 A1 | 2/2020 | Shedletsky et al. |
| 2020/0064968 A1 | 2/2020 | Kim et al. |
| 2020/0075683 A1 | 3/2020 | Polyakov et al. |
| 2020/0075693 A1 | 3/2020 | Polyakov et al. |
| 2020/0075864 A1 | 3/2020 | Helander et al. |
| 2020/0099836 A1 | 3/2020 | Chao |
| 2020/0105843 A1 | 4/2020 | Baek et al. |
| 2020/0111401 A1 | 4/2020 | Zhao et al. |
| 2020/0136077 A1 | 4/2020 | Lee et al. |
| 2020/0159284 A1 | 5/2020 | Mathew et al. |
| 2020/0161579 A1* | 5/2020 | Kim ............... H10K 59/38 |
| 2020/0194676 A1 | 6/2020 | Chang et al. |
| 2020/0194730 A1 | 6/2020 | Park et al. |
| 2020/0212130 A1 | 7/2020 | Kim et al. |
| 2020/0357871 A1 | 11/2020 | Chung et al. |
| 2022/0085114 A1* | 3/2022 | Seong ............... H10K 59/38 |
| 2022/0085334 A1* | 3/2022 | Oh ............... H10K 50/19 |
| 2022/0106477 A1 | 4/2022 | Lee et al. |
| 2022/0149316 A1 | 5/2022 | Kim et al. |
| 2022/0181591 A1* | 6/2022 | Niboshi ............... H05B 33/26 |
| 2022/0398759 A1 | 12/2022 | Schindler et al. |

FOREIGN PATENT DOCUMENTS

| | | |
|---|---|---|
| CN | 101617064 A | 12/2009 |
| CN | 101730938 A | 6/2010 |
| CN | 104037359 A | 9/2014 |
| CN | 104769149 A | 7/2015 |
| CN | 105094451 A | 11/2015 |
| CN | 105097877 A | 11/2015 |
| CN | 105206650 A | 12/2015 |
| CN | 105206753 A | 12/2015 |
| CN | 106206995 A | 12/2016 |
| CN | 106946859 A | 7/2017 |
| CN | 106992267 A | 7/2017 |
| CN | 107564945 A | 1/2018 |
| CN | 107573329 A | 1/2018 |
| CN | 107808895 A | 3/2018 |
| CN | 108376019 A | 8/2018 |
| CN | 108389878 A | 8/2018 |
| CN | 108418928 A | 8/2018 |
| CN | 108630830 A | 10/2018 |
| CN | 108767136 A | 11/2018 |
| CN | 108881531 A | 11/2018 |
| CN | 108900659 A | 11/2018 |
| CN | 109299631 A | 2/2019 |
| CN | 109461758 A | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 110112182 A | 8/2019 |
| CN | 110144551 A | 8/2019 |
| CN | 110265474 A | 9/2019 |
| CN | 110301053 A | 10/2019 |
| CN | 110391348 A | 10/2019 |
| CN | 110416269 A | 11/2019 |
| CN | 110429117 A | 11/2019 |
| CN | 110444125 A | 11/2019 |
| CN | 110459175 A | 11/2019 |
| CN | 110473898 A | 11/2019 |
| CN | 110473988 A | 11/2019 |
| CN | 110491917 A | 11/2019 |
| CN | 110491918 A | 11/2019 |
| CN | 110492018 A | 11/2019 |
| CN | 110518034 A | 11/2019 |
| CN | 110570774 A | 12/2019 |
| CN | 110634930 A | 12/2019 |
| CN | 110718580 A | 1/2020 |
| CN | 110727142 A | 1/2020 |
| CN | 110752249 A | 2/2020 |
| CN | 110767662 A | 2/2020 |
| CN | 110767682 A | 2/2020 |
| CN | 110767708 A | 2/2020 |
| CN | 110767709 A | 2/2020 |
| CN | 110767713 A | 2/2020 |
| CN | 110767736 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110780375 A | 2/2020 |
| CN | 110783484 A | 2/2020 |
| CN | 110783485 A | 2/2020 |
| CN | 110783486 A | 2/2020 |
| CN | 110828699 A | 2/2020 |
| CN | 110867527 A | 3/2020 |
| CN | 110914891 A | 3/2020 |
| CN | 110923625 A | 3/2020 |
| CN | 110928453 A | 3/2020 |
| CN | 110956925 A | 4/2020 |
| CN | 110989861 A | 4/2020 |
| CN | 111009619 A | 4/2020 |
| CN | 111020489 A | 4/2020 |

(56) References Cited

FOREIGN PATENT DOCUMENTS

| | | |
|---|---|---|
| CN | 111029381 A | 4/2020 |
| CN | 111029382 A | 4/2020 |
| CN | 111046599 A | 4/2020 |
| CN | 111048564 A | 4/2020 |
| CN | 111142180 A | 5/2020 |
| CN | 111155055 A | 5/2020 |
| CN | 111180490 A | 5/2020 |
| CN | 111223908 A | 6/2020 |
| CN | 111261641 A | 6/2020 |
| CN | 111292617 A | 6/2020 |
| CN | 111293235 A | 6/2020 |
| CN | 111293236 A | 6/2020 |
| CN | 111312795 A | 6/2020 |
| CN | 111341936 A | 6/2020 |
| CN | 210668382 U | 6/2020 |
| CN | 111403621 A | 7/2020 |
| CN | 111524460 A | 8/2020 |
| CN | 111524469 A | 8/2020 |
| CN | 111584725 A | 8/2020 |
| CN | 111584748 A | 8/2020 |
| CN | 111640882 A | 9/2020 |
| CN | 111668240 A | 9/2020 |
| CN | 111682055 A | 9/2020 |
| CN | 111682120 A | 9/2020 |
| CN | 111725288 A | 9/2020 |
| CN | 111739921 A | 10/2020 |
| CN | 111739924 A | 10/2020 |
| CN | 111755493 A | 10/2020 |
| CN | 111755623 A | 10/2020 |
| CN | 111799374 A | 10/2020 |
| CN | 111834547 A | 10/2020 |
| CN | 111862875 A | 10/2020 |
| CN | 111863900 A | 10/2020 |
| EP | 1 850 368 A1 | 10/2007 |
| EP | 1 873 162 A1 | 1/2008 |
| EP | 2 998 997 A1 | 3/2016 |
| EP | 3 182 477 A1 | 6/2017 |
| EP | 2 248 849 B1 | 7/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 3 406 752 A1 | 11/2018 |
| EP | 3 499 576 A1 | 6/2019 |
| JP | 2004-352815 A | 12/2004 |
| JP | 2006-302878 | 11/2006 |
| JP | 2007-188854 A | 7/2007 |
| JP | 2010-258410 A | 11/2010 |
| JP | 2011-008958 | 1/2011 |
| JP | 2011-258383 | 12/2011 |
| JP | 2013-008669 | 1/2013 |
| JP | 5233074 B2 | 7/2013 |
| JP | 2013-219278 A | 10/2013 |
| JP | 5749870 B1 | 7/2015 |
| JP | 2017-037192 | 2/2017 |
| JP | 2018-533183 A | 11/2018 |
| JP | 2019-160632 | 9/2019 |
| KR | 10-20100054630 A | 5/2010 |
| KR | 1020100123735 A | 11/2010 |
| KR | 20120080536 A | 7/2012 |
| KR | 10-20140062258 A | 5/2014 |
| KR | 101530266 B1 | 6/2015 |
| KR | 10-20150127368 A | 11/2015 |
| KR | 101640772 B1 | 7/2016 |
| KR | 10-20170030168 A | 3/2017 |
| KR | 10-20170075865 A | 7/2017 |
| KR | 10-20180115655 A | 10/2018 |
| KR | 10-20180121304 A | 11/2018 |
| KR | 10-20190020930 A | 3/2019 |
| KR | 20190086756 A | 7/2019 |
| TW | 201929219 A | 7/2019 |
| WO | WO-2011/012212 A1 | 2/2011 |
| WO | WO-2011/043083 A1 | 4/2011 |
| WO | WO-2011/049284 A1 | 4/2011 |
| WO | WO-2013/183851 A1 | 12/2013 |
| WO | WO-2014/163228 A1 | 10/2014 |
| WO | WO-2016/056364 A1 | 4/2016 |
| WO | WO-2017/072678 A1 | 5/2017 |
| WO | WO-2018/100559 A1 | 6/2018 |
| WO | WO-2018/206575 A1 | 11/2018 |
| WO | WO-2019/002198 A1 | 1/2019 |
| WO | WO-2019/006749 A1 | 1/2019 |
| WO | WO-2019/047126 A1 | 3/2019 |
| WO | WO-2019/062221 A1 | 4/2019 |
| WO | WO-2019/062236 A1 | 4/2019 |
| WO | WO-2019/088594 A2 | 5/2019 |
| WO | WO-2019/141198 A1 | 7/2019 |
| WO | WO-2019/147012 A1 | 8/2019 |
| WO | WO-2019/150327 A1 | 8/2019 |
| WO | WO-2019/178782 A1 | 9/2019 |
| WO | WO-2019/199131 A1 | 10/2019 |
| WO | WO-2019/199139 A1 | 10/2019 |
| WO | WO-2019/199693 A1 | 10/2019 |
| WO | WO-2019/200862 A1 | 10/2019 |
| WO | WO-2019/233298 A1 | 12/2019 |
| WO | WO-2019/242510 A1 | 12/2019 |
| WO | WO-2020/029559 A1 | 2/2020 |
| WO | WO-2020/029612 A1 | 2/2020 |
| WO | WO-2020/029621 A1 | 2/2020 |
| WO | WO-2020/045262 A1 | 3/2020 |
| WO | WO-2020/052232 A1 | 3/2020 |
| WO | WO-2020/057208 A1 | 3/2020 |
| WO | WO-2020/079456 A1 | 4/2020 |
| WO | WO-2020/105015 A1 | 5/2020 |
| WO | WO-2020/134914 A1 | 7/2020 |
| WO | WO-2020/178804 A | 9/2020 |
| WO | WO-2020/191889 A1 | 10/2020 |
| WO | WO-2020/192051 A1 | 10/2020 |
| WO | WO-2020/195917 A1 | 10/2020 |
| WO | WO-2020/199445 A1 | 10/2020 |
| WO | WO-2020/212953 A1 | 10/2020 |
| WO | WO-2020/225778 A1 | 11/2020 |
| WO | WO-2020/226383 A1 | 11/2020 |
| WO | WO-2020/261191 A1 | 12/2020 |
| WO | WO-2022/101429 A1 | 5/2022 |

OTHER PUBLICATIONS

International Search Report and Written Opinion for PCT PCT/IB2020/062423 dated Mar. 23, 2021.
Notice of Allowance on U.S. Appl. No. 17/789,127 DTD Mar. 30, 2023.
Abroshan, H. et al. "66-3: Active Learning for the Design of Novel OLED Materials." SID Symposium Digest of Technical Papers. 53.1 (2022).
Alhadid A. et al., "Design of Deep Eutectic Systems: A Simple Approach for Preselecting Eutectic Mixture Constituents (Supplementary Material)", Molecules, 25.5 (2020):1077.
Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.
Allcock, H.R. "Phosphorus-nitrogen Compounds", pp. 400-447, Academic Press (1972).
Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.
Allcock, Harry R., and Dawn E. Smith. "Surface studies of poly (organophosphazenes) containing dimethylsiloxane grafts." Chemistry of materials 7.8 (1995): 1469-1474.
Allcock, Harry R., and Michael L. Turner. "Ring expansion and polymerization of transannular bridged cyclotriphosphazenes and their spirocyclic analogs." Macromolecules 26.1 (1993): 3-10.
Allcock, Harry R., Gayann S. McDonnell, and James L. Desorcie. "Ring expansion and equilibration in organophosphazenes and the relationship to polymerization." Inorganic chemistry 29.19 (1990):3839-3844.
Allcock, Harry R., Michael L. Turner, and Karyn B. Visscher. "Synthesis of transannular-and spiro-substituted cyclotriphosphazenes:

(56) References Cited

OTHER PUBLICATIONS x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]." Inorganic chemistry 31.21 (1992): 4354-4364.

Amano, Akio, et al. "49.4 L: Late-News Paper: Highly Transmissive One Side Emission OLED Panel for Novel Lighting Applications." SID Symposium Digest of Technical Papers. Vol. 44. No. 1. Oxford, UK: Blackwell Publishing Ltd, 2013.

Aqra, Fathi, and Ahmed Ayyad. "Surface free energy of alkali and transition metal nanoparticles." Applied surface science 314 (2014): 308-313.

Araki, H. and Naka, K., "Syntheses and Properties of Dumbbell-Shaped POSS Derivatives Linked by Luminescent p-Conjugated Units", Polymer Chemistry, 50.20 (2012):4170-4181.

Araki, H. and Naka, K., "Syntheses and Properties of Star- and Dumbbell-Shaped POSS Derivatives Containing Isobutyl Groups", Polymer Journal, 44 (2012):340-346.

Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.

Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.

Bae, J. et al. "Optically recoverable, deep ultraviolet (UV) stable and transparent sol-gel fluoro siloxane hybrid material for a UV LED encapsulant." RSC advances 6.32 (2016): 26826-26834.

Baek, Seungin, et al. "74-2: Diffracted Image Retrieving with Deep Learning." SID Symposium Digest of Technical Papers. vol. 51. No. 1. 2020.

Baradie, B. et al. "Synthesis and characterization of novel polysiloxane-grafted fluoropolymers." Canadian journal of chemistry 83.6-7 (2005): 553-558.

Barry, B., "Routes to Silsesquioxanes Functionalization—Capping of DDSQs for the Synthesis of Asymmetric POSS Compounds", Masters Thesis, Michigan State University (2019).

Bechtolsheim, C. V., V. Zaporojtchenko, and F. Faupel. "Interface structure and formation between gold and trimethylcyclohexane polycarbonate." Journal of materials research 14.9 (1999): 3538-3543.

Bertolucci, M. et al. "Wetting Behavior of Films of New Fluorinated Styrene—Siloxane Block Copolymers." Macromolecules 37.10 (2004): 3666-3672.

Besli, S. et al., "Bridged Cyclophosphazenes Resulting From Deprotonation Reactions of Cyclotriphophazenes Bearing a P—NH Group", Dalton Trans., 40.19 (2011):5307.

Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.

Biederman, H. et al., "The Properties of Fluorocarbon Films Prepared by R.F. Sputtering and Plasma Polymerization in Inert and Active Gas", Thin Solid Films, 41.3 (1977):329-339.

Blanchet, G.B., "Deposition of Amorphous Fluoropolymers Thin Films by Laser Ablation", Appl. Phys. Lett. 62 (1993):479-481.

Blanco, I., "The Rediscovery of POSS: A Molecule Rather than a Filler", Polymers, 10.8 (2018):904-914.

Boyne, D. et al., "Vacuum Thermal Evaporation of Polyaniline Doped with Camphor Sulfonic Acid", Journal of Vacuum Science & Technology A, 33.3 (2015):031510.

Brickley, J.F. et al., "Supramolecular Variations on a Molecular Theme: the Structural Diversity of Phosphazenes (RNH)6P3N3 in the Solid State", Dalton Trans., 7 (2003):1235-1244.

Brown, Douglas E., et al. "Poly [(vinyloxy) cyclophosphazenes]." Macromolecules 34.9 (2001): 2870-2875.

Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.

Buzin, M. I., et al. "Solid-state polymerization of hexaphenylcyclotrisiloxane." Journal of Polymer Science Part A: Polymer Chemistry 35.10 (1997): 1973-1984.

Cai, J. et al. "P-13.10: A New Color Space Model for AMOLED Display Based on IR Drop" SID Symposium Digest of Technical Papers 54 (2023).

Camino, G. et al., "Polydimethylsiloxane Thermal Degradation Part 1. Kinetic Aspects", Polymer, 42.6 (2001):2395-2402.

Chaiprasert, T. et al. "Vinyl-functionalized Janus ring siloxane: potential precursors to hybrid functional materials." Materials 14.8 (2021): 2014.

Chan, E.P. et al., "Viscoelastic Properties of Confined Polymer Films Measured via Thermal Wrinkling", Soft Matter, 5.23 (2009):4638-4641.

Chan, K.L. et al., "Cubic Silsesquioxanes for Use in Solution Processable Organic Light Emitting Diodes (OLED)", Journal of Materials Chemistry, 19.48 (2009):9103-9120.

Chandrasekhar, V. et al., "Cyclophosphazene-Based Multi-Site Coordination Ligands", Coordination Chemistry Reviews, 251.9-10 (2007):1045-1074.

Chaudhury, M. and Pocius, A. V. "Adhesion science and engineering-2: Surfaces, Chemistry and Applications" Elsevier (2002).

Chen, G. K. J., and J. Chen. "Flexible displays: Flexible AMOLED manufacturing." Handbook of Visual Display Technology; Chen, J., Cranton, W., Fihn, M., Eds (2016).

Chen, W. et al., "Highly Thermal Stable Phenolic Resin Based on Double-Decker-Shaped POSS Nanocomposites for Supercapacitors", Polymers, 12.9 (2020):2151-2165.

Chen, Yu-Hung, et al. "58.2: High-Performance Large-Size OLED Tv with Ultra Hd Resolution." SID Symposium Digest of Technical Papers. vol. 46. No. 1. 2015.

Ching, Suet Ying. "Plasmonic properties of silver-based alloy thin films." (2015). Open Access Theses and Dissertations. 194.

Ching, Suet Ying. "Plasmonic properties of silver-based alloy thin films." (2016).

Cho, H.U. et al. "17-1: Invited Paper: Enhancement of Current Efficiency for OLED Devices Using Meta-Heuristic Algorithm." SID Symposium Digest of Technical Papers. 52.1 (2021).

Choi, B. K. et al. "48-1: Invited Paper: Next Generation Highly Efficient and Stable Phosphorescent Emitting Materials For OLEDs." SID Symposium Digest of Technical Papers 51.1 (2020).

Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.

Cordes, D.B. et al., "Recent Developments in the Chemistry of Cubic Polyhedral Oligosilsesquioxanes", Chem. Rev., 110 (2010):2081-2173.

Dalvi, V.H. and Rossky, P.J., "Molecular Origins of Fluorocarbon Hydrophobicity", PNAS, 107.31 (2010):13603-13607.

Dash, P. and Y. C.H. "How much battery does dark mode save? An accurate OLED display power profiler for modern smartphones." Proceedings of the 19th Annual International Conference on Mobile Systems, Applications, and Services (2021).

David, Robert, Neumann, A. Wilhelm. "A Theory for the Surface Tensions and Contact Angles of HydrogenBonding Liquids." Langmuir 30.39 (2014):11634-11639.

De Wilde, W., "Evaporation of Polytetrafluoroethylene by Electron Bombardment of the Bulk Material", Thin Solid Films, 24.1 (1974):101-111.

Dong, H. et al., "Surface Properties and Thermal Stability of a Novel Low-Surface-Energy Polybenzoxazine/Clay Nanocomposites", Polymer Composites, 33.8 (2012):1313-1320.

Drelich, J. et al., "Hydrophilic and Superhydrophilic Surfaces and Materials", Soft Matter, 7.21 (2011):9804-9828.

Dubrovskii, Vladimir. "Fundamentals of Nucleation Theory." Nucleation Theory and Growth of Nanostructures. Springer, Berlin, Heidelberg, 2014. 1-73.

(56) References Cited

OTHER PUBLICATIONS

Dudziec, B. and Marciniec, B., "Double-decker Silsesquioxanes: Current Chemistry and Applications", Current Organic Chemistry, 21.28 (2017):2794-2813.

Dudziec, B. et al., "Synthetic Routes to Silsesquioxane-Based Systems as Photoactive Materials and Their Precursors", Polymers, 11.3 (2019):504-542.

Dutkiewicz, M. et al., "New Fluorocarbofunctional Spherosilicates: Synthesis and Characterization", Organometallics, 30.8 (2011):2149-2153.

Eguchi, Shingo, et al. "35-1: Strategy for Developing an Ultra-High-Luminance AMOLED Display." SID Symposium Digest of Technical Papers. vol. 49. No. 1. 2018.

Eilers, H., et al. "Teflon AF/Ag nanocomposites with tailored optical properties." Journal of materials research 21.9 (2006): 2168-2171.

Ellison, A. H., H. W. Fox, and W. A. Zisman. "Wetting of fluorinated solids by hydrogen-bonding liquids." The Journal of Physical Chemistry 57.7 (1953): 622-627.

Emerton, Neil, David Ren, and Tim Large. "28-1: Image Capture Through TFT Arrays." SID Symposium Digest of Technical Papers. vol. 51. No. 1. 2020.

English translation of 037-06-JP NP office action dated Jan. 16, 2023.

Faupel, F., et al. "Nucleation, growth, interdiffusion, and adhesion of metal films on polymers." AIP Conference Proceedings. vol. 491. No. 1. American Institute of Physics, 1999.

Feher, F.J. and Budzichowski, T.A., "Silasesquioxanes as Ligands in Inorganic and Organometallic Chemistry", Polyhedron, 14.22 (1995):3239-3253.

Feng, Zhengyu, et al. "28-3: Pixel Design for Transparent MicroLED Display with Low Blurring." SID Symposium Digest of Technical Papers. vol. 51. No. 1. 2020.

Flores-Camacho, Jose Manuel, et al. "Growth and optical properties of Ag clusters deposited on poly (ethylene terephthalate)." Nanotechnology 22.27 (2011): 275710.

Forrest, James A. "Reductions of the glass transition temperature in thin polymer films: Probing the length scale of cooperative dynamics." Physical Review E 61.1 (2000): R53-6.

Fowkes, Frederick M. "Attractive Forces at Interfaces." Industrial and Engineering Chemistry 56.12 (1964): 40-52.

Fox, H.W. et al., "Polyorganosiloxanes . . . Surface Active Properties", Ind. Eng. Chem., 39.11 (1947):1401-1409.

Frey, Kurt, et al. "Implications of coverage-dependent O adsorption for catalytic NO oxidation on the late transition metals." Catalysis Science & Technology 4.12 (2014): 4356-4365.

Fryer, David S., et al. "Dependence of the glass transition temperature of polymer films on interfacial energy and thickness." Macromolecules 34.16 (2001): 5627-5634.

Fusella, Michael A., et al. "Plasmonic enhancement of stability and brightness in organic light-emitting devices." Nature 585.7825 (2020): 379-382.

Gabler, D.G. and Haw, J.F., "Hydrolysis Chemistry of the Chlorophosphazene Cyclic Trimer", Inorganic Chemistry, 29.20 (1990):4018-4021.

Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.

Gao Y., "Microphase Separation of Stimulus-Responsive Block-co-Polypeptides on Surfaces", Master's thesis, Duke University (2018).

Giebink, C. "Catastrophic OLED failure and pathways to address it" Department of Energy, url:https://www.energy.gov/sites/prod/files/2018/02/f48/giebink_oled-failure_nashville18_0.pdf (2018).

Glüge, J. et al., "An Overview of the Uses of Per- and Polyfluoroalkyl Substances (PFAS)—Electronic supplementary information 1", Environmental Science: Processes & Impacts, 20.12 (2020):2345-2373.

Gogoi, N. et al., "Low-Surface-Energy Materials Based on Polybenzoxazines for Surface Modification of Textiles", The Journal of The Textile Institute, 105.11 (2014):1212-1220.

Golovin, K. et al., "Low-Interfacial Toughness Materials for Effective Large-Scale Deicing", Science, 364.6438 (2019):371-375.

Golovin, K. et al., Supplementary Materials for "Low-Interfacial Toughness Materials for Effective Large-Scale Deicing", Science, 364.6438 (2019):371-375.

Goyal, S. et al. "Fundamentals of Organic-Glass Adhesion", Handbook of Materials Modeling, edited by Andreoni W. and Yip S., Springer Nature Switzerland AG (2020): 2049-2089.

Grant Norton, M. et al., "Pulsed Laser Ablation and Deposition of Fluorocarbon Polymers", Applied Surface Science, 96-98 (1996):617-620.

Gritsenko, K.P. and Krasovsky, A.M., "Thin-Film Deposition of Polymers by Vacuum Degradation", Chem. Rev., 103.9 (2003):3607-3649.

Grytsenko, K. "Vacuum-deposited fluoropolymer films for organic electronics" International Symposium on Plastics Electronics (Part of Semicon Europe—2015) at Dresden, Germany (2015).

Grytsenko, K.P. et al., "Protective Applications of Vacuum-Deposited Perfluoropolymer Films", Semiconductor Physics, Quantum Electronics & Optoelectronics, 19.2 (2016):139-148.

Heaney, James B. "Evaluation of commercially supplied silver coated Teflon for spacecraft temperature control usage." (1974).

Ho, P. S. "Chemistry and adhesion of metal-polymer interfaces." Applied surface science 41 (1990): 559-566.

Ho, P. S., et al. "Chemical bonding and reaction at metal/polymer interfaces." Journal of Vacuum Science & Technology A: Vacuum, Surfaces, and Films 3.3 (1985): 739-745.

Hoge, J. "Novel Benzoxazine Based System for Flame Retardant Aircraft Interior Prepreg Applications" The Sixth Triennial International Aircraft Fire and Cabin Safety Research (2010).

Holland, L. et al., "Sputtered and Plasma Polymerized Fluorocarbon Films", Thin Solid Films, 35 (1976): L19-L21.

Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.

Hwang, S. et al., "ChemInform Abstract: Dendritic Macromolecules for Organic Light-Emitting Diodes", Chemical Society Reviews, 37.11 (2008):2543-2557.

Iacono, S. T. et al. "Fluorinated polyhedral oligomeric silsesquioxanes (F-POSS)", Defense Technical Information Center, (2010) url:https://apps.dtic.mil/sti/tr/pdf/ADA521393.pdf.

Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.

Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.

Ikonnikov, D.A., "Controlling Multiple Diffraction with Quasiperiodic Gratings", Laser Phys. Lett., 16.12 (2019):126202.

Imoto, H. et al., "Corner- and Side-Opened Cage Silsesquioxanes: Structural Effects on the Materials Properties", European Journal of Inorganic Chemistry, 2020.9 (2020):737-742.

Imoto, H. et al., "Tripodal Polyhedral Oligomeric Silsesquioxanes as a Novel Class of Three-Dimensional Emulsifiers", Polymer Journal, 47 (2015):609-615.

Ito, Hitoshi, et al. "Synthesis and Thermal Properties of Fully Aromatic Polysilarylenesiloxanes." Polymer Journal 38.2 (2006): 109-116.

Ivleva, E.A. et al., "Synthesis of Adamantane Functional Derivatives Basing on N-[(Adamantan-1-yl)alkyl]acetamides", Russian Journal of Organic Chemistry, 52.11 (2016):1558-1564.

Iwamori, S. et al., "Adsorption Properties of Fluorocarbon Thin Films Prepared by Physical Vapor Deposition Methods", Surface & Coatings Technology, 204:16-17 (2010):2803-2807.

Iwamori, S., "Adhesion and Friction Properties of Fluorocarbon Polymer Thin Films Coated onto Metal Substrates", Key Engineering Materials, 384 (2008):311-320.

Jarvis, N.L. and Zisman, W.A., "Surface Chemistry of Fluorochemicals", Defense Technical Information Center (1965):1-37.

(56) References Cited

OTHER PUBLICATIONS

Jiao, Zhiqiang, et al. "61-2: Weakening Micro-Cavity Effects in White Top-Emitting WOLEDs with Semitransparent Metal Top Electrode." SID Symposium Digest of Technical Papers. vol. 49. No. 1. 2018.

Jin, Y. et al. "Two-Tier Ensemble Deep Learning Model for Anomaly Detection in OLED Encapsulation Process" The 21st International Meeting on Information Display, Seoul, Korea (2021).

Jung, W. et al. "62-3: High Precise laser glass cutting for future display" Journal of the Society for Information Display 30.5 (2022): 462-470.

Kaesler, K., "The hidden defenders: Silane and siloxane impregnation protects construction materials", European coatings journal, 3 (2006):36-41.

Kanzow, J., et al. "Formation of a metal/epoxy resin interface." Applied surface science 239.2 (2005): 227-236.

Karabacak, Tansel. "Thin-film growth dynamics with shadowing and re-emission effects." Journal of Nanophotonics 5.1 (2011): 052501.

Kaspaul, A. F., and E. E. Kaspaul. "Application of molecular amplification to microcircuitry." Trans. 10th National Vacuum Symposium. 1963. pp. 422-427.

Kato, Daimotsu, et al. "52.4 L Transmissive One-Side-Emission OLED Panel using Alignment-Free Cathode Patterning." SID Symposium Digest of Technical Papers. vol. 46. No. 1. 2015.

Khanin, D. A., et al. "New hybrid materials based on cyclophosphazene and polysiloxane precursors: Synthesis and properties." Polymer 186 (2020): 122011.

Kim, Chiwoo, et al. "Fine metal mask material and manufacturing process for high-resolution active-matrix organic light-emitting diode displays." Journal of the Society for Information Display 28.8 (2020): 668-679.

Kim, G. et al. "Multiscale Calculation of Carrier Mobility in Organic Solids Through the Fine-Tuned Kinetic Monte Carlo Method" The 21st International Meeting on Information Display, Seoul, Korea (2021).

Kim, H. et al. "83-2: Reliability Characterization of Luminance Degradation of OLED Mobile Display Considering Color Difference Index Based on Usage Patterns." SID Symposium Digest of Technical Papers 51.1 (2020).

Kim, Haewon, et al. "Analysis of Semi-Transparent Cathode Performance Based on Fabrication Methods." IDW '19. 2019.

Kim, Hyun-Chang, et al. 39-4: A Method of Panel-Current Limitation for Automotive OLED Displays. SID Symposium Digest of Technical Papers. vol. 51. No. 1. 2020.

Kim, J. et al. "Design of Stable Blue Phosphorescent OLEDs Using State Interaction between Exciplex and Component Host" The 21st International Meeting on Information Display, Seoul, Korea (2021).

Kim, J.H. et al., "Thickness and Composition Dependence of the Glass Transition Temperature in Thin Homogeneous Polymer Blend Films", Macromolecules, 35.1 (2002):311-313.

Kim, J.H. et al., "Thickness Dependence of the Glass Transition Temperature in Thin Polymer Films", Langmuir, 17.9 (2001):2703-2710.

Kim, J.H. et al., "Thickness Dependence of the Melting Temperature of Thin Polymer Films", Macromol. Rapid Commun. 22.6 (2001):386-389.

Kim, S. et al. "25-3: Machine-Learning-Assisted Materials Discovery of Blue Emitter for More Efficient and Durable OLED Device." SID Symposium Digest of Technical Papers. 52.1 (2021).

Kim, S. "40-2: Long lifetime Phosphorescent Blue" 2022 Display Week International Symposium, San Jose (2022).

Kim, S. et al. "Autonomous Materials Design for More Efficient OLED Devices using Machine Learning" The 21st International Meeting on Information Display, Seoul, Korea (2021).

Kim, S. et al., "Origin of Macroscopic Adhesion in Organic Light-Emitting Diodes Analyzed at Different Length Scales", Scentific Reports, 8.6391 (2018): 1-7.

Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.

Kim, T. et al., "Electrical Injection and Transport in Teflon-Diluted Hole Transport Materials", Organic Electronics, 83 (2020):105754.

Kim, Y. "AI & Simulation Technology for Displays", SID 2021 Short Course, SID Display Week, virtual (2021).

Kim, Y. et al. "17-2: Invited Paper: Simulation Based Artificial Intelligence for Displays." SID Symposium Digest of Technical Papers. 52.1 (2021).

Kim, Y. et al. "17-2: Invited talk: Simulation Based Artificial Intelligence for Displays." 2021 Virtual Display Week International Symposium (2021).

Kisin, Srdjan. Adhesion changes at metal-polymer interfaces: Study of the copper-(acrylonitrile-utadiene-styrene) system. Diss. Dissertation, Technische Universiteit Eindhoven, 2007.

Kiskan, B., "Adapting Benzoxazine Chemistry for Unconventional Applications", Reactive and Functional Polymers, 129 (2018):76-88.

Knight Jr, L. B., et al. "Unusual behavior of vaporized magnesium under low pressure conditions."?The Journal of Physical Chemistry? 79.12 (1975): 1183-1190.

Koh, K. et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005):1264-1270.

Koma, N. et al. "44.2: Novel Front-light System Using Fine-pitch Patterned OLED." SID Symposium Digest of Technical Papers, 39: 655-658. 2008.

Kota, Arun K., Gibum Kwon, and Anish Tuteja. "The design and applications of superomniphobic surfaces." NPG Asia Materials 6.7 (2014): e109.

Kovacik, P. et al., "Vacuum-Deposited Planar Heterojunction Polymer Solar Cells", ACS Appl. Mater. Interfaces, 3.1 (2011):11-15.

Krishnan, S. et al., "Fluorinated Polymers: Liquid Crystalline Properties and Applications in Lithography", The Chemical Record, 4.5 (2004):315-330.

Kunthom, R. et al., "Synthesis and Characterization of Unsymmetrical Double-Decker Siloxane (Basket Cage)", Molecules, 24.23 (2019):4252.

Kuo, S. et al., "Preparing Low-Surface-Energy Polymer Materials by Minimizing Intermolecular Hydrogen-Bonding Interactions", J. Phys. Chem. C, 113.48 (2009):20666-20673.

Lanoux, S. and Mas, R.H., "Reactions of the Hydrolyzed Phosphazene N3P3(OCH2CF3)5ONa", Phosphorus and Sulfur and the Related Elements, 26.2 (1986):139-142.

Lee, Chang-Jun, et al. "Microcavity effect of top-emission organic light-emitting diodes using aluminum cathode and anode." Bulletin of the Korean Chemical Society 26.9 (2005): 1344-1346.

Lee, Chia-Tse, et al. "58.3: A Novel Highly Transparent 6-in. AMOLED Display Consisting of IGZO TFTs." SID Symposium Digest of Technical Papers. vol. 46. No. 1. 2015.

Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).

Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.

Lee, S. et al. "20-2: High Efficiency and Long Device Lifetime Green Organic Light Emitting Diodes using a Pt Complex." SID Symposium Digest of Technical Papers 51.1 (2020).

Li, L. et al., "Synthesis and Properties of Microporous Organic Polymers Based on Adamantane", Progress in Chemistry, 32 (2020):190-203.

Li, P. et al. "Preparation and application of fluorinated-siloxane protective surface coating material for stone inscriptions." Journal of Polymer Engineering 35.6 (2015): 511-522.

Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).

(56) References Cited

OTHER PUBLICATIONS

Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, C. et al., "Mechanistic Studies on Ring-Opening Polymerization of Benzoxazines: A Mechanistically Based Catalyst Design", Macromolecules, 44.12 (2011):4616-4622.
Liu, F. et al. "Syntheses and structure of the first eight-membered fluoro and chloro hafnium siloxane complexes" Zeitschrift für anorganische und allgemeine Chemie 622.5 (1996): 819-822.
Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Liu, Z. et al., "Two-Dimensional Gratings of Hexagonal Holes for High Order Diffraction Suppression", Optics Express, 25.2 (2017): 1339-1349.
Lowe, R.D. et al., "Deposition of Dense Siloxane Monolayers from Water and Trimethoxyorganosilane Vapor", Langmuir, 27.16 (2011):9928-9935.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane—OH and Epoxy Resins", Journal of Applied Polymer Science, 106.6 (2007):4117-4123.
Lund, L. G., et al. "514. Phosphonitrilic derivatives. Part I. The preparation of cyclic and linear phosphonitrilic chlorides." Journal of the Chemical Society (Resumed) (1960): 2542-2547.
Lysien, M. et al. "55-1: Deposition of Conductive and Insulating Materials at Micrometer Scale for Display-Component Prototyping." SID Symposium Digest of Technical Papers 53.1 (2022).
Mabry, J.M. et al., "Fluorinated Polyhedral Oligomeric Silsesquioxanes (F-POSS)", Angew. Chem. Int. Ed., 47.22 (2008):4137-4140.
Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.
Mackus, A.J.M. et al. "From the bottom-up: toward area-selective atomic layer deposition with high selectivity" Chemistry of Materials 31.1 (2018): 2-12.
Maissel, Leon I., and Maurice H. Francombe. An introduction to thin films. CRC Press, 1973. pp. 61-83, 198, 199.
Majhy, B. et al., "Facile Fabrication and Mechanistic Understanding of a Transparent Reversible Superhydrophobic-Superhydrophilic Surface", Scientific Reports, 8 (2018):18018.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Marzari, N. et al. "Electronic-structure methods for materials design." Nature materials 20.6 (2021):736-749.
Meinders, Marcel BJ, William Kloek, and Ton van Vliet. "Effect of surface elasticity on Ostwald ripening in emulsions." Langmuir 17.13 (2001): 3923-3929.
Michele Ricks. Advanced OLED Materials Enabling Large-Size OLED Displays by Ink Jet Printing. OLEDs World Summit, Sep. 2020.
Mikhaylov, D.Y. and Budnikova, Y.H., "Fluoroalkylation of Organic Compounds", Russian Chemical Reviews, 82.9 (2013):835-864.
Mittal, Kashmiri Lal, ed. Metallized plastics 3: fundamental and applied aspects. Springer Science & Business Media, 2012.

Morgenstern, Karina, Georg Rosenfeld, and George Comsa. "Decay of two-dimensional Ag islands on Ag (111)." Physical review letters 76.12 (1996): 2113.
Mugisawa, M. et al., "Synthesis and Application of Novel Fluoroalkyl End-Capped Cooligomers Having Adamantane as a Pendant Group", Colloid Polym Sci, 285 (2007):737-744.
Murano, Sven, et al. "30.3: Invited Paper: AMOLED Manufacturing-Challenges and Solutions from a Material Makers Perspective." SID Symposium Digest of Technical Papers. vol. 45. No. 1. 2014.
Murray, M. et al., "NMR Studies of Hydrolysis and Rearrangement Reactions of Cyclophosphazenes", Phosphorus, Sulfur, and Silicon and the Related Elements, 65.1-4 (1992):83-86.
Nakamura, Daiki, et al. "68-4: Top-emission OLED Kawara-type Multidisplay with Auxiliary Electrode." SID Symposium Digest of Technical Papers. vol. 49. No. 1. 2018.
Nason, T.C. et al., "Deposition of Amorphous Fluoropolymer Thin Films by Thermolysis of Teflon Amorphous Fluoropolymer", Appl. Phys. Lett. 60 (1992):1866-1868.
Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on—CF3 Alignment", Langmuir, 15 (1999):4321-4323.
Nittler, Laurent, et al. "Morphology study of small amounts of evaporated gold on polymers." Surface and interface analysis 44.8 (2012): 1072-1075.
Niu, J. et al., "High Order Diffraction Suppression by Quasi-Periodic Two-Dimensional Gratings", Optical Materials Express, 7.2 (2017):366-375.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Ohring, Milton. Materials science of thin films. Elsevier, 2001.
Oka, M. and Satoshi, H. "Synthesis of photoresponsive cyclic poly (dimethyl siloxane) s from monodisperse linear precursors" Reactive and functional polymers 158 (2021): 104800.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.
Olejnik, A. et al., "Silsesquioxanes in the Cosmetics Industry—Applications and Perspectives", Materials, 15.3 (2022):1126-1143.
Owen, M. J. "A review of significant directions in fluorosiloxane coatings" Surface Coatings International Part B: Coatings Transactions 87:B2 (2004).
Pandharkar, Riddhish, et al. "A Computational Study of AlF3 and ACF Surfaces." Inorganics 6.4 (2018): 124.
Park, Chan II, et al. "54-1: Distinguished Paper: World 1st Large Size 77-inch Transparent Flexible OLED Display." SID Symposium Digest of Technical Papers. vol. 49. No. 1. 2018.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.
Peters, Richard D., et al. "Using Self-Assembled Monolayers Exposed to X-rays To Control the Wetting Behavior of Thin Films of Diblock Copolymers." Langmuir 16.10 (2000): 4625-4631.

(56) References Cited

OTHER PUBLICATIONS

Pham, J.Q. and Green, P.F., "The Glass Transition of Thin Film Polymer/Polymer Blends: Interfacial Interactions and Confinement", J. Chem. Phys., 116.13 (2002):5801-5806.
Pocius, A. V. and Dillard, D.A. "Adhesion science and engineering-1: The Mechanics of Adhesion" Elsevier (2002).
Pu, T. et al., "Effects of Structure Parameters on High-Order Diffraction Suppression of Quasi-Periodic Gratings", Journal of the Optical Society of America B, 35.4 (2018):711-717.
Quan, Wei, et al. "69-2: Transparent Conductive Hybrid Cathode Structure for Top-Emitting Organic Light-Emitting Devices." SID Symposium Digest of Technical Papers. vol. 51. No. 1. 2020.
Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.
Reichert, V.R. and Mathias, L.J., "Expanded Tetrahedral Molecules from 1,3,5,7-Tetraphenyladarnantane", Macromolecules, 27.24 (1994):7015-7023.
Ribeiro, Paulo, David L. Andrews, and Maria Raposo, eds. Optics, Photonics and Laser Technology 2017. vol. 222. Springer, 2019.
Ringe, E., "Shapes, Plasmonic Properties, and Reactivity of Magnesium Nanoparticles", J. Phys, Chem. C, 124 (2020):15665.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Roy, M.R., "Surface Properties of Hard Fluorinated Amorphous Carbon Films Deposited by Pulsed-DC Discharges", Doctoral Thesis, Universitat de Barcelona (2012).
Safonov, Alexey I., et al. "Deposition of thin composite films consisting of fluoropolymer and silver nanoparticles having surface plasmon resonance." Thin Solid Films 603 (2016): 313-316.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schilling, C.I. et al., "Fourfold Suzuki-Miyaura and Sonogashira Cross-Coupling Reactions on Tetrahedral Methane and Adamantane Derivatives", Eur. J. Org. Chem., 2011.9 (2011):1743-1754.
Schissel, Paul, and Alvin Warren Czanderna. "Reactions at the silver/polymer interface: a review." Solar Energy Materials 3.1-2 (1980): 225-245.
Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.
Seebauer, E.G. and Allen, C.E., "Estimating Surface Diffusion Coefficients", Progress in Surface Science, 49.3 (1995): 265-330.
Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.
Senchyk, G.A. et al., "Functionalized Adamantane Tectons Used in the Design of Mixed-Ligand Copper (II) 1,2,4-Triazolyl/Carboxylate Metal-Organic Frameworks", Inorganic Chemistry, 52.2 (2013):863-872.
Sessler, C.D. et al., "CF2H, a Hydrogen Bond Donor", J. Am. Chem. Soc., 139.27 (2017):9325-9332.
Shen, Mingmin, et al. "Destabilization of Ag nanoislands on Ag (100) by adsorbed sulfur." The Journal of chemical physics 135.15 (2011): 154701.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shi, Shiming, et al. "56-1: Invited Paper: Research on Commercial Foldable AMOLED and Relevant Technologies." SID Symposium Digest of Technical Papers. vol. 51. No. 1. 2020.
Shih, H. et al., "A Cross-Linkable Triphenylamine Derivative as a Hole Injection/Transporting Material in Organic Light-Emitting Diodes", Polym. Chem., 6 (2015):6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Shin, Dong-Youn, and Inyoung Kim. "Self-patterning of fine metal electrodes by means of the formation of isolated silver nanoclusters embedded in polyaniline." Nanotechnology?20.41 (2009): 415301.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Sohn, I. et al. "Improved modeling of material deposition during OLED manufacturing using direct simulation monte carlo method on GPU Architecture." International Journal of Precision Engineering and Manufacturing—Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing—Green Technology (2021): 1-14.
Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Spoljaric, S. et al., "Novel Elastomer-Dumbbell Functionalized POSS Composites: Thermomechanical and Morphological Properties", Journal of Applied Polymer Science, 123.1 (2012):585-600.
Starr, F.W. et al., "Bound Layers 'Cloak' Nanoparticles in Strongly Interacting Polymer Nanocomposites", ACS Nano, 10.12 (2016):10960-10965.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, T. et al., "Reversible Switching between Superhydrophilicity and Superhydrophobicity", Angew. Chem. Int. Ed., 43.3 (2004):357-360.
Svorcik, V. et al., "Deposition of Polystyrene Films by Vacuum Evaporation", Journal of Materials Science Letters, 16 (1997):1564-1566.
Takele, H. et al., "Plasmonic Properties of Ag Nanoclusters in Various Polymer Matrices", Nanotechnology, 17.14 (2006):3499-3505.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tao, C. et al., "Highly Icephobic Properties on Slippery Surfaces Formed From Polysiloxane and Fluorinated POSS", Progress in Organic Coatings, 103 (2017):48-59.
Tarasevich, Y. I. "Surface energy of oxides and silicates." Theoretical and Experimental Chemistry 42 (2006): 145-161.
Thran, A., et al. "Condensation coefficients of Ag on polymers." Physical review letters 82.9 (1999): 1903.
Tokuchi. S et al. "8-4: Oxide Semiconductor In—Zn—O—X system with High Electron Mobility." SID Symposium Digest of Technical Papers 54.1 (2023).
Tong, T. et al., "Adhesion in Organic Electronics Structures", Journal of Applied Physics, 106.8 (2009): 083708.

(56) References Cited

OTHER PUBLICATIONS

Töpper, T. et al. "Siloxane-based thin films for biomimetic low-voltage dielectric actuators." Sensors and Actuators A: Physical 233 (2015): 32-41.
Tsai, Yu-Hsiang, et al. "P-202: A Flexible Transparent OLED Display with FlexUPTM Technology." SID Symposium Digest of Technical Papers. vol. 48. No. 1. 2017.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Selective metal deposition on photoswitchable molecular surfaces." Journal of the American Chemical Society 130.32 (2008): 10740-10747.
Tsujioka, Tsuyoshi, Rie Takagi, and Takahiro Shiozawa. "Light-controlled metal deposition on photochromic polymer films." Journal of Materials Chemistry 20.43 (2010): 9623-9627.
Tuteja, A. et al., "Designing Superoleophobic Surfaces", Science, 318.5856 (2007):1618-1622.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by Ionized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by Ionization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Van de Grampel, R.D., "Surfaces of Fluorinated Polymer Systems", Doctoral Thesis, Technische Universiteit Eindhoven (2002).
Varagnolo, Silvia, et al. "Embedded-grid silver transparent electrodes fabricated by selective metal condensation.";Journal of Materials Chemistry C?8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vasilak, L. et al., "A statistical paradigm for organic optoelectronic devices: normal force testing for adhesion of OPVs and OLEDs", ACS Appl. Mater. Interfaces, 9.15 (2017), 13347-13356.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vitos, Levente, et al. "The surface energy of metals." Surface science 411.1-2 (1998): 186-202.
Vogelsang, D.F. et al., "Separation of Asymmetrically Capped Double-Decker Silsesquioxanes Mixtures", Polyhedron, 155 (2018): 189-193.
Von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3-Dimethyl-adamantane", ACS Omega, 5.26 (2020):16085-16088.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, Hailiang, et al. "P-132: An Under-Display Camera Optical Structure for Full-Screen LCD." SID Symposium Digest of Technical Papers. vol. 51. No. 1. 2020.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.
Wang, Y. et al., "Substrate Effect on the Melting Temperature of Thin Polyethylene Films", Physical Review Letters, 96.2 (2006):028303.
Wang, Zhibin, et al. "55-1: Invited Paper: Self-Assembled Cathode Patterning in AMOLED for Under-Display Camera." SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Wei, H. and Eilers, H., "Electrical Conductivity of Thin-Film Composites Containing Silver Nanoparticles Embedded in a Dielectric Teflon® AF Matrix (Pre-print version)", Thin Solid Films, 517.2 (2008):575-581.
Weigel, W.K. et al., "Direct Radical Functionalization Methods to Access Substituted Adamantanes and Diamondoids", Org. Biomol. Chem., 20 (2022):10-36.
Weimer, P. K. "Physics of Thin Films, vol. 2.". Academic Press, (1964).
Weiss, F.M. et al., "Molecular Beam Deposition of High-Permittivity Polydimethylsiloxane for Nanometer-Thin Elastomer Films in Dielectric Actuators", Materials and Design, 105 (2016):106-113.
Winget, P. et al. "57-1: Accelerating Next-Generation Display Materials Development with a Smart Digital Chemistry Platform." SID Symposium Digest of Technical Papers 54.1 (2023).
Wojtczak, L., "The Melting Point of Thin Films", Phys. Stat. Sol., 23.2 (1967):K163-K166.
Wolfgang Decker, Vast Films, Ltd. "Pattern Metallization: Selective Deposition of Metals on Polymer Films for Functional Applications" AIMCAL Fall Conference 2005.
Wu, Y. et al. "P-13.5: Investigation on Chromatic Dispersion of Reflection for CFOT Display" SID Symposium Digest of Technical Papers 54 (2023).
Wu, Zhongyuan, et al. "34-2: Distinguished Paper: Development of 55inch 8K AMOLED TV by Inkjet Printing Process." SID Symposium Digest of Technical Papers. vol. 51. No. 1. 2020.
Xie, J. et al., "Regioselective Synthesis of Methyl-Substituted Adamantanes for Promoting Oxidation Stability of High-Density Fuels", Energy Fuels, 34.4 (2020):4516-4524.
Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).
Yamada, Toshikazu, et al. "Nanoparticle chemisorption printing technique for conductive silver patterning with submicron resolution." Nature communications 7.1 (2016): 1-9.

(56) References Cited

OTHER PUBLICATIONS

Yang, H. et al., "Catalyst-Controlled C—H Functionalization of Adamantanes Using Selective H-Atom Transfer", ACS Catal., 9.6 (2019):5708-5715.
Yang, J. et al. "25-4: Methodology and Correlation of AI-Based Design for OLED Materials." SID Symposium Digest of Technical Papers 52.1 (2021).
Yang, Jun-Yu, et al. "32-3: AMOLED IR Drop Compensation for Channel Length Modulation." SID Symposium Digest of Technical Papers. vol. 51. No. 1. 2020.
Yao, Y. et al. "P-7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.
Yoo, D. et al. "Retrosynthesis Planning for Thermally Activated Delayed Fluorescence Molecules" The 21st International Meeting on Information Display, Seoul, Korea (2021).
Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zalewski, K. et al., "A Review of Polysiloxanes in Terms of Their Application in Explosives", Polymers, 13.7 (2021):1080-1090.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method." Surface science 532 (2003): 300-305.
Zaporojtchenko, V., et al. "Determination of condensation coefficients of metals on polymer surfaces."?Surface science?454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zeng, Yang, et al. "28-4: Investigation of Moir? Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects." SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018):5641-5646.
Zhang, Zhenhua. "74-3: Image Deblurring of Camera Under Display by Deep Learning." SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P- 233: Late-News-Poster: Color Shift Improvement of AMOLED Device with Color Filter." SID Symposium Digest of Technical Papers. vol. 51. No. 1. 2020.
Zhu, C. et al. "A novel synthetic UV-curable fluorinated siloxane resin for low surface energy coating." Polymers 10.9 (2018): 979.
Zibarov, A. et al., "AB5 Derivatives of Cyclotriphosphazene for the Synthesis of Dendrons and Their Applications", Molecules, 26.13 (2021):4017-4040.
Office Action for Japanese Application No. 2023-067163 Dated Jul. 2, 2024 (6 pages).
Office Action and Search Report with English Translation for Chinese Patent Application No. 202080097002.0 dated Sep. 19, 2024, 17 pages.
Office Action on Korean Application No. 10-2022-7025610 dated Apr. 29, 2025 (32 pages with English language translation).

\* cited by examiner

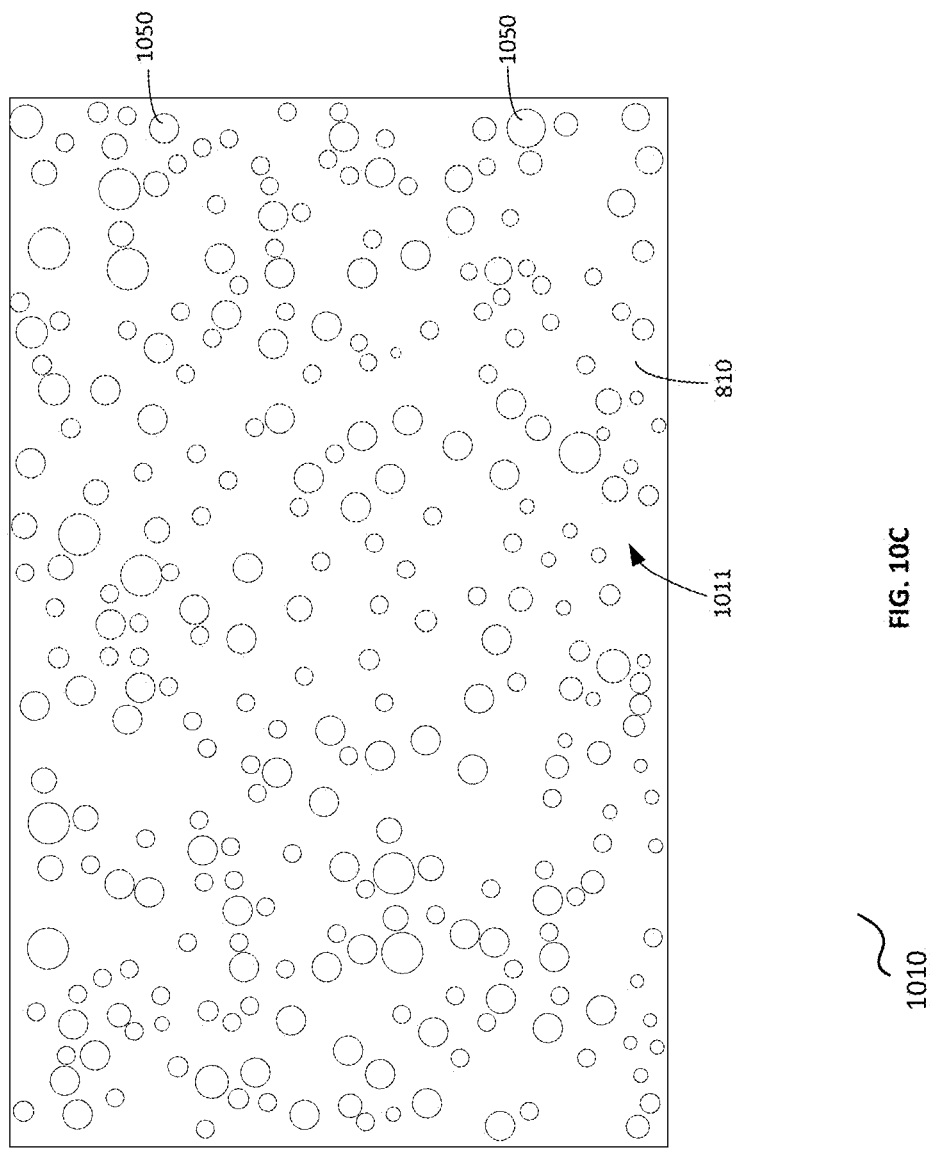

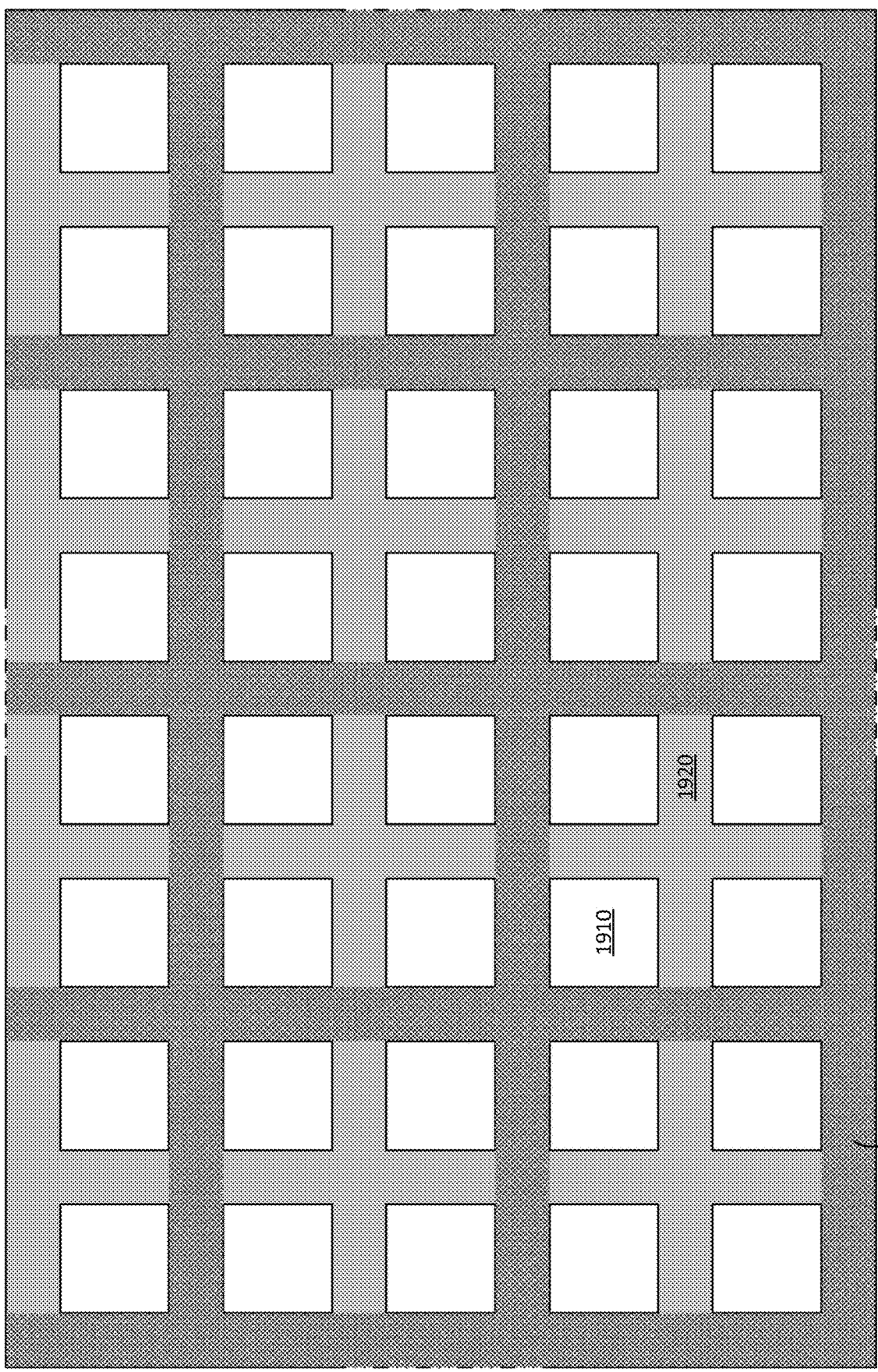

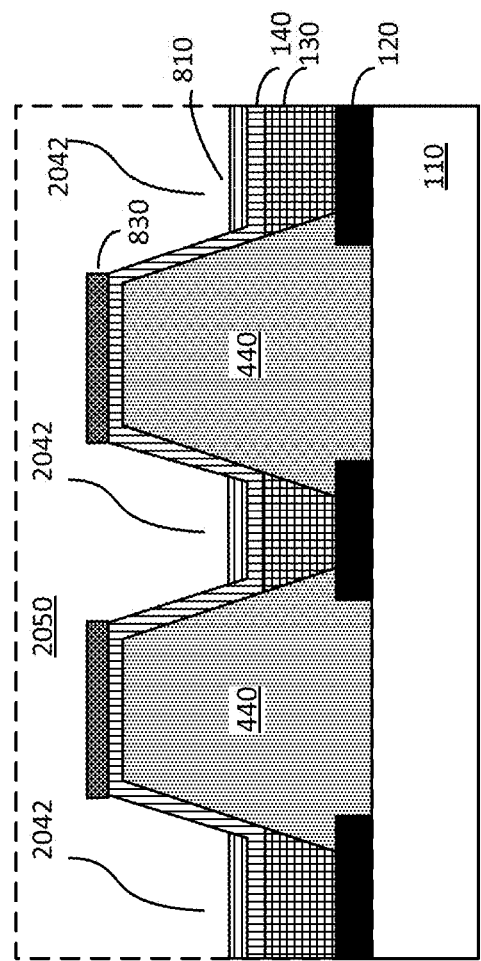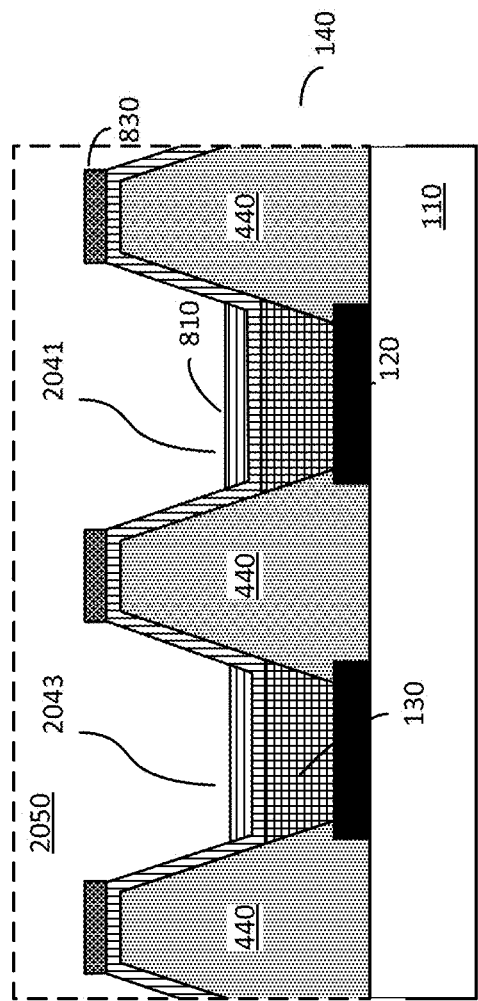
FIG. 20B
FIG. 20C

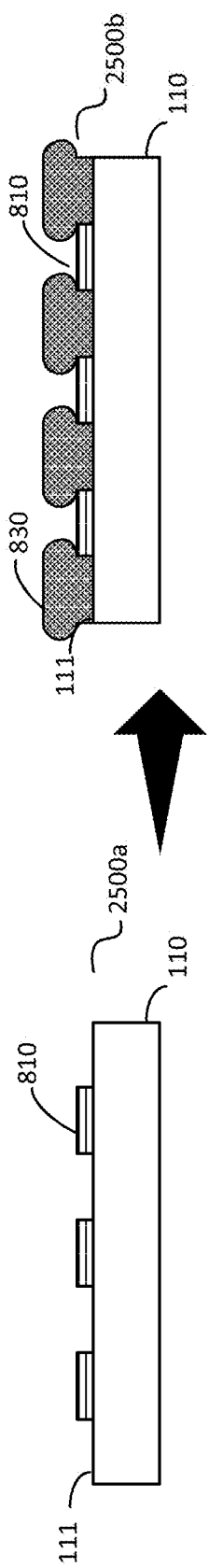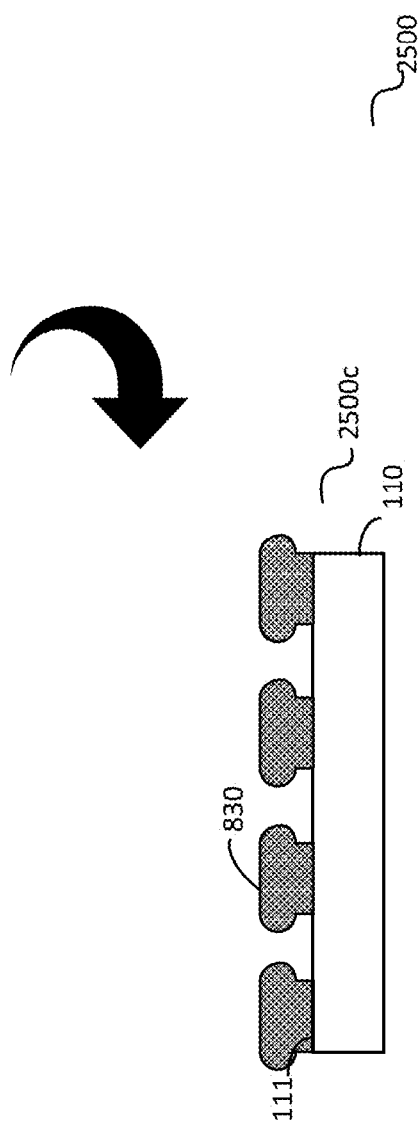

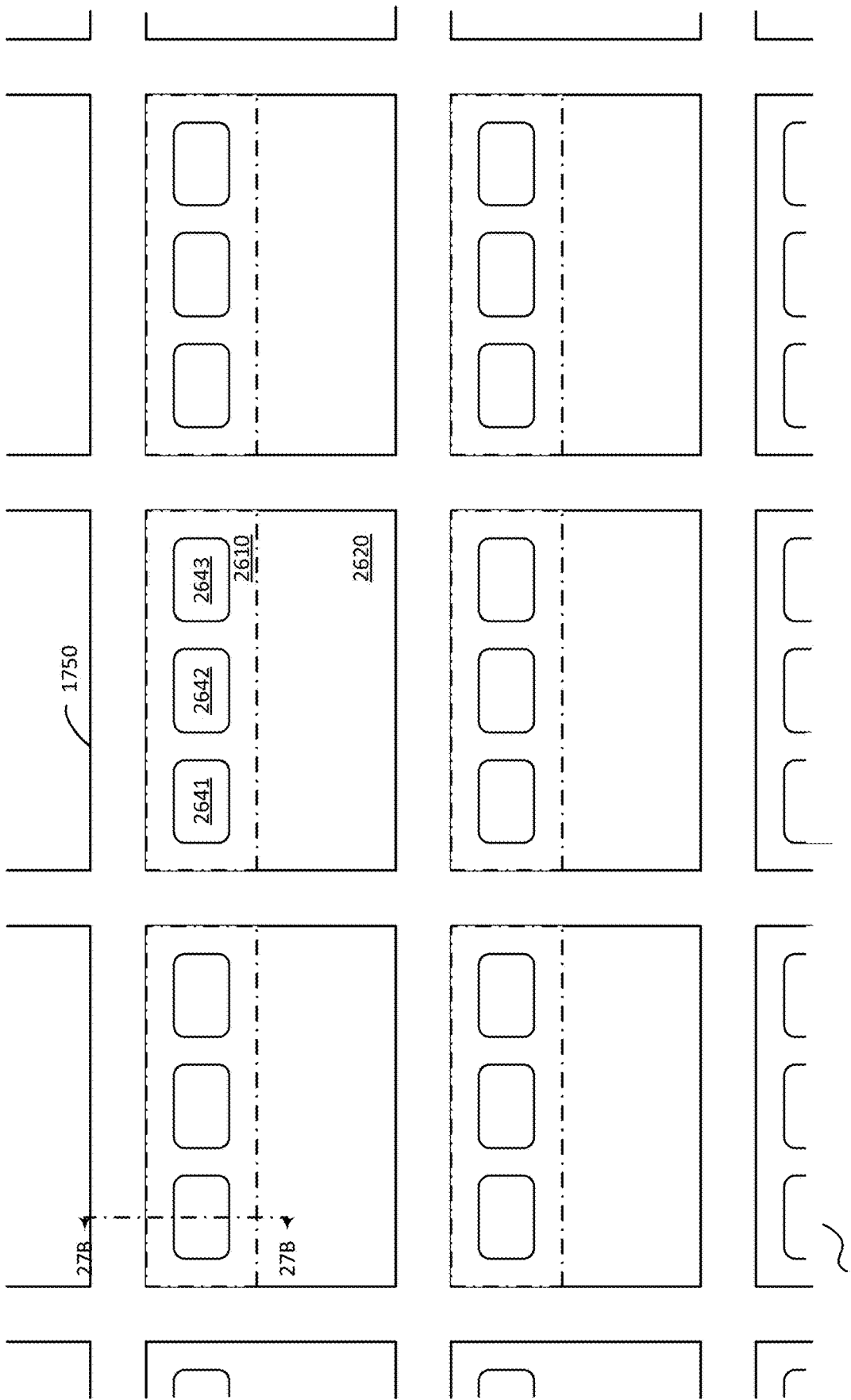

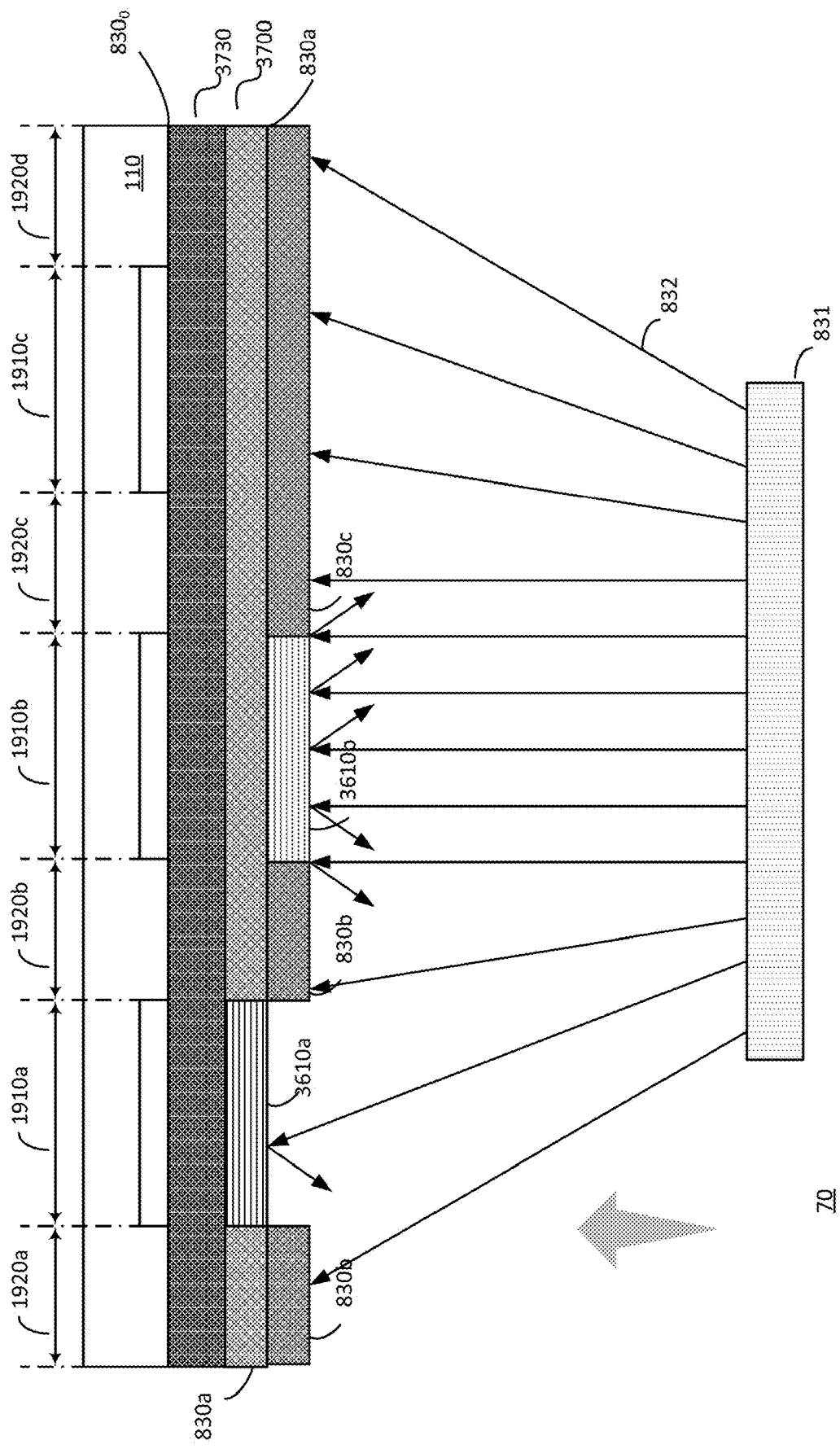

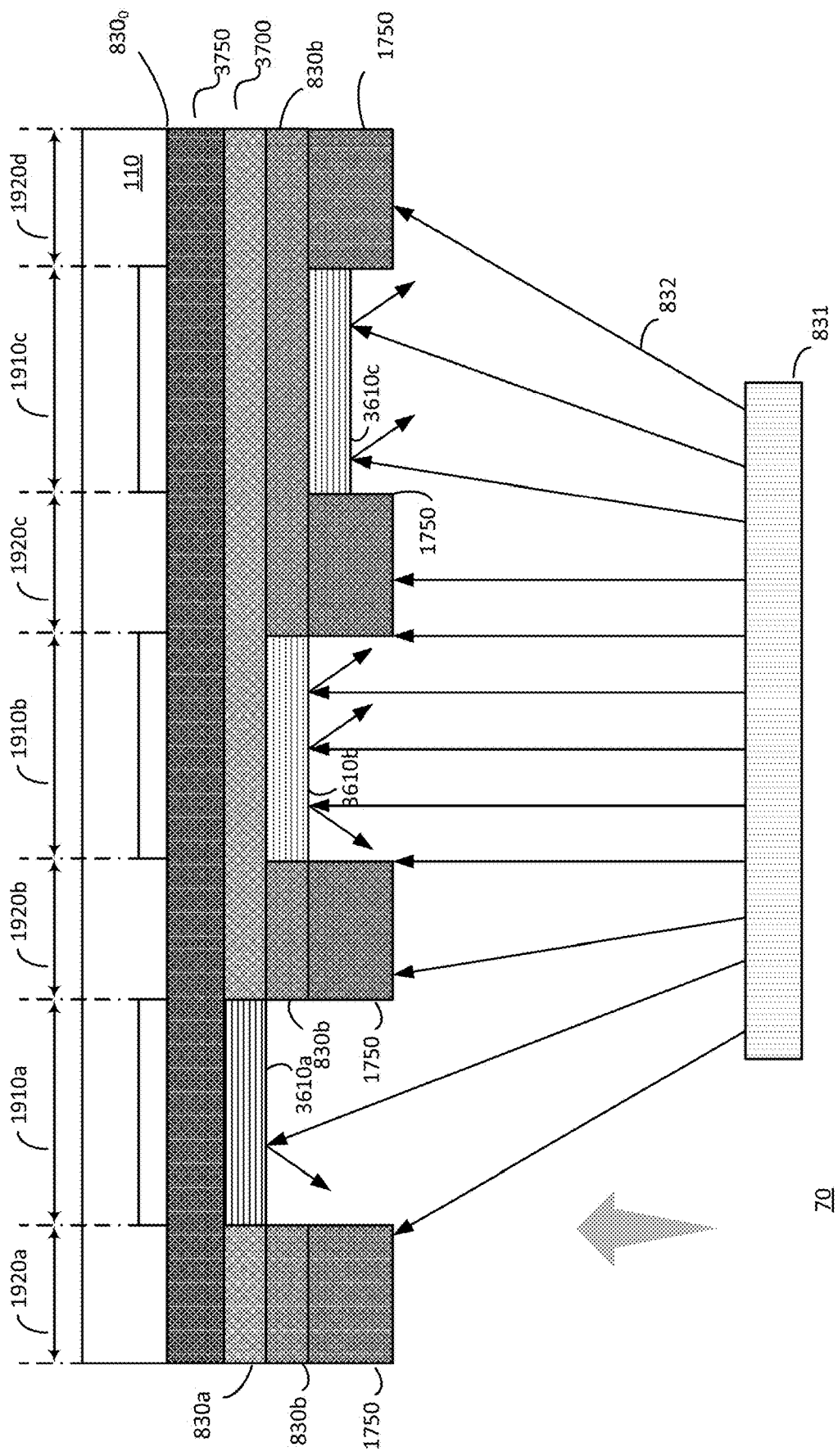

US 12,389,742 B2

LIGHT EMITTING DEVICE INCLUDING CAPPING LAYERS ON RESPECTIVE EMISSIVE REGIONS

RELATED APPLICATIONS

The present application is a continuation of U.S. application Ser. No. 17/789,127 filed Jun. 24, 2022, which is a 371 National Stage Entry of International Application No. PCT/IB2020/062423, filed Dec. 24, 2020, which claims the benefit of priority to U.S. Provisional Patent Application No. 62/953,442 filed Dec. 24, 2019, the contents of which are incorporated herein by reference in their entirety.

TECHNICAL FIELD

The present disclosure relates to opto-electronic devices and in particular to an opto-electronic device having multiple emissive regions, each comprising first and second electrodes separated by a semiconductor layer and having a capping layer having optical properties tuned to the emission spectrum wavelength range generated by the emissive region.

BACKGROUND

In an opto-electronic device such as an organic light emitting diode (OLED), at least one semiconducting layer is disposed between a pair of electrodes, such as an anode and a cathode. The anode and cathode are electrically coupled to a power source and respectively generate holes and electrons that migrate toward each other through the at least one semiconducting layer. When a pair of holes and electrons combine, a photon may be emitted.

OLED display panels may comprise a plurality of (sub-) pixels, each of which has an associated pair of electrodes. Various layers and coatings of such panels are typically formed by vacuum-based deposition techniques.

In some applications, it may be desirable to provide a conductive coating and/or electrode coating in a pattern for each (sub-) pixel of the panel across either or both of a lateral and a cross-sectional aspect thereof, by selective deposition of the conductive coating to form a device feature, such as, without limitation, an electrode and/or a conductive element electrically coupled thereto, during the OLED manufacturing process.

One method for doing so, in some non-limiting applications, involves the interposition of a fine metal mask (FMM) during deposition of an electrode material and/or a conductive element electrically coupled thereto. However, materials typically used as electrodes have relatively high evaporation temperatures, which impacts the ability to re-use the FMM and/or the accuracy of the pattern that may be achieved, with attendant increases in cost, effort and complexity.

One method for doing so, in some non-limiting examples, involves depositing the electrode material and thereafter removing, including by a laser drilling process, unwanted regions thereof to form the pattern. However, the removal process often involves the creation and/or presence of debris, which may affect the yield of the manufacturing process.

Further, such methods may not be suitable for use in some applications and/or with some devices with certain topographical features.

In some applications, it may be desirable to provide an opto-electronic device having multiple emissive regions each having optical characteristics tuned to a wavelength spectrum emitted thereby.

BRIEF DESCRIPTION OF THE DRAWINGS

Examples of the present disclosure will now be described by reference to the following figures, in which identical reference numerals in different figures indicate identical and/or in some non-limiting examples, analogous and/or corresponding elements and in which:

FIG. 10C is a plan view of the first portion of the device of FIG. 10B;

FIG. 19 is a schematic diagram illustrating, in plan view an example pattern of an auxiliary electrode overlaying at least one emissive region and at least one non-emissive region according to an example in the present disclosure;

FIG. 20B is a schematic diagram illustrating an example cross-sectional view of the device of FIG. 20A taken along line 20B-20B;

FIG. 20C is a schematic diagram illustrating an, example cross-sectional view of the device of FIG. 20A taken along line 20C-20C;

FIGS. 25A-25C are schematic diagrams that show example stages of an example process for depositing a conductive coating in a pattern on an exposed layer surface of an example version of the device of FIG. 1, by selective deposition and subsequent removal process, according to an example in the present disclosure;

FIG. 27A is a schematic diagram illustrating, in plan view, an example of a transparent version of the device of FIG. 1 comprising at least one example pixel region and at least one example light-transmissive region according to an example in the present disclosure;

FIGS. 37A-37E are schematic diagrams that show example stages of an example process for manufacturing an example version of the device of FIG. 1 to provide three emissive regions each having a second electrode of different thickness according to an example in the present disclosure;

Figure 1:
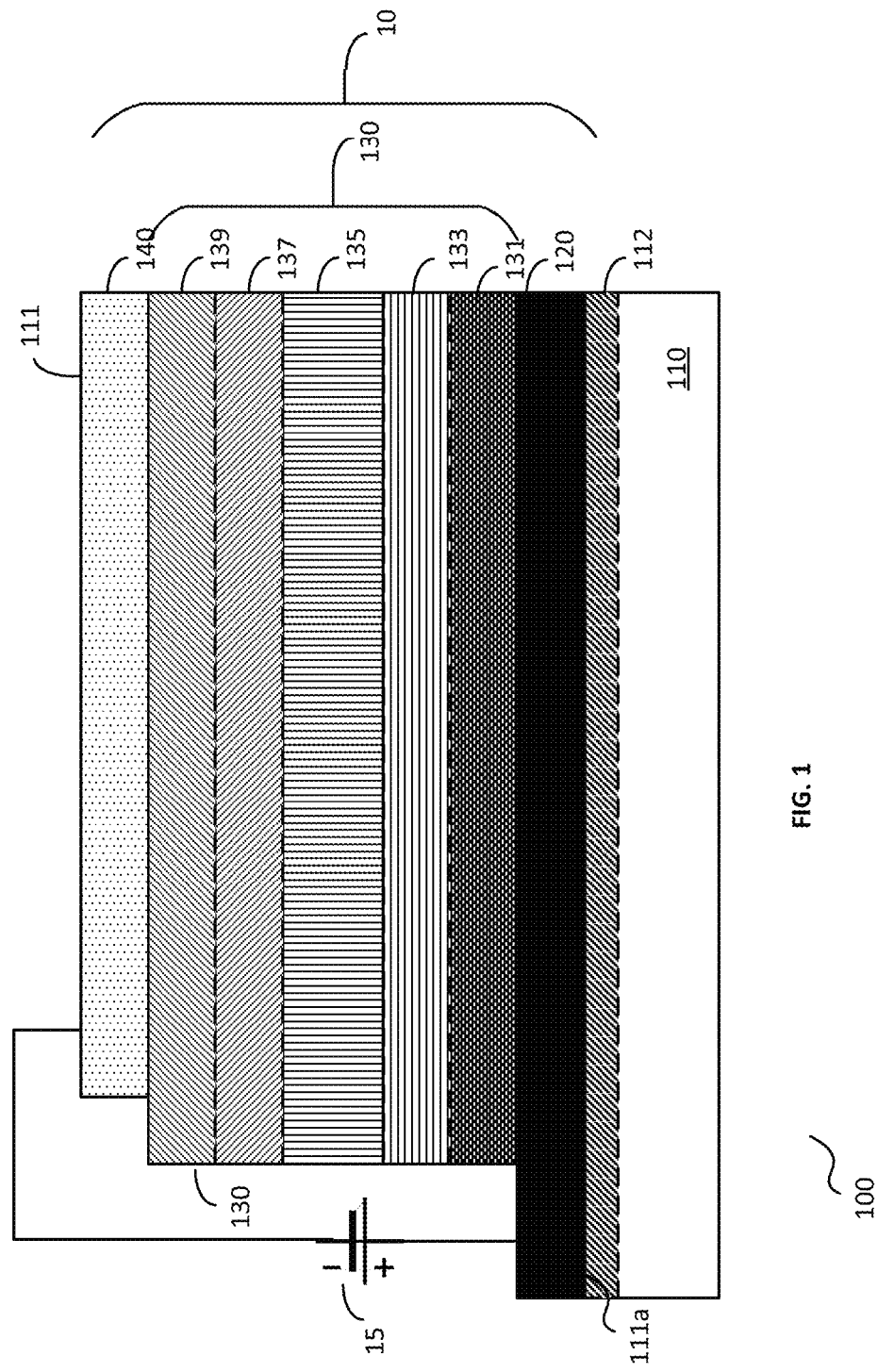
FIG. 1 is a block diagram from a cross-sectional aspect, of an example electro-luminescent device according to an example in the present disclosure.

In the present disclosure, for purposes of explanation and not limitation, specific details are set forth in order to provide a thorough understanding of the present disclosure, including, without limitation, particular architectures, interfaces and/or techniques. In some instances, detailed descriptions of well-known systems, technologies, components, devices, circuits, methods and applications are omitted so as not to obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, so as not to obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses an opto-electronic device having a plurality of layers. A first capping layer (CPL) comprises a first CPL material and is disposed in a first emissive region. A second CPL comprises a second CPL material and is disposed in a second emissive region. The first emissive region is configured to emit photons having a first wavelength spectrum that is characterized by a first onset wavelength. The second emissive region is configured to emit photons having a second wavelength spectrum that is characterized by a second onset wavelength. At least one of the first CPL and the first CPL material (collectively "CPL(m)1") exhibits a first absorption edge at a first absorption edge wavelength that is shorter than the first onset wavelength. At least one of the second CPL and the second CPL material (collectively "CPL(m)2") exhibits a second absorption edge at a second absorption edge wavelength that is shorter than the second onset wavelength.

According to a broad aspect of the present disclosure, there is disclosed an opto-electronic device having a plurality of layers, comprising: a first capping layer (CPL) comprising a first CPL material and disposed in a first emissive region, the first emissive region configured to emit photons having a first wavelength spectrum that is characterized by a first onset wavelength; and a second CPL comprising a second CPL material and disposed in a second emissive region, the second emissive region configured to emit photons having a second wavelength spectrum that is characterized by a second onset wavelength, wherein: at least one of the first CPL and the first CPL material (CPL(m)1) exhibits a first absorption edge at a first absorption edge wavelength that is shorter than the first onset wavelength; and at least one of the second CPL and the second CPL material (CPL(m)2) exhibits a second absorption edge at a second absorption edge wavelength that is shorter than the second onset wavelength.

In some non-limiting examples, the first onset wavelength may be shorter than the second onset wavelength. In some non-limiting examples, the first absorption edge wavelength is shorter than the second absorption edge wavelength.

In some non-limiting examples, the first absorption edge may be characterized by a first extinction wavelength at which an extinction coefficient k of the CPL(m)1 equals a threshold value and the second absorption edge may be characterized by a second extinction wavelength at which an extinction coefficient of the CPL(m)2 equals the threshold value.

In some non-limiting examples, the first onset wavelength may be longer than the first absorption edge wavelength by less than at least one of about 50 nm, about 40 nm, about 35 nm, about 30 nm, about 25 nm, about 20 nm, about 15 nm, about 10 nm, about 5 nm, and about 3 nm. In some non-limiting examples, the first extinction wavelength may be a longest one of at least one wavelength at which the extinction coefficient of the CPL(m)1 equals the threshold value. In some non-limiting examples, a first derivative of the extinction coefficient of the CPL(m) as a function of wavelength may be negative at the first extinction wavelength. In some non-limiting examples, the extinction coefficient of the CPL(m)1 at a wavelength longer than the first extinction wavelength may be less than the threshold value. In some non-limiting examples, the extinction coefficient of the CPL(m)1 at all wavelengths longer than the first extinction wavelength may be less than the threshold value. In some non-limiting examples, the extinction coefficient of the CPL(m)1 at any wavelength longer than the first onset wavelength may be less than at least one of about 0.1, about 0.09, about 0.08, about 0.06, about 0.05, about 0.03, about 0.01, about 0.005, and about 0.0001. In some non-limiting examples, the extinction coefficient of the CPL(m)1 at a wavelength shorter than the first absorption edge wavelength may exceed at least one of about 0.1, about 0.12, about 0.13, about 0.15, about 0.18, about 0.2, about 0.25, about 0.3, about 0.5, about 0.7, about 0.75, about 0.8, about 0.9, and about 1.0.

In some non-limiting examples, a refractive index of the CPL(m)1 for at least one wavelength longer than the first absorption edge wavelength may exceed the refractive index of the CPL(m)1 for at least one wavelength shorter than the first absorption wavelength. In some non-limiting examples, the refractive index of the CPL(m) in at least one wavelength in the first wavelength spectrum may exceed at least one of about 1.8, about 1.9, about 1.95, about 2, about 2.05, about 2.1, about 2.2, about 2.3, and about 2.5.

In some non-limiting examples, the second onset wavelength may be longer than the second absorption edge wavelength by less than at least one of about 200 nm, about 150 nm, about 130 nm, about 100 nm, about 80 nm, about 70 nm, about 60 nm, about 50 nm, about 40 nm, about 35 nm, about 25 nm, about 20 nm, about 15 nm, and about 10 n. In some non-limiting examples, the second extinction wavelength may be a longest one of at least one wavelength at which the extinction coefficient of the CPL(m)2 equals the threshold value. In some non-limiting examples, a first derivative of the extinction coefficient of the CPL(m)2 as a function of wavelength may be negative at the second extinction wavelength. In some non-limiting examples, the extinction coefficient of the CPL(m)2 at a wavelength longer than the second extinction wavelength may be less than the threshold value. In some non-limiting examples, the extinction coefficient of the CPL(m)2 at all wavelengths longer than the second extinction wavelength may be less than the threshold value. In some non-limiting examples, the extinction coefficient of the CPL(m)2 at any wavelength longer than the second onset wavelength may be less than at least one of about 0.1, about 0.09, about 0.08, about 0.06, about 0.05, about 0.03, about 0.01, about 0.005, and about 0.0001. In some non-limiting examples, the extinction coefficient of the CPL(m)2 at a wavelength shorter than the second absorption edge wavelength may exceed at least one of about 0.1, about 0.12, about 0.13, about 0.15, about 0.18, about 0.2, about 0.25, about 0.3, about 0.5, about 0.7, about 0.75, about 0.8, about 0.9, and about 1.0.

In some non-limiting examples, a refractive index of the CPL(m)2 for at least one wavelength longer than the second absorption edge wavelength may exceed the refractive index of the CPL(m)2 for at least one wavelength shorter than the second absorption edge wavelength. IN some non-limiting examples, the refractive index of the CPL(m)2 in at least one wavelength in the second wavelength spectrum may exceed at least one of about 1.8, about 1.9, about 1.95, about 2, about 2.05, about 2.1, about 2.2, about 2.3, and about 2.5.

In some non-limiting examples, the extinction coefficient of the CPL(m)1 may be less than the threshold value at the second onset wavelength. In some non-limiting examples, the extinction coefficient of the CPL(m)1 may be less than the threshold value at all wavelengths in the second wavelength spectrum. In some non-limiting examples, the extinction coefficient of the CPL(m)1 at any wavelength in the second wavelength spectrum may be less than at least one of about 0.1, about 0.09, about 0.08, about 0.05, about 0.05, about 0.03, about 0.01, about 0.005, and about 0.001.

In some non-limiting examples, a refractive index of the CPL(m)1 for at least one wavelength in the first wavelength spectrum may exceed the refractive index of the CPL(m)1 for at least one wavelength in the second wavelength spectrum. In some non-limiting examples, a refractive index of the CPL(m)2 for at least one wavelength in the second wavelength spectrum may exceed the refractive index of the CPL(m)2 for at least one wavelength in the first wavelength spectrum. In some non-limiting examples, a refractive index of the CPL(m)1 for at least one wavelength of the second wavelength spectrum may be less than at least one of about 1.8, about 1.7, about 1.65, about 1.6, about 1.5, about 1.45, about 1.4, and about 1.3. In some non-limiting examples, a refractive index of the CPL(m)2 in at least one wavelength of the first wavelength spectrum may be less than at least one of about 1.8, about 1.7, about 1.65, about 1.6, about 1.5, about 1.45, about 1.4, and about 1.3.

In some non-limiting examples, the extinction coefficient of the CPL(m)2 may exceed the extinction coefficient of the CPL(m)1 for at least one wavelength in the first wavelength spectrum. In some non-limiting examples, the extinction coefficient of the CPL(m)2 may exceed the extinction coefficient of the CPL(m)1 for every wavelength in the first wavelength spectrum.

In some non-limiting examples, the threshold value may be at least one of 0.1, 0.09, 0.08, 0.06, 0.05, 0.03, 0.01, 0.005, and 0.001.

In some non-limiting examples, the first emissive region and the second emissive region may occupy different regions of the device in a lateral aspect.

In some non-limiting examples, the first wavelength spectrum and the second wavelength spectrum lie in the visible spectrum. In some non-limiting examples, the first wavelength spectrum may have a first peak wavelength and the second wavelength spectrum may have a second peak wavelength that is longer than the first peak wavelength.

In some non-limiting examples, the first onset wavelength may be a shortest one of at least one wavelength at which an intensity of the first wavelength spectrum may be at least one of about 20%, about 15%, about 10%, about 5%, about 3%, about 1%, and about 0.01% of an intensity at the first peak wavelength. In some non-limiting examples, the second onset wavelength may be a shortest one of at least one wavelength at which an intensity of the second wavelength spectrum may be at least one of about 20%, about 15%, about 10%, about 5%, about 3%, about 1%, and about 0.01% of an intensity at the second peak wavelength.

In some non-limiting examples, the first wavelength spectrum may correspond to a colour that is at least one of B(lue) and G(reen). In some non-limiting examples, the second wavelength spectrum may correspond to a colour that is at least one of R(ed) and G(reen). In some non-limiting examples, the first wavelength spectrum may correspond to a colour that is B(lue) and the second wavelength spectrum may correspond to a colour that is at least one of G(reen) and R(ed). In some non-limiting examples, the first wavelength spectrum may correspond to a colour that is G(reen) and the second wavelength spectrum may correspond to a colour that is R(ed).

In some non-limiting examples, the first CPL material may have a different composition from the second CPL material.

In some non-limiting examples, a thickness of the first CPL may be the same as a thickness of the second CPL. In some non-limiting examples, a thickness of the first CPL may be different from a thickness of the second CPL.

In some non-limiting examples, a thickness of the first CPL may be in a range of between about 5 to about 120 nm. In some non-limiting examples, a thickness of the first CPL may exceed at least one of about 10 nm, about 15 nm, about 20 nm, about 25 nm, about 30 nm, and about 40 nm. In some non-limiting examples, a thickness of the first CPL may be less than at least one of about 100 nm, about 90 nm, about 80 nm, and about 70 nm.

In some non-limiting examples, a thickness of the second CPL may be in a range of between about 5 nm to about 120 nm. In some non-limiting examples, a thickness of the second CPL may exceed at least one of about 10 nm, about 15 nm, about 20 nm, about 25 nm, about 30 nm, and about 40 n. In some non-limiting examples, a thickness of the second CPL may be less than about 100 nm, about 90 nm, about 80 nm, and about 70 nm.

In some non-limiting examples, the device may further comprise at least one electrode coating in the first emissive region and the second emissive region. In some non-limiting examples, the first CPL may be disposed on an exposed layer surface of the at least one electrode coating. In some non-limiting examples, the second CPL may be disposed on an exposed layer surface of the at least one electrode coating. IN some non-limiting examples, the at least one electrode coating may have a first electrode thickness in the first emissive region. In some non-limiting examples, the at least one electrode coating may have a second electrode thickness in the second emissive region.

In some non-limiting examples, the first electrode thickness may be less than the second electrode thickness. In some non-limiting examples, a quotient of the first electrode thickness divided by the second electrode thickness may be less than at least one of about 0.9, about 0.8, about 0.7, about 0.6, about 0.5, about 0.4, about 0.3, and about 0.2. In some non-limiting examples, the first electrode thickness may be in a range that is at least one of about 5 nm to about 100 nm, about 5 nm to about 50 nm, about 5 nm to about 25 nm, about 5 nm to about 20 nm, about 5 nm to about 15 nm, about 8 nm to about 15 nm, about 8 nm to about 12 nm, and about 8 nm to about 10 nm. In some non-limiting examples, the second electrode thickness may be in a range that is at least one of about 10 nm to about 60 nm, about 10 nm to about 50 nm, about 15 nm to about 40 nm, about 15 nm to about 35 nm, and about 20 nm to about 35 nm.

In some non-limiting examples, the second electrode thickness may be less than the first electrode thickness. In some non-limiting examples, a quotient of the second electrode thickness divided by the first electrode thickness may be less than at least one of about 0.9, about 0.8, about 0.7, about 0.6, about 0.5, about 0.4, about 0.3, and about 0.2. In some non-limiting examples, the first electrode thickness may be in a range that is at least one of about 10 nm to about 60 nm, about 10 nm to about 50 nm, about 15 nm to about 40 nm, about 15 nm to about 35 nm, and about 20 nm to about 35 nm. In some non-limiting examples, the second electrode thickness may be in a range that is at least one of about t nm to about 100 nm, about 5 nm to about 50 nm, about 5 nm to about 25 nm, about 5 nm to about 20 nm, about 5 nm to about 15 nm, about 8 nm to about 15 nm, about 8 nm to about 12 nm, and about 8 nm to about 10 nm.

In some non-limiting examples, the at least one electrode coating may comprise a metallic coating and a conductive coating disposed on an exposed layer surface of the metallic coating. In some non-limiting examples, the conductive coating may extend between the metallic coating and the second CPL in the second emissive region. In some non-limiting examples, the first CPL may be disposed on an exposed layer surface of the metallic coating in the first emissive region. In some non-limiting examples, the conductive coating may extend between the metallic coating and the first CPL in the first emissive region.

In some non-limiting examples, the metallic coating may be comprised of a metallic coating material. In some non-limiting examples, the metallic coating material may comprise a metal having a bond dissociation energy in a diatomic molecule thereof at 298K of at least one of at least 10 kJ/mol, at least 50 kJ/mol, at least 100 kJ/mol, at least 150 kJ/mol, at least 180 kJ/mol, and at least 200 kJ/mol. In some non-limiting examples, the metallic coating material may comprise an element having an electronegativity less than at least one of about 1.4, about 1.3, and about 1.2.

In some non-limiting examples, the metallic coating material may comprise an element selected from potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), nickel (Ni), titanium (Ti), palladium (Pd), chromium (Cr), iron (Fe), cobalt (Co), zirconium (Zr), platinum (Pt), vanadium (V), niobium (Nb), iridium (Ir), osmium (Os), tantalum (Ta), molybdenum (Mo), tungsten (W), and any combination of any of these. In some non-limiting examples, the element may be selected from Cu, Ag, Au, and any combination of any of these. In some non-limiting examples, the element may be Cu. In some non-limiting examples, the element may be Al. In some non-limiting examples, the element may be selected from Mg, Zn, Cd, Yb, and any combination of nay of these. In some non-limiting examples, the element may be selected from Sn, Ni, Ti, Pd, Cr, Fe, Co, and any combination of any of these. In some non-limiting examples, the element may be selected from Zr, Pt, V, Nb, Ir, Os, and any combination of any of these. In some non-limiting examples, the element may be selected from Ta, Mo, W, and any combination of any of these. In some non-limiting examples, the element may be selected from Mg, Ag, Al, Yb, Li, and any combination of any of these. In some non-limiting examples, the element may be selected from any one of Mg, Ag, Al, Yb, and any combination of any of these. In some non-limiting examples, the element may be selected from Mg, Ag, Yb, and any combination of any of these. In some non-limiting examples, the element may be selected from Mg, Ag, and any combination of any of these. In some non-limiting examples, the element may be Ag.

In some non-limiting examples, the metallic coating material may comprise a pure metal. In some non-limiting examples, the pure metal may be at least one of pure silver (Ag) and substantially pure Ag. In some non-limiting examples, the pure metal may be at least one of pure magnesium (Mg) and substantially pure Mg. In some non-limiting examples, the pure metal may be at least one of pure aluminum (Al) and substantially pure Al.

In some non-limiting examples, the metallic coating material may comprise an alloy. In some non-limiting examples, the alloy may be at least one of a silver (Ag) containing alloy, and a silver-magnesium (AgMg)-containing alloy.

In some non-limiting examples, the metallic coating may comprise oxygen (O). In some non-limiting examples, the metallic coating may comprise O and at least one metal. In some non-limiting examples, the metallic coating may comprise a metal oxide. In some non-limiting examples, the metal oxide may comprise zinc (Zn), indium (I), tin (Sn), antimony (Sb), gallium (Ga), and any combination of any of these. In some non-limiting examples, the metal oxide may be a transparent conducting oxide (TCO). In some non-limiting examples, the TCO may be at least one of indium titanium oxide (ITO), zinc oxide (ZnO), indium zinc oxide (IZO), indium gallium zinc oxide (IGZO), and any combination of any of these.

In some non-limiting examples, the metallic coating may comprise a plurality of layers of the metallic coating material. In some non-limiting examples, the metallic coating material of a first one of the plurality of layers may be different from the metallic coating material of a second one of the plurality of layers. In some non-limiting examples, the metallic coating material of at least one of the plurality of layers may comprise ytterbium (Yb). In some non-limiting examples, the metallic coating material of another one of the plurality of layers may comprise at least one of a silver (Ag)-containing alloy, and a silver-magnesium (AgMg)-containing alloy. In some non-limiting examples, the metallic coating material of another one of the plurality of layers may comprise at least one of pure silver (Ag), substantially pure (Ag), pure magnesium (Mg), substantially pure Mg, and any combination of any of these. In some non-limiting examples, the metallic coating material of one of the plurality of layers proximate to the NIC comprises an element selected from silver (Ag), gold (Au), copper (Cu), aluminum (Al), tin (Sn), nickel (Ni), titanium (Ti), palladium (Pd), chromium (Cr), iron (Fe), cobalt (Co), zirconium (Zr), platinum (Pt), vanadium (V), niobium (Nb), iridium (Ir), osmium (Os), tantalum (Ta), molybdenum (Mo), tungsten (W), and any combination of any of these. In some non-limiting examples, the element may comprise Cu, Ag, Au, and any combination of any of these. In some non-limiting examples, the element may be Cu. In some non-limiting examples, the element may be Al. In some non-limiting examples, the element may comprise Sn, Ti, Pd, Cr, Fe, Co, and any combination of any of these. In some non-limiting examples, the element may comprise Ni, Zr, Pt, V, Nb, Ir, Os, and any combination of any of these. In some non-limiting examples, the element may comprise Ta, Mo, W, and any combination of any of these. In some non-limiting examples, the element may comprise Mg, Ag, Al, and any combination of any of these. In some non-limiting examples, the element may comprise Mg, Ag, and any combination of any of these. In some non-limiting examples, the element may be Ag. In some non-limiting examples, at least one of the plurality of layers may comprise a metal having a work function that is less than about 4 eV.

In some non-limiting examples, the conductive coating may be comprised of a conductive coating material In some non-limiting examples, the conductive coating material may comprise a metal having a bond dissociation energy in a diatomic molecule thereof at 298K of less than 300 kJ/mol, less than 200 kJ/mol, less than 165 kJ/mol, less than 150 kJ/mol, less than 100 kJ/mol, less than 50 kJ/mol, and less than 20 kJ/mol.

In some non-limiting examples, the conductive coating material may comprise an element selected from potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), yttrium (Y), and any combination of any of these. In some non-limiting examples, the element may be selected from K, Na, Li, Ba, Cs, Yb, Ag, Au, Cu, Al, Mg, and any combination of any of these. In some non-limiting examples, the element may be selected from Cu, Ag, Au, and any combination of these. In some non-limiting examples, the element may be Cu. In some non-limiting examples, the element may be Al. In some non-limiting examples, the element may be selected from Mg, Zn, Cd, Yb, and any combination of any of these. In some non-limiting examples, the element may be selected from Mg, Ag, Al, Yb, Li, and any combination of any of these. In some non-limiting examples, the element may be selected from Mg, Ag, Yb, and any combination of any of these. In some non-limiting examples, the element may be selected from Mg, Ag, and any combination of any of these. In some non-limiting examples, the element may be Ag.

In some non-limiting examples, the conductive coating material may comprise a pure metal. In some non-limiting examples, the pure metal may be at least one of pure silver (Ag), and substantially pure Ag. In some non-limiting examples, the substantially pure Ag may have a purity of at least one of at least about 95%, at least about 98%, at least about 99%, at least about 99.9%, at least about 99.99%, at least about 99.999%, and at least about 99.9995%. In some non-limiting examples, the pure metal may be at least one of pure magnesium (Mg), and substantially pure Mg. IN some non-limiting examples, the substantially pure Mg may have a purity of at least one of at least about 95%, at least about 98%, at least about 99%, at least about 99.9%, at least about 99.99%, at least about 99.999%, and at least about 99.9995%.

In some non-limiting examples, the conductive coating may comprise an alloy. In some non-limiting examples, the alloy may be at least one of a silver (Ag) containing alloy, a magnesium (Mg) containing alloy, and an AgMg-containing alloy.

In some non-limiting examples, the conductive coating may comprise a non-metallic element. In some non-limiting examples, the non-metallic element may be selected from at least one of oxygen (O), sulfur (S), nitrogen (N), carbon (C), and any combination of any of these. In some non-limiting examples, a concentration of the non-metallic element in the conductive coating material may be less than at least one of about 1%, about 0.1%, about 0.01%, about 0.001%, about 0.0001%, about 0.00001%, about 0.000001%, and about 0.0000001%.

In some non-limiting examples, the device may further comprise a semiconducting layer, wherein the at least one electrode coating extends between the semiconducting layer and the first CPL in the first emissive region and between the semiconducting layer and the second CPL in the second emissive region. In some non-limiting examples, at least one of the first CPL and the second CPL may comprise a nucleation inhibiting coating (NIC) for patterning the conductive coating.

In some non-limiting examples, the second CPL may be disposed in the first emissive region. In some non-limiting examples, the first CPL may extend between the at least one electrode coating and the second CPL in the first emissive region. In some non-limiting examples, the second CPL may extend between the at least one electrode coating and the first CPL in the first emissive region.

In some non-limiting examples, the first CPL may be disposed in the second emissive region. In some non-limiting examples, the first CPL may extend between the at least one electrode coating and the second CPL in the second emissive region. In some non-limiting examples, the second CPL may extend between the at least one electrode coating and the first CPL in the second emissive region.

In some non-limiting examples, the device may further comprise a third emissive region configured to emit photons having a third wavelength spectrum that is characterized by a third onset wavelength. In some non-limiting examples, the third wavelength spectrum may have a third peak wavelength that is shorter than a second peak wavelength of the second wavelength spectrum and longer than a first peak wavelength of the first wavelength spectrum. In some non-limiting examples, the first wavelength spectrum may correspond to a colour that is B(lue), the second wavelength spectrum may correspond to a colour that is G(reen), and the third wavelength spectrum may correspond to a colour that is R(ed).

In some non-limiting examples, at least one of the first CPL and the second CPL may be disposed in the third emissive region. In some non-limiting examples, a third CPL may be disposed in the third emissive region. In some non-limiting examples, at least one of the third CPL and the third CPL material (CPL(m)3) may exhibit a third absorption edge at a third absorption edge wavelength that is shorter than the third onset wavelength.

In some non-limiting examples, the third absorption edge may be characterized by a third extinction wavelength at which an extinction coefficient of the CPL(m)3 equals a threshold value.

In some non-limiting examples, the third onset wavelength may be longer than the absorption edge wavelength by less than at least one of about 200 nm, about 150 nm, about 130 nm, about 100 nm, about 80 nm, about 70 nm, about 60 nm, about 50 nm, about 40 nm, about 35 nm, about 25 nm, about 20 nm, about 15 nm, and about 10 nm. In some non-limiting examples, the third extinction wavelength is a longest one of at least one wavelength at which the extinction coefficient of the CPL(m)3 equals the threshold value. In some non-limiting examples, a first derivative of the extinction coefficient of the CPL(m)3 as a function of wavelength may be negative at the third extinction wavelength. IN some non-limiting examples, the extinction coefficient of the CPL(m)3 at a wavelength longer than the third extinction wavelength may be less than the threshold value. In some non-limiting examples, the extinction coefficient of the CPL(m)3 at all wavelengths longer than the third extinction wavelength may be less than the threshold value. In some non-limiting examples, the extinction coefficient of the CPL(m)3 at any wavelength longer than the third onset wavelength may be less than at least one of about 0.1, about 0.09, about 0.08, about 0.06, about 0.05, about 0.03, about 0.01, about 0.005, and about 0.0001. In some non-limiting examples, the extinction coefficient of the CPL(m)3 at a wavelength shorter than the first absorption edge wavelength may exceed at least one of about 0.1, about 0.12, about 0.13, about 0.15, about 0.18, about 0.2, about 0.25, about 0.3, about 0.5, about 0.7, about 0.75, about 0.8, about 0.9, and about 1.0.

In some non-limiting examples, a refractive index of the CPL(m)3 for at least one wavelength longer than the third absorption edge wavelength may exceed the refractive index of the CPL(m)3 for at least one wavelength shorter than the first absorption edge wavelength. In some non-limiting examples, the refractive index of the CPL(m)3 in at least one wavelength in the third wavelength spectrum may exceed at least one of about 1.8, about 1.9, about 1.95, about 2, about 2.05, about 2.1, about 2.2, about 2.3, and about 2.5.

In some non-limiting examples, the third emissive region may be substantially devoid of at least one of the first CPL and the second CPL.

Examples have been described above in conjunctions with aspects of the present disclosure upon which they can be implemented. Those skilled in the art will appreciate that examples may be implemented in conjunction with the aspect with which they are described, but may also be implemented with other examples of that or another aspect. When examples are mutually exclusive, or are otherwise incompatible with each other, it will be apparent to those having ordinary skill in the relevant art. Some examples may be described in relation to one aspect, but may also be applicable to other aspects, as will be apparent to those having ordinary skill in the relevant art.

Some aspects or examples of the present disclosure may provide an opto-electronic device having first and second emissive regions having respective emission spectra on which are deposited respective capping layers (CPLs), an optical property of which may be selected to modify at least one optical microcavity effect of the underlying emissive region The CPLs may comprise a patterning coating having an initial sticking probability for forming a conductive coating on a surface thereof that is substantially less than the initial sticking probability for forming the conductive coating on an underlying surface, such that the CPL is substantially devoid of a subsequently deposited conductive coating.

Description

Opto-Electronic Device

The present disclosure relates generally to electronic devices, and more specifically, to opto-electronic devices. An opto-electronic device generally encompasses any device that converts electrical signals into photons and vice versa.

In the present disclosure, the terms "photon" and "light" may be used interchangeably to refer to similar concepts. In the present disclosure, photons may have a wavelength that lies in the visible light spectrum, in the infrared (IR) and/or ultraviolet (UV) region thereof.

In the present disclosure, the term "visible light spectrum" as used herein, generally refers to at least one wavelength in the visible part of the electromagnetic spectrum. In some non-limiting examples, the visible light spectrum may correspond to a wavelength range of about 380 nm to about 750 nm.

Figure 32:
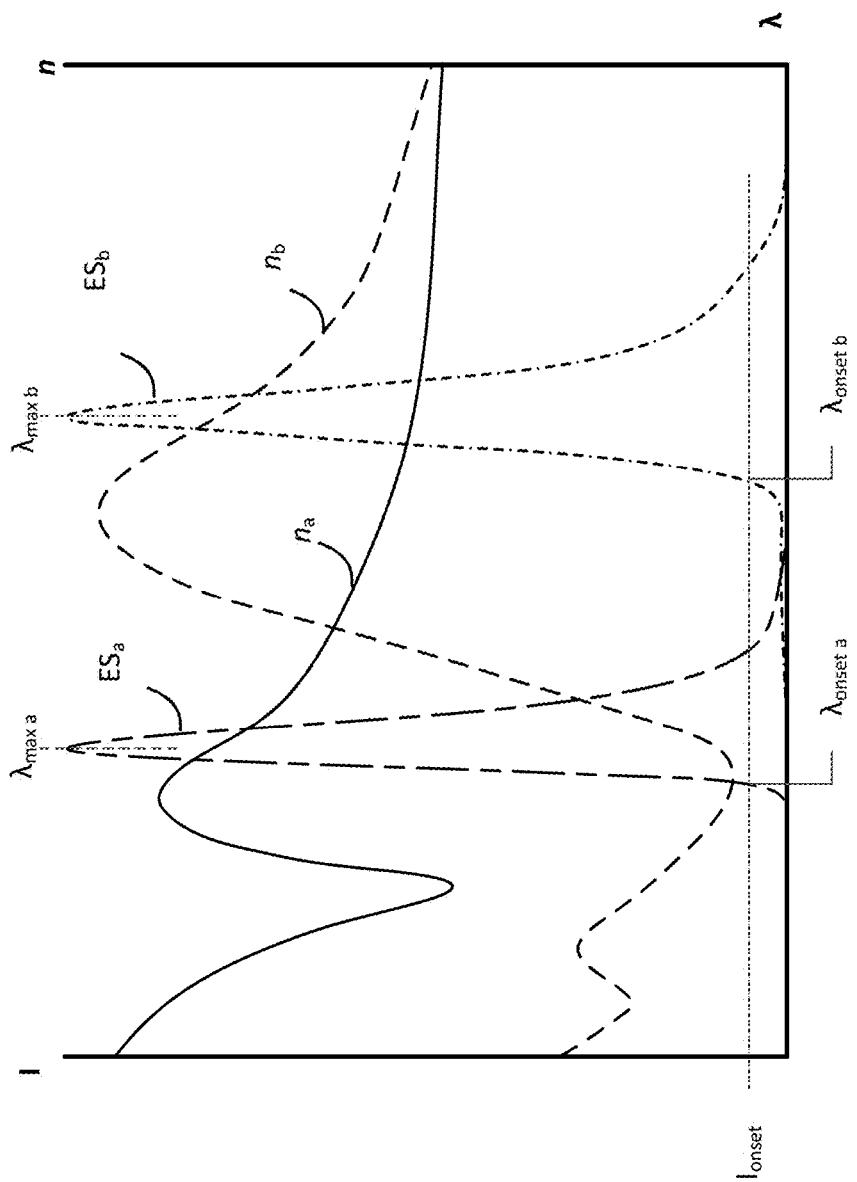
FIG. 32 is a schematic diagram that illustrates, in qualitative form, a relationship between example emission spectra for a pair of example emissive regions and plots of example refractive indices of respective capping layers overlying the emissive regions according to various examples in the present disclosure.

In the present disclosure, the term "emission spectrum" (ES) as used herein, and as shown by way of non-limiting example in FIG. 32 as a plot of intensity (I) as a function of wavelength (λ), generally refers to an electroluminescence spectrum of light emitted by an opto-electronic device. By way of non-limiting example, an emission spectrum (ES) may be detected using an optical instrument, such as, by way of non-limiting example, a spectrophotometer, which measure an intensity (I) of electromagnetic radiation across a wavelength range.

In the present disclosure, the term "onset wavelength" $\lambda_{onset}$, as used herein, and as shown by way of non-limiting example in FIG. 32, generally refers to a shortest wavelength at which an emission is detected within an emission spectrum.

In the present disclosure, the term "peak wavelength" $\lambda_{max}$, as used herein, and as shown by way of non-limiting example in FIG. 32, generally refers to a wavelength at which the maximum luminance is detected within an emission spectrum. Those having ordinary skill in the relevant art will appreciate that luminance may be measured in units of candelas (cd) (a measure of luminous intensity per square area), in units of cd/m$^2$ or nits. In some non-limiting examples of opto-electronic devices in which the emission spectrum varies with viewing angle (i.e. the angle at which the emission spectrum is measured), the emission spectrum taken at a normal angle to a plane of the device may be used for determining various characteristics of the emission, including without limitation, the maximum luminance and/or peak wavelength $\lambda_{max}$ thereof.

In general, the onset wavelength $\lambda_{onset}$ occurs at a shorter wavelength than the peak wavelength $\lambda_{max}$. In some non-limiting examples, the onset wavelength $\lambda_{onset}$ may correspond to a wavelength within the emission spectrum at which the luminance is at a threshold intensity ($I_{onset}$), as shown generally by way of non-limiting example in FIG. 32, which in some non-limiting examples, may be at about 10%, about 5%, about 3%, about 1%, about 0.5%, about 0.1%, or about 0.01%, of the luminance at the peak wavelength Amax.

In general, electro-luminescent devices are configured to emit and/or transmit light having wavelengths in a range from about 425 nm to about 725 nm, and more specifically, in some non-limiting examples, light having peak emission wavelengths of 456 nm, 528 nm, and 624 nm, corresponding to B(lue) 2543, G(reen) 2542, and R(ed) 2541 sub-pixels, respectively. Accordingly, in the context of such electro-luminescent devices, the emission spectrum may to any wavelengths or wavelength ranges from about 425 nm to about 725 nm, or from about 456 nm to about 624 nm. Photons having a wavelength in the visible light spectrum may, in some non-limiting examples, also be referred to as "visible light" herein.

In some non-limiting examples, an emission spectrum that lies in the R(ed) portion of the visible light spectrum may be characterized by a peak wavelength $\lambda_{max}$ that may lie in a wavelength range of 600 nm to about 640 nm and in some non-limiting examples, may be substantially about 620 nm. The corresponding onset wavelength $\lambda_{onset}$ may lie in a wavelength range of about 500 nm to about 610 nm, about 575 nm to about 600 nm, about 570 nm to about 580 nm, or about 580 nm to about 590 nm.

In some non-limiting examples, an emission spectrum that lies in the G(reen) portion of the visible light spectrum may be characterized by a peak wavelength $\lambda_{max}$ that may lie in a wavelength range of 510 nm to about 540 nm and in some non-limiting examples, may be substantially about 530 nm. The corresponding onset wavelength $\lambda_{onset}$ may lie in a wavelength range of about 470 nm to about 520 nm, about 480 nm to about 510 nm, about 480 nm to about 490 nm, or about 490 to about 500 nm.

In some non-limiting examples, an emission spectrum that lies in the B(lue) portion of the visible light spectrum may be characterized by a peak wavelength $\lambda_{max}$ that may lie in a wavelength range of 450 nm to about 460 nm and in some non-limiting examples, may be substantially about 455 nm. The corresponding onset wavelength $\lambda_{onset}$ may lie in a wavelength range of about 420 nm to about 450 nm, about 425 nm to about 440 nm, about 420 nm to about 430 nm, or about 430 nm to about 440 nm.

In the present disclosure, the term "IR signal" as used herein, generally refers to EM radiation having a wavelength in an IR portion of the EM spectrum. An IR signal may, in some non-limiting examples, have a wavelength corresponding to a near-infrared (NIR) subset thereof. By way of non-limiting examples, an NIR signal may have a wavelength of about 750 nm to about 1400 nm, about 750 nm to about 1300 nm, about 800 nm to about 1300 nm, about 800 nm to about 1200 nm, about 850 nm to about 1100 nm, and/or about 900 nm to about 1000 nm.

In the present disclosure, the term "absorption spectrum", as used herein, generally refers a wavelength (sub-)range of the EM spectrum over which absorption occurs.

Figure 33:
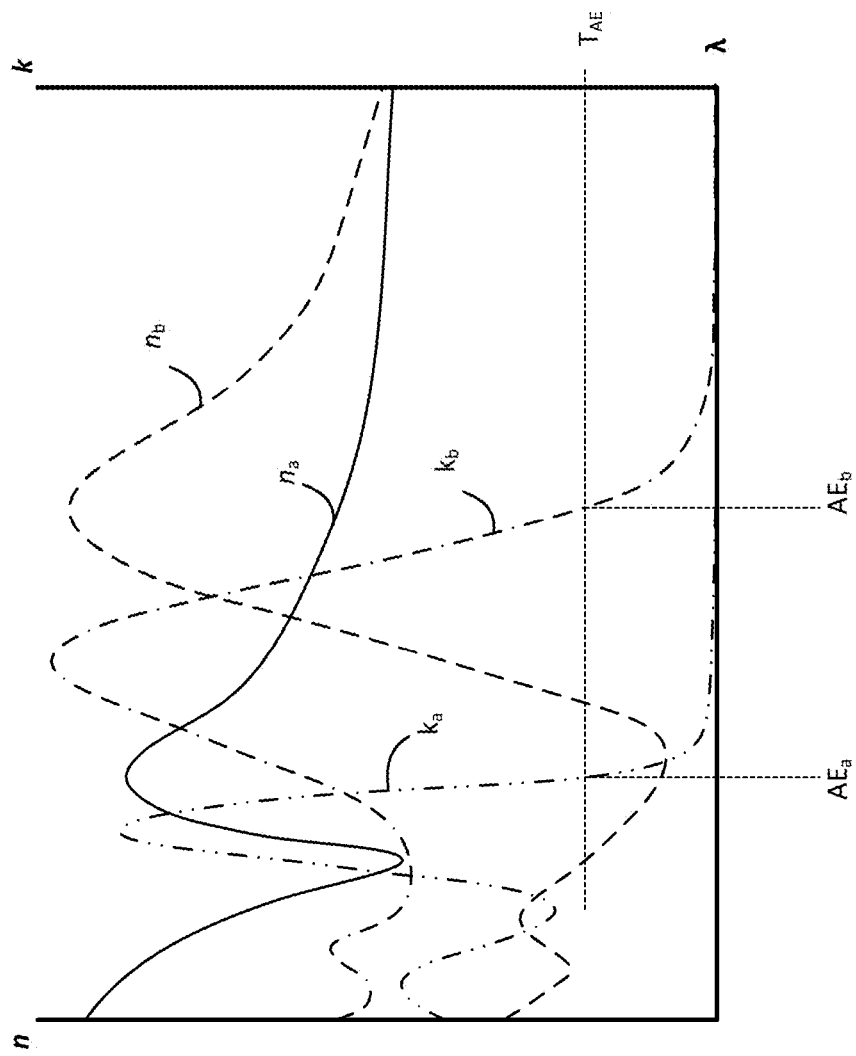
FIG. 33 is a schematic diagram that illustrates, in qualitative form, a relationship between the plots of the example refractive indices of FIG. 32, and respective plots of example extinction coefficients of the respective capping layers of FIG. 32 according to various examples in the present disclosure.
Figure 34:
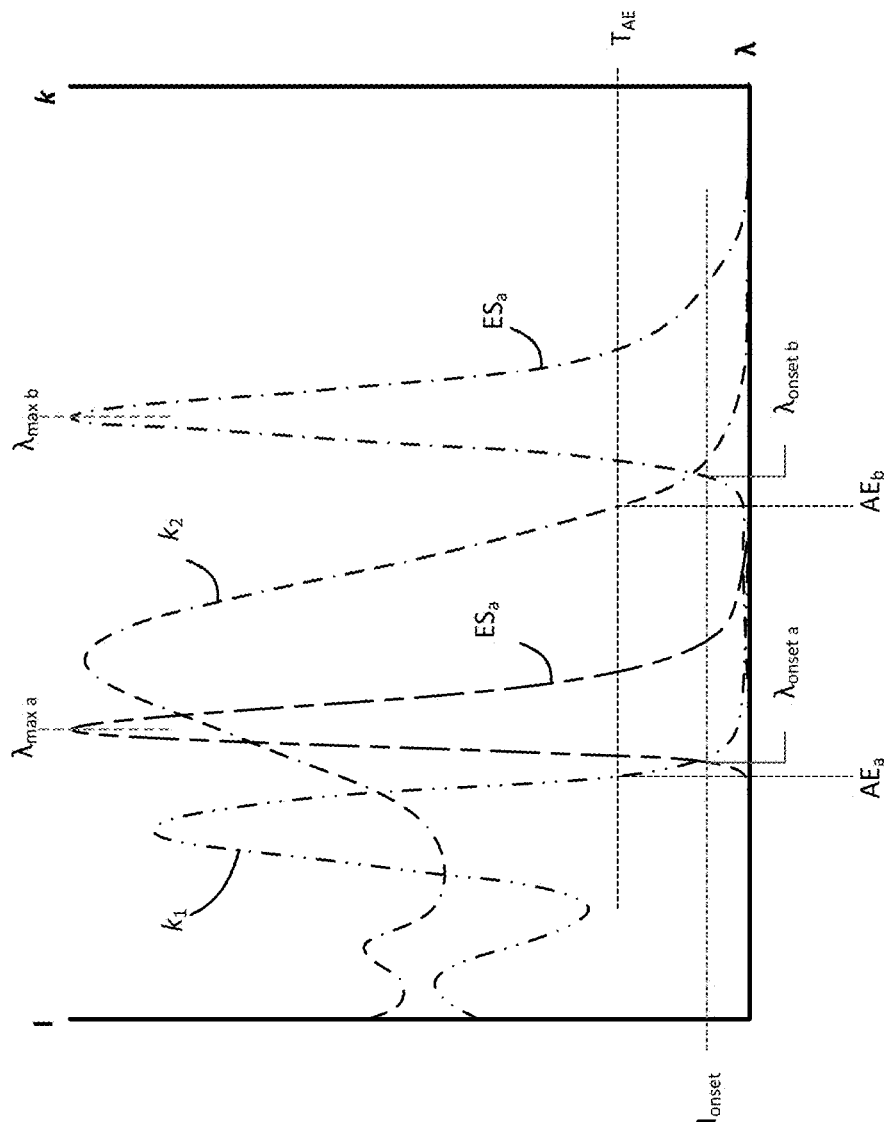
FIG. 34 is a schematic diagram that illustrates, in qualitative form, a relationship between the example emission spectra of FIG. 32, and the respective plots of example extinction coefficients of FIG. 33 according to various examples in the present disclosure.

In the present disclosure, the term "extinction coefficient" (k) as used herein, and as shown generally by way of non-limiting example in FIG. 33, refers to the degree to which an electromagnetic coefficient is attenuated when propagating through a material. In some non-limiting examples, the extinction coefficient may be understood to correspond to the imaginary component k of a complex refractive index N. In some non-limiting examples, the extinction coefficient of a material may be measured by a variety of methods, including without limitation, by ellipsometry.

In the present disclosure, the terms "refractive index" (n) and/or "index", as used herein to describe a medium, and as shown generally by way of non-limiting example in FIG. 32, refer to a value calculated from a ratio of the speed of light in such medium relative to the speed of light in a vacuum. In the present disclosure, particularly when used to describe the properties of substantially transparent materials, including without limitation, thin film layers and/or coatings, the terms may correspond to the real part, n, in the expression N=n+ik, in which N represents the complex refractive index and k represents the extinction coefficient.

As would be appreciated by those having ordinary skill in the relevant art, substantially transparent materials, including without limitation, thin film layers and/or coatings, generally exhibit a relatively low k value in the visible light spectrum, and therefore the imaginary component of the expression may have a negligible contribution to the complex refractive index, N. On the other hand, light-transmissive electrodes formed, for example, by a metallic thin film, may exhibit a relatively low n value and a relatively high k value in the visible light spectrum. Accordingly, the complex refractive index, N, of such thin films may be dictated primarily by its imaginary component.

In the present disclosure, unless the context dictates otherwise, reference without specificity to a refractive index is intended to be a reference to the real part n of the complex refractive index N.

In the present disclosure, the terms "absorption edge" (AE), "absorption discontinuity" and/or "absorption limit" as used herein, and as shown by way of non-limiting example in FIG. 33, generally refers to a rapid decrease in the extinction coefficient k and/or absorption spectrum of a coating, layer, and/or material. In the present disclosure, the "absorption edge" as described, for example, in relation to a capping layer (CPL) 3610, refers to the longest wavelength, for example, within the visible spectrum, at which a rapid decrease in the extinction coefficient k of the CPL 3610 is observed. In some non-limiting examples, the extinction coefficient k of a CPL 3610, particularly in the visible spectrum, may diminish toward zero, and remain low across the remainder of the visible spectrum. In such non-limiting examples, the absorption edge of a CPL 3610 may correspond to the wavelength, or the longest wavelength, at which the extinction coefficient k passes a threshold value $T_{AE}$, as shown generally by way of non-limiting example in FIG. 33, as it diminishes towards zero. In some non-limiting examples, the absorption edge of a CPL 3610 may correspond to the wavelength, or the longest wavelength, at which the extinction coefficient k passes the threshold value $T_{AE}$ with a first derivative of the extinction coefficient k as a function of wavelength $\lambda$ that is negative.

In some non-limiting examples, there may be a generally positive correlation between refractive index n and transmittance, or in other words, a generally negative correlation between refractive index n and absorption at or near the absorption edge. In some non-limiting examples, the absorption edge of a substance may correspond to a wavelength at which the extinction coefficient k approaches a threshold value near 0.

An organic opto-electronic device can encompass any opto-electronic device where one or more active layers and/or strata thereof are formed primarily of an organic (carbon-containing) material, and more specifically, an organic semiconductor material.

In the present disclosure, it will be appreciated by those having ordinary skill in the relevant art that an organic material, may comprise, without limitation, a wide variety of organic molecules, and/or organic polymers. Further, it will be appreciated by those having ordinary skill in the relevant art that organic materials that are doped with various inorganic substances, including without limitation, elements and/or inorganic compounds, may still be considered to be organic materials. Still further, it will be appreciated by those having ordinary skill in the relevant art that various organic materials may be used, and that the processes described herein are generally applicable to an entire range of such organic materials. Still further, it will be appreciated by those having ordinary skill in the relevant art that organic materials that contain metals and/or other inorganic elements, may still be considered as organic materials. Still further, it will be appreciated by those having ordinary skill in the relevant art that various organic materials may be molecules, oligomers, and/or polymers.

In the present disclosure, an inorganic substance may refer to a substance that primarily includes an inorganic material. In the present disclosure, an inorganic material may comprise any material that is not considered to be an organic material, including without limitation, metals, glasses and/or minerals.

Where the opto-electronic device emits photons through a luminescent process, the device may be considered an electro-luminescent device. In some non-limiting examples, the electro-luminescent device may be an organic light-emitting diode (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor and/or a television set (collectively "user device").

In some non-limiting examples, the opto-electronic device may be an organic photo-voltaic (OPV) device that converts photons into electricity. In some non-limiting examples, the opto-electronic device may be an electro-luminescent quantum dot device. In the present disclosure, unless specifically indicated to the contrary, reference will be made to OLED devices, with the understanding that such disclosure could, in some examples, equally be made applicable to other opto-electronic devices, including without limitation, an OPV and/or quantum dot device in a manner apparent to those having ordinary skill in the relevant art.

The structure of such devices will be described from each of two aspects, namely from a cross-sectional aspect and/or from a lateral (plan view) aspect.

In the present disclosure, the terms "layer" and "strata" may be used interchangeably to refer to similar concepts.

In the context of introducing the cross-sectional aspect below, the components of such devices are shown in substantially planar lateral strata. Those having ordinary skill in the relevant art will appreciate that such substantially planar representation is for purposes of illustration only, and that across a lateral extent of such a device, there may be localized substantially planar strata of different thicknesses and dimension, including, in some non-limiting examples, the substantially complete absence of a layer, and/or layer(s) separated by non-planar transition regions (including lateral gaps and even discontinuities). Thus, while for illustrative purposes, the device is shown below in its cross-sectional aspect as a substantially stratified structure, in the plan view aspect discussed below, such device may illustrate a diverse topography to define features, each of which may substantially exhibit the stratified profile discussed in the cross-sectional aspect.

Cross-Sectional Aspect

FIG. 1 is a simplified block diagram from a cross-sectional aspect, of an example electro-luminescent device according to the present disclosure. The electro-luminescent device, shown generally at 100 comprises a plurality of layers, including without limitation, a substrate 110, upon which a frontplane 10, comprising a plurality of layers, respectively, a first electrode 120, at least one semiconducting layer 130, and a second electrode 140, are disposed. In some non-limiting examples, the frontplane 10 may provide mechanisms for photon emission and/or manipulation of emitted photons. In some non-limiting examples, a barrier coating 1650 (FIG. 16C) may be provided to surround and/or encapsulate the layers 120, 130, 140 and/or the substrate 110 disposed thereon.

For purposes of illustration, an exposed layer surface of underlying material is referred to as 111. In FIG. 1, the exposed layer surface 111 is shown as being of the second electrode 140. Those having ordinary skill in the relevant art will appreciate that, at the time of deposition of, by way of non-limiting example, the first electrode 120, the exposed layer surface 111 would have been shown as 111a, of the substrate 110.

Those having ordinary skill in the relevant art will appreciate that when a component, a layer, a region and/or portion thereof is referred to as being "formed", "disposed" and/or "deposited" on and/or over another underlying material, component, layer, region and/or portion, such formation, disposition and/or deposition may be directly and/or indirectly on an exposed layer surface 111 (at the time of such formation, disposition and/or deposition) of such underlying material, component, layer, region and/or portion, with the potential of intervening material(s), component(s), layer(s), region(s) and/or portion(s) therebetween.

In the present disclosure, a directional convention is followed, extending substantially normally relative to the lateral aspect described above, in which the substrate 110 is considered to be the "bottom" of the device 100, and the layers 120, 130, 140 are disposed on "top" of the substrate 11. Following such convention, the second electrode 140 is at the top of the device 100 shown, even if (as may be the case in some examples, including without limitation, during a manufacturing process, in which one or more layers 120, 130, 140 may be introduced by means of a vapor deposition process), the substrate 110 is physically inverted such that the top surface, on which one of the layers 120, 130, 140, such as, without limitation, the first electrode 120, is to be disposed, is physically below the substrate 110, so as to allow the deposition material (not shown) to move upward and be deposited upon the top surface thereof as a thin film.

In some non-limiting examples, the device 100 may be electrically coupled to a power source 15. When so coupled, the device 100 may emit photons as described herein.

In some non-limiting examples, the device 100 may be classified according to a direction of emission of photons generated therefrom. In some non-limiting examples, the device 100 may be considered to be a bottom-emission device if the photons generated are emitted in a direction toward and through the substrate 100 at the bottom of the device 100 and away from the layers 120, 130, 140 disposed on top of the substrate 110. In some non-limiting examples, the device 100 may be considered to be a top-emission device if the photons are emitted in a direction away from the substrate 110 at the bottom of the device 100 and toward and/or through the top layer 140 disposed, with intermediate layers 120, 130, on top of the substrate 110. In some non-limiting examples, the device 100 may be considered to be a double-sided emission device if it is configured to emit photons in both the bottom (toward and through the substrate 110) and top (toward and through the top layer 140).

Thin Film Formation

Figure 8:
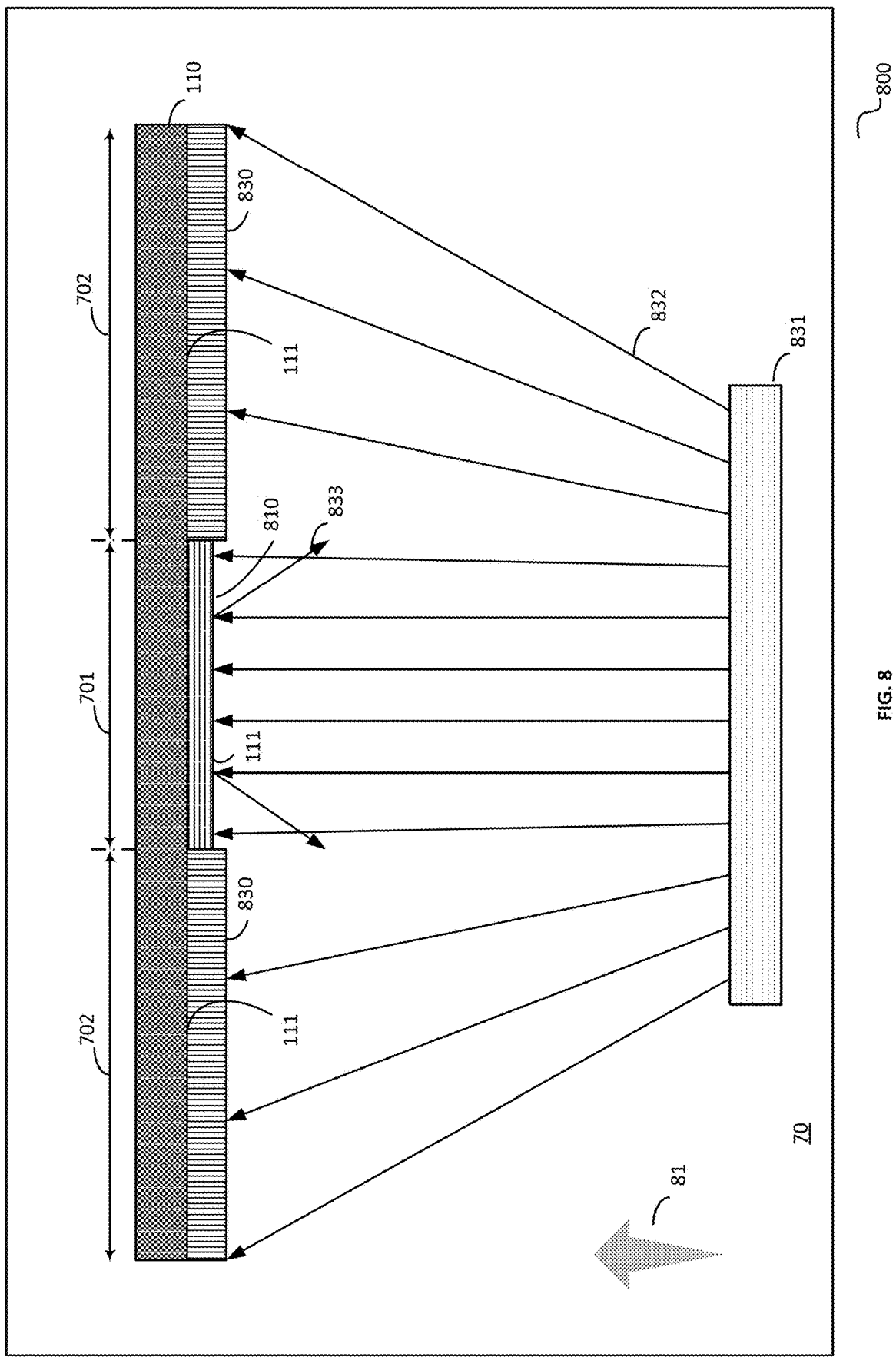
FIG. 8 is a schematic diagram showing an example process for depositing a conductive coating in the first pattern on an exposed layer surface that comprises the deposited pattern of the selective coating of FIG. 7 where the selective coating is a nucleation-inhibiting coating (NIC)

The frontplane 10 layers 120, 130, 140 may be disposed in turn on a target exposed layer surface 111 (and/or, in some non-limiting examples, including without limitation, in the case of selective deposition disclosed herein, at least one target region and/or portion of such surface) of an underlying material, which in some non-limiting examples, may be, from time to time, the substrate 110 and intervening lower layers 120, 130, 140, as a thin film. In some non-limiting examples, an electrode 120, 140, 1750, 4150 may be formed of at least one thin conductive film layer of a conductive coating 830 (FIG. 8). It will be understood by those having ordinary skill in the relevant art that such conductive coating 830 may be (at least) one of the plurality of layers of the device 100. The conductive coating 830 may be comprised of a conductive coating material 831. Those having ordinary skill in the relevant art will appreciate that the conductive coating 830 and the conductive coating material 831 of which it is comprised, especially when disposed as a film and under conditions and/or by mechanisms substantially similar to those employed in depositing the conductive coating 830, may exhibit largely similar optical and/or other properties.

The thickness of each layer, including without limitation, layers 120, 130, 140, and of the substrate 110, shown in FIG. 1, and throughout the figures, is illustrative only and not necessarily representative of a thickness relative to another layer 120, 130, 140 (and/or of the substrate 110).

In the present disclosure, for purposes of simplicity of description, the terms "coating film", "closed coating", and/or "closed film" 4530, as used herein, refer to a thin film structure and/or coating of, in some non-limiting examples, a conductive coating material 831 used for a conductive coating 830, in which a relevant portion of a surface is substantially coated thereby, such that such surface is not substantially exposed by or through the closed film 4530 deposited thereon.

In the present disclosure, unless the context dictates otherwise, reference without specificity to a thin film is intended to be a reference to a substantially closed film 4530.

In some non-limiting examples, a closed film 4530, in some non-limiting examples, of a conductive coating material 831, may be disposed to cover a portion of an underlying surface, such that, within such portion, less than about 20%, less than about 15%, less than about 10%, less than about 5%, less than about 3%, or less than about 1% of the underlying surface therewithin is exposed by or through the closed film 4530.

Those having ordinary skill in the relevant art will appreciate that a closed film 4530 may be patterned using various techniques and processes, including without limitation, those described herein, so as to deliberately leave a part of the exposed layer surface 111 of the underlying surface to be exposed after deposition of the closed film 4530. In the present disclosure, such patterned films may nevertheless be considered to constitute a closed film 4530, if, by way of non-limiting example, the thin film and/or coating that is deposited, within the context of such patterning, and between such deliberately exposed parts of the exposed layer surface 111 of the underlying surface, itself substantially comprises a closed film 4530.

Those having ordinary skill in the relevant art will appreciate that due to the inherent variability in the deposition process, and in some non-limiting examples, to the existence of impurities in either or both of the deposited materials, in some non-limiting examples, the conductive coating material 831, and the exposed layer surface 111 of the underlying material, deposition of a thin film, using various techniques and processes, including without limitation, those described herein, may nevertheless result in the formation of small apertures, including without limitation, pin-holes, tears, and/or cracks, therein. In the present disclosure, such thin films may nevertheless be considered to constitute a closed film 4530, if, by way of non-limiting example, the thin film and/or coating that is deposited substantially comprises a closed film 4530 and meets the percentage coverage criterion set out above, despite the presence of such apertures.

With continued vapor deposition of monomers (which in some non-limiting examples may be molecules and/or atoms of a deposited material in vapor form) a substantially closed film 4530 may eventually be deposited on an exposed layer surface 111 of an underlying material. The behaviour, including optical effects caused thereby, of such closed films 4530 are generally relatively consistent and unsurprising.

In some non-limiting examples, the behaviour, including optical effects thereof, of thin films that comprise at least one closed film 4530 are generally relatively uniform.

While the present disclosure discusses thin film formation, in reference to at least one layer or coating, in terms of vapor deposition, those having ordinary skill in the relevant art will appreciate that, in some non-limiting examples, various components of the electro-luminescent device 100 may be selectively deposited using a wide variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), physical vapor deposition (PVD) (including without limitation, sputtering), chemical vapor deposition (CVD) (including without limitation, plasma-enhanced CVD (PECVD) and/or organic vapor phase deposition (OVPD)), laser annealing, laser-induced thermal imaging (LITI) patterning, atomic-layer deposition (ALD), coating (including without limitation, spin coating, dip coating, line coating and/or spray coating) and/or combinations thereof. Some processes may be used in combination with a shadow mask, which may, in some non-limiting examples, be an open mask and/or fine metal mask (FMM), during deposition of any of various layers and/or coatings to achieve various patterns by masking and/or precluding deposition of a deposited material on certain parts of a surface of an underlying material exposed thereto.

In the present disclosure, the terms "evaporation" and/or "sublimation" may be used interchangeably to refer generally to deposition processes in which a source material is converted into a vapor, including without limitation by heating, to be deposited onto a target surface in, without limitation, a solid state. As will be understood, an evaporation process is a type of PVD process where one or more source materials are evaporated and/or sublimed under a low pressure (including without limitation, a vacuum) environment to form vapor monomers and deposited on a target surface through de-sublimation of the one or more evaporated source materials. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source) and/or any other type of evaporation source.

In some non-limiting examples, a deposition source material may be a mixture. In some non-limiting examples, at least one component of a mixture of a deposition source material may not be deposited during the deposition process (or, in some non-limiting examples, be deposited in a relatively small amount compared to other components of such mixture).

In the present disclosure, a reference to a layer thickness of a material, irrespective of the mechanism of deposition thereof, refers to an amount of the material deposited on a target exposed layer surface 111, which corresponds to an amount of the material to cover the target surface with a uniformly thick layer of the material having the referenced layer thickness. By way of non-limiting example, depositing a layer thickness of 10 nm of material indicates that an amount of the material deposited on the surface corresponds to an amount of the material to form a uniformly thick layer of the material that is 10 nm thick. It will be appreciated that, having regard to the mechanism by which thin films are formed discussed above, by way of non-limiting example, due to possible stacking or clustering of monomers (which in some non-limiting examples may be molecules and/or atoms), an actual thickness of the deposited material may be non-uniform. By way of non-limiting example, depositing a layer thickness of 10 nm may yield some parts of the deposited material having an actual thickness greater than 10 nm, or other parts of the deposited material having an actual thickness less than 10 nm. A certain layer thickness of a material deposited on a surface may thus correspond, in some non-limiting examples, to an average thickness of the deposited material across the target surface, including without limitation, as a closed film 4530.

In the present disclosure, a reference to a reference layer thickness refers to a layer thickness of the conductive coating 830, also referred to herein as the conductive coating material 831, that is deposited on a reference surface exhibiting a high initial sticking probability or initial sticking coefficient $S_0$ (that is, a surface having an initial sticking probability $S_0$ that is about and/or close to 1). The reference layer thickness does not indicate an actual thickness of the conductive coating material 831 deposited on a target surface (such as, without limitation, a surface of a nucleation-inhibiting coating (NIC) 810).

It will be understood by those having ordinary skill in the relevant art that such NIC 810 may be (at least) one of the plurality of layers of the device 100. The NIC 810 may be comprised of an NIC material. Those having ordinary skill in the relevant art will appreciate that the NIC 810 and the NIC material of which it is comprised, especially when disposed as a film and under conditions and/or by mechanisms substantially similar to those employed in depositing the NIC 810, may exhibit largely similar optical and/or other properties.

Rather, the reference layer thickness refers to a layer thickness of the conductive coating material 831 that would be deposited on a reference surface, in some non-limiting examples, a surface of a quartz crystal positioned inside a deposition chamber for monitoring a deposition rate and the reference layer thickness, upon subjecting the target surface and the reference surface to identical vapor flux of the conductive coating material 831 for the same deposition period. Those having ordinary skill in the relevant art will appreciate that in the event that the target surface and the reference surface are not subjected to identical vapor flux simultaneously during deposition, an appropriate tooling factor may be used to determine and/or to monitor the reference layer thickness.

In the present disclosure, a reference to depositing a number X of monolayers of material refers to depositing an amount of the material to cover a desired area of an exposed layer surface 111 with X single layer(s) of constituent monomers of the material, such as, without limitation, in a closed film 4530.

The formation of thin films during vapor deposition on an exposed layer surface 111 of an underlying material involves processes of nucleation and growth. During initial stages of film formation, a sufficient number of vapor monomers (which in some non-limiting examples may be molecules and/or atoms) typically condense from a vapor phase to form initial nuclei on the exposed layer surface 111 presented, whether of the substrate 110 (or of an intervening lower layer 120, 130, 140). As vapor monomers continue to impinge on such surface, a size and density of these initial nuclei increase to form small clusters or islands. After reaching a saturation island density, adjacent islands typically will start to coalesce, increasing an average island size, while decreasing an island density. Coalescence of adjacent islands may continue until a substantially closed film 4530 is formed.

However, prior to the formation of a substantially closed film 4530, the deposition of vapor monomers may result in thin film structures, described herein, which may exhibit one or more varied characteristics and concomitantly, varied behaviours, including without limitation, optical effects.

In the present disclosure, a reference to depositing a fraction 0.X monolayer of a material refers to depositing an amount of the material to cover a fraction 0.X of a desired area of a surface with a single layer of constituent monomers of the material. Those having ordinary skill in the relevant art will appreciate that due to, by way of non-limiting example, possible stacking and/or clustering of monomers, an actual local thickness of a deposited material across a desired area of a surface may be non-uniform. By way of non-limiting example, depositing 1 monolayer of a material may result in some local regions of the desired area of the surface being uncovered by the material, while other local regions of the desired area of the surface may have multiple atomic and/or molecular layers deposited thereon.

In the present disclosure, a target surface (and/or target region(s) thereof) may be considered to be "substantially devoid of", "substantially free of", and/or "substantially uncovered by" a material if there is a substantial absence of the material on the target surface as determined by any suitable determination mechanism.

In the present disclosure, for purposes of simplicity of description, the result of deposition of vapor monomers onto an exposed layer surface 111 of an underlying material, that has not (yet) reached a stage where a closed film 4530 has been formed, will be referred to as a "clustering layer". In some non-limiting examples, such a clustering layer may reflect that the deposition process has not been completed, in which such a clustering layer may be considered as an interim stage of formation of a closed film 4530. In some non-limiting examples, a clustering layer may be the result of a completed deposition process, and thus constitute a final stage of formation in and of itself.

In the present disclosure, for purposes of simplicity of description, the term "discontinuous coating" 1050 as used herein, refers to a clustering layer, in which a relevant portion of the exposed layer surface 111 of an underlying material coated by the deposition process, is neither substantially devoid of such material, nor forms a closed film 4530 thereof. In some non-limiting examples, a discontinuous coating 1050 of a conductive coating material 831 may manifest as a plurality of discrete islands deposited on such surface.

In the present disclosure, for purposes of simplicity of description, the term "dendritic", with respect to a coating, including without limitation, the conductive coating 830, refers to feature(s) that resemble a branched structure when viewed in a lateral aspect. In some non-limiting examples, the conductive coating 830 may comprise a dendritic projection 1021 and/or a dendritic recess 1022. In some non-limiting examples, a dendritic projection 1021 may correspond to a part of the conductive coating 830 that exhibits a branched structure comprising a plurality of short projections that are physically connected and extend substantially outwardly. In some non-limiting examples, a dendritic recess 1022 may correspond to a branched structure of gaps, openings, and/or uncovered parts of the conductive coating 830 that are physically connected and extend substantially outwardly. In some non-limiting examples, a dendritic recess 1022 may correspond to, including without limitation, a mirror image and/or inverse pattern, to the pattern of a dendritic projection 1021. In some non-limiting examples, a dendritic projection 1021 and/or a dendritic recess 1022 may have a configuration that exhibits, and/or mimics a fractal pattern, a mesh, a web, and/or an interdigitated structure.

In some non-limiting examples, there may be a clustering layer that reflects an intermediate stage in the deposition of vapor monomers, beyond formation of a discontinuous coating 1050, but prior to formation of a closed film 4530, in which continued coalescence of clusters and/or islands 5001, 5002 continues until the number of clusters and/or islands 5001, 5002 remaining approaches zero. Where such an intermediate stage clustering layer is reached, the deposited monomers may in some non-limiting examples form an intermediate stage thin film that may comprise a fraction 0.X of a single monolayer, such that it is not a closed film 4530, in that there may be apertures and/or gaps in the film coverage, including without limitation, one or more dendritic projections 1021, and/or one or more dendritic recesses 1022, yet remains substantially conductive.

There may be at least three basic growth modes for the formation of thin films, initially as clustering layers and, in some non-limiting examples, culminating in a closed film 4530: 1) island (Volmer-Weber), 2) layer-by-layer (Frank-van der Merwe), and 3) Stranski-Krastanov.

In the present disclosure, the terms "island" and "cluster" may be used interchangeably to refer to similar concepts.

Island growth typically occurs when stale clusters of monomers nucleate on a surface and grow to form discrete islands. This growth mode occurs when the interactions between the monomers is stronger than that between the monomers and the surface.

The nucleation rate describes how many nuclei of a given size (where the free energy does not push a cluster of such nuclei to either grow or shrink) ("critical nuclei") form on a surface per unit time. During initial stages of film formation, it is unlikely that nuclei will grow from direct impingement of monomers on the surface, since the density of nuclei is low, and thus the nuclei cover a relatively small fraction of the surface (e.g. there are large gaps/spaces between neighboring nuclei). Therefore, the rate at which critical nuclei grow typically depends on the rate at which adatoms (e.g. adsorbed monomers) on the surface migrate and attach to nearby nuclei.

Figure 6:
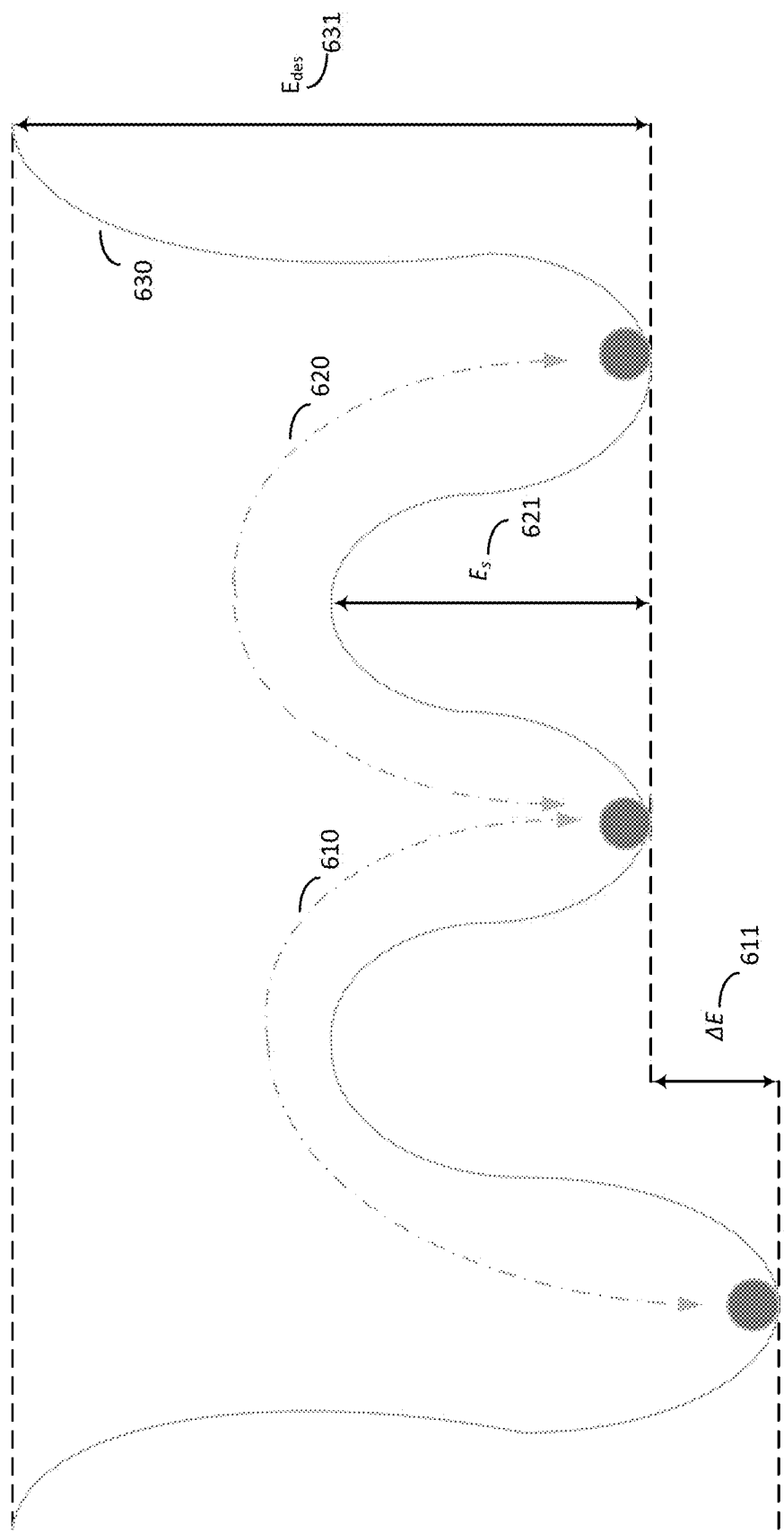
FIG. 6 is an example energy profile illustrating relative energy states of an adatom absorbed onto a surface according to an example in the present disclosure.

An example of an energy profile of an adatom adsorbed onto an exposed layer surface 111 of an underlying material (in the figure, the substrate 110) is illustrated in FIG. 6. Specifically, FIG. 6 illustrates example qualitative energy profiles corresponding to: an adatom escaping from a local low energy site (610); diffusion of the adatom on the exposed layer surface 111 (620); and desorption of the adatom (630).

In 610, the local low energy site may be any site on the exposed layer surface 111 of an underlying material, onto which an adatom will be at a lower energy. Typically, the nucleation site may comprise a defect and/or an anomaly on the exposed layer surface 111, including without limitation, a step edge, a chemical impurity, a bonding site and/or a kink. Once the adatom is trapped at the local low energy site, there may in some non-limiting examples, typically be an energy barrier before surface diffusion takes place. Such energy barrier is represented as $\Delta E$ 611 in FIG. 6. In some non-limiting examples, if the energy barrier $\Delta E$ 611 to escape the local low energy site is sufficiently large the site may act as a nucleation site.

In 620, the adatom may diffuse on the exposed layer surface 111. By way of non-limiting example, in the case of localized absorbates, adatoms tend to oscillate near a minimum of the surface potential and migrate to various neighboring sites until the adatom is either desorbed, and/or is incorporated into a growing film and/or growing islands formed by a cluster 5001, 5002 of adatoms. In FIG. 6, the activation energy associated with surface diffusion of adatoms is represented as $E_s$ 621.

In 630, the activation energy associated with desorption of the adatom from the surface is represented as $E_{des}$ 631. Those having ordinary skill in the relevant art will appreciate that any adatoms that are not desorbed may remain on the exposed layer surface 111. By way of non-limiting example, such adatoms may diffuse on the exposed layer surface 111, be incorporated as part of a growing film and/or coating, and/or become part of a cluster 5001, 5002 of adatoms that form islands on the exposed layer surface 111.

After adsorption of an adatom on a surface, the adatom may either desorb from the surface, or may migrate some distance on the surface before either desorbing, interacting with other adatoms to form a small cluster, or attaching to a growing nucleus. An average amount of time that an adatom remains on the surface after initial adsorption is given by:

$$\tau_s = \frac{1}{\nu}\exp\left(\frac{E_{des}}{kT}\right)$$

In the above equation, $\nu$ is a vibrational frequency of the adatom on the surface, k is the Botzmann constant, T is temperature, and $E_{des}$ 631 is an energy involved to desorb the adatom from the surface. From this equation it is noted that the lower the value of $E_{des}$ 631 the easier it is for the adatom to desorb from the surface, and hence the shorter the time the adatom will remain on the surface. A mean distance an adatom can diffuse is given by, $$X = a_0\exp\left(\frac{E_{des} - E_s}{2kT}\right)$$

where $a_0$ is a lattice constant and $E_s$ 621 is an activation energy for surface diffusion. For low values of $E_{des}$ 631 and/or high values of $E_s$ 621, the adatom will diffuse a shorter distance before desorbing, and hence is less likely to attach to growing nuclei or interact with another adatom or cluster of adatoms.

During initial stages of film formation, adsorbed adatoms may interact to form clusters, with a critical concentration of clusters per unit area being given by, $$\frac{N_i}{n_0} = \left|\frac{N_1}{n_0}\right|^i \exp\left(\frac{E_i}{kT}\right)$$

where $E_i$ is an energy involved to dissociate a critical cluster containing i adatoms into separate adatoms, $n_0$ is a total density of adsorption sites, and $N_1$ is a monomer density given by:

$$N_1 = \dot{R}\tau_s$$

where $\dot{R}$ is a vapor impingement rate. Typically i will depend on a crystal structure of a material being deposited and will determine the critical cluster size to form a stable nucleus.

A critical monomer supply rate for growing clusters is given by the rate of vapor impingement and an average area over which an adatom can diffuse before desorbing:

$$\dot{R}X^2 = a_0^2 \exp\left(\frac{E_{des} - E_s}{kT}\right)$$

The critical nucleation rate is thus given by the combination of the above equations:

$$\dot{N}_i = \dot{R}a_0^2 n_0 \left(\frac{\dot{R}}{vn_0}\right)^i \exp\left(\frac{(i+1)E_{des} - E_s + E_i}{kT}\right)$$

From the above equation it is noted that the critical nucleation rate will be suppressed for surfaces that have a low desorption energy for adsorbed adatoms, a high activation energy for diffusion of an adatom, are at high temperatures, and/or are subjected to vapor impingement rates.

Sites of substrate heterogeneities, such as defects, ledges or step edges, may increase $E_{des}$ 631, leading to a higher density of nuclei observed at such sites. Also, impurities or contamination on a surface may also increase $E_{des}$ 631, leading to a higher density of nuclei. For vapor deposition processes, conducted under high vacuum conditions, the type and density of contaminates on a surface is affected by a vacuum pressure and a composition of residual gases that make up that pressure.

Under high vacuum conditions, a flux of molecules that impinge on a surface (per $cm^2$-sec) is given by:

$$\phi = 3.513 \times 10^{22} \frac{P}{MT}$$

where P is pressure, and M is molecular weight. Therefore, a higher partial pressure of a reactive gas, such as $H_2O$, can lead to a higher density of contamination on a surface during vapor deposition, leading to an increase in $E_{des}$ 631 and hence a higher density of nuclei.

In some non-limiting examples, one measure of an amount of a material on a surface is a percentage coverage of the surface by such material. In some non-limiting examples surface coverage may be assessed using a variety of imaging techniques, including without limitation, transmission electron microscopy (TEM), atomic force microscopy (AFM) and/or scanning electron microscopy (SEM).

In some non-limiting examples, one measure of an amount of an electrically conductive material on a surface is a (light) transmittance, since in some non-limiting examples, electrically conductive materials, including without limitation, metals, including without limitation silver (Ag), magnesium (Mg), and/or ytterbium (Yb), attenuate and/or absorb photons.

Thus, in some non-limiting examples, a surface of a material may be considered to be substantially devoid of an electrically conductive material if the transmittance therethrough is greater than 90%, greater than 92%, greater than 95%, and/or greater than 98% of the transmittance of a reference material of similar composition and dimension of such material, in some non-limiting examples, in the visible part of the electromagnetic spectrum.

In the present disclosure, for purposes of simplicity of illustration, details of deposited materials, including without limitation, thickness profiles and/or edge profiles of layer(s) have been omitted. Various possible edge profiles at an interface between NICs 810 and conductive coatings 830 are discussed herein.

Substrate

In some examples, the substrate 110 may comprise a base substrate 112. In some examples, the base substrate 112 may be formed of material suitable for use thereof, including without limitation, an inorganic material, including without limitation, silicon (Si), glass, metal (including without limitation, a metal foil), sapphire, and/or other inorganic material, and/or an organic material, including without limitation, a polymer, including without limitation, a polyimide and/or a silicon-based polymer. In some examples, the base substrate 112 may be rigid or flexible. In some examples, the substrate 112 may be defined by at least one planar surface. The substrate 110 has at least one surface that supports the remaining front plane 10 components of the device 100, including without limitation, the first electrode 120, the at least one semiconducting layer 130 and/or the second electrode 140.

In some non-limiting examples, such surface may be an organic surface and/or an inorganic surface.

In some examples, the substrate 110 may comprise, in addition to the base substrate 112, one or more additional organic and/or inorganic layers (not shown nor specifically described herein) supported on an exposed layer surface 111 of the base substrate 112.

In some non-limiting examples, such additional layers may comprise and/or form one or more organic layers, which may comprise, replace and/or supplement one or more of the at least one semiconducting layers 130.

In some non-limiting examples, such additional layers may comprise one or more inorganic layers, which may comprise and/or form one or more electrodes, which in some non-limiting examples, may comprise, replace and/or supplement the first electrode 120 and/or the second electrode 140.

In some non-limiting examples, such additional layers may comprise and/or be formed of and/or as a backplane layer 20 (FIG. 2) of a semiconductor material. In some non-limiting examples, the backplane layer 20 contains power circuitry and/or switching elements for driving the device 100, including without limitation, electronic TFT structure(s) and/or component(s) 200 (FIG. 2) thereof that may be formed by a photolithography process, which may not be provided under, and/or may precede the introduction of low pressure (including without limitation, a vacuum) environment.

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials thus generally exhibit electrical conductivity that is less than that of a conductive material (including without limitation, a metal), but that is greater than that of an insulating material (including without limitation, a glass). In some non-limiting examples, the semiconductor material may comprise an organic semiconductor material. In some non-limiting examples, the semiconductor material may comprise an inorganic semiconductor material.

Backplane and TFT Structure(s) Embodied Therein

Figure 2:
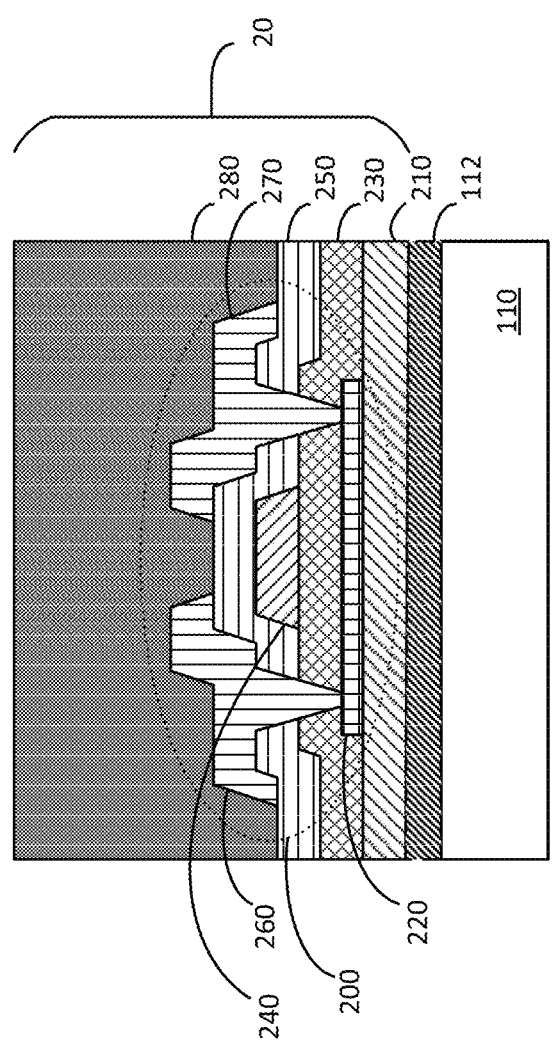
FIG. 2 is a cross-sectional view of an example backplane layer of the substrate of the device of FIG. 1, showing a thin film transistor (TFT) embodied therein.

FIG. 2 is a simplified cross-sectional view of an example of the substrate 110 of the device 100, including a backplane layer 20 thereof. In some non-limiting examples, the backplane 20 of the substrate 110 may comprise one or more electronic and/or opto-electronic components, including without limitation, transistors, resistors and/or capacitors, such as which may support the device 100 acting as an active-matrix and/or a passive matrix device. In some non-limiting examples, such structures may be a thin-film transistor (TFT) structure, such as is shown at 200. In some non-limiting examples, the TFT structure 200 may be fabricated using organic and/or inorganic materials to form various layers 210, 220, 230, 240, 250, 270, 270, 280 and/or parts of the backplane layer 20 of the substrate 110 above the base substrate 112. In FIG. 2, the TFT structure 200 shown is a top-gate TFT. In some non-limiting examples, TFT technology and/or structures, including without limitation, one or more of the layers 210, 220, 230, 240, 250, 270, 270, 280, may be employed to implement non-transistor components, including without limitation, resistors and/or capacitors.

In some non-limiting examples, the backplane 20 may comprise a buffer layer 210 deposited on an exposed layer surface 111 of the base substrate 112 to support the components of the TFT structure 200. In some non-limiting examples, the TFT structure 200 may comprise a semiconductor active area 220, a gate insulating layer 230, a TFT gate electrode 240, an interlayer insulating layer 250, a TFT source electrode 260, a TFT drain electrode 270 and/or a TFT insulating layer 280. In some non-limiting examples, the semiconductor active area 220 is formed over a part of the buffer layer 210, and the gate insulating layer 230 is deposited on substantially cover the semiconductor active area 220. In some non-limiting examples, the gate electrode 240 is formed on top of the gate insulating layer 230 and the interlayer insulating layer 250 is deposited thereon. The TFT source electrode 270 and the TFT drain electrode 270 are formed such that they extend through openings formed through both the interlayer insulating layer 250 and the gate insulating layer 230 such that they are electrically coupled to the semiconductor active area 220. The TFT insulating layer 280 is then formed over the TFT structure 200.

In some non-limiting examples, one or more of the layers 210, 220, 230, 240, 250, 270, 270, 280 of the backplane 20 may be patterned using photolithography, which uses a photomask to expose selective parts of a photoresist covering an underlying device layer to UV light. Depending upon a type of photoresist used, exposed or unexposed parts of the photomask may then be removed to reveal desired parts of the underlying device layer. In some examples, the photoresist is a positive photoresist, in which the selective parts thereof exposed to UV light are not substantially removable thereafter, while the remaining parts not so exposed are substantially removable thereafter. In some non-limiting examples, the photoresist is a negative photoresist, in which the selective parts thereof exposed to UV light are substantially removable thereafter, while the remaining parts not so exposed are not substantially removable thereafter. A patterned surface may thus be etched, including without limitation, chemically and/or physically, and/or washed off and/or away, to effectively remove an exposed part of such layer 210, 220, 230, 240, 250, 260, 270, 280.

Further, while a top-gate TFT structure 200 is shown in FIG. 2, those having ordinary skill in the relevant art will appreciate that other TFT structures, including without limitation a bottom-gate TFT structure, may be formed in the backplane 20 without departing from the scope of the present disclosure.

In some non-limiting examples, the TFT structure 200 may be an n-type TFT and/or a p-type TFT. In some non-limiting examples, the TFT structure 200 may incorporate any one or more of amorphous Si (a-Si), indium gallium zinc (Zn) oxide (IGZO) and/or low-temperature polycrystalline Si (LTPS).

First Electrode

The first electrode 120 is deposited over the substrate 110. In some non-limiting examples, the first electrode 120 is electrically coupled to a terminal of the power source 15 and/or to ground. In some non-limiting examples, the first electrode 120 is so coupled through at least one driving circuit 300 (FIG. 3), which in some non-limiting examples, may incorporate at least one TFT structure 200 in the backplane 20 of the substrate 110.

Figure 3:
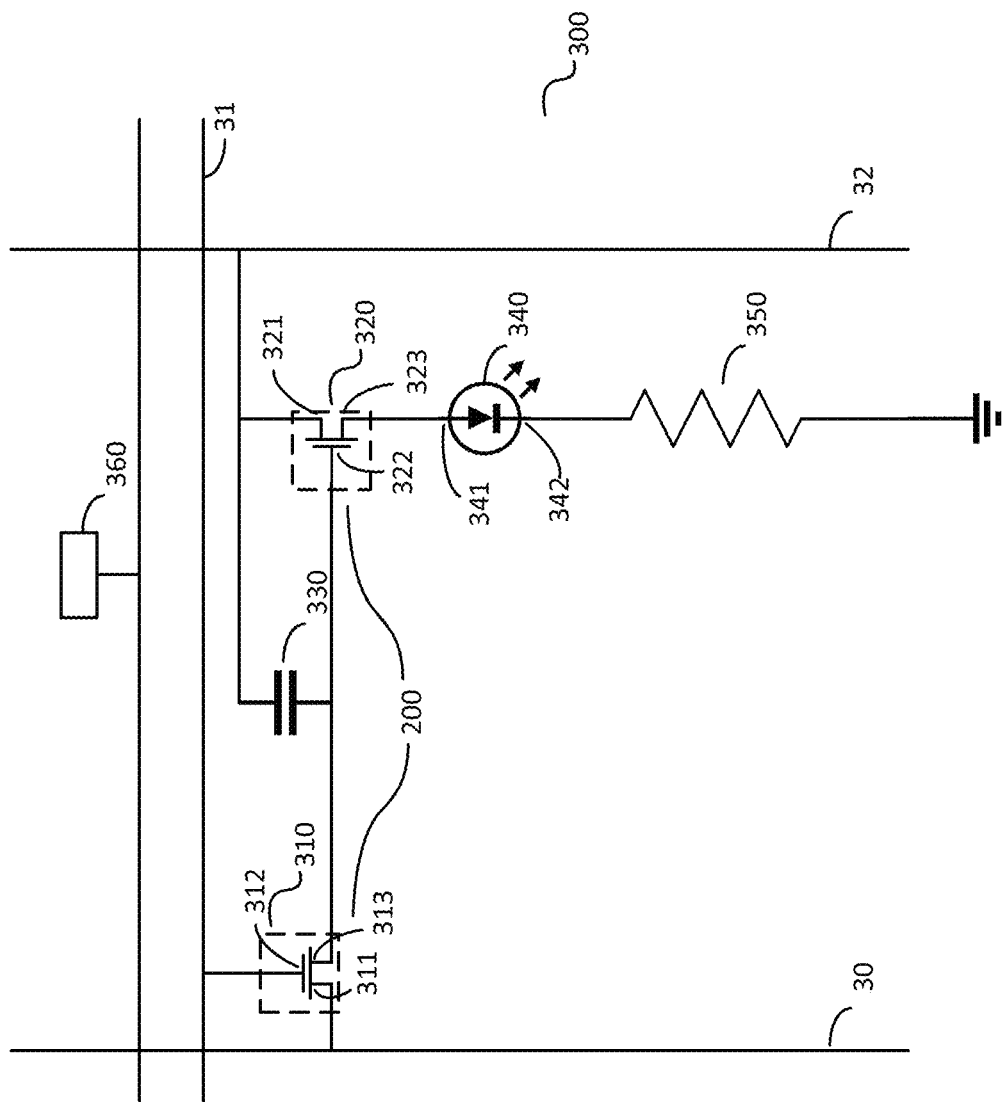
FIG. 3 is a circuit diagram for an example circuit such as may be provided by one or more of the TFTs shown in the backplane layer of FIG. 2.

In some non-limiting examples, the first electrode 120 may comprise an anode 341 (FIG. 3) and/or a cathode 342 (FIG. 3). In some non-limiting examples, the first electrode 120 is an anode 341.

Figure 4:
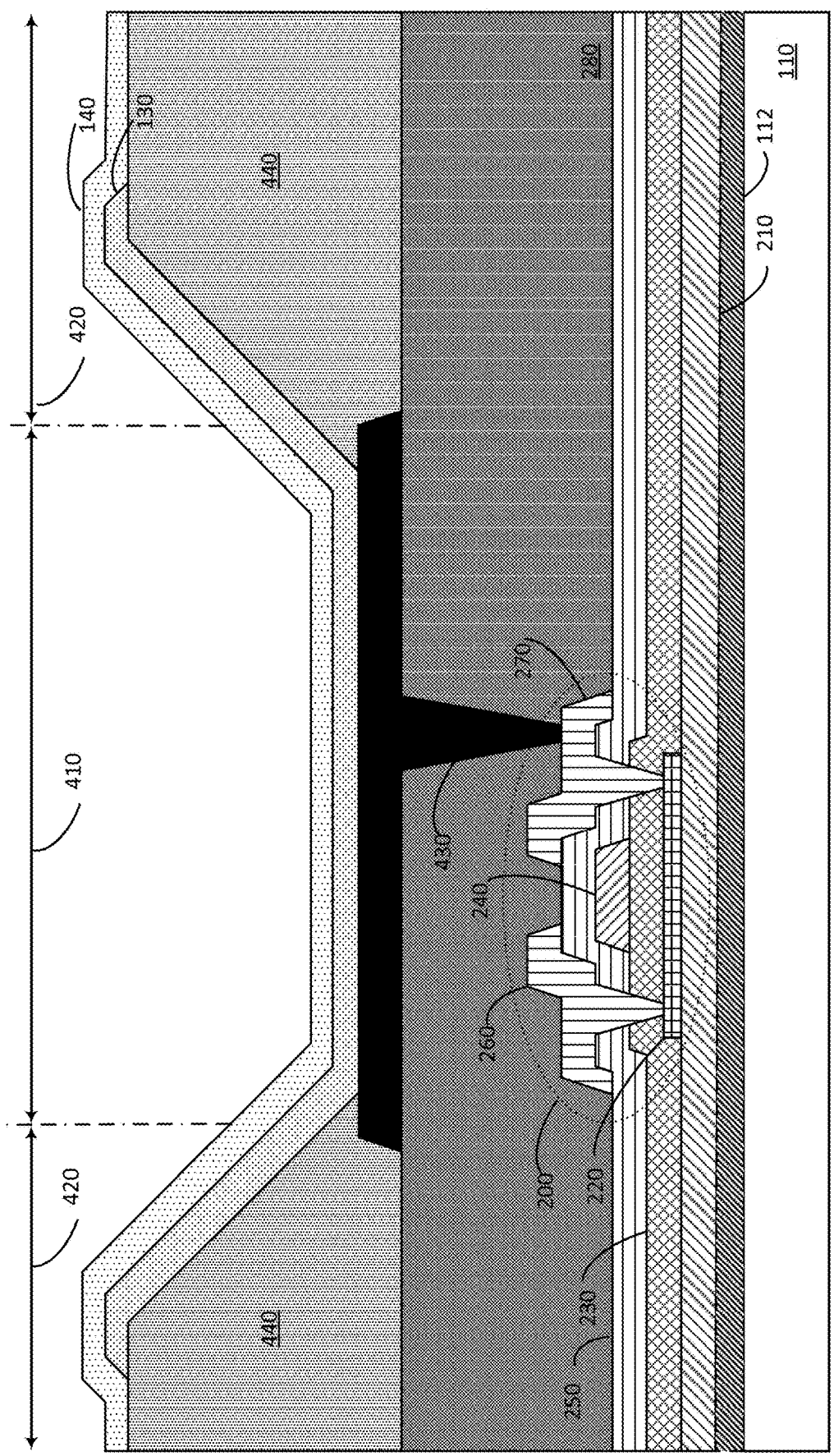
FIG. 4 is a cross-sectional view of the device of FIG. 1.

In some non-limiting examples, the first electrode 120 may be formed by depositing at least one thin conductive film, over (a part of) the substrate 110. In some non-limiting examples, there may be a plurality of first electrodes 120, disposed in a spatial arrangement over a lateral aspect of the substrate 110. In some non-limiting examples, one or more of such at least one first electrodes 120 may be deposited over (a portion of) the TFT insulating layer 280 disposed in a lateral aspect in a spatial arrangement. If so, in some non-limiting examples, at least one of such at least one first electrodes 120 may extend through an opening of the corresponding TFT insulating layer 280, as shown in FIG. 4, to be electrically coupled to an electrode 240, 260, 270 of the TFT structure 200 in the backplane 20. In FIG. 4, a part of the at least one first electrode 120 is shown coupled to the TFT drain electrode 270.

In some non-limiting examples, the at least one first electrode 120 and/or at least one thin film thereof, may comprise various materials, including without limitation, one or more metallic materials, including without limitation, Mg, aluminum (Al), calcium (Ca), Zn, Ag, cadmium (Cd), barium (Ba) and/or Yb, and/or combinations of any two or more thereof, including without limitation, alloys containing any of such materials, one or more metal oxides, including without limitation, a transparent conducting oxide (TCO), including without limitation, ternary compositions such as, without limitation, fluorine tin oxide (FTO), indium zinc oxide (IZO), and/or indium tin oxide (ITO), and/or combinations of any two or more thereof and/or in varying proportions, and/or combinations of any two or more thereof in at least one layer, any one or more of which may be, without limitation, a thin film.

In some non-limiting examples, a thin conductive film comprising the first electrode 120 may be selectively deposited, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

Second Electrode

The second electrode 140 is deposited over the at least one semiconducting layer 130. In some non-limiting examples, the second electrode 140 is electrically coupled to a terminal of the power source 15 and/or to ground. In some non-limiting examples, the second electrode 140 is so coupled through at least one driving circuit 300, which in some non-limiting examples, may incorporate at least one TFT structure 200 in the backplane 20 of the substrate 110.

In some non-limiting examples, the second electrode 140 may comprise an anode 341 and/or a cathode 342. In some non-limiting examples, the second electrode 130 is a cathode 342.

In some non-limiting examples, the second electrode 140 may be formed by depositing a conductive coating 830, in some non-limiting examples, as at least one thin film, over (a part of) the at least one semiconducting layer 130. In some non-limiting examples, there may be a plurality of second electrodes 140, disposed in a spatial arrangement over a lateral aspect of the at least one semiconducting layer 130.

In some non-limiting examples, sheet resistance is a property of a component, layer, and/or part that may alter a characteristic of an electric current passing through such component, layer, and/or part. In some non-limiting examples, a sheet resistance R1 of the second electrode 140 may generally correspond to a sheet resistance of the second electrode 140 measured in isolation from other components, layers, and/or parts of the device 100. In some non-limiting examples, the second electrode 140 may be formed as a thin film. Accordingly, in some non-limiting examples, the sheet resistance R1 for the second electrode 140 may be determined and/or calculated based on the composition, thickness, and/or morphology of such thin film. In some non-limiting examples, the sheet resistance R1 may be about 0.1-1,000 Ω/sqr, about 1-100 Ω/sqr, about 2-50 Ω/sqr, about 3-30 Ω/sqr, about 4-20 Ω/sqr, about 5-15 Ω/sqr, and/or about 10-12 Ω/sqr.

In some non-limiting examples, the second electrode 140 may be comprised of a second electrode material.

In some non-limiting examples, a bond dissociation energy of a metal may correspond to a standard-state enthalpy change measured at 298 K from the breaking of a bond of a diatomic molecule formed by two identical atoms of the metal. Bond dissociation energies may, by way of non-limiting example, be determined based on known literature, including without limitation, Luo, Yu-ran, "Bond dissociation energies" (2010). In some non-limiting examples, the second electrode material may comprise a metal having a bond dissociation energy of at least 10 kJ/mol, at least 50 kJ/mol, at least 100 kJ/mol, at least 150 kJ/mol, at least 180 kJ/mol, and/or at least 200 kJ/mol.

In some non-limiting examples, the second electrode material may comprise a metal having an electronegativity that is less than about 1.4, about 1.3, and/or about 1.2.

In some non-limiting examples, the second electrode material may comprise an element selected from potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), nickel (Ni), titanium (Ti), palladium (Pd), chromium (Cr), iron (Fe), cobalt (Co), zirconium (Zr), platinum (Pt), vanadium (V), niobium (Nb), iridium (Ir), osmium (Os), tantalum (Ta), molybdenum (Mo), and/or tungsten (W). In some non-limiting examples, the element may comprise Cu, Ag, and/or Au. In some non-limiting examples, the element may be Cu. In some non-limiting examples, the element may be Al. In some non-limiting examples, the element may comprise Mg, Zn, Cd, and/or Yb. In some non-limiting examples, the element may comprise Sn, Ni, Ti, Pd, Cr, Fe, and/or Co. In some non-limiting examples, the element may comprise Zr, Pt, V, Nb, Ir, and/or Os. In some non-limiting examples, the element may comprise Ta, Mo, and/or W. In some non-limiting examples, the element may comprise Mg, Ag, Al, Yb, and/or Li. In some non-limiting examples, the element may comprise Mg, Ag, and/or Yb. In some non-limiting examples, the element may comprise Mg, and/or Ag. In some non-limiting examples, the element may be Ag.

In some non-limiting examples, the second electrode material may comprise a pure metal. In some non-limiting examples, the second electrode material is a pure metal. In some non-limiting examples, the second electrode material is pure Ag or substantially pure Ag. In some non-limiting examples, the second electrode material is pure Mg or substantially pure Mg. In some non-limiting examples, the second electrode material is pure Al or substantially pure Al.

In some non-limiting examples, the second electrode material may comprise an alloy. In some non-limiting examples, the alloy may be an Ag-containing alloy, and/or an AgMg-containing alloy.

In some non-limiting examples, the second electrode material may comprise other metals in place of, and/or in combination with, Ag. In some non-limiting examples, the second electrode material may comprise an alloy of Ag with at least one other metal. In some non-limiting examples, the second electrode material may comprise an alloy of Ag with Mg, and/or Yb. In some non-limiting examples, such alloy may be a binary alloy having a composition from about 5 vol. % Ag to about 95 vol. % Ag, with the remainder being the other metal. In some non-limiting examples, the second electrode material comprises Ag and Mg. In some non-limiting examples, the second electrode material comprises an Ag:Mg alloy having a composition from about 1:10 to about 10:1 by volume. In some non-limiting examples, the second electrode material comprises Ag and Yb. In some non-limiting examples, the second electrode material comprises a Yb:Ag alloy having a composition from about 1:20 to about 1-10:1 by volume. In some non-limiting examples, the second electrode material comprises Mg and Yb. In some non-limiting examples, the second electrode material comprises an Mg:Yb alloy. In some non-limiting examples, the second electrode material comprises Ag, Mg, and Yb. In some non-limiting examples, the second electrode material comprises an Ag:Mg:Yb alloy.

In some non-limiting examples, the second electrode material may comprise oxygen (O). In some non-limiting examples, the second electrode material may comprise at least one metal and O. In some non-limiting examples, the second electrode material may comprise a metal oxide. In some non-limiting examples, the metal oxide comprises Zn, indium (I), tin (Sn), antimony (Sb), and/or gallium (Ga). In some non-limiting examples, the metal oxide may be a transparent conducting oxide (TCO). In some non-limiting examples, the TCO may comprise an indium oxide, tin oxide, antimony oxide, and/or gallium oxide. In some non-limiting examples, the TCO may comprise indium titanium oxide (ITO), ZnO, indium zinc oxide (IZO), and/or indium gallium zinc oxide (IGZO). In some non-limiting examples, the TCO may be electrically doped with other elements.

In some non-limiting example, the second electrode 140 may be formed by metal and/or metal alloys.

In some non-limiting examples, the second electrode 140 may comprise at least one metal or metal alloy and at least one metal oxide.

In some non-limiting examples, the second electrode 140 may comprise a plurality of layers of the second electrode material. In some non-limiting examples, the second electrode material of a first one of the plurality of layers may be different from the second electrode material of a second one of the plurality of layers. In some non-limiting examples, the second electrode material of the first one of the plurality of layers may comprise a metal and the second electrode material of the second one of the plurality of layers may comprise a metal oxide.

In some non-limiting examples, the second electrode material of at least one of the plurality of layers may comprise Yb. In some non-limiting examples, the second electrode material of one of the plurality of layers may comprise an Ag-containing alloy and/or an AgMg-containing alloy, and/or pure Ag, substantially pure Ag, pure Mg, and/or substantially pure Mg. In some non-limiting examples, the second electrode 140 is a bilayer Yb/AgMg coating.

In some non-limiting examples, a first one of the plurality of layers that is proximate to the NIC 810 (top-most) may comprise an element selected from Ag, Au, Cu, Al, Sn, Ni, Ti, Pd, Cr, Fe, Co, Zr, Pt, V, Nb, Ir, Os, Ta, Mo, and/or W. In some non-limiting examples, the element may comprise Cu, Ag, and/or Au. In some non-limiting examples, the element may be Cu. In some non-limiting examples, the element may be Al. In some non-limiting examples, the element may comprise Sn, Ti, Pd, Cr, Fe, and/or Co. In some non-limiting examples, the element may comprise Ni, Zr, Pt, V, Nb, Ir, and/or Os. In some non-limiting examples, the element may comprise Ta, Mo, and/or W. In some non-limiting examples, the element may comprise Mg, Ag, and/or Al. In some non-limiting examples, the element may comprise Mg, and/or Ag. In some non-limiting examples, the element may be Ag.

In some non-limiting examples, the second electrode 140 may comprise at least one additional element. In some non-limiting examples, such additional element may be a non-metallic element. In some non-limiting examples, the non-metallic material may be oxygen (O), sulfur (S), nitrogen (N), and/or carbon C. It will be appreciated by those having ordinary skill in the relevant art that, in some non-limiting examples, such additional element(s) may be incorporated into the second electrode 140 as a contaminant, due to the presence of such additional element(s) in the source material, equipment used for deposition, and/or the vacuum chamber environment. In some non-limiting examples, the concentration of such additional element(s) may be limited to be below a threshold concentration. In some non-limiting examples, such additional element(s) may form a compound together with other element(s) of the second electrode 140. In some non-limiting examples, a concentration of the non-metallic element in the conductive coating material may be less than about 1%, about 0.1%, about 0.001%, about 0.0001%, about 0.00001%, about 0.000001% and/or about 0.0000001%. In some non-limiting examples, the conductive coating 830 has a composition in which a combined amount of 0 and C therein is less than about 10%, about 5%, about 1%, about 0.1%, about 0.001%, about 0.0001%, about 0.00001%, about 0.000001%, and/or about 0.0000001% In some non-limiting examples, the second electrode 140 may comprise a closed coating 4530. In some non-limiting examples, the second electrode 140 may comprise a discontinuous coating 1050.

In some non-limiting examples, the second electrode 140 may be disposed in a pattern that may be defined by at least one region therein that is substantially devoid of a closed coating 4530 of the second electrode 140 on the first layer surface in the first portion 115. In some non-limiting examples, the at least one region has disposed thereon, a metal patterning NIC 810. In some non-limiting examples, the at least one region may separate the second electrode 140 into a plurality of discrete fragments thereof. In some non-limiting examples, at least two of such plurality of discrete fragments of the second electrode 140 may be electrically coupled. In some non-limiting examples, at least two of such plurality of discrete fragments of the second electrode 140 may be each electrically coupled to a common conductive layer or coating, including without limitation, the conductive coating 830, to allow the flow of electric current between them. In some non-limiting examples, at least two of such plurality of discrete fragments of the second electrode 140 may be electrically insulated from one another.

In some non-limiting examples, a thin conductive film comprising the second electrode 140 may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

For purposes of simplicity of description, in the present disclosure, a combination of a plurality of elements in a single layer is denoted by separating two such elements by a colon ":", while a plurality of (combination(s) of) elements comprising a plurality of layers in a multi-layer coating are denoted by separating two such layers by a slash "/". In some non-limiting examples, the layer after the slash may be deposited on the layer preceding the slash.

In some non-limiting examples, for a Mg:Ag alloy, such alloy composition may range from about 1:10 to about 10:1 by volume.

In some non-limiting examples, the deposition of the second electrode 140 may be performed using an open-mask and/or a mask-free deposition process.

Driving Circuit

In the present disclosure, the concept of a sub-pixel 2641-2643 (FIG. 26) may be referenced herein, for simplicity of description only, as a sub-pixel 264x. Likewise, in the present disclosure, the concept of a pixel 340 (FIG. 3) may be discussed in conjunction with the concept of at least one sub-pixel 264x thereof. For simplicity of description only, such composite concept is referenced herein as a "(sub-)pixel 340/264x" and such term is understood to suggest either or both of a pixel 340 and/or at least one sub-pixel 264x thereof, unless the context dictates otherwise.

FIG. 3 is a circuit diagram for an example driving circuit such as may be provided by one or more of the TFT structures 200 shown in the backplane 20. In the example shown, the circuit, shown generally at 300 is for an example driving circuit for an active-matrix OLED (AMOLED) device 100 (and/or a (sub-) pixel 340/264x thereof) for supplying current to the first electrode 120 and the second electrode 140, and that controls emission of photons from the device 100 (and/or a (sub-) pixel 340/264x). The circuit 300 shown incorporates a plurality of p-type top-gate thin film TFT structures 200, although the circuit 300 could equally incorporate one or more p-type bottom-gate TFT structures 200, one or more n-type top-gate TFT structures 200, one or more n-type bottom-gate TFT structures 200, one or more other TFT structure(s) 200, and/or any combination thereof, whether or not formed as one or a plurality of thin film layers. The circuit 300 comprises, in some non-limiting examples, a switching TFT 310, a driving TFT 320 and a storage capacitor 330.

A (sub-) pixel 340/264x of the OLED display 100 is represented by a diode 340. The source 311 of the switching TFT 310 is coupled to a data (or, in some non-limiting examples, a column selection) line 30. The gate 312 of the switching TFT 310 is coupled to a gate (or, in some non-limiting examples, a row selection) line 31. The drain 313 of the switching TFT 310 is coupled to the gate 322 of the driving TFT 320.

The source 321 of the driving TFT 320 is coupled to a positive (or negative) terminal of the power source 15. The (positive) terminal of the power source 15 is represented by a power supply line (VDD) 32.

The drain 323 of the driving TFT 320 is coupled to the anode 341 (which may be, in some non-limiting examples, the first electrode 120) of the diode 340 (representing a (sub-) pixel 340/264x of the OLED display 100) so that the driving TFT 320 and the diode 340 (and/or a (sub-) pixel 340/264x of the OLED display 100) are coupled in series between the power supply line (VDD) 32 and ground.

The cathode 342 (which may be, in some non-limiting examples, the second electrode 140) of the diode 340 (representing a (sub-) pixel 340/264x of the OLED display 100) is represented as a resistor 350 in the circuit 300.

The storage capacitor 330 is coupled at its respective ends to the source 321 and gate 322 of the driving TFT 320. The driving TFT 320 regulates a current passed through the diode 340 (representing a (sub-) pixel 340/264x of the OLED display 100) in accordance with a voltage of a charge stored in the storage capacitor 330, such that the diode 340 outputs a desired luminance. The voltage of the storage capacitor 330 is set by the switching TFT 310, coupling it to the data line 30.

In some non-limiting examples, a compensation circuit 370 is provided to compensate for any deviation in transistor properties from variances during the manufacturing process and/or degradation of the switching TFT 310 and/or driving TFT 320 over time.

Semiconducting Layer

In some non-limiting examples, the at least one semiconducting layer 130 may comprise a plurality of layers 131, 133, 135, 137, 139, any of which may be disposed, in some non-limiting examples, in a thin film, in a stacked configuration, which may include, without limitation, any one or more of a hole injection layer (HIL) 131, a hole transport layer (HTL) 133, an emissive layer (EML) 135, an electron transport layer (ETL) 137 and/or an electron injection layer (EIL) 139. In the present disclosure, the term "semiconducting layer(s)" may be used interchangeably with "organic layer(s)" since the layers 131, 133, 135, 137, 139 in an OLED device 100 may in some non-limiting examples, may comprise organic semiconducting materials.

In some non-limiting examples, the at least one semiconducting layer 130 may form a "tandem" structure comprising a plurality of EMLs 135. In some non-limiting examples, such tandem structure may also comprise at least one charge generation layer (CGL).

In some non-limiting examples, a thin film comprising a layer 131, 133, 135, 137, 139 in the stack making up the at least one semiconducting layer 130, may be selectively applied, deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

Those having ordinary skill in the relevant art will readily appreciate that the structure of the device 100 may be varied by omitting and/or combining one or more of the semiconductor layers 131, 133, 135, 137, 139.

Further, any of the layers 131, 133, 135, 137, 139 of the at least one semiconducting layer 130 may comprise any number of sub-layers. Still further, any of such layers 131, 133, 135, 137, 139 and/or sub-layer(s) thereof may comprise various mixture(s) and/or composition gradient(s). In addition, those having ordinary skill in the relevant art will appreciate that the device 100 may comprise one or more layers containing inorganic and/or organometallic materials and is not necessarily limited to devices composed solely of organic materials. By way of non-limiting example, the device 100 may comprise one or more quantum dots.

In some non-limiting examples, the HIL 131 may be formed using a hole injection material, which may facilitate injection of holes by the anode 341.

In some non-limiting examples, the HTL 133 may be formed using a hole transport material, which may, in some non-limiting examples, exhibit high hole mobility.

In some non-limiting examples, the ETL 137 may be formed using an electron transport material, which may, in some non-limiting examples, exhibit high electron mobility.

In some non-limiting examples, the EIL 139 may be formed using an electron injection material, which may facilitate injection of electrons by the cathode 342.

In some non-limiting examples, the EML 135 may be formed, by way of non-limiting example, by doping a host material with at least one emitter material. In some non-limiting examples, the emitter material may be a fluorescent emitter, a phosphorescent emitter, a thermally activated delayed fluorescence (TADF) emitter and/or a plurality of any combination of these.

In some non-limiting examples, the device 100 may be an OLED in which the at least one semiconducting layer 130 comprises at least an EML 135 interposed between conductive thin film electrodes 120, 140, whereby, when a potential difference is applied across them, holes are injected into the at least one semiconducting layer 130 through the anode 341 and electrons are injected into the at least one semiconducting layer 130 through the cathode 342.

The injected holes and electrons tend to migrate through the various layers 131, 133, 135, 137, 139 until they reach and meet each other. When a hole and an electron are in close proximity, they tend to be attracted to one another due to a Coulomb force and in some examples, may combine to form a bound state electron-hole pair referred to as an exciton. Especially if the exciton is formed in the EML 135, the exciton may decay through a radiative recombination process, in which a photon is emitted. The type of radiative recombination process may depend upon a spin state of an exciton. In some examples, the exciton may be characterized as having a singlet or a triplet spin state. In some non-limiting examples, radiative decay of a singlet exciton may result in fluorescence. In some non-limiting examples, radiative decay of a triplet exciton may result in phosphorescence.

More recently, other photon emission mechanisms for OLEDs have been proposed and investigated, including without limitation, TADF. In some non-limiting examples, TADF emission occurs through a conversion of triplet excitons into single excitons via a reverse inter-system crossing process with the aid of thermal energy, followed by radiative decay of the singlet excitons.

In some non-limiting examples, an exciton may decay through a non-radiative process, in which no photon is released, especially if the exciton is not formed in the EML 135.

In the present disclosure, the term "internal quantum efficiency" (IQE) of an OLED device 100 refers to a proportion of all electron-hole pairs generated in the device 100 that decay through a radiative recombination process and emit a photon.

In the present disclosure, the term "external quantum efficiency" (EQE) of an OLED device 100 refers to a proportion of charge carriers delivered to the device 100 relative to a number of photons emitted by the device 100. In some non-limiting examples, an EQE of 100% indicates that one photon is emitted for each electron that is injected into the device 100.

Those having ordinary skill in the relevant art will appreciate that the EQE of a device 100 may, in some non-limiting examples, be substantially lower than the IQE of the same device 100. A difference between the EQE and the IQE of a given device 100 may in some non-limiting examples be attributable to a number of factors, including without limitation, adsorption and reflection of photons caused by various components of the device 100.

In some non-limiting examples, the device 100 may be an electro-luminescent quantum dot device in which the at least one semiconducting layer 130 comprises an active layer comprising at least one quantum dot. When current is provided by the power source 15 to the first electrode 120 and second electrode 140, photons are emitted from the active layer comprising the at least one semiconducting layer 130 between them.

Those having ordinary skill in the relevant art will readily appreciate that the structure of the device 100 may be varied by the introduction of one or more additional layers (not shown) at appropriate position(s) within the at least one semiconducting layer 130 stack, including without limitation, a hole blocking layer (not shown), an electron blocking layer (not shown), an additional charge transport layer (not shown) and/or an additional charge injection layer (not shown).

Barrier Coating

In some non-limiting examples, a barrier coating 1650 may be provided to surround and/or encapsulate the first electrode 120, second electrode 140, and the various layers of the at least one semiconducting layer 130 and/or the substrate 110 disposed thereon of the device 100.

In some non-limiting examples, the barrier coating 1650 may be provided to inhibit the various layers 120, 130, 140 of the device 100, including the at least one semiconducting layer 130 and/or the cathode 342 from being exposed to moisture and/or ambient air, since these layers 120, 130, 140 may be prone to oxidation.

In some non-limiting examples, application of the barrier coating 1650 to a highly non-uniform surface may increase a likelihood of poor adhesion of the barrier coating 1650 to such surface.

In some non-limiting examples, the absence of a barrier coating 1650 and/or a poorly-applied barrier coating 1650 may cause and/or contribute to defects in and/or partial and/or total failure of the device 100. In some non-limiting examples, a poorly-applied barrier coating 1650 may reduce adhesion of the barrier coating 1650 to the device 100. In some non-limiting examples, poor adhesion of the barrier coating 1650 may increase a likelihood of the barrier coating 1650 peeling off the device 100 in whole or in part, especially if the device 100 is bent and/or flexed. In some non-limiting examples, a poorly-applied barrier coating 1650 may allow air pockets to be trapped, during application of the barrier coating 1650, between the barrier coating 1650 and an underlying surface of the device 100 to which the barrier coating 1650 was applied.

In some non-limiting examples, the barrier coating 1650 may be a thin film encapsulation (TFE) layer 2050 (FIG. 20B) and may be selectively applied, deposited and/or processed using a variety of techniques, including without limitation, evaporation (including without limitation, thermal evaporation and/or electron beam evaporation), photo-lithography, printing (including without limitation, ink jet and/or vapor jet printing, reel-to-reel printing and/or microcontact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

In some non-limiting examples, the barrier coating 1650 may be provided by laminating a pre-formed barrier film onto the device 100. In some non-limiting examples, the barrier coating 1650 may comprise a multi-layer coating comprising at least one of an organic material, an inorganic material and/or any combination thereof. In some non-limiting examples, the barrier coating 1550 may further comprise a getter material and/or a desiccant.

Lateral Aspect

In some non-limiting examples, including where the OLED device 100 comprises a lighting panel, an entire lateral aspect of the device 100 may correspond to a single lighting element. As such, the substantially planar cross-sectional profile shown in FIG. 1 may extend substantially along the entire lateral aspect of the device 100, such that photons are emitted from the device 100 substantially along the entirety of the lateral extent thereof. In some non-limiting examples, such single lighting element may be driven by a single driving circuit 300 of the device 100.

In some non-limiting examples, including where the OLED device 100 comprises a display module, the lateral aspect of the device 100 may be sub-divided into a plurality of emissive regions 1910 of the device 100, in which the cross-sectional aspect of the device structure 100, within each of the emissive region(s) 1910 shown, without limitation, in FIG. 1 causes photons to be emitted therefrom when energized.

Emissive Regions

In some non-limiting examples, individual emissive regions 1910 of the device 100 may be laid out in a lateral pattern. In some non-limiting examples, the pattern may extend along a first lateral direction. In some non-limiting examples, the pattern may also extend along a second lateral direction, which in some non-limiting examples, may be substantially normal to the first lateral direction. In some non-limiting examples, the pattern may have a number of elements in such pattern, each element being characterized by one or more features thereof, including without limitation, a wavelength of light emitted by the emissive region 1910 thereof, a shape of such emissive region 1910, a dimension (along either or both of the first and/or second lateral direction(s)), an orientation (relative to either and/or both of the first and/or second lateral direction(s)) and/or a spacing (relative to either or both of the first and/or second lateral direction(s)) from a previous element in the pattern. In some non-limiting examples, the pattern may repeat in either or both of the first and/or second lateral direction(s).

In some non-limiting examples, each individual emissive region 1910 of the device 100 is associated with, and driven by, a corresponding driving circuit 300 within the backplane 20 of the device 100, in which the diode 340 corresponds to the OLED structure for the associated emissive region 1910. In some non-limiting examples, including without limitation, where the emissive regions 1910 are laid out in a regular pattern extending in both the first (row) lateral direction and the second (column) lateral direction, there may be a signal line 30, 31 in the backplane 20, which may be the gate line (or row selection) line 31, corresponding to each row of emissive regions 1910 extending in the first lateral direction and a signal line 30, 31, which may in some non-limiting examples be the data (or column selection) line 30, corresponding to each column of emissive regions 1910 extending in the second lateral direction. In such a non-limiting configuration, a signal on the row selection line 31 may energize the respective gates 312 of the switching TFT(s) 310 electrically coupled thereto and a signal on the data line 30 may energize the respective sources of the switching TFT(s) 310 electrically coupled thereto, such that a signal on a row selection line 31/data line 30 pair will electrically couple and energies, by the positive terminal (represented by the power supply line VDD 32) of the power source 15, the anode 341 of the OLED structure of the emissive region 1910 associated with such pair, causing the emission of a photon therefrom, the cathode 342 thereof being electrically coupled to the negative terminal of the power source 15.

In some non-limiting examples, each emissive region 1910 of the device 100 corresponds to a single display pixel 340. In some non-limiting examples, each pixel 340 emits light at a given wavelength spectrum. In some non-limiting examples, the wavelength spectrum corresponds to a colour in, without limitation, the visible light spectrum.

In some non-limiting examples, each emissive region 1910 of the device 100 corresponds to a sub-pixel 264x of a display pixel 340. In some non-limiting examples, a plurality of sub-pixels 264x may combine to form, or to represent, a single display pixel 340.

In some non-limiting examples, a single display pixel 340 may be represented by three sub-pixels 2641-2643. In some non-limiting examples, the three sub-pixels 2641-2643 may be denoted as, respectively, R(ed) sub-pixels 2641, G(reen) sub-pixels 2642 and/or B(lue) sub-pixels 2643. In some non-limiting examples, a single display pixel 340 may be represented by four sub-pixels 264x, in which three of such sub-pixels 264x may be denoted as R, G and B sub-pixels 2641-2643 and the fourth sub-pixel 264x may be denoted as a W(hite) sub-pixel 264x. In some non-limiting examples, the emission spectrum of the light emitted by a given sub-pixel 264x corresponds to the colour by which the sub-pixel 264x is denoted. In some non-limiting examples, the wavelength of the light does not correspond to such colour but further processing is performed, in a manner apparent to those having ordinary skill in the relevant art, to transform the wavelength to one that does so correspond.

Since the wavelength of sub-pixels 264x of different colours may be different, the optical characteristics of such sub-pixels 264x may differ, especially if a common electrode 120, 140 having a substantially uniform thickness profile is employed for sub-pixels 264x of different colours.

When a common electrode 120, 140 having a substantially uniform thickness is provided as the second electrode 140 in a device 100, the optical performance of the device 100 may not be readily be fine-tuned according to an emission spectrum associated with each (sub-)pixel 340/ 264x. The second electrode 140 used in such OLED devices 100 may in some non-limiting examples, be a common electrode 120, 140 coating a plurality of (sub-)pixels 340/ 264x. By way of non-limiting example, such common electrode 120, 140 may be a relatively thin conductive film having a substantially uniform thickness across the device 100. While efforts have been made in some non-limiting examples, to tune the optical microcavity effects associated with each (sub-)pixel 340/264x color by varying a thickness of organic layers disposed within different (sub-)pixel(s) 340/264x, such approach may, in some non-limiting examples, provide a significant degree of tuning of the optical microcavity effects in at least some cases. In addition, in some non-limiting examples, such approach may be difficult to implement in an OLED display production environment.

As a result, the presence of optical interfaces created by numerous thin-film layers and coatings with different refractive indices, such as may in some non-limiting examples be used to construct opto-electronic devices including without limitation OLED devices 100, may create different optical microcavity effects for sub-pixels 264x of different colours.

Some factors that may impact an observed microcavity effect in a device 100 includes, without limitation, the total path length (which in some non-limiting examples may correspond to the total thickness of the device 100 through which photons emitted therefrom will travel before being out-coupled) and the refractive indices of various layers and coatings.

In some non-limiting examples, modulating the thickness of an electrode 120, 140 in and across a lateral aspect 410 of emissive region(s) 1910 of a (sub-) pixel 340/264x may impact the microcavity effect observable. In some non-limiting examples, such impact may be attributable to a change in the total optical path length.

In some non-limiting examples, this may be particularly the case where the electrode 120, 140 is formed of at least one conductive coating 830. In some non-limiting examples, the total optical path length, and concomitantly, the optical microcavity effect observable, may also be modulated by a change in a thickness of any layer, including without limitation, the NIC 810, NPC 1120, and/or a capping layer (CPL) 3610 (FIG. 36A), disposed in a given emissive region 1910.

In some non-limiting examples, the optical properties of the device 100, and/or in some non-limiting examples, across the lateral aspect 410 of emissive region(s) 1910 of a (sub-) pixel 340/264x that may be varied by modulating at least one optical microcavity effect, include, without limitation, the emission spectrum, the intensity (including without limitation, luminous intensity) and/or angular distribution of emitted light, including without limitation, an angular dependence of a brightness and/or color shift of the emitted light.

In some non-limiting examples, a sub-pixel 264x is associated with a first set of other sub-pixels 264x to represent a first display pixel 340 and also with a second set of other sub-pixels 264x to represent a second display pixel 340, so that the first and second display pixels 340 may have associated therewith, the same sub-pixel(s) 264x.

The pattern and/or organization of sub-pixels 264x into display pixels 340 continues to develop. All present and future patterns and/or organizations are considered to fall within the scope of the present disclosure.

Non-Emissive Regions

In some non-limiting examples, the various emissive regions 1910 of the device 100 are substantially surrounded and separated by, in at least one lateral direction, one or more non-emissive regions 1920, in which the structure and/or configuration along the cross-sectional aspect, of the device structure 100 shown, without limitation, in FIG. 1, is varied, so as to substantially inhibit photons to be emitted therefrom. In some non-limiting examples, the non-emissive regions 1920 comprise those regions in the lateral aspect, that are substantially devoid of an emissive region 1910.

Thus, as shown in the cross-sectional view of FIG. 4, the lateral topology of the various layers of the at least one semiconducting layer 130 may be varied to define at least one emissive region 1910, surrounded (at least in one lateral direction) by at least one non-emissive region 1920.

In some non-limiting examples, the emissive region 1910 corresponding to a single display (sub-) pixel 340/264x may be understood to have a lateral aspect 410, surrounded in at least one lateral direction by at least one non-emissive region 1920 having a lateral aspect 420.

A non-limiting example of an implementation of the cross-sectional aspect of the device 100 as applied to an emissive region 1910 corresponding to a single display (sub-) pixel 340/264x of an OLED display 100 will now be described. While features of such implementation are shown to be specific to the emissive region 1910, those having ordinary skill in the relevant art will appreciate that in some non-limiting examples, more than one emissive region 1910 may encompass common features.

In some non-limiting examples, the first electrode 120 may be disposed over an exposed layer surface 111 of the device 100, in some non-limiting examples, within at least a part of the lateral aspect 410 of the emissive region 1910. In some non-limiting examples, at least within the lateral aspect 410 of the emissive region 1910 of the (sub-) pixel(s) 340/264x, the exposed layer surface 111, may, at the time of deposition of the first electrode 120, comprise the TFT insulating layer 280 of the various TFT structures 200 that make up the driving circuit 300 for the emissive region 1910 corresponding to a single display (sub-) pixel 340/264x.

In some non-limiting examples, the TFT insulating layer 280 may be formed with an opening 430 extending therethrough to permit the first electrode 120 to be electrically coupled to one of the TFT electrodes 240, 260, 270, including, without limitation, as shown in FIG. 4, the TFT drain electrode 270.

Those having ordinary skill in the relevant art will appreciate that the driving circuit 300 comprises a plurality of TFT structures 200, including without limitation, the switching TFT 310, the driving TFT 320 and/or the storage capacitor 330. In FIG. 4, for purposes of simplicity of illustration, only one TFT structure 200 is shown, but it will be appreciated by those having ordinary skill in the relevant art, that such TFT structure 200 is representative of such plurality thereof that comprise the driving circuit 300.

In a cross-sectional aspect, the configuration of each emissive region 1910 may, in some non-limiting examples, be defined by the introduction of at least one pixel definition layer (PDL) 440 substantially throughout the lateral aspects 420 of the surrounding non-emissive region(s) 1920. In some non-limiting examples, the PDLs 440 may comprise an insulating organic and/or inorganic material.

In some non-limiting examples, the PDLs 440 are deposited substantially over the TFT insulating layer 280, although, as shown, in some non-limiting examples, the PDLs 440 may also extend over at least a part of the deposited first electrode 120 and/or its outer edges.

In some non-limiting examples, as shown in FIG. 4, the cross-sectional thickness and/or profile of the PDLs 440 may impart a substantially valley-shaped configuration to the emissive region 1910 of each (sub-) pixel 340/264x by a region of increased thickness along a boundary of the lateral aspect 420 of the surrounding non-emissive region 1920 with the lateral aspect 410 of the surrounded emissive region 1910, corresponding to a (sub-) pixel 340/264x.

In some non-limiting examples, the profile of the PDLs 440 may have a reduced thickness beyond such valley-shaped configuration, including without limitation, away from the boundary between the lateral aspect 420 of the surrounding non-emissive region 1920 and the lateral aspect 410 of the surrounded emissive region 1910, in some non-limiting examples, substantially well within the lateral aspect 420 of such non-emissive region 1920.

While the PDL(s) 440 have been generally illustrated as having a linearly-sloped surface to form a valley-shaped configuration that define the emissive region(s) 1910 surrounded thereby, those having ordinary skill in the relevant art will appreciate that in some non-limiting examples, at least one of the shape, aspect ratio, thickness, width and/or configuration of such PDL(s) 440 may be varied. By way of non-limiting example, a PDL 440 may be formed with a steeper or more gradually-sloped part. In some non-limiting examples, such PDL(s) 440 may be configured to extend substantially normally away from a surface on which it is deposited, that covers one or more edges of the first electrode 120. In some non-limiting examples, such PDL(s) 440 may be configured to have deposited thereon at least one semiconducting layer 130 by a solution-processing technology, including without limitation, by printing, including without limitation, ink-jet printing.

In some non-limiting examples, the at least one semiconducting layer 130 may be deposited over the exposed layer surface 111 of the device 100, including at least a part of the lateral aspect 410 of such emissive region 1910 of the (sub-) pixel(s) 340/264x. In some non-limiting examples, at least within the lateral aspect 410 of the emissive region 1910 of the (sub-) pixel(s) 340/264x, such exposed layer surface 111, may, at the time of deposition of the at least one semiconducting layer 130 (and/or layers 131, 133, 135, 137, 139 thereof), comprise the first electrode 120.

In some non-limiting examples, the at least one semiconducting layer 130 may also extend beyond the lateral aspect 410 of the emissive region 1910 of the (sub-) pixel(s)

340/264x and at least partially within the lateral aspects 420 of the surrounding non-emissive region(s) 1920. In some non-limiting examples, such exposed layer surface 111 of such surrounding non-emissive region(s) 1920 may, at the time of deposition of the at least one semiconducting layer 130, comprise the PDL(s) 440.

In some non-limiting examples, the second electrode 140 may be disposed over an exposed layer surface 111 of the device 100, including at least a part of the lateral aspect 410 of the emissive region 1910 of the (sub-) pixel(s) 340/264x. In some non-limiting examples, at least within the lateral aspect 410 of the emissive region 1910 of the (sub-) pixel(s) 340/264x, such exposed layer surface 111, may, at the time of deposition of the second electrode 130, comprise the at least one semiconducting layer 130.

In some non-limiting examples, the second electrode 140 may also extend beyond the lateral aspect 410 of the emissive region 1910 of the (sub-) pixel(s) 340/264x and at least partially within the lateral aspects 420 of the surrounding non-emissive region(s) 1920. In some non-limiting examples, such exposed layer surface 111 of such surrounding non-emissive region(s) 1920 may, at the time of deposition of the second electrode 140, comprise the PDL(s) 440.

In some non-limiting examples, the second electrode 140 may extend throughout substantially all or a substantial part of the lateral aspects 420 of the surrounding non-emissive region(s) 1920.

Transmissivity

Because the OLED device 100 emits photons through either or both of the first electrode 120 (in the case of a bottom-emission and/or a double-sided emission device), as well as the substrate 110 and/or the second electrode 140 (in the case of a top-emission and/or double-sided emission device), it may be desirable to make either or both of the first electrode 120 and/or the second electrode 140 substantially photon- (or light)-transmissive ("transmissive"), in some non-limiting examples, at least across a substantial part of the lateral aspect 410 of the emissive region(s) 1910 of the device 100. In the present disclosure, such a transmissive element, including without limitation, an electrode 120, 140, a material from which such element is formed, and/or property thereof, may comprise an element, material and/or property thereof that is substantially transmissive ("transparent"), and/or, in some non-limiting examples, partially transmissive ("semi-transparent"), in some non-limiting examples, in at least one wavelength range.

A variety of mechanisms have been adopted to impart transmissive properties to the device 100, at least across a substantial part of the lateral aspect 410 of the emissive region(s) 1910 thereof.

In some non-limiting examples, including without limitation, where the device 100 is a bottom-emission device and/or a double-sided emission device, the TFT structure(s) 200 of the driving circuit 300 associated with an emissive region 1910 of a (sub-) pixel 340/264x, which may at least partially reduce the transmissivity of the surrounding substrate 110, may be located within the lateral aspect 420 of the surrounding non-emissive region(s) 1920 to avoid impacting the transmissive properties of the substrate 110 within the lateral aspect 410 of the emissive region 1910.

In some non-limiting examples, where the device 100 is a double-sided emission device, in respect of the lateral aspect 410 of an emissive region 1910 of a (sub-) pixel 340/264x, a first one of the electrode 120, 140 may be made substantially transmissive, including without limitation, by at least one of the mechanisms disclosed herein, in respect of the lateral aspect 410 of neighbouring and/or adjacent (sub-) pixel(s) 340/264x, a second one of the electrodes 120, 140 may be made substantially transmissive, including without limitation, by at least one of the mechanisms disclosed herein. Thus, the lateral aspect 410 of a first emissive region 1910 of a (sub-) pixel 340/264x may be made substantially top-emitting while the lateral aspect 410 of a second emissive region 1910 of a neighbouring (sub-) pixel 340/264x may be made substantially bottom-emitting, such that a subset of the (sub-) pixel(s) 340/264x are substantially top-emitting and a subset of the (sub-) pixel(s) 340/264x are substantially bottom-emitting, in an alternating (sub-) pixel 340/264x sequence, while only a single electrode 120, 140 of each (sub-) pixel 340/264x is made substantially transmissive.

In some non-limiting examples, a mechanism to make an electrode 120, 140, in the case of a bottom-emission device and/or a double-sided emission device, the first electrode 120, and/or in the case of a top-emission device and/or a double-sided emission device, the second electrode 140, transmissive is to form such electrode 120, 140 of a transmissive thin film.

In some non-limiting examples, a sheet resistance R2 of the conductive coating 830 may generally correspond to a sheet resistance of the conductive coating 380 measured in isolation from other components, layers, and/or parts of the device 100. In some non-limiting examples, the conductive coating 830 may be formed as a thin film. Accordingly, in some non-limiting examples, the sheet resistance R3 for the conductive coating 830 may be determined and/or calculated based on the composition, thickness, and/or morphology of such thin film. In some non-limiting examples, the sheet resistance R3 may be less than about 10 Ω/sqr, be less than about 5 Ω/sqr, be less than about 1 Ω/sqr, be less than about 0.5 Ω/sqr, 0.2 Ω/sqr, and/or be less than about 0.1 Ω/sqr.

In some non-limiting examples, the conductive coating 830 may comprise a conductive coating material 831.

In some non-limiting examples, the conductive coating material 831 may comprise a metal having a bond dissociation energy of the conductive coating material 831 of less than 300 kJ/mol, less than 200 kJ/mol, less than 165 kJ/mol, less than 150 kJ/mol, less than 100 kJ/mol, less than 50 kJ/mol, and/or less than 20 kJ/mol.

In some non-limiting examples, the conductive coating material 831 may comprise an element selected from K, Na, Li, Ba, Cs, Yb, Ag, Au, Cu, Al, Mg, Zn, Cd, Sn, and/or yttrium (Y). In some non-limiting examples, the element may comprise K, Na, Li, Ba, Cs, Tb, Ag, Au, Cu, Al, and/or Mg. In some non-limiting examples, the element may comprise Cu, Ag, and/or Au. In some non-limiting examples, the element may be Cu. In some non-limiting examples, the element may be Al. In some non-limiting examples, the element may comprise Mg, Zn, Cd, and/or Yb. In some non-limiting examples, the element may comprise Mg, Ag, Al, Yb, and/or Li. In some non-limiting examples, the element may comprise Mg, Ag, and/or Yb. In some non-limiting examples, the element may comprise Mg, and/or Ag. In some non-limiting examples, the element may be Ag.

In some non-limiting examples, the conductive coating material 831 may comprise a pure metal. In some non-limiting examples, the conductive coating 830 is a pure metal. In some non-limiting examples, the conductive coating 830 is pure Ag or substantially pure Ag. In some non-limiting examples, the substantially pure Ag may have a purity of at least about 95%, at least about 99%, at least about 99.9%, at least about 99.99%, at least about 99.999%, and/or at least about 99.9995%. In some non-limiting examples, the conductive coating 830 is pure Mg or substantially pure Mg. In some non-limiting examples, the substantially pure Mg may have a purity of at least about 95%, at least about 99%, at least about 99.9%, at least about 99.99%, at least about 99.999%, and/or at least about 99.9995%.

In some non-limiting examples, the conductive coating 830 may comprise an alloy. In some non-limiting examples, the alloy may be an Ag-containing alloy, an Mg-containing alloy, and/or an AgMg-containing alloy. In some non-limiting examples, the AgMg-containing alloy may have an alloy composition that may range from 1:10 (Ag:Mg) to about 10:1 by volume.

In some non-limiting examples, the conductive coating material 831 may comprise other metals in place of, and/or in combination with, Ag. In some non-limiting examples, the conductive coating material 831 may comprise an alloy of Ag with at least one other metal. In some non-limiting examples, the conductive coating material 831 may comprise an alloy of Ag with Mg, and/or Yb. In some non-limiting examples, such alloy may be a binary alloy having a composition from about 5 vol. % Ag to about 95 vol. % Ag, with the remainder being the other metal. In some non-limiting examples, the conductive coating material 831 comprises Ag and Mg. In some non-limiting examples, the conductive coating material 831 comprises an Ag:Mg alloy having a composition from about 1:10 to about 10:1 by volume. In some non-limiting examples, the conductive coating material 831 comprises Ag and Yb. In some non-limiting examples, the conductive coating material 831 comprises a Yb:Ag alloy having a composition from about 1:20 to about 1-10:1 by volume. In some non-limiting examples, the conductive coating material 831 comprises Mg and Yb. In some non-limiting examples, the conductive coating material 831 comprises an Mg:Yb alloy. In some non-limiting examples, the conductive coating material 831 comprises Ag, Mg, and Yb. In some non-limiting examples, the conductive coating material 831 comprises an Ag:Mg:Yb alloy.

In some non-limiting examples, the conductive coating 830 may comprise at least one additional element. In some non-limiting examples, such additional element may be a non-metallic element. In some non-limiting examples, the non-metallic material may be oxygen (O), sulfur (S), nitrogen (N), and/or carbon (C). It will be appreciated by those having ordinary skill in the relevant art that, in some non-limiting examples, such additional element(s) may be incorporated into the conductive coating 830 as a contaminant, due to the presence of such additional element(s) in the source material, equipment used for deposition, and/or the vacuum chamber environment. In some non-limiting examples, the concentration of such additional element(s) may be limited to be below a threshold concentration. In some non-limiting examples, such additional element(s) may form a compound together with other element(s) of the conductive coating 830. In some non-limiting examples, a concentration of the non-metallic element in the conductive coating material 831 may be less than about 1%, about 0.1%, about 0.001%, about 0.0001%, about 0.00001%, about 0.000001% and/or about 0.0000001%. In some non-limiting examples, the conductive coating 830 has a composition in which a combined amount of O and C therein is less than about 10%, about 5%, about 1%, about 0.1%, about 0.001%, about 0.0001%, about 0.00001%, about 0.000001%, and/or about 0.0000001%

It has now been, somewhat surprisingly, found that reducing a concentration of certain non-metallic element in the conductive coating 830 may facilitate selected deposition of the conductive coating 830. Without wishing to be bound by any particular theory, it may be postulated that certain non-metallic elements, such as, by way of non-limiting examples, O and/or C, when present in the vapour flux of the conductive coating 830 and/or in the deposition chamber and/or environment, may be deposited onto the surface of the NIC 810 to act as nucleation sites for the metallic element(s) of the conductive coating 830. It may be postulated that reducing a concentration of such non-metallic elements that could act as nucleation sites may facilitate reducing an amount of conductive coating material 831 deposited on the exposed layer surface 111 of the NIC 810.

In some non-limiting examples, the conductive coating 830 and the metallic coating 138 may comprise a common metal. In some non-limiting examples, the conductive coating material 831 and the metallic coating material have the same composition.

In some non-limiting examples, the conductive coating 830 may comprise a plurality of layers of the conductive coating material 831. In some non-limiting examples, the conductive coating material 831 of a first one of the plurality of layers may be different from the conductive coating material 831 of a second one of the plurality of layers. In some non-limiting examples, the conductive coating 830 may comprise a multilayer coating. In some non-limiting examples, such multilayer coating may comprise Yb/Ag, Yb/Mg, Yb/Mg:Ag, Yb/Yb:Ag, Yb/Ag/Mg, and/or Yb/Mg/Ag.

In some non-limiting examples, especially in the case of such thin conductive films, a relatively thin layer thickness may be up to substantially a few tens of nm so as to contribute to enhanced transmissive qualities but also favorable optical properties (including without limitation, reduced microcavity effects) for use in an OLED device 100.

In some non-limiting examples, such thin conductive films may comprise an intermediate stage thin film.

In some non-limiting examples, a reduction in the thickness of an electrode 120, 140 to promote transmissive qualities may be accompanied by an increase in the sheet resistance of the electrode 120, 140.

In some non-limiting examples, a device 100 having at least one electrode 120, 140 with a high sheet resistance creates a large current-resistance (IR) drop when coupled to the power source 15, in operation. In some non-limiting examples, such an IR drop may be compensated for, to some extent, by increasing a level (VDD) of the power source 15. However, in some non-limiting examples, increasing the level of the power source 15 to compensate for the IR drop due to high sheet resistance, for at least one (sub-) pixel 340/264x may call for increasing the level of a voltage to be supplied to other components to maintain effective operation of the device 100.

In some non-limiting examples, to reduce power supply demands for a device 100 without significantly impacting an ability to make an electrode 120, 140 substantially transmissive (by employing at least one thin film layer of any combination of TCOs, thin metal films and/or thin metallic alloy films), an auxiliary electrode 1750 and/or busbar structure 4150 may be formed on the device 100 to allow current to be carried more effectively to various emissive region(s) of the device 100, while at the same time, reducing the sheet resistance and its associated IR drop of the transmissive electrode 120, 140.

In some non-limiting examples, a sheet resistance specification, for a common electrode 120, 140 of an AMOLED display device 100, may vary according to a number of parameters, including without limitation, a (panel) size of the device 100 and/or a tolerance for voltage variation across the device 100. In some non-limiting examples, the sheet resistance specification may increase (that is, a lower sheet resistance is specified) as the panel size increases. In some non-limiting examples, the sheet resistance specification may increase as the tolerance for voltage variation decreases.

In some non-limiting examples, a sheet resistance specification may be used to derive an example thickness of an auxiliary electrode 1750 and/or a busbar 4150 to comply with such specification for various panel sizes. In one non-limiting example, an aperture ratio of 0.64 was assumed for all display panel sizes and a thickness of the auxiliary electrode 1750 for various example panel sizes were calculated for example voltage tolerances of 0.1 V and 0.2 V in Table 1 below.

TABLE 1

Example Auxiliary Electrode Thickness for Various Panel Size and Voltage Tolerances

| Panel Size (in.) | | 9.7 | 12.9 | 15.4 | 27 | 65 |
|---|---|---|---|---|---|---|
| Specified Thickness (nm) | @0.1 V | 132 | 239 | 335 | 1200 | 6500 |
| | @0.2 V | 67 | 117 | 174 | 516 | 2800 |

By way of non-limiting example, for a top-emission device, the second electrode 140 may be made transmissive. On the other hand, in some non-limiting examples, such auxiliary electrode 1750 and/or busbar 4150 may not be substantially transmissive but may be electrically coupled to the second electrode 140, including without limitation, by deposition of a conductive coating 830 therebetween, to reduce an effective sheet resistance of the second electrode 140.

In some non-limiting examples, such auxiliary electrode 1750 may be positioned and/or shaped in either or both of a lateral aspect and/or cross-sectional aspect so as not to interfere with the emission of photons from the lateral aspect 410 of the emissive region 1910 of a (sub-) pixel 340/264x.

In some non-limiting examples, a mechanism to make the first electrode 120, and/or the second electrode 140, is to form such electrode 120, 140 in a pattern across at least a part of the lateral aspect 410 of the emissive region(s) 1910 thereof and/or in some non-limiting examples, across at least a part of the lateral aspect 420 of the non-emissive region(s) 1920 surrounding them. In some non-limiting examples, such mechanism may be employed to form the auxiliary electrode 1750 and/or busbar 4150 in a position and/or shape in either or both of a lateral aspect and/or cross-sectional aspect so as not to interfere with the emission of photons from the lateral aspect 410 of the emissive region 1910 of a (sub-) pixel 340/264x, as discussed above.

In some non-limiting examples, the device 100 may be configured such that it is substantially devoid of a conductive oxide material in an optical path of photons emitted by the device 100. By way of non-limiting example, in the lateral aspect 410 of at least one emissive region 1910 corresponding to a (sub-) pixel 340/264x, at least one of the layers and/or coatings deposited after the at least one semi-conducting layer 130, including without limitation, the second electrode 140, the NIC 810 and/or any other layers and/or coatings deposited thereon, may be substantially devoid of any conductive oxide material. In some non-limiting examples, being substantially devoid of any conductive oxide material may reduce absorption and/or reflection of light emitted by the device 100. By way of non-limiting example, conductive oxide materials, including without limitation, ITO and/or IZO, may absorb light in at least the B(lue) region of the visible spectrum, which may, in generally, reduce efficiency and/or performance of the device 100.

In some non-limiting examples, a combination of these and/or other mechanisms may be employed.

Additionally, in some non-limiting examples, in addition to rendering one or more of the first electrode 120, the second electrode 140, the auxiliary electrode 1750 and/or the busbar 4150, substantially transmissive across at least across a substantial part of the lateral aspect 410 of the emissive region 1910 corresponding to the (sub-) pixel(s) 340/264x of the device 100, in order to allow photons to be emitted substantially across the lateral aspect 410 thereof, it may be desired to make at least one of the lateral aspect(s) 420 of the surrounding non-emissive region(s) 1920 of the device 100 substantially transmissive in both the bottom and top directions, so as to render the device 100 substantially transmissive relative to light incident on an external surface thereof, such that a substantial part such externally-incident light may be transmitted through the device 100, in addition to the emission (in a top-emission, bottom-emission and/or double-sided emission) of photons generated internally within the device 100 as disclosed herein.

Conductive Coating

In the present disclosure, the terms "conductive coating" and "electrode coating" may be used interchangeably to refer to similar concepts and references to a conductive coating 830 herein, in the context of being patterned by selective deposition of an NIC 810 and/or an NPC 1120 may, in some non-limiting examples, be applicable to an electrode coating 830 in the context of being patterned by selective deposition of a patterning coating 810, 1120. In some non-limiting examples, reference to an electrode coating 830 may signify a coating having a specific composition as described herein. Similarly, in the present disclosure, the terms "conductive coating material" and "electrode coating material" may be used interchangeably to refer to similar concepts and references to a conductive coating material 831 herein.

In some non-limiting examples, the conductive coating material 831 (FIG. 9) used to deposit a conductive coating 830 onto an exposed layer surface 111 of underlying material may be a substantially pure element. In some further non-limiting examples, the conductive coating 830 includes a substantially pure element. In some other non-limiting examples, the conductive coating 830 includes two or more elements, which may for example be provided as an alloy or a mixture.

In some non-limiting examples, at least one component of such mixture is not deposited on such surface, may not be deposited on such exposed layer surface 111 during deposition and/or may be deposited in a small amount relative to an amount of remaining component(s) of such mixture that are deposited on such exposed layer surface 111.

In some non-limiting examples, such at least one component of such mixture may have a property relative to the remaining component(s) to selectively deposit substantially only the remaining component(s). In some non-limiting examples, the property may be a vapor pressure.

In some non-limiting examples, such at least one component of such mixture may have a lower vapor pressure relative to the remaining components.

In some non-limiting examples, the conductive coating material 831 may be a copper (Cu)-magnesium (Cu—Mg) mixture, in which Cu has a lower vapor pressure than Mg.

In some non-limiting examples, the conductive coating material 831 used to deposit a conductive coating 830 onto an exposed layer surface 111 may be substantially pure.

In some non-limiting examples, the conductive coating material 831 used to deposit Mg is and in some non-limiting examples, comprises substantially pure Mg. In some non-limiting examples, substantially pure Mg may exhibit substantially similar properties relative to pure Mg. In some non-limiting examples, purity of Mg may be about 95% or higher, about 98% or higher, about 99% or higher, about 99.9% or higher and/or about 99.99% and higher.

In some non-limiting examples, a conductive coating 830 in an opto-electronic device according to various example includes Mg. In some non-limiting examples, the conductive coating 830 comprises substantially pure Mg. In some non-limiting examples, the conductive coating 830 includes other metals in place of and/or in combination with Mg. In some non-limiting examples, the conductive coating 830 includes an alloy of Mg with one or more other metals. In some non-limiting examples, the conductive coating 830 includes an alloy of Mg with Yb, Cd, Zn, and/or Ag. In some non-limiting examples, such alloy may be a binary alloy having a composition ranging from between about 5 vol. % Mg and about 95 vol. % Mg, with the remainder being the other metal. In some non-limiting examples, the conductive coating 830 includes a Mg:Ag alloy having a composition ranging from between about 1:10 to about 10:1 by volume.

In some non-limiting examples, the conductive coating 830 and/or the conductive coating material 831 in an opto-electronic device according to various examples includes Ag. In some non-limiting examples, the conductive coating 830 and/or the conductive coating material 831 comprises substantially pure Ag. In some non-limiting examples, the conductive coating 830 and/or the conductive coating material 831 includes other metals in place of and/or in combination with Ag. In some non-limiting examples, the conductive coating 830 and/or the conductive coating material 831 includes an alloy of Ag with one or more other metals. In some non-limiting examples, the conductive coating 830 and/or the conductive coating material 831 includes an alloy of Ag with Mg, Yb, and/or Zn. In some non-limiting examples, such alloy may be a binary alloy having a composition from about 5 vol. % Ag to about 95 vol. % Ag, with the remainder being the other metal. In some non-limiting examples, the conductive coating 830 and/or the conductive coating material 831 includes Ag and Mg. Non-limiting examples of such conductive coating 830 and/or the conductive coating material 831 includes an Mg:Ag alloy having a composition from about 1:10 to about 10:1 by volume. In some non-limiting examples, the conductive coating 830 and/or the conductive coating material 831 includes Ag and Yb. Non-limiting examples of such conductive coating 830 includes a Yb:Ag alloy having a composition from about 1:20 to about 10:1 by volume. In some non-limiting examples, the conductive coating 830 includes Mg and Yb, for example as an Mg:Yb alloy. In some non-limiting examples, the conductive coating 830 and/or the conductive coating material 831 includes Ag, Mg, and Yb, for example as an Ag:Mg:Yb alloy.

In some non-limiting examples, the conductive coating 830 includes two or more layers having different compositions from one another. In some non-limiting examples, two or more layers of the conductive coating 830 include a different element from one another. Non-limiting examples of such conductive coating 830 include multilayer coatings formed by: Yb/Ag, Yb/Mg, Yb/Mg:Ag, Mg/Ag, Yb/Yb:Ag, Yb/Ag/Mg, and/or Yb/Mg/Ag.

Patterning

As a result of the foregoing, it may be desirable to selectively deposit, across the lateral aspect 410 of the emissive region 1910 of a (sub-) pixel 340/264x and/or the lateral aspect 420 of the non-emissive region(s) 1920 surrounding the emissive region 1910, a device feature, including without limitation, at least one of the first electrode 120, the second electrode 140, the auxiliary electrode 1750 and/or busbar 4150 and/or a conductive element electrically coupled thereto, in a pattern, on an exposed layer surface 111 of a frontplane 10 layer of the device 100. In some non-limiting examples, the first electrode 120, the second electrode 140, the auxiliary electrode 1750 and/or the busbar 4150 may be deposited in at least one of a plurality of conductive coatings 830.

However, it may not be feasible to employ a shadow mask such as an FMM that may, in some non-limiting examples, be used to form relatively small features, with a feature size on the order of tens of microns or smaller to achieve such patterning of a conductive coating 830, since, in some non-limiting examples:

an FMM may be deformed during a deposition process, especially at high temperatures, such as may be employed for deposition of a thin conductive film;

limitations on the mechanical (including, without limitation, tensile) strength of the FMM and/or shadowing effects, especially in a high-temperature deposition process, may impart a constraint on an aspect ratio of features that may be achievable using such FMMs;

the type and number of patterns that may be achievable using such FMMs may be constrained since, by way of non-limiting example, each part of the FMM will be physically supported so that, in some non-limiting examples, some patterns may not be achievable in a single processing stage, including by way of non-limiting example, where a pattern specifies an isolated feature;

FMMs may exhibit a tendency to warp during a high-temperature deposition process, which may, in some non-limiting examples, distort the shape and position of apertures therein, which may cause the selective deposition pattern to be varied, with a degradation in performance and/or yield;

FMMs that may be used to produce repeating structures spread across the entire surface of a device 100, may call for a large number of apertures to be formed in the FMM, which may compromise the structural integrity of the FMM;

repeated use of FMMs in successive depositions, especially in a metal deposition process, may cause the deposited material to adhere thereto, which may obfuscate features of the FMM and which may cause the selective deposition pattern to be varied, with a degradation in performance and/or yield;

while FMMs may be periodically cleaned to remove adhered non-metallic material, such cleaning procedures may not be suitable for use with adhered metal, and even so, in some non-limiting examples, may be time-consuming and/or expensive; and irrespective of any such cleaning processes, continued use of such FMMs, especially in a high-temperature deposition process, may render them ineffective at producing a desired patterning, at which point they may be discarded and/or replaced, in a complex and expensive process.

Figure 5:
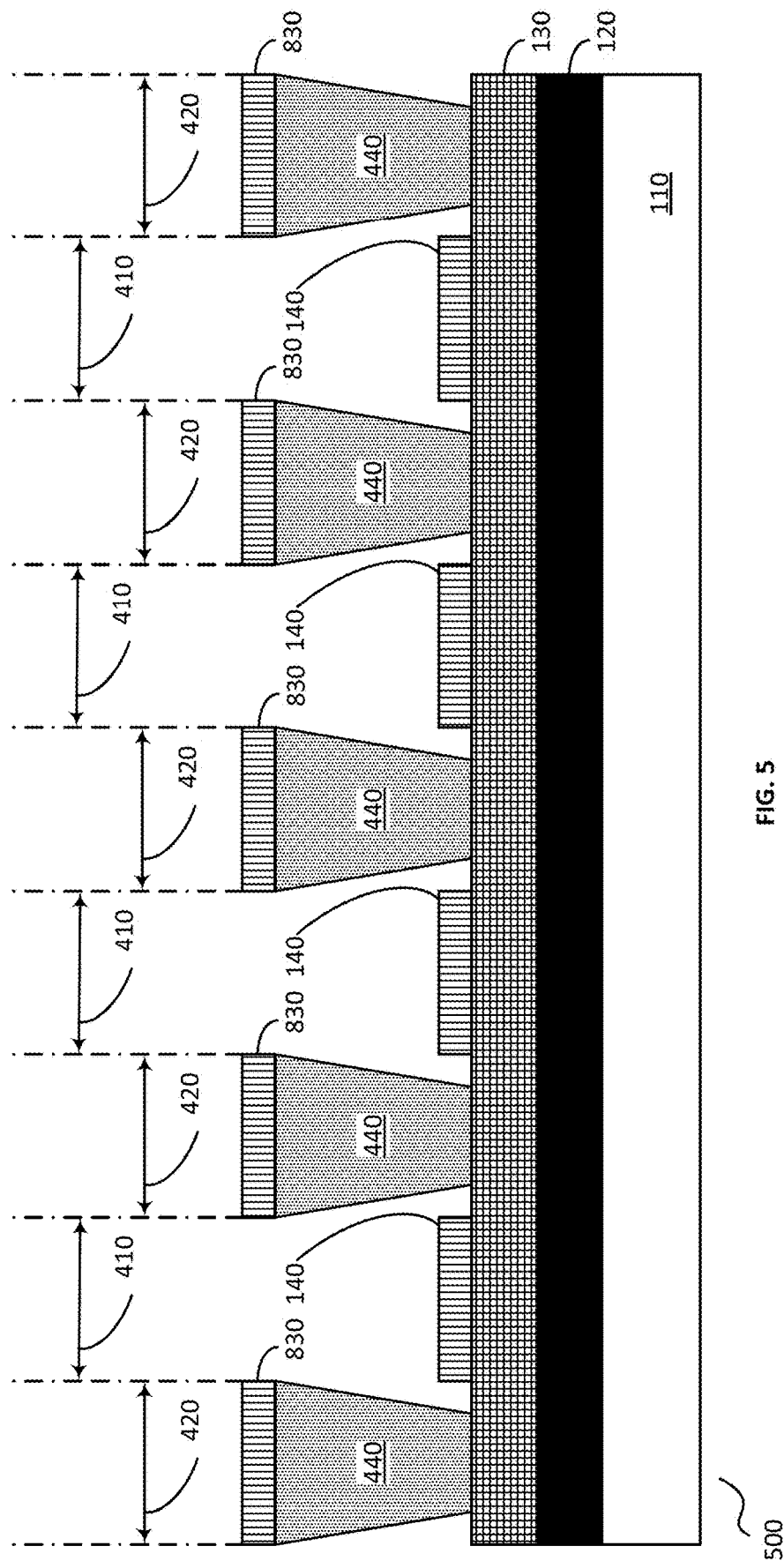
FIG. 5 is a cross-sectional view of an example version of the device of FIG. 1, showing at least one example pixel definition layer (PDL) supporting deposition of at least one second electrode of the device.

FIG. 5 shows an example cross-sectional view of a device 500 that is substantially similar to the device 100, but further comprises a plurality of raised PDLs 440 across the lateral aspect(s) 420 of non-emissive regions 1920 surrounding the lateral aspect(s) 410 of emissive region(s) 1910 corresponding to (sub-) pixel(s) 340/264x.

When the conductive coating 830 is deposited, in some non-limiting examples, using an open-mask and/or a mask-free deposition process, the conductive coating 830 is deposited across the lateral aspect(s) 410 of emissive region(s) 1910 corresponding to (sub-) pixel(s) 340/264x to form (in the figure) the second electrode 140 thereon, and also across the lateral aspect(s) 420 of non-emissive regions 1920 surrounding them, to form regions of conductive coating 830 on top of the PDLs 440. To ensure that each (segment) of the second electrode 140 is not electrically coupled to any of the at least one conductive region(s) 830, a thickness of the PDL(s) 440 is greater than a thickness of the second electrode(s) 140. In some non-limiting examples, the PDL(s) 440 may be provided, as shown in the figure, with an undercut profile to further decrease a likelihood that any (segment) of the second electrode(s) 140 will be electrically coupled to any of the at least one conductive region(s) 830.

In some non-limiting examples, application of a barrier coating 1650 over the device 500 may result in poor adhesion of the barrier coating 1650 to the device 500, having regard to the highly non-uniform surface topography of the device 500.

In some non-limiting examples, it may be desirable to tune optical microcavity effects associated with sub-pixel(s) 264x of different colours (and/or wavelengths) by varying a thickness of the at least one semiconducting layer 130 (and/or a layer thereof) across the lateral aspect 410 of emissive region(s) 1910 corresponding to sub-pixel(s) 264x of one colour relative to the lateral aspect 410 of emissive region(s) 1910 corresponding to sub-pixel(s) 264x of another colour. In some non-limiting examples, the use of FMMs to perform patterning may not provide a precision called for to provide such optical microcavity tuning effects in at least some cases and/or, in some non-limiting examples, in a production environment for OLED displays 100.

Nucleation-Inhibiting and/or Promoting Material Properties

In some non-limiting examples, a conductive coating 830, that may be employed as, or as at least one of a plurality of layers of thin conductive films to form a device feature, including without limitation, at least one of the first electrode 120, the first electrode 140, an auxiliary electrode 1750 and/or a busbar 4150 and/or a conductive element electrically coupled thereto, may exhibit a relatively low affinity towards being deposited on an exposed layer surface 111 of an underlying material, so that the deposition of the conductive coating 830 is inhibited.

The relative affinity or lack thereof of a material and/or a property thereof to having a conductive coating 830 deposited thereon may be referred to as being "nucleation-promoting" or "nucleation-inhibiting" respectively.

In the present disclosure, "nucleation-inhibiting" refers to a coating, material and/or a layer thereof that has a surface that exhibits a relatively low affinity for (deposition of) a conductive coating 830 thereon, such that the deposition of the conductive coating 830 on such surface is inhibited.

In the present disclosure, "nucleation-promoting" refers to a coating, material and/or a layer thereof that has a surface that exhibits a relatively high affinity for (deposition of) a conductive coating 830 thereon, such that the deposition of the conductive coating 830 on such surface is facilitated.

The term "nucleation" in these terms references the nucleation stage of a thin film formation process, in which monomers in a vapor phase condense onto the surface to form nuclei.

Without wishing to be bound by a particular theory, it is postulated that the shapes and sizes of such nuclei and the subsequent growth of such nuclei into islands and thereafter into a thin film may depend upon a number of factors, including without limitation, interfacial tensions between the vapor, the surface and/or the condensed film nuclei.

In the present disclosure, such affinity may be measured in a number of fashions.

One measure of a nucleation-inhibiting and/or nucleation-promoting property of a surface is the initial sticking probability $S_0$ of the surface for a given electrically conductive material, including without limitation, Mg. In the present disclosure, the terms "sticking probability" and "sticking coefficient" may be used interchangeably.

In some non-limiting examples, the sticking probability S may be given by:

$$S = \frac{N_{ads}}{N_{total}}$$

where $N_{ads}$ is a number of adsorbed monomers ("adatoms") that remain on an exposed layer surface 111 (that is, are incorporated into a film) and $N_{total}$ is a total number of impinging monomers on the surface. A sticking probability S equal to 1 indicates that all monomers that impinge on the surface are adsorbed and subsequently incorporated into a growing film. A sticking probability S equal to 0 indicates that all monomers that impinge on the surface are desorbed and subsequently no film is formed on the surface. A sticking probability S of metals on various surface can be evaluated using various techniques of measuring the sticking probability S, including without limitation, a dual quartz crystal microbalance (QCM) technique as described by Walker et al., *J. Phys. Chem. C* 2007, 111, 765 (2006).

As the density of islands increases (e.g., increasing average film thickness), a sticking probability S may change. By way of non-limiting example, a low initial sticking probability $S_0$ may increase with increasing average film thickness. This can be understood based on a difference in sticking probability S between an area of a surface with no islands, by way of non-limiting example, a bare substrate 110, and an area with a high density of islands. By way of non-limiting example, a monomer that impinges on a surface of an island may have a sticking probability S that approaches 1.

An initial sticking probability $S_0$ may therefore be specified as a sticking probability S of a surface prior to the formation of any significant number of critical nuclei. One measure of an initial sticking probability $S_0$ can involve a sticking probability S of a surface for a material during an initial stage of deposition of the material, where an average thickness of the deposited material across the surface is at or below a threshold value. In the description of some non-limiting examples a threshold value for an initial sticking probability $S_0$ can be specified as, by way of non-limiting example, 1 nm. An average sticking probability $\bar{S}$ may then be given by:

$$\bar{S} = S_0(1-A_{nuc}) + S_{nuc}(A_{nuc})$$

where $S_{nuc}$ is a sticking probability S of an area covered by islands, and $A_{nuc}$ is a percentage of an area of a substrate surface covered by islands.

Based on the energy profiles 610, 620, 630 shown in FIG. 6, it may be postulated that NIC 810 materials exhibiting relatively low activation energy for desorption ($E_{des}$ 631) and/or relatively high activation energy for surface diffusion ($E_s$ 631) may be particularly advantageous for use in various applications.

One measure of a nucleation-inhibiting and/or nucleation-promoting property of a surface is an initial deposition rate of a given electrically conductive material, including without limitation, Mg, on the surface, relative to an initial deposition rate of the same conductive material on a reference surface, where both surfaces are subjected to and/or exposed to an evaporation flux of the conductive material.

Selective Coatings for Impacting Nucleation-Inhibiting and/or Promoting Material Properties In some non-limiting examples, one or more selective coatings 710 (FIG. 7) may be selectively deposited on at least a first portion 701 (FIG. 7) of an exposed layer surface 111 of an underlying material to be presented for deposition of a thin film conductive coating 830 thereon. Such selective coating(s) 710 have a nucleation-inhibiting property (and/or conversely a nucleation-promoting property) with respect to the conductive coating 830 that differs from that of the exposed layer surface 111 of the underlying material. In some non-limiting examples, there may be a second portion 702 (FIG. 7) of the exposed layer surface 111 of an underlying material to which no such selective coating(s) 710, has been deposited.

Such a selective coating 710 may be an NIC 810 and/or a nucleation promoting coating (NPC 1120 (FIG. 11)).

Figure 35:
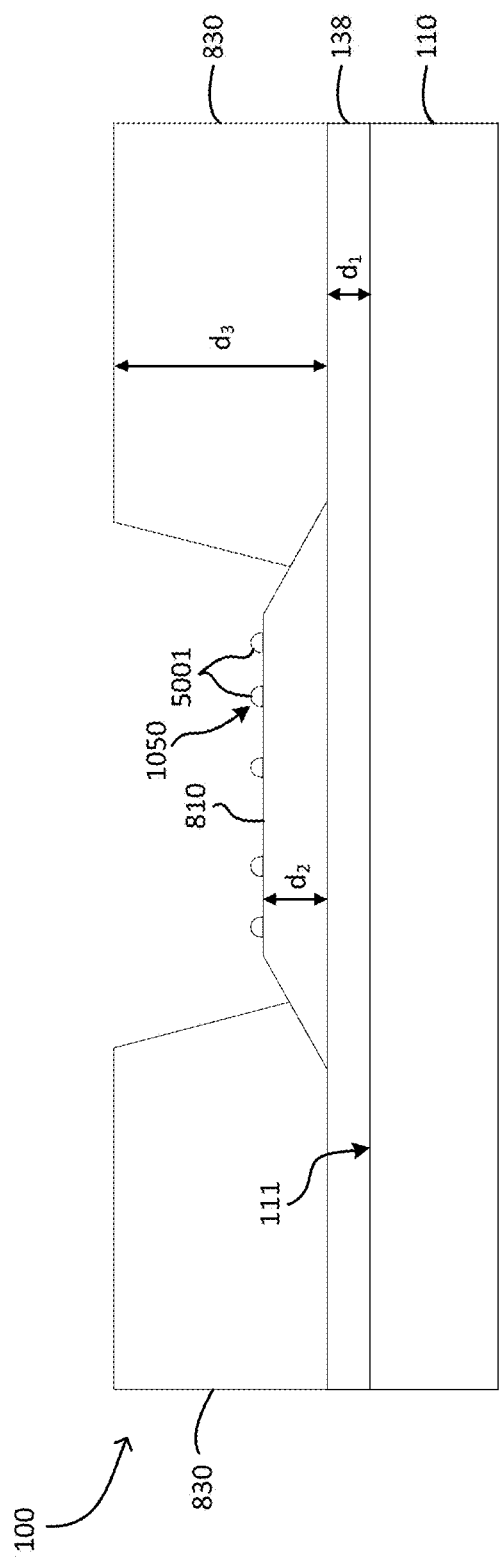
FIG. 35 is a schematic diagram that illustrates a metallic coating underlying an NIC and/or a conductive coating according to an example in the present disclosure.

In some non-limiting examples, the NIC 810 may be disposed on an exposed layer surface 111 of an underlying metallic coating 138, such as shown by way of non-limiting example, in FIG. 35. It will be understood by those having ordinary skill in the relevant art that such metallic coating 138 may be (at least) one of the plurality of layers of the device 100. The metallic coating 138 may be comprised of a metallic coating material. Those having ordinary skill in the relevant art will appreciate that the metallic coating 138 and the metallic coating material of which it is comprised, especially when disposed as a film and under conditions and/or by mechanisms substantially similar to those employed in depositing the second electrode 140, may exhibit largely similar optical and/or other properties.

In some non-limiting examples, sheet resistance is a property of a component, layer, and/or part that may alter a characteristic of an electric current passing through such component, layer, and/or part. In some non-limiting examples, a sheet resistance R1 of the metallic coating 138 may generally correspond to a sheet resistance of the metallic coating 138 measured in isolation from other components, layers, and/or parts of the device 100. In some non-limiting examples, the metallic coating 138 may be formed as a thin film. Accordingly, in some non-limiting examples, the sheet resistance R1 for the metallic coating 138 may be determined and/or calculated based on the composition, thickness, and/or morphology of such thin film. In some non-limiting examples, the sheet resistance R1 may be about 0.1-1,000 $\Omega$/sqr, about 1-100 $\Omega$/sqr, about 2-50 $\Omega$/sqr, about 3-30 $\Omega$/sqr, about 4-20 $\Omega$/sqr, about 5-15 $\Omega$/sqr, and/or about 10-12 $\Omega$/sqr.

In some non-limiting examples, a bond dissociation energy of a metal may correspond to a standard-state enthalpy change measured at 298 K from the breaking of a bond of a diatomic molecule formed by two identical atoms of the metal. Bond dissociation energies may, by way of non-limiting example, be determined based on known literature, including without limitation, Luo, Yu-ran, "Bond dissociation energies" (2010). In some non-limiting examples, the metallic coating material may comprise a metal having a bond dissociation energy of at least 10 kJ/mol, at least 50 kJ/mol, at least 100 kJ/mol, at least 150 kJ/mol, at least 180 kJ/mol, and/or at least 200 kJ/mol.

In some non-limiting examples, the metallic coating material may comprise a metal having an electronegativity that is less than about 1.4, about 1.3, and/or about 1.2.

In some non-limiting examples, the metallic coating material may comprise an element selected from potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), nickel (Ni), titanium (Ti), palladium (Pd), chromium (Cr), iron (Fe), cobalt (Co), zirconium (Zr), platinum (Pt), vanadium (V), niobium (Nb), iridium (Ir), osmium (Os), tantalum (Ta), molybdenum (Mo), and/or tungsten (W). In some non-limiting examples, the element may comprise Cu, Ag, and/or Au. In some non-limiting examples, the element may be Cu. In some non-limiting examples, the element may be Al. In some non-limiting examples, the element may comprise Mg, Zn, Cd, and/or Yb. In some non-limiting examples, the element may comprise Sn, Ni, Ti, Pd, Cr, Fe, and/or Co. In some non-limiting examples, the element may comprise Zr, Pt, V, Nb, Ir, and/or Os. In some non-limiting examples, the element may comprise Ta, Mo, and/or W. In some non-limiting examples, the element may comprise Mg, Ag, Al, Yb, and/or Li. In some non-limiting examples, the element may comprise Mg, Ag, and/or Yb. In some non-limiting examples, the element may comprise Mg, and/or Ag. In some non-limiting examples, the element may be Ag.

In some non-limiting examples, the metallic coating material may comprise a pure metal. In some non-limiting examples, the metallic coating material is a pure metal. In some non-limiting examples, the metallic coating material is pure Ag or substantially pure Ag. In some non-limiting examples, the metallic coating material is pure Mg or substantially pure Mg. In some non-limiting examples, the metallic coating material is pure Al or substantially pure Al.

In some non-limiting examples, the metallic coating material may comprise an alloy. In some non-limiting examples, the alloy may be an Ag-containing alloy, and/or an AgMg-containing alloy.

In some non-limiting examples, the metallic coating material may comprise other metals in place of, and/or in combination with, Ag. In some non-limiting examples, the metallic coating material may comprise an alloy of Ag with at least one other metal. In some non-limiting examples, the metallic coating material may comprise an alloy of Ag with Mg, and/or Yb. In some non-limiting examples, such alloy may be a binary alloy having a composition from about 5 vol. % Ag to about 95 vol. % Ag, with the remainder being the other metal. In some non-limiting examples, the metallic coating material comprises Ag and Mg. In some non-limiting examples, the metallic coating material comprises an Ag:Mg alloy having a composition from about 1:10 to about 10:1 by volume. In some non-limiting examples, the metallic coating material comprises Ag and Yb. In some non-limiting examples, the metallic coating material comprises a Yb:Ag alloy having a composition from about 1:20 to about 1-10:1 by volume. In some non-limiting examples, the metallic coating material comprises Mg and Yb. In some non-limiting examples, the metallic coating material comprises an Mg:Yb alloy. In some non-limiting examples, the metallic coating material comprises Ag, Mg, and Yb. In some non-limiting examples, the metallic coating material comprises an Ag:Mg:Yb alloy.

In some non-limiting examples, the metallic coating material may comprise oxygen (O). In some non-limiting examples, the metallic coating material may comprise at least one metal and O. In some non-limiting examples, the metallic coating material may comprise a metal oxide. In some non-limiting examples, the metal oxide comprises Zn, indium (I), tin (Sn), antimony (Sb), and/or gallium (Ga). In some non-limiting examples, the metal oxide may be a transparent conducting oxide (TCO). In some non-limiting examples, the TCO may comprise an indium oxide, tin oxide, antimony oxide, and/or gallium oxide. In some non-limiting examples, the TCO may comprise indium titanium oxide (ITO), ZnO, indium zinc oxide (IZO), and/or indium gallium zinc oxide (IGZO). In some non-limiting examples, the TCO may be electrically doped with other elements.

In some non-limiting example, the metallic coating 138 may be formed by metal and/or metal alloys.

In some non-limiting examples, the metallic coating 138 may comprise at least one metal or metal alloy and at least one metal oxide.

In some non-limiting examples, the metallic coating 138 may comprise a plurality of layers of the metallic coating material. In some non-limiting examples, the metallic coating material of a first one of the plurality of layers may be different from the metallic coating material of a second one of the plurality of layers. In some non-limiting examples, the metallic coating material of the first one of the plurality of layers may comprise a metal and the metallic coating material of the second one of the plurality of layers may comprise a metal oxide.

In some non-limiting examples, the metallic coating material of at least one of the plurality of layers may comprise Yb. In some non-limiting examples, the metallic coating material of one of the plurality of layers may comprise an Ag-containing alloy and/or an AgMg-containing alloy, and/or pure Ag, substantially pure Ag, pure Mg, and/or substantially pure Mg. In some non-limiting examples, the metallic coating 138 is a bilayer Yb/AgMg coating.

In some non-limiting examples, a first one of the plurality of layers that is proximate to the NIC 810 (top-most) may comprise an element selected from Ag, Au, Cu, Al, Sn, Ni, Ti, Pd, Cr, Fe, Co, Zr, Pt, V, Nb, Ir, Os, Ta, Mo, and/or W. In some non-limiting examples, the element may comprise Cu, Ag, and/or Au. In some non-limiting examples, the element may be Cu. In some non-limiting examples, the element may be Al. In some non-limiting examples, the element may comprise Sn, Ti, Pd, Cr, Fe, and/or Co. In some non-limiting examples, the element may comprise Ni, Zr, Pt, V, Nb, Ir, and/or Os. In some non-limiting examples, the element may comprise Ta, Mo, and/or W. In some non-limiting examples, the element may comprise Mg, Ag, and/or Al. In some non-limiting examples, the element may comprise Mg, and/or Ag. In some non-limiting examples, the element may be Ag.

In some non-limiting examples, the metallic coating 138 may comprise at least one additional element. In some non-limiting examples, such additional element may be a non-metallic element. In some non-limiting examples, the non-metallic material may be oxygen (O), sulfur (S), nitrogen (N), and/or carbon C. It will be appreciated by those having ordinary skill in the relevant art that, in some non-limiting examples, such additional element(s) may be incorporated into the metallic coating 138 as a contaminant, due to the presence of such additional element(s) in the source material, equipment used for deposition, and/or the vacuum chamber environment. In some non-limiting examples, the concentration of such additional element(s) may be limited to be below a threshold concentration. In some non-limiting examples, such additional element(s) may form a compound together with other element(s) of the metallic coating 138. In some non-limiting examples, a concentration of the non-metallic element in the conductive coating material may be less than about 1%, about 0.1%, about 0.001%, about 0.0001%, about 0.00001%, about 0.000001% and/or about 0.0000001%. In some non-limiting examples, the conductive coating 830 has a composition in which a combined amount of 0 and C therein is less than about 10%, about 5%, about 1%, about 0.1%, about 0.001%, about 0.0001%, about 0.00001%, about 0.000001%, and/or about 0.0000001% In some non-limiting examples, the metallic coating 138 may comprise a closed coating 4530. In some non-limiting examples, the metallic coating 138 may comprise a discontinuous coating 1050.

In some non-limiting examples, the metallic coating 138 may be disposed in a pattern that may be defined by at least one region therein that is substantially devoid of a closed coating 4530 of the metallic coating 138 on the first layer surface in the first portion 115. In some non-limiting examples, the at least one region has disposed thereon, a metal patterning NIC 810. In some non-limiting examples, the at least one region may separate the metallic coating 138 into a plurality of discrete fragments thereof. In some non-limiting examples, at least two of such plurality of discrete fragments of the metallic coating 138 may be electrically coupled. In some non-limiting examples, at least two of such plurality of discrete fragments of the metallic coating 138 may be each electrically coupled to a common conductive layer or coating, including without limitation, the conductive coating 830, to allow the flow of electric current between them. In some non-limiting examples, at least two of such plurality of discrete fragments of the metallic coating 138 may be electrically insulated from one another.

In the present disclosure, in some non-limiting examples, as the context dictates, the terms "NIC" and "patterning coating" may be used interchangeably to refer to similar concepts, and references to an NIC 810 herein, in the context of being selectively deposited to pattern a conductive coating 830 may, in some non-limiting examples, be applicable to a patterning coating 810 in the context of selective deposition thereof to pattern an electrode coating 830.

Similarly, in some non-limiting examples, as the context dictates, the term "NPC" and "patterning coating" may be used interchangeably to refer to similar concepts, and reference to an NPC 1120 herein, in the context of being selectively deposited to pattern a conductive coating 830 may, in some non-limiting examples, be applicable to a patterning coating 1120 in the context of selective deposition thereof to pattern an electrode coating 830.

In some non-limiting examples, reference to a patterning coating 810, 1120 may signify a coating having a specific composition as described herein.

It will be appreciated by those having ordinary skill in the relevant art that the use of such a selective coating 710 may, in some non-limiting examples, facilitate and/or permit the selective deposition of the conductive coating 830 without employing an FMM during the stage of depositing the conductive coating 830.

In some non-limiting examples, such selective deposition of the conductive coating 830 may be in a pattern. In some non-limiting examples, such pattern may facilitate providing and/or increasing transmissivity of at least one of the top and/or bottom of the device 100, within the lateral aspect 410 of one or more emissive region(s) 1910 of a (sub-) pixel 340/264$x$ and/or within the lateral aspect 420 of one or more non-emissive region(s) 1920 that may, in some non-limiting examples, surround such emissive region(s) 1910.

In some non-limiting examples, the conductive coating 830 may be deposited on a conductive structure and/or in some non-limiting examples, form a layer thereof, for the device 100, which in some non-limiting examples may be the first electrode 120 and/or the second electrode 140 to act as one of an anode 341 and/or a cathode 342, and/or an auxiliary electrode 1750 and/or busbar 4150 to support conductivity thereof and/or in some non-limiting examples, be electrically coupled thereto.

In some non-limiting examples, an NIC 810 for a given conductive coating 830, including without limitation Mg, may refer to a coating having a surface that exhibits a relatively low initial sticking probability $S_0$ for the conductive coating 830 (in the example Mg) in vapor form, such that deposition of the conductive coating 830 (in the example Mg) onto the exposed layer surface 111 is inhibited. Thus, in some non-limiting examples, selective deposition of an NIC 810 may reduce an initial sticking probability $S_0$ of an exposed layer surface 111 (of the NIC 810) presented for deposition of the conductive coating 830 thereon.

In some non-limiting examples, an NPC 1120, for a given conductive coating 830, including without limitation Mg, may refer to a coating having an exposed layer surface 111 that exhibits a relatively high initial sticking probability $S_0$ for the conductive coating 830 in vapor form, such that deposition of the conductive coating 830 onto the exposed layer surface 111 is facilitated. Thus, in some non-limiting examples, selective deposition of an NPC 1120 may increase an initial sticking probability $S_0$ of an exposed layer surface 111 (of the NPC 1120) presented for deposition of the conductive coating 830 thereon.

When the selective coating 710 is an NIC 810, the first portion 701 of the exposed layer surface 111 of the underlying material, upon which the NIC 810 is deposited, will thereafter present a treated surface (of the NIC 810) whose nucleation-inhibiting property has been increased or alternatively, whose nucleation-promoting property has been reduced (in either case, the surface of the NIC 810 deposited on the first portion 701), such that it has a reduced affinity for deposition of the conductive coating 830 thereon relative to that of the exposed layer surface 111 of the underlying material upon which the NIC 810 has been deposited. By contrast the second portion 702, upon which no such NIC 810 has been deposited, will continue to present an exposed layer surface 111 (of the underlying substrate 110) whose nucleation-inhibiting property or alternatively, whose nucleation-promoting property (in either case, the exposed layer surface 111 of the underlying substrate 110 that is substantially devoid of the selective coating 710), has an affinity for deposition of the conductive coating 830 thereon that has not been substantially altered.

When the selective coating 710 is an NPC 1120, the first portion 701 of the exposed layer surface 111 of the underlying material, upon which the NPC 1120 is deposited, will thereafter present a treated surface (of the NPC 1120) whose nucleation-inhibiting property has been reduced or alternatively, whose nucleation-promoting property has been increased (in either case, the surface of the NPC 1120 deposited on the first portion 701), such that it has an increased affinity for deposition of the conductive coating 830 thereon relative to that of the exposed layer surface 111 of the underlying material upon which the NPC 1120 has been deposited. By contrast, the second portion 702, upon which no such NPC 1120 has been deposited, will continue to present an exposed layer surface 111 (of the underlying substrate 110) whose nucleation-inhibiting property or alternatively, whose nucleation-promoting property (in either case, the exposed layer surface 111 of the underlying substrate 110 that is substantially devoid of the NPC 1120), has an affinity for deposition of the conductive coating 830 thereon that has not been substantially altered.

In some non-limiting examples, both an NIC 810 and an NPC 1120 may be selectively deposited on respective first portions 701 and NPC portions 1103 (FIG. 11A) of an exposed layer surface 111 of an underlying material to respectively alter a nucleation-inhibiting property (and/or conversely a nucleation-promoting property) of the exposed layer surface 111 to be presented for deposition of a conductive coating 830 thereon. In some non-limiting examples, there may be a second portion 702 of the exposed layer surface 111 of an underlying material to which no selective coating 710 has been deposited, such that the nucleation-inhibiting property (and/or conversely its nucleation-promoting property) to be presented for deposition of the conductive coating 830 thereon is not substantially altered.

In some non-limiting examples, the first portion 701 and NPC portion 1103 may overlap, such that a first coating of an NIC 810 and/or an NPC 1120 may be selectively deposited on the exposed layer surface 111 of the underlying material in such overlapping region and the second coating of the NIC 810 and/or the NPC 1120 may be selectively deposited on the treated exposed layer surface 111 of the first coating. In some non-limiting examples, the first coating is an NIC 810. In some non-limiting examples, the first coating is an NPC 1120.

In some non-limiting examples, the first portion 701 (and/or NPC portion 1103) to which the selective coating 710 has been deposited, may comprise a removal region, in which the deposited selective coating 710 has been removed, to present the uncovered surface of the underlying material for deposition of the conductive coating 830 thereon, such that the nucleation-inhibiting property (and/or conversely its nucleation-promoting property) to be presented for deposition of the conductive coating 830 thereon is not substantially altered.

In some non-limiting examples, the underlying material may be at least one layer selected from the substrate 110 and/or at least one of the frontplane 10 layers, including without limitation, the first electrode 120, the second electrode 140, the at least one semiconducting layer 130 (and/or at least one of the layers thereof) and/or any combination of any of these.

In some non-limiting examples, the conductive coating 830 may have specific material properties. In some non-limiting examples, the conductive coating 830 may comprise Mg, whether alone or in a compound and/or alloy.

By way of non-limiting example, pure and/or substantially pure Mg may not be readily deposited onto some organic surfaces due to a low sticking probability S of Mg on some organic surfaces.

Deposition of Selective Coatings

In some non-limiting examples, a thin film comprising the selective coating 710, may be selectively deposited and/or processed using a variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof.

Figure 7:
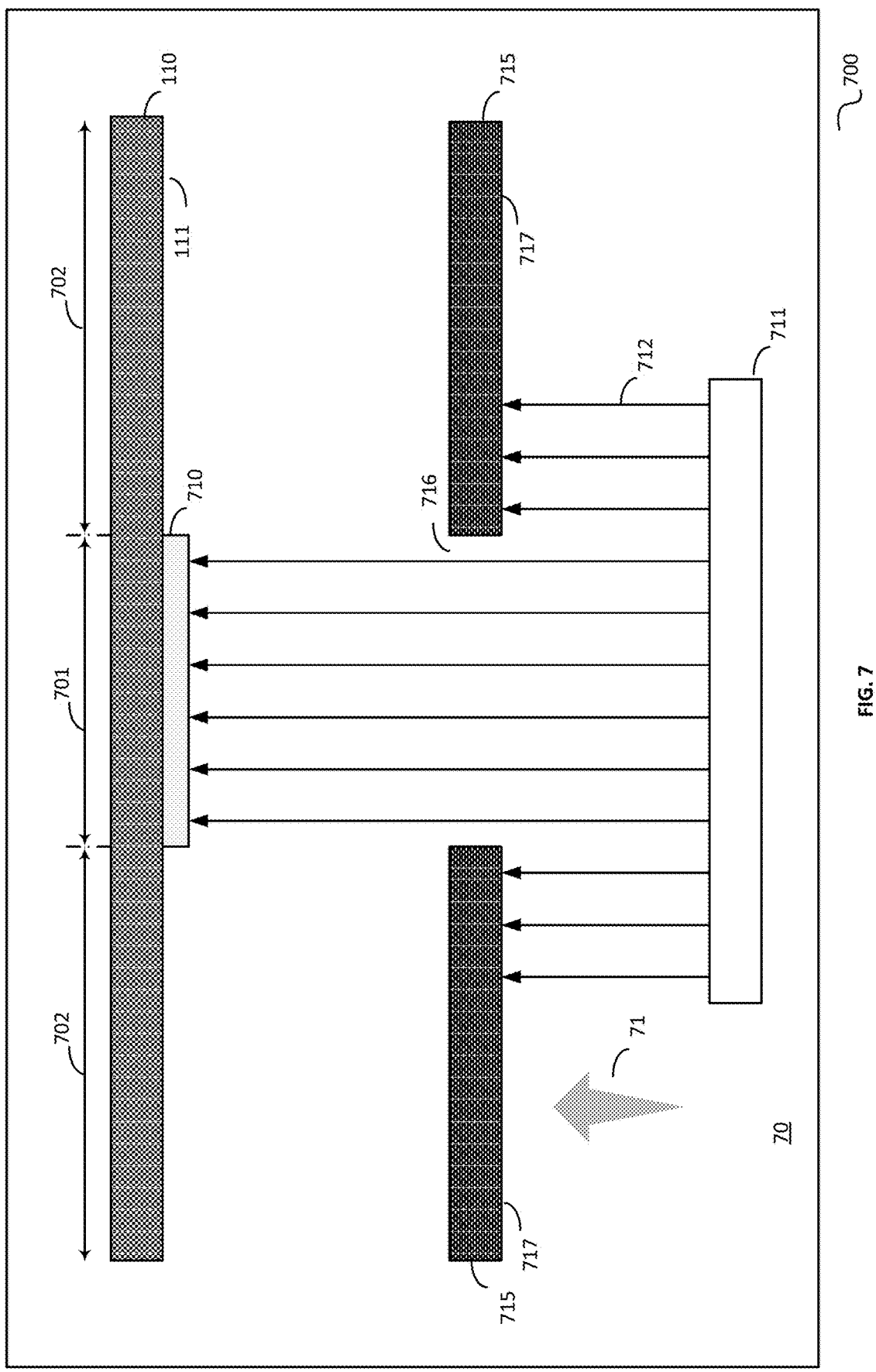
FIG. 7 is a schematic diagram showing an example process for depositing a selective coating in a pattern on an exposed layer surface of an underlying material in an example version of the device of FIG. 1, according to an example in the present disclosure.

FIG. 7 is an example schematic diagram illustrating a non-limiting example of an evaporative process, shown generally at 700, in a chamber 70, for selectively depositing a selective coating 710 onto a first portion 701 of an exposed layer surface 111 of an underlying material (in the figure, for purposes of simplicity of illustration only, the substrate 110).

In the process 700, a quantity of a selective coating material 711, is heated under vacuum, to evaporate and/or sublime 712 the selective coating material 711. In some non-limiting examples, the selective coating material 711 comprises entirely, and/or substantially, a material used to form the selective coating 710. Evaporated selective coating material 712 is directed through the chamber 70, including in a direction indicated by arrow 71, toward the exposed layer surface 111. When the evaporated selective coating material 712 is incident on the exposed layer surface 111, that is, in the first portion 701, the selective coating 710 is formed thereon.

In some non-limiting examples, as shown in the figure for the process 700, the selective coating 710 may be selectively deposited only onto a portion, in the example illustrated, the first portion 701, of the exposed layer surface 111, by the interposition, between the selective coating material 711 and the exposed layer surface 111, of a shadow mask 715, which in some non-limiting examples, may be an FMM. The shadow mask 715 has at least one aperture 716 extending therethrough such that a part of the evaporated selective coating material 712 passes through the aperture 716 and is incident on the exposed layer surface 111 to form the selective coating 710. Where the evaporated selective coating material 712 does not pass through the aperture 716 but is incident on the surface 717 of the shadow mask 715, it is precluded from being disposed on the exposed layer surface 111 to form the selective coating 710 within the second portion 703. The second portion 702 of the exposed layer surface 111 is thus substantially devoid of the selective coating 710. In some non-limiting examples (not shown), the selective coating material 711 that is incident on the shadow mask 715 may be deposited on the surface 717 thereof.

Accordingly, a patterned surface is produced upon completion of the deposition of the selective coating 710.

In some non-limiting examples, for purposes of simplicity of illustration, the selective coating 710 employed in FIG. 7 may be an NIC 810. In some non-limiting examples, for purposes of simplicity of illustration, the selective coating 710 employed in FIG. 7 may be an NPC 1120.

FIG. 8 is an example schematic diagram illustrating a non-limiting example of a result of an evaporative process, shown generally at 800, in a chamber 70, for selectively depositing a conductive coating 830 onto a second portion 702 of an exposed layer surface 111 of an underlying material (in the figure, for purposes of simplicity of illustration only, the substrate 110) that is substantially devoid of the NIC 810 that was selectively deposited onto a first portion 701, including without limitation, by the evaporative process 700 of FIG. 7. In some non-limiting examples, the second portion 702 comprises that part of the exposed layer surface 111 that lies beyond the first portion 701.

Once the NIC 810 has been deposited on a first portion 701 of an exposed layer surface 111 of an underlying material (in the figure, the substrate 110), the conductive coating 830 may be deposited on the second portion 702 of the exposed layer surface 111 that is substantially devoid of the NIC 810.

In the process 800, a quantity of a conductive coating material 831, is heated under vacuum, to evaporate and/or sublime 832 the conductive coating material 831. In some non-limiting examples, the conductive coating material 831 comprises entirely, and/or substantially, a material used to form the conductive coating 830. Evaporated conductive coating material 832 is directed inside the chamber 70, including in a direction indicated by arrow 81, toward the exposed layer surface 111 of the first portion 701 and of the second portion 702. When the evaporated conductive coating material 832 is incident on the second portion 702 of the exposed layer surface 111, the conductive coating 830 is formed thereon.

In some non-limiting examples, deposition of the conductive coating material 831 may be performed using an open mask and/or mask-free deposition process, such that the conductive coating 830 is formed substantially across the entire exposed layer surface 111 of the underlying material (in the figure, the substrate 110) to produce a treated surface (of the conductive coating 830).

It will be appreciated by those having ordinary skill in the relevant art that, contrary to that of an FMM, the feature size of an open mask is generally comparable to the size of a device 100 being manufactured. In some non-limiting examples, such an open mask may have an aperture that may generally correspond to a size of the device 100, which in some non-limiting examples, may correspond, without limitation, to about 1 inch for micro-displays, about 4-6 inches for mobile displays, and/or about 8-17 inches for laptop and/or tablet displays, so as to mask edges of such device 100 during manufacturing. In some non-limiting examples, the feature size of an open mask may be on the order of about 1 cm and/or greater. In some non-limiting examples, an aperture formed in an open mask may in some non-limiting examples be sized to encompass the lateral aspect(s) 410 of a plurality of emissive regions 1910 each corresponding to a (sub-) pixel 340/264$x$ and/or surrounding and/or the lateral aspect(s) 420 of surrounding and/or intervening non-emissive region(s) 1920.

It will be appreciated by those having ordinary skill in the relevant art that, in some non-limiting examples, the use of an open mask may be omitted, if desired. In some non-limiting examples, an open mask deposition process described herein may alternatively be conducted without the use of an open mask, such that an entire target exposed layer surface 111 may be exposed.

In some non-limiting examples, as shown in the figure for the process 800, deposition of the conductive coating 830 may be performed using an open mask and/or mask-free deposition process, such that the conductive coating 830 is formed substantially across the entire exposed layer surface 111 of the underlying material (in the figure, of the substrate 110) to produce a treated surface (of the conductive coating 830).

Indeed, as shown in FIG. 8, the evaporated conductive coating material 832 is incident both on an exposed layer surface 111 of NIC 810 across the first portion 701 as well as the exposed layer surface 111 of the substrate 110 across the second portion 702 that is substantially devoid of NIC 810.

Since the exposed layer surface 111 of the NIC 810 in the first portion 701 exhibits a relatively low initial sticking probability $S_0$ for the conductive coating 830 compared to the exposed layer surface 111 of the substrate 110 in the second portion 702, the conductive coating 830 is selectively deposited substantially only on the exposed layer surface 111 of the substrate 110 in the second portion 702 that is substantially devoid of the NIC 810. By contrast, the evaporated conductive coating material 832 incident on the exposed layer surface 111 of NIC 810 across the first portion 701 tends not to be deposited, as shown (833) and the exposed layer surface 111 of NIC 810 across the first portion 701 is substantially devoid of the conductive coating 830. Although not shown in FIG. 8, in some non-limiting examples, the exposed layer surface 111 of the NIC 810 across the first portion 701 is not substantially devoid of the material of the conductive coating 830 but does not amount to a coating film of the conductive coating 830. Rather, as discussed in detail later below, the exposed layer surface 111 of the NIC 810 may have a discontinuous coating of the material of the conductive coating 830 deposited thereon and/or an intermediate stage conductive thin film.

In some non-limiting examples, an initial deposition rate of the evaporated conductive coating material 832 on the exposed layer surface 111 of the substrate 110 in the second portion 702 may be at least and/or greater than about 200 times, at least and/or greater than about 550 times, at least and/or greater than about 900 times, at least and/or greater than about 1,000 times, at least and/or greater than about 1,500 times, at least and/or greater than about 1,900 times and/or at least and/or greater than about 2,000 times an initial deposition rate of the evaporated conductive coating material 832 on the exposed layer surface 111 of the NIC 810 in the first portion 701.

The foregoing may be combined in order to effect the selective deposition of at least one conductive coating 830 to form a device feature, including without limitation, a patterned electrode 120, 140, 1750, 4150 and/or a conductive element electrically coupled thereto, without employing an FMM within the conductive coating 830 deposition process. In some non-limiting examples, such patterning may permit and/or enhance the transmissivity of the device 100.

In some non-limiting examples, the selective coating 710, which may be an NIC 810 and/or an NPC 1120 may be applied a plurality of times during the manufacturing process of the device 100, in order to pattern a plurality of electrodes 120, 140, 1750, 4150 and/or various layers thereof and/or a device feature comprising a conductive coating 830 electrically coupled thereto.

FIGS. 9A-9D illustrate non-limiting examples of open masks.

Figure 9A:
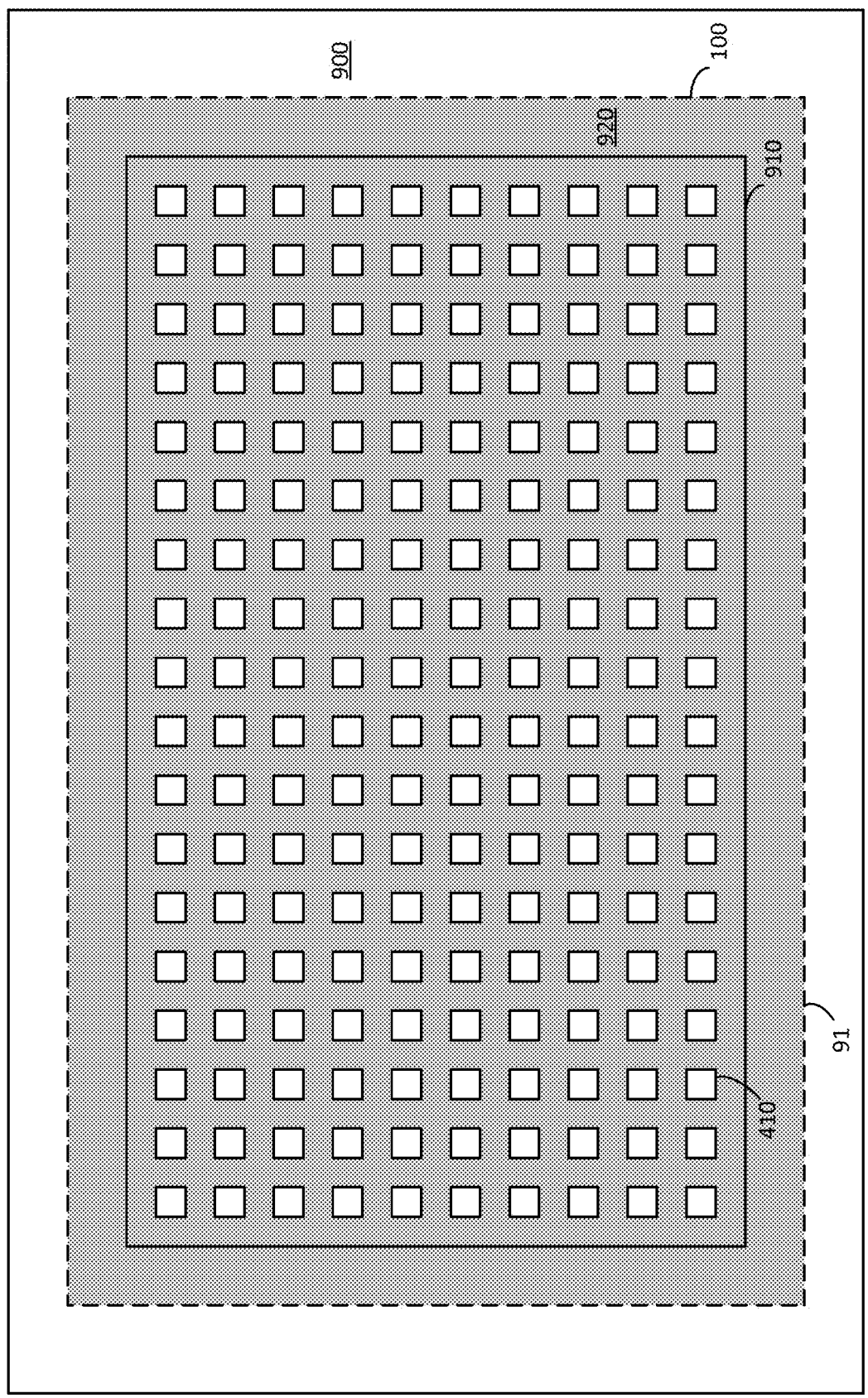
FIGS. 9A-D are schematic diagrams showing example open masks, suitable for use with the process of FIG. 7, having an aperture therewithin according to an example in the present disclosure.

FIG. 9A illustrates a non-limiting example of an open mask 900 having and/or defining an aperture 910 formed therein. In some non-limiting examples, such as shown, the aperture 910 of the open mask 900 is smaller than a size of a device 100, such that when the mask 900 is overlaid on the device 100, the mask 900 covers edges of the device 100. In some non-limiting examples, as shown, the lateral aspect(s) 410 of the emissive regions 1910 corresponding to all and/or substantially all of the (sub-) pixel(s) 340/264x of the device 100 are exposed through the aperture 910, while an unexposed region 920 is formed between outer edges 91 of the device 100 and the aperture 910. It will be appreciated by those having ordinary skill in the relevant art that, in some non-limiting examples, electrical contacts and/or other components (not shown) of the device 100 may be located in such unexposed region 920, such that these components remain substantially unaffected throughout an open mask deposition process.

Figure 9B:
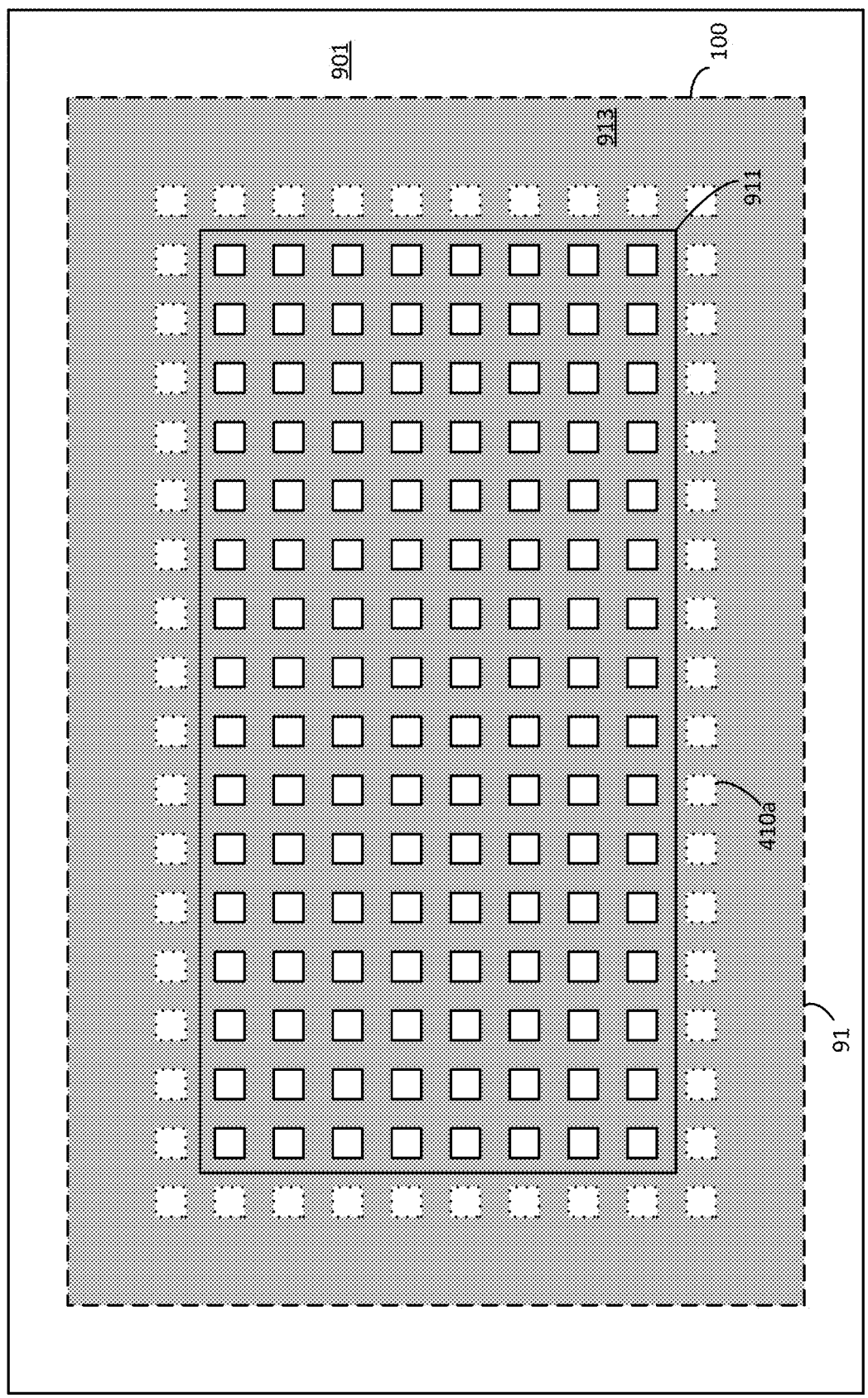

FIG. 9B illustrates a non-limiting example of an open mask 901 having and/or defining an aperture 911 formed therein that is smaller than the aperture 910 of FIG. 9A, such that when the mask 901 is overlaid on the device 100, the mask 901 covers at least the lateral aspect(s) 410a of the emissive region(s) 1910 corresponding to at least some (sub-) pixel(s) 340/264x. As shown, in some non-limiting examples, the lateral aspect(s) 410a of the emissive region(s) 1910 corresponding to outermost (sub-) pixel(s) 340/264x are located within an unexposed region 913 of the device 100, formed between the outer edges 91 of the device 100 and the aperture 911, are masked during an open mask deposition process to inhibit evaporated conductive coating material 832 from being incident on the unexposed region 913.

Figure 9C:
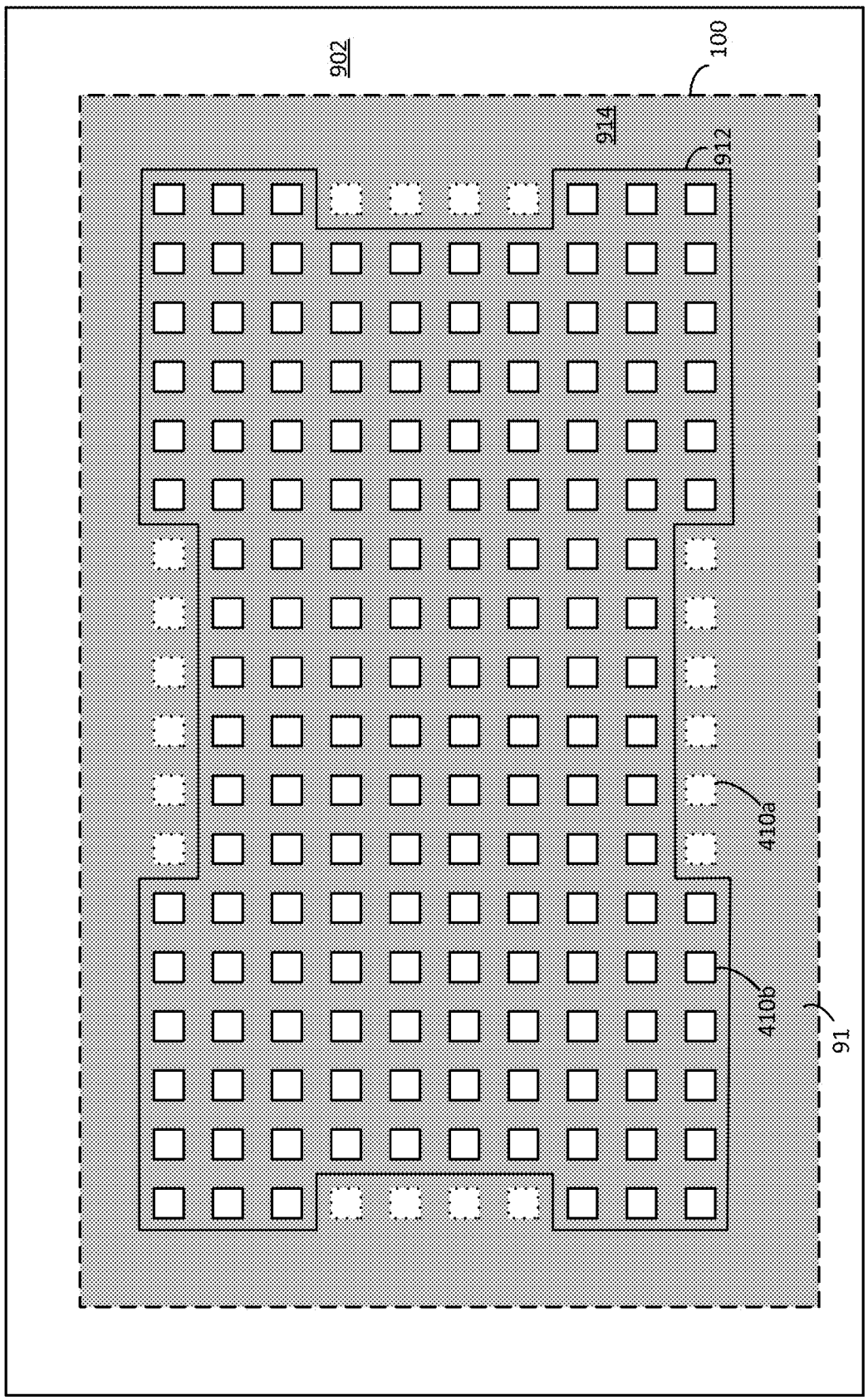

FIG. 9C illustrates a non-limiting example of an open mask 902 having and/or defining an aperture 912 formed therein defines a pattern that covers the lateral aspect(s) 410a of the emissive region(s) 1910 corresponding to at least some (sub-) pixel(s) 340/264x, while exposing the lateral aspect(s) 410b of the emissive region(s) 1910 corresponding to at least some (sub-) pixel(s) 340/264x. As shown, in some non-limiting examples, the lateral aspect(s) 410a of the emissive region(s) 1910 corresponding to at least some (sub-) pixel(s) 340/264x located within an unexposed region 914 of the device 100, are masked during an open mask deposition process to inhibit evaporated conductive coating material 830 from being incident on the unexposed region 914.

While in FIGS. 9B-9C, the lateral aspects 410a of the emissive region(s) 1910 corresponding to at least some of the outermost (sub-) pixel(s) 340/264x have been masked, as illustrated, those having ordinary skill in the relevant art will appreciate that, in some non-limiting examples, an aperture of an open mask 900-902 may be shaped to mask the lateral aspects 410 of other emissive region(s) 1910 and/or the lateral aspects 420 of non-emissive region(s) 1920 of the device 100.

Furthermore, while FIGS. 9A-9C show open masks 900-902 having a single aperture 910-912, those having ordinary skill in the relevant art will appreciate that such open masks 900-902 may, in some non-limiting examples (not shown), additional apertures (not shown) for exposing multiple regions of an exposed layer surface 111 of an underlying material of a device 100.

Figure 9D:
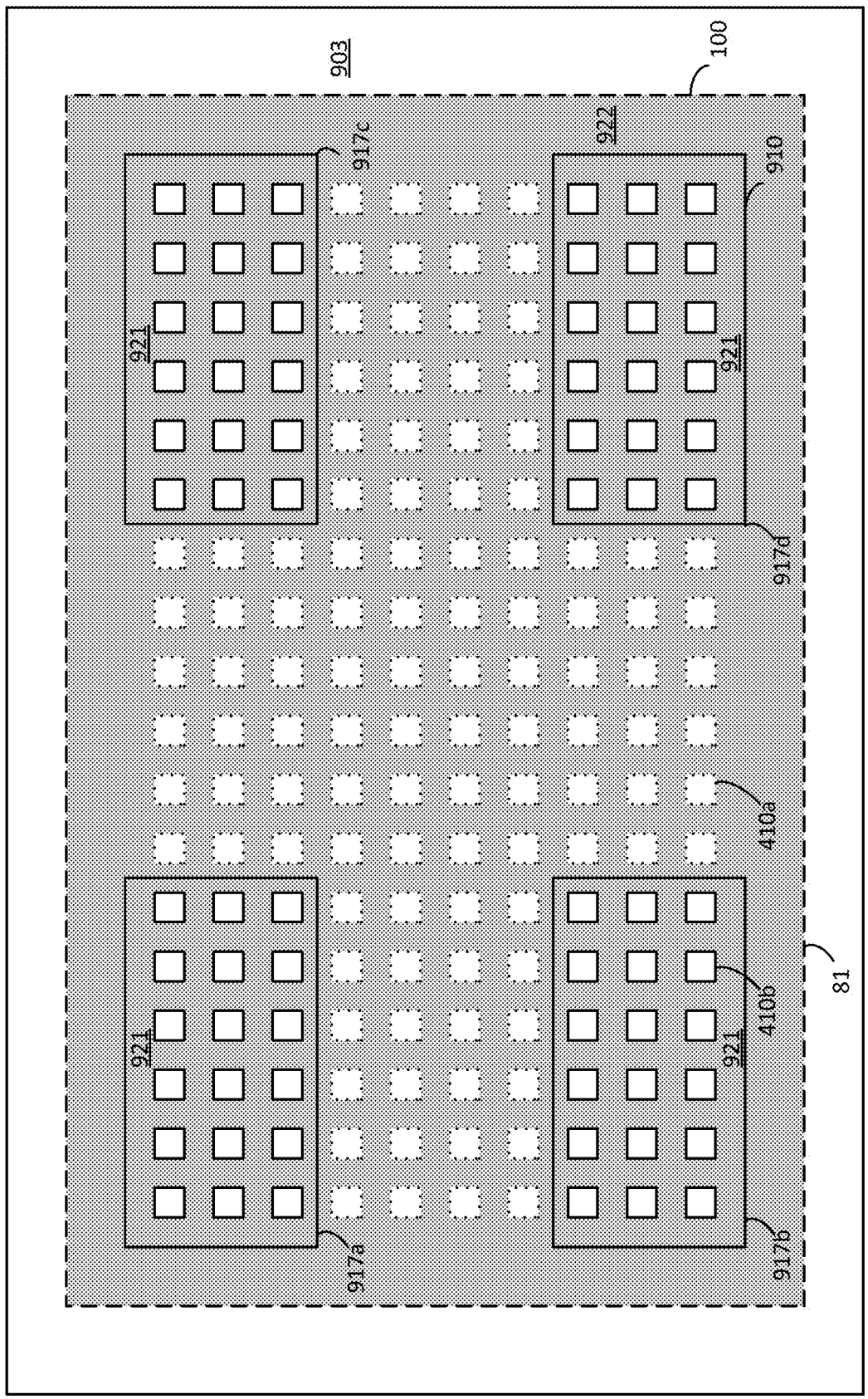

FIG. 9D illustrates a non-limiting example of an open mask 903 having and/or defining a plurality of apertures 917a-917d. The apertures 917a-917d are, in some non-limiting examples, positioned such that they may selectively expose certain regions 921 of the device 100, while masking other regions 922. In some non-limiting examples, the lateral aspects 410b of certain emissive region(s) 1910 corresponding to at least some (sub-) pixel(s) 340/264x are exposed through the apertures 917a-917d in the regions 921, while the lateral aspects 410a of other emissive region(s) 1910 corresponding to at least one some (sub-) pixel(s) 340/264x lie within regions 922 and are thus masked.

Figure 10A:
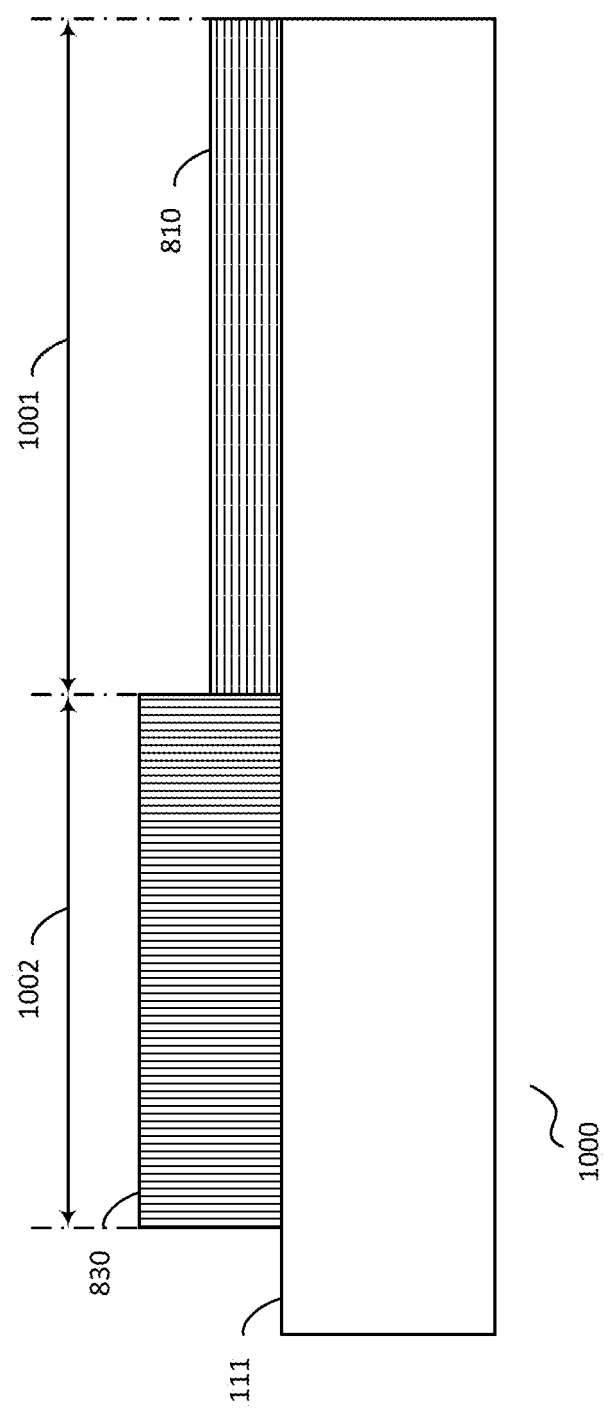
FIG. 10A is an example version of the device of FIG. 1, with additional example deposition steps according to an example in the present disclosure.

Turning now to FIG. 10A there is shown an example version 1000 of the device 100 shown in FIG. 1, but with a number of additional deposition steps that are described herein.

The device 1000 shows a lateral aspect of the exposed layer surface 111 of the underlying material. The lateral aspect comprises a first portion 1001 and a second portion 1002. In the first portion 1001, an NIC 810 is disposed on the exposed layer surface 111. However, in the second portion 1002, the exposed layer surface 111 is substantially devoid of the NIC 810.

In some non-limiting examples, the first portion 1001 and the second portion 1002 are substantially adjacent to one another in a lateral aspect.

In some non-limiting examples, the exposed layer surface 1001 of the first portion 1001 and the exposed layer surface 111 of the second portion 1002 are substantially proximate to one another in a cross-sectional aspect. That is to say, while there may be one or more intervening layers between the exposed layer surface 111 of the first portion 1001 and the exposed layer surface 111 of the second portion 1002, the difference between them caused thereby is, in some non-limiting examples, a fraction of the lateral extent of at least one of the first portion 1001 and the second portion 1002.

After selective deposition of the NIC 810 across the first portion 1001, the conductive coating 830 is deposited over the device 1000, in some non-limiting examples, using an open mask and/or a mask-free deposition process.

The NIC 810 provides, within the first portion 1001, a surface with a relatively low initial sticking probability $S_0$, for the conductive coating 830, and that is substantially less than the initial sticking probability $S_0$, for the conductive coating 830, of the exposed layer surface 111 of the underlying material of the device 1000 within the second portion 1002.

Thus, the conductive coating 830 is formed as a closed film in the second portion 1002, while the first portion 1001 is substantially devoid of the conductive coating 830.

In this fashion, the NIC 810 may be selectively deposited, including using a shadow mask, to allow the conductive coating 830 to be deposited, including without limitation, using an open mask and/or a mask-free deposition process, so as to form a device feature, including without limitation, at least one of the first electrode 120, the second electrode 140, the auxiliary electrode 1750, a busbar 4150 and/or at least one layer thereof, and/or a conductive element electrically coupled thereto.

Figure 10B:
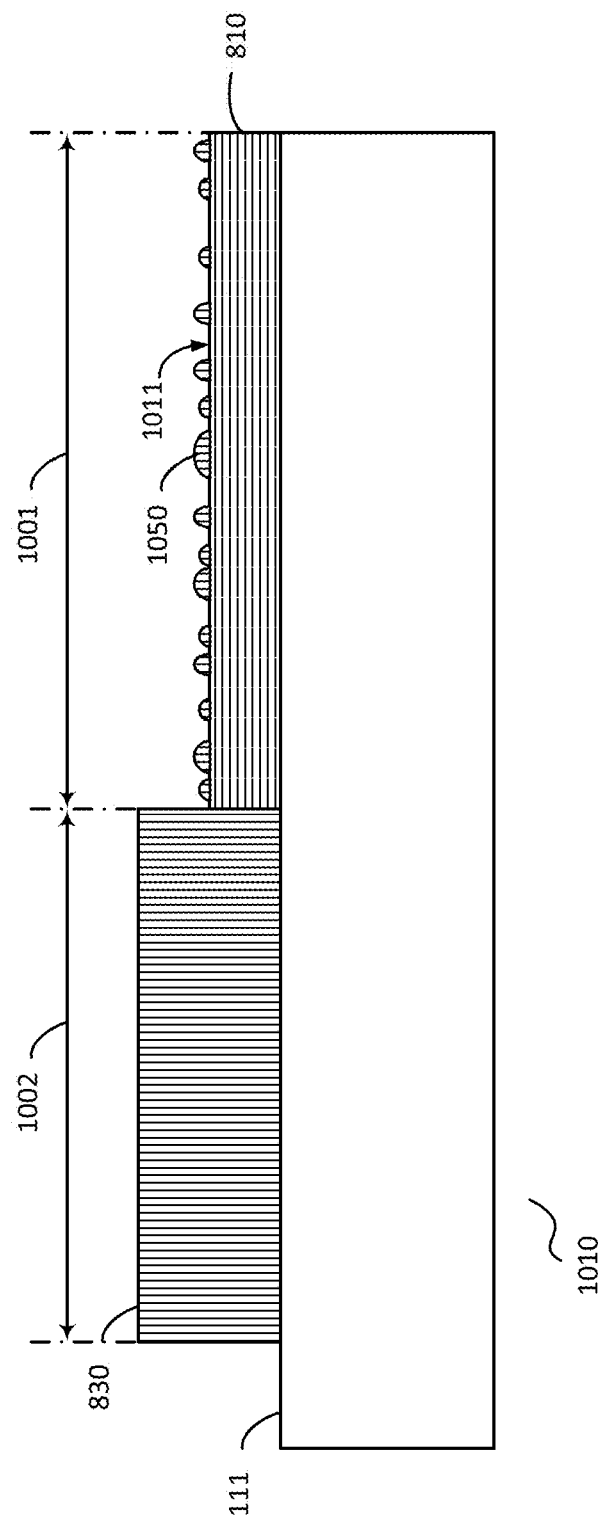
FIG. 10B is an example version of the device of FIG. 10A, in which the first portion includes a discontinuous coating.

Turning now to FIG. 10B, there is shown an example 1010 of an example version of the device 1000.

The device 1010 shows, contrary to the device 1000 of FIG. 10A, in which the first portion 1001 is shown to be substantially devoid of the conductive coating 830, a first portion 1001 that is substantially devoid of a closed film 4530 of the conductive coating 830. In FIG. 10B, due to the presence of the NIC 810 in the first portion 1001, the conductive coating material 831 is deposited as a discontinuous coating 1050 on an exposed layer surface 1011 of the NIC 810 in the first portion 1001. In some non-limiting examples, the discontinuous coating 1050 comprises a plurality of discrete islands. In some non-limiting examples, at least some of the islands are disconnected from one another. In other words, in some non-limiting examples, the discontinuous coating 1050 may comprise features that are physically separated from one another, such that the discontinuous coating 1050 does not form a continuous layer.

In this fashion, the NIC 810 may be selectively deposited, including using a shadow mask, to allow the conductive coating 830 to be deposited, including without limitation, using an open mask and/or a mask-free deposition process, so as to form a device feature, including without limitation, at least one of the first electrode 120, the second electrode 140, the auxiliary electrode 1750, a busbar 4150 and/or at least one layer thereof, and/or a conductive element electrically coupled thereto.

Without wishing to be limited to any particular theory, it may be postulated that during the deposition of the conductive coating 830, some vapor monomers of the conductive coating material 831 impinging on the exposed layer surface 1011 of the NIC 810, may condense to form small clusters and/or islands thereon. However, substantial growth of such clusters and/or islands, which, if left unimpeded, may lead to possible formation of a substantially closed film 4530 of the conductive coating material 831 on the exposed layer surface 1011 of the NIC 810, is inhibited due to one or more properties and/or features of the NIC 810. Accordingly, in some non-limiting examples, the discontinuous coating 1050 comprises the conductive coating material 831 for forming the conductive coating 830. In some non-limiting examples, a peak absorption wavelength of the discontinuous coating 1050 may be less than a peak wavelength of the photon(s) emitted and/or transmitted by the device 1020. By way of non-limiting example, the discontinuous coating 1050 may exhibit a peak absorption at a wavelength less than about 470 nm, less than about 460 nm, less than about 455 nm, less than about 450 nm, less than about 445 nm, less than about 440 nm, less than about 430 nm, less than about 420 nm, and/or less than about 400 nm.

In some non-limiting examples, the discontinuous coating 1050 containing the clusters and/or islands may be arranged to be on, and/or in physical contact with, and/or proximate to, the NIC 810.

FIG. 10C is a simplified example plan view of the first portion 1001 of the device 1010 according to the non-limiting example of FIG. 10B.

Figure 10D:
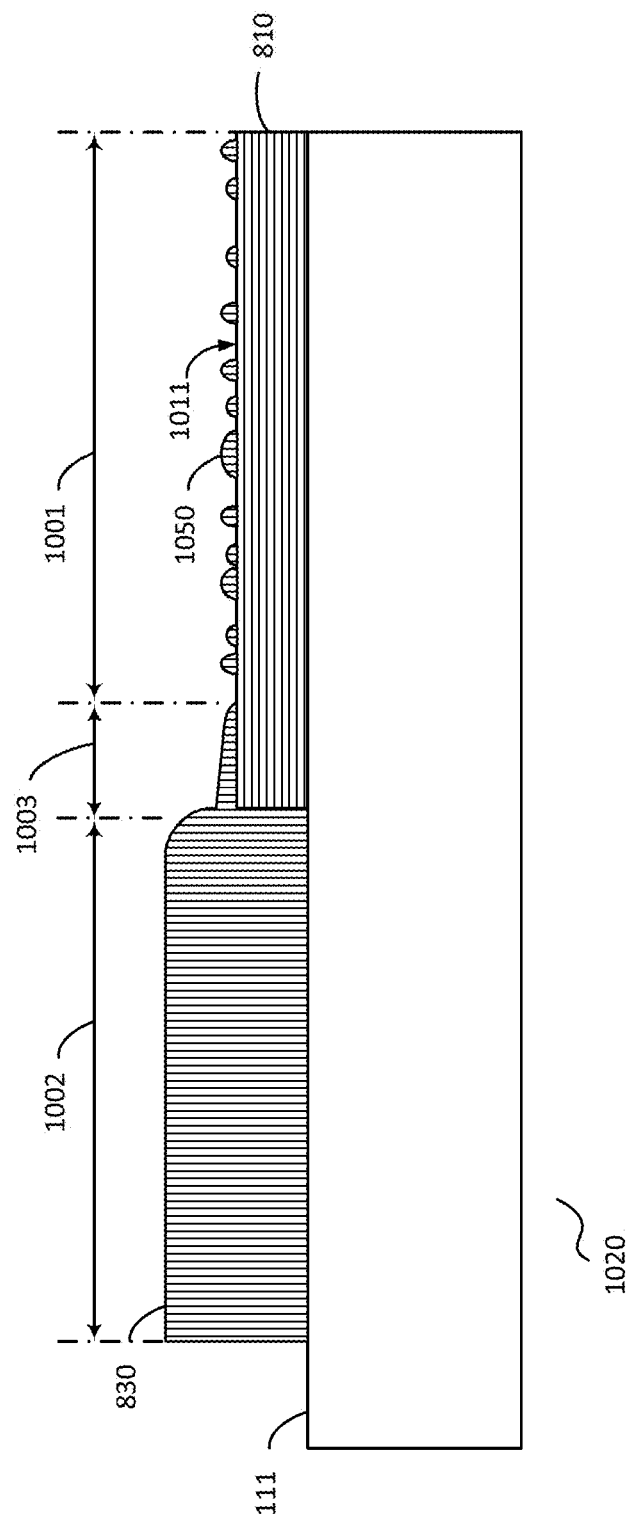
FIG. 10D is an example version of the device of FIG. 10A, further comprising a third portion.

Turning now to FIG. 10D, there is shown an example version 1020 of a simplified version of the device 1020 shown in FIG. 10B, in which there is shown a third portion 1003 arranged between the first portion 1001 and the second portion 1002 in a lateral aspect of the device 1020. Although not shown as such, in some non-limiting examples, the third portion 1003 may be considered to be a part of the first portion 1001, representing an extremity thereof and/or an interface with the second portion 1002. In some non-limiting examples, the third portion 1003 comprises the conductive coating 830 covering at least a portion of the exposed layer surface 1011 of the underlying material, which, in some non-limiting examples, may comprise the NIC 810 in the third portion 1003 as well as the first portion 1001. In some non-limiting examples, a thickness of the conductive coating 830 in the third portion 1003 may be less than a thickness of the conductive coating 830 in the second portion 1002. Although not specifically illustrated in FIG. 10C, a thickness of the NIC 810 in the third portion 1003 may be less than a thickness of the NIC 810 in the first portion 1001.

In some non-limiting examples, the conductive coating 830 in the third portion 1003 comprises at least one projection and/or at least one recess in a lateral aspect of the device 1020. In some non-limiting examples, the conductive coating 830 in the third portion 1003 may comprise an intermediate stage coating, in some non-limiting examples, having a plurality of apertures, including without limitation, pinholes, tears and/or cracks.

Figure 10E:
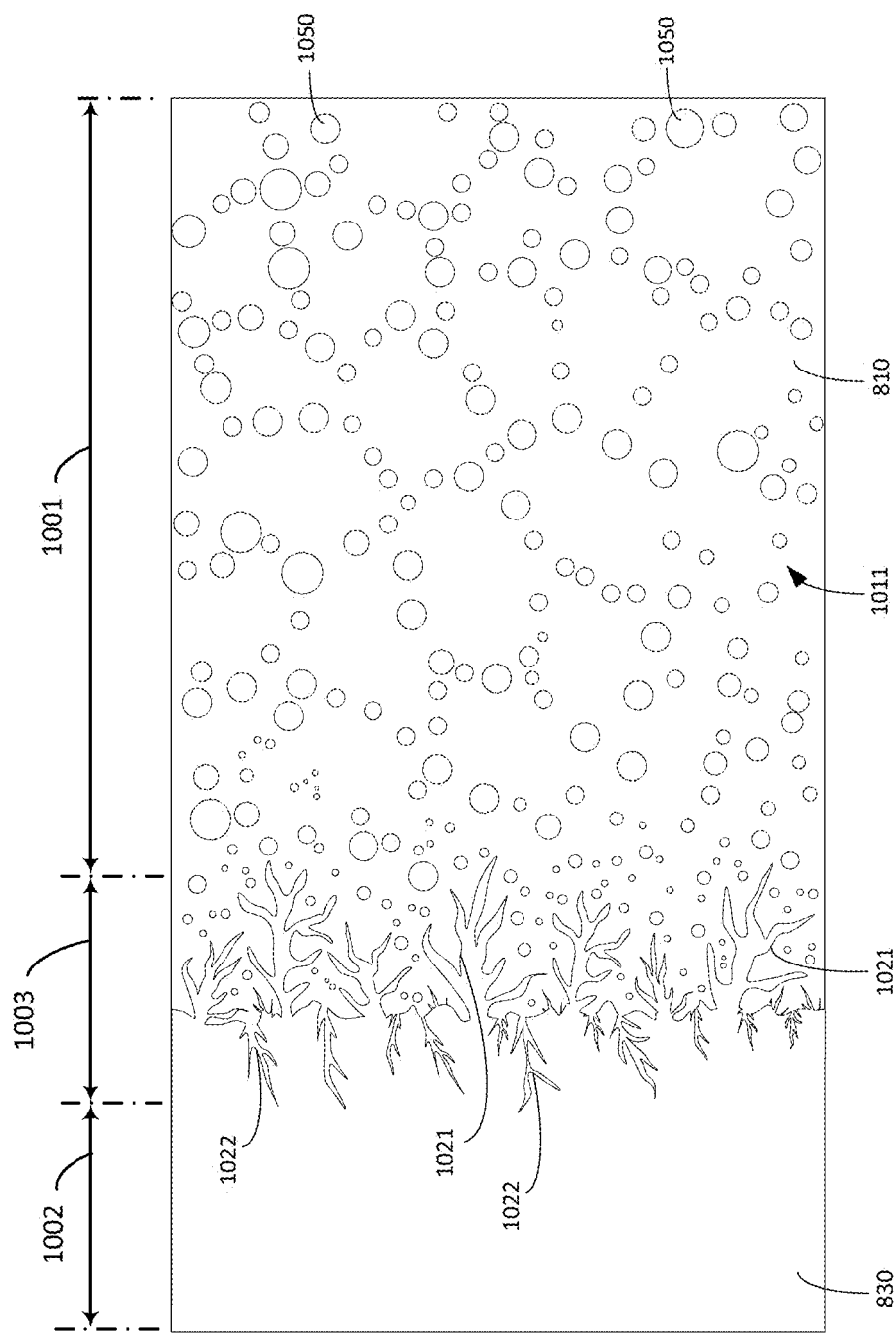
FIG. 10E is a plan view of a portion of the device of FIG. 10D.

FIG. 10E is a simplified example plan view of a part of the device 1020, showing the third portion 1003 arranged between (parts of the first portion 1001 and the second portion 1002). In some non-limiting examples, the conductive coating 830 in the third portion 1003, and in some non-limiting examples, encroaching into the first portion 1001 the conductive coating 830 may comprise at least one dendritic projection 1021 that, in some non-limiting examples, may extend laterally toward and/or encroach at least partially into the adjacent first portion 1001. The at least one dendritic projections 1021 coat the exposed layer surface 1011 of the underlying material, which in some non-limiting examples may be the NIC 810. In some non-limiting examples, at least one part of the exposed layer surface 1011 of the underlying material, which in some non-limiting examples may be the NIC 810, may not be covered by the conductive coating 830 in the third portion 1003, and in some non-limiting examples, extending into the second portion 1002, may comprise at least one dendritic recess 1022 that, in some non-limiting examples, may extend laterally toward and/or extend at least partially into the adjacent second portion 1002.

Without wishing to be bound by any particular theory, it may be postulated that at least one projection, including without limitation, the at least one dendritic projections 1021, and/or at least one recess, including without limitation, the at least one dendritic recesses 1022 may be formed at and/or near and/or because of at least one localized non-uniformity in at least one property and/or feature of the NIC 810. By way of non-limiting example, at least one localized area of the NIC 810 may exhibit a variation in a critical surface tension, a physical discontinuity in, and/or a domain boundary of a thin film coating thereof. In some non-limiting examples, such variation may be formed between adjacent crystallites and may cause the conductive coating material 831 to be selectively deposited, thus resulting in the at least one projection and/or at least one recess. In some non-limiting examples, the at least one dendritic projection 1021 may comprise at least one feature formed by coalescence of at least one island and/or cluster of the discontinuous coating 1050 with another at least one island and/or cluster of the discontinuous coating 1050 and/or with the conductive coating 830.

In some non-limiting examples, the third portion 1003 may comprise at least one area that is substantially devoid of the conductive coating material 831, including without limitation, a gap in the discontinuous coating 1050, a gap between at least one feature of at least one dendritic projection 1021 and/or at least one feature of at least one dendritic recess 1022. In some non-limiting examples, a surface coverage of the conductive coating material 831 in the third portion 1003 may be, in some non-limiting examples, between about 30% to about 90%, and/or between about 40% to about 80%.

Thus, the first portion 1001 is substantially devoid of the conductive coating 830.

In this fashion, the NIC 810 may be selectively deposited, including using a shadow mask, to allow the conductive coating 830 to be deposited, including without limitation, using an open mask and/or a mask-free deposition process, so as to form a device feature, including without limitation, at least one of the first electrode 120, the second electrode 140, the auxiliary electrode 1750, a busbar 4150 and/or at least one layer thereof, and/or a conductive element electrically coupled thereto.

Figure 11A:
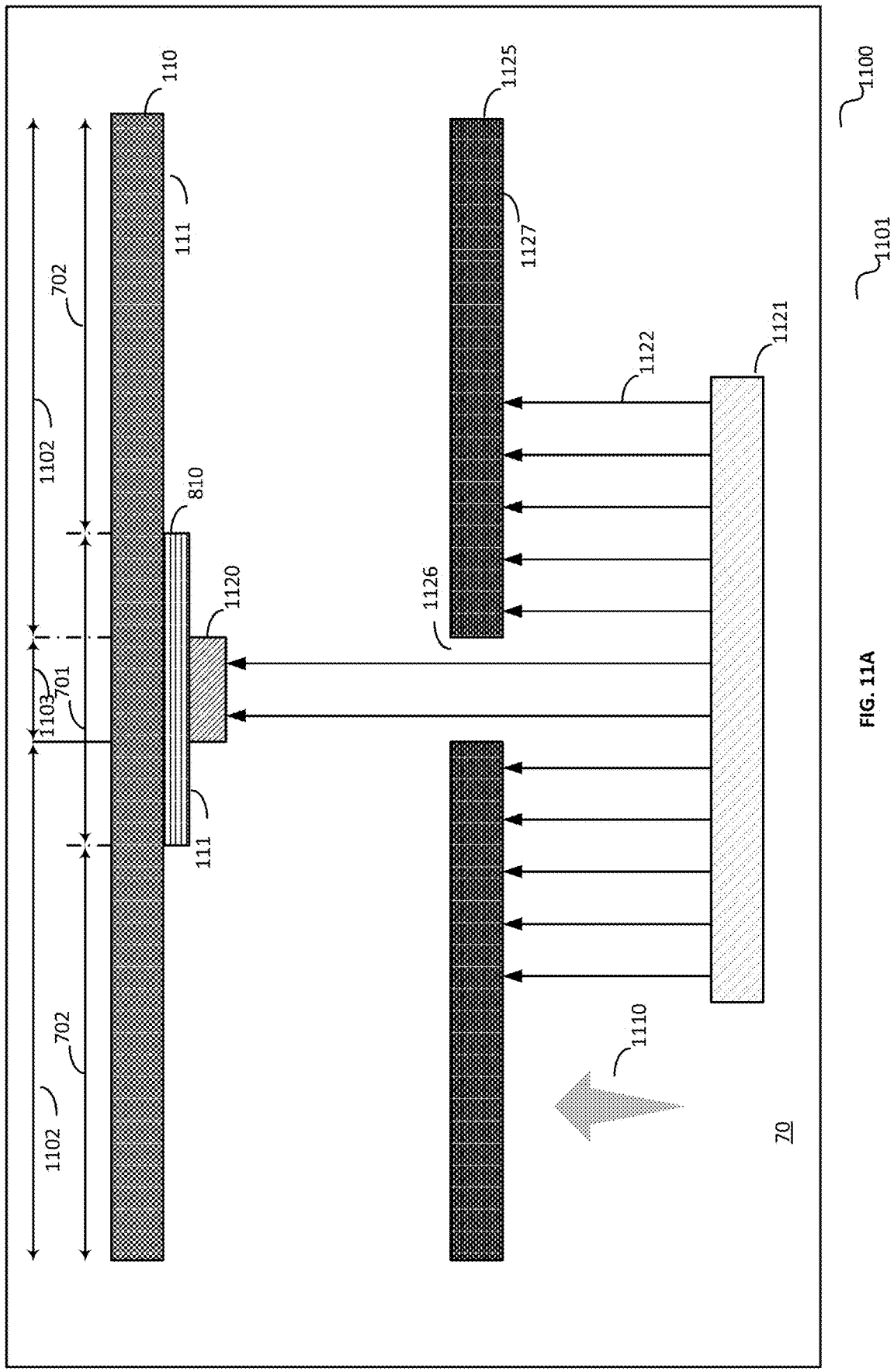
FIG. 11A is a schematic diagram showing an example process for depositing a selective coating that is a nucleation-promoting coating (NPC) in a pattern on an exposed layer surface that comprises the deposited pattern of the selective coating of FIG. 9.
Figure 11B:
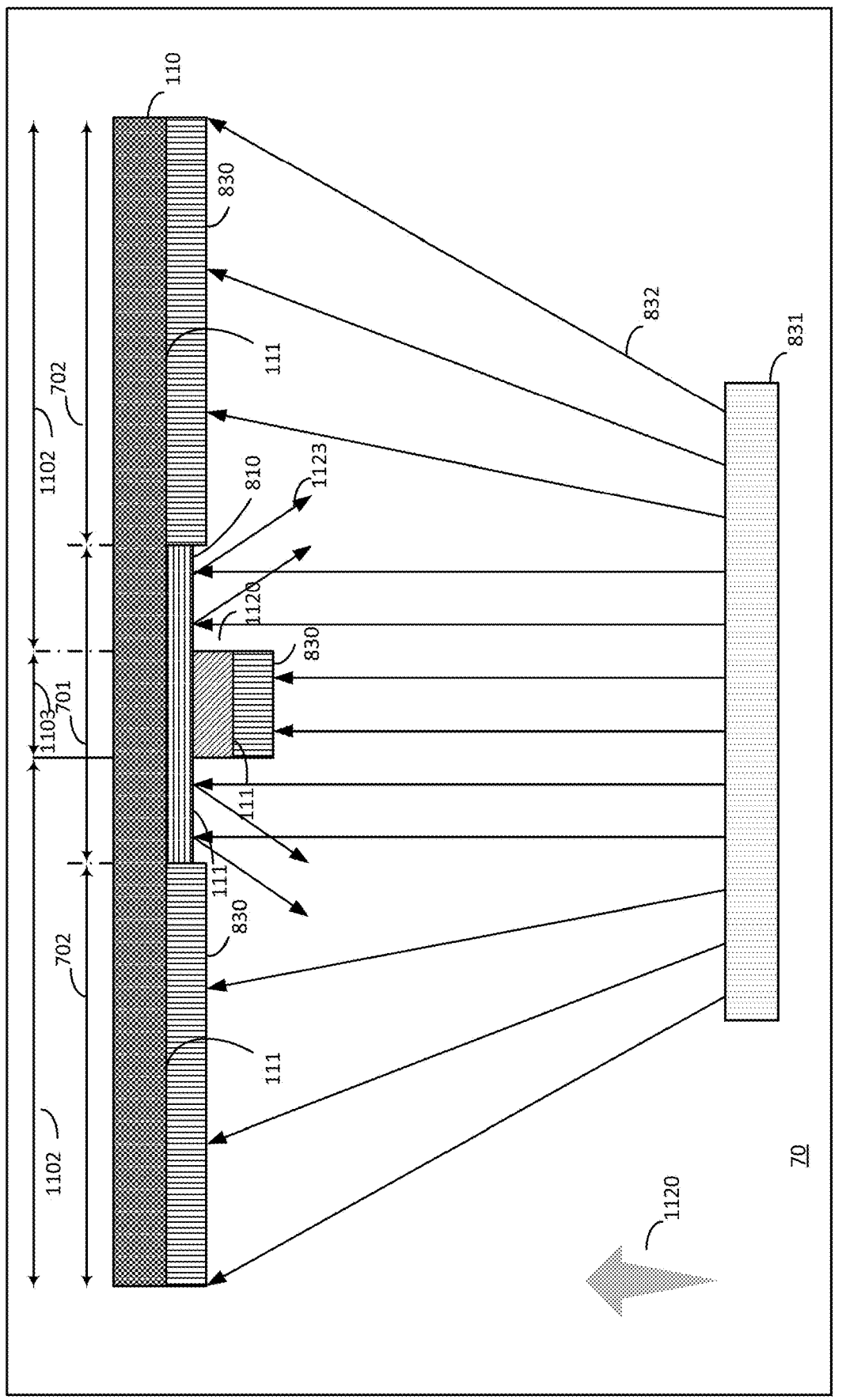
FIG. 11B is a schematic diagram showing an example process for depositing a conductive coating in a pattern on an exposed layer surface that comprises the deposited pattern of the NPC of FIG. 11A.

FIGS. 11A-11B illustrate a non-limiting example of an evaporative process, shown generally at 1100, in a chamber 70, for selectively depositing a conductive coating 830 onto a second portion 702 of an exposed layer surface 111 of an underlying material (in the figure, for purposes of simplicity of illustration only, the substrate 110), that is substantially devoid of the NIC 810 that was selectively deposited onto a first portion 701, and onto an NPC portion 1103 of the first portion 701, on which the NIC 810 was deposited, including without limitation, by the evaporative process 700 of FIG. 7.

FIG. 11A describes a stage 1101 of the process 1100, in which, once the NIC 810 has been deposited on the first portion 701 of an exposed layer surface 111 of an underlying material (in the figure, the substrate 110), the NPC 1120 may be deposited on the NPC portion 1103 of the exposed layer surface 111 of the NIC 810 disposed on the substrate 110 in the first portion 701. In the figure, by way of non-limiting example, the NPC portion 1103 extends completely within the first portion 701.

In the stage 1101, a quantity of an NPC material 1121, is heated under vacuum, to evaporate and/or sublime 1122 the NPC material 1121. In some non-limiting examples, the NPC material 1121 comprises entirely, and/or substantially, a material used to form the NPC 1120. Evaporated NPC material 1122 is directed through the chamber 70, including in a direction indicated by arrow 1110, toward the exposed layer surface 111 of the first portion 701 and of the NPC portion 1103. When the evaporated NPC material 1122 is incident on the NPC portion 1103 of the exposed layer surface 111, the NPC 1120 is formed thereon.

In some non-limiting examples, deposition of the NPC material 1121 may be performed using an open mask and/or a mask-free deposition technique, such that the NPC 1120 is formed substantially across the entire exposed layer surface 111 of the underlying material (which could be, in the figure, the NIC 810 throughout the first portion 701 and/or the substrate 110 through the second portion 702) to produce a treated surface (of the NPC 1120).

In some non-limiting examples, as shown in the figure for the stage 1101, the NPC 1120 may be selectively deposited only onto a portion, in the example illustrated, the NPC portion 1103, of the exposed layer surface 111 (in the figure, of the NIC 810), by the interposition, between the NPC material 1121 and the exposed layer surface 111, of a shadow mask 1125, which in some non-limiting examples, may be an FMM. The shadow mask 1125 has at least one aperture 1126 extending therethrough such that a part of the evaporated NPC material 1122 passes through the aperture 1126 and is incident on the exposed layer surface 111 (in the figure, by way of non-limiting example, of the NIC 810 within the NPC portion 1103 only) to form the NPC 1120. Where the evaporated NPC material 1122 does not pass through the aperture 1126 but is incident on the surface 1127 of the shadow mask 1125, it is precluded from being disposed on the exposed layer surface 111 to form the NPC 1120. The portion 1102 of the exposed layer surface 111 that lies beyond the NPC portion 1103, is thus substantially devoid of the NPC 1120. In some non-limiting examples (not shown), the evaporated NPC material 1122 that is incident on the shadow mask 1125 may be deposited on the surface 1127 thereof.

While the exposed layer surface 111 of the NIC 810 in the first portion 701 exhibits a relatively low initial sticking probability $S_0$ for the conductive coating 830, in some non-limiting examples, this may not necessarily be the case for the NPC coating 1120, such that the NPC coating 1120 is still selectively deposited on the exposed layer surface (in the figure, of the NIC 810) in the NPC portion 1103.

Accordingly, a patterned surface is produced upon completion of the deposition of the NPC 1120.

FIG. 11B describes a stage 1104 of the process 1100, in which, once the NIC 810 has been deposited on the first portion 701 of an exposed layer surface 111 of an underlying material (in the figure, the substrate 110) and the NPC 1120 has been deposited on the NPC portion 1103 of the exposed layer surface 111 (in the figure, of the NIC 810), the conductive coating 830 may be deposited on the NPC portion 1103 and the second portion 702 of the exposed layer surface 111 (in the figure, the substrate 110).

In the stage 1104, a quantity of a conductive coating material 831, is heated under vacuum, to evaporate and/or sublime 832 the conductive coating material 831. In some non-limiting examples, the conductive coating material 831 comprises entirely, and/or substantially, a material used to form the conductive coating 830. Evaporated conductive coating material 832 is directed through the chamber 70, including in a direction indicated by arrow 1120, toward the exposed layer surface 111 of the first portion 701, of the NPC portion 1103 and of the second portion 702. When the evaporated conductive coating material 832 is incident on the NPC portion 1103 of the exposed layer surface 111 (of the NPC 1120) and on the second portion 702 of the exposed layer surface 111 (of the substrate 110), that is, other than on the exposed layer surface 111 of the NIC 810, the conductive coating 830 is formed thereon.

In some non-limiting examples, as shown in the figure for the stage 1104, deposition of the conductive coating 830 may be performed using an open mask and/or mask-free deposition process, such that the conductive coating 830 is formed substantially across the entire exposed layer surface 111 of the underlying material (other than where the underlying material is the NIC 810) to produce a treated surface (of the conductive coating 830).

Indeed, as shown in FIG. 11B, the evaporated conductive coating material 832 is incident both on an exposed layer surface 111 of NIC 810 across the first portion 701 that lies beyond the NPC portion 1103, as well as the exposed layer surface 111 of the NPC 1120 across the NPC portion 1103 and the exposed layer surface 111 of the substrate 110 across the second portion 702 that is substantially devoid of NIC 810.

Since the exposed layer surface 111 of the NIC 810 in the first portion 701 that lies beyond the NPC portion 1103 exhibits a relatively low initial sticking probability $S_0$ for the conductive coating 830 compared to the exposed layer surface 111 of the substrate 110 in the second portion 702, and/or since the exposed layer surface 111 of the NPC 1120 in the NPC portion 1103 exhibits a relatively high initial sticking probability $S_0$ for the conductive coating 830 compared to both the exposed layer surface 111 of the NIC 810 in the first portion 701 that lies beyond the NPC portion 1103 and the exposed layer surface 111 of the substrate 110 in the second portion 702, the conductive coating 830 is selectively deposited substantially only on the exposed layer surface 111 of the substrate 110 in the NPC portion 1103 and the second portion 702, both of which are substantially devoid of the NIC 810. By contrast, the evaporated conductive coating material 832 incident on the exposed layer surface 111 of NIC 810 across the first portion 701 that lies beyond the NPC portion 1103, tends not to be deposited, as shown (1123) and the exposed layer surface 111 of NIC 810 across the first portion 701 that lies beyond the NPC portion 1103 is substantially devoid of the conductive coating 830.

Accordingly, a patterned surface is produced upon completion of the deposition of the conductive coating 830.

Figure 12A:
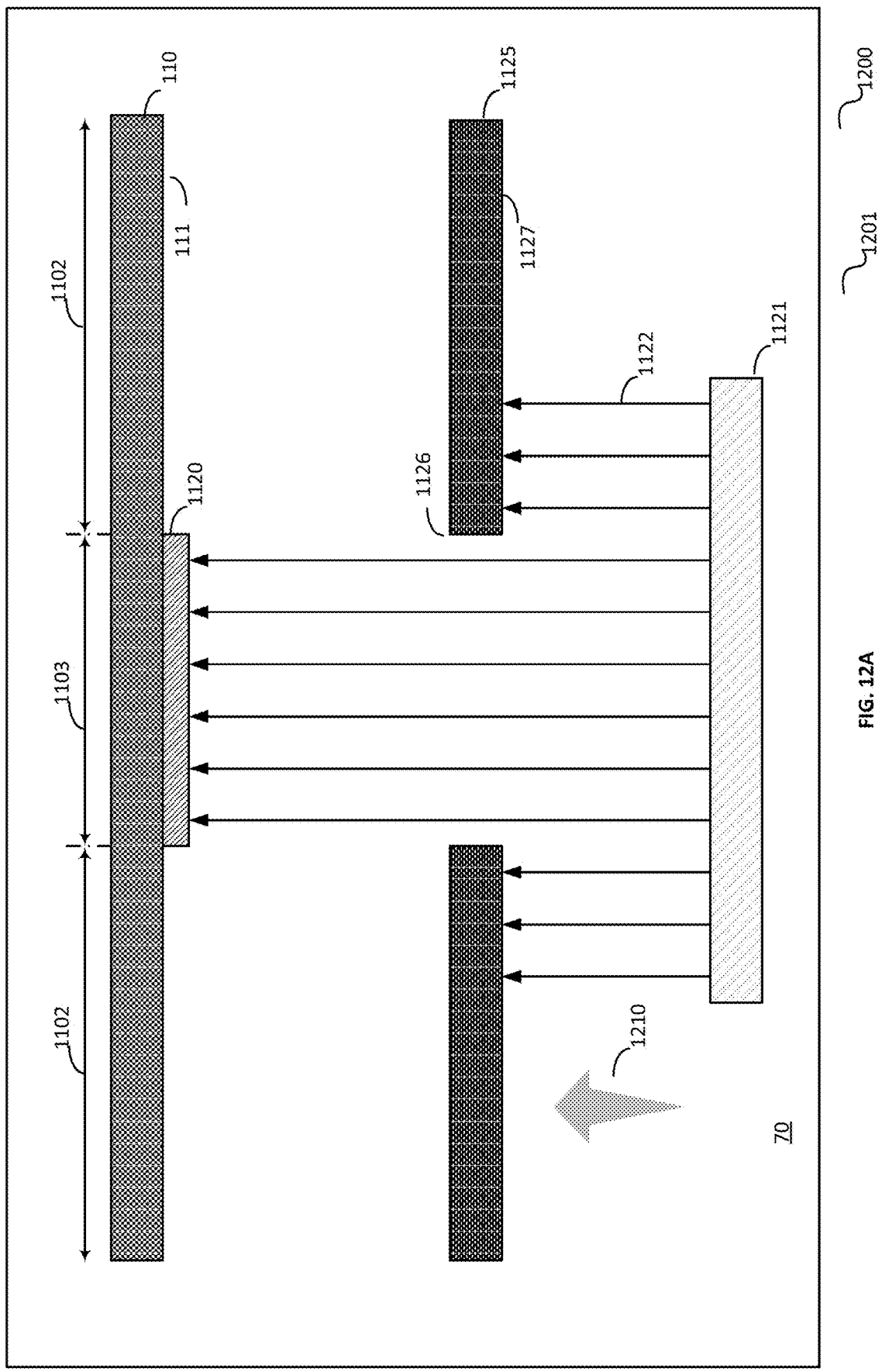
FIG. 12A is a schematic diagram showing an example process for depositing an NPC in a pattern on an exposed layer surface of an underlying material in an example version of the device of FIG. 1, according to an example in the present disclosure.
Figure 12B:
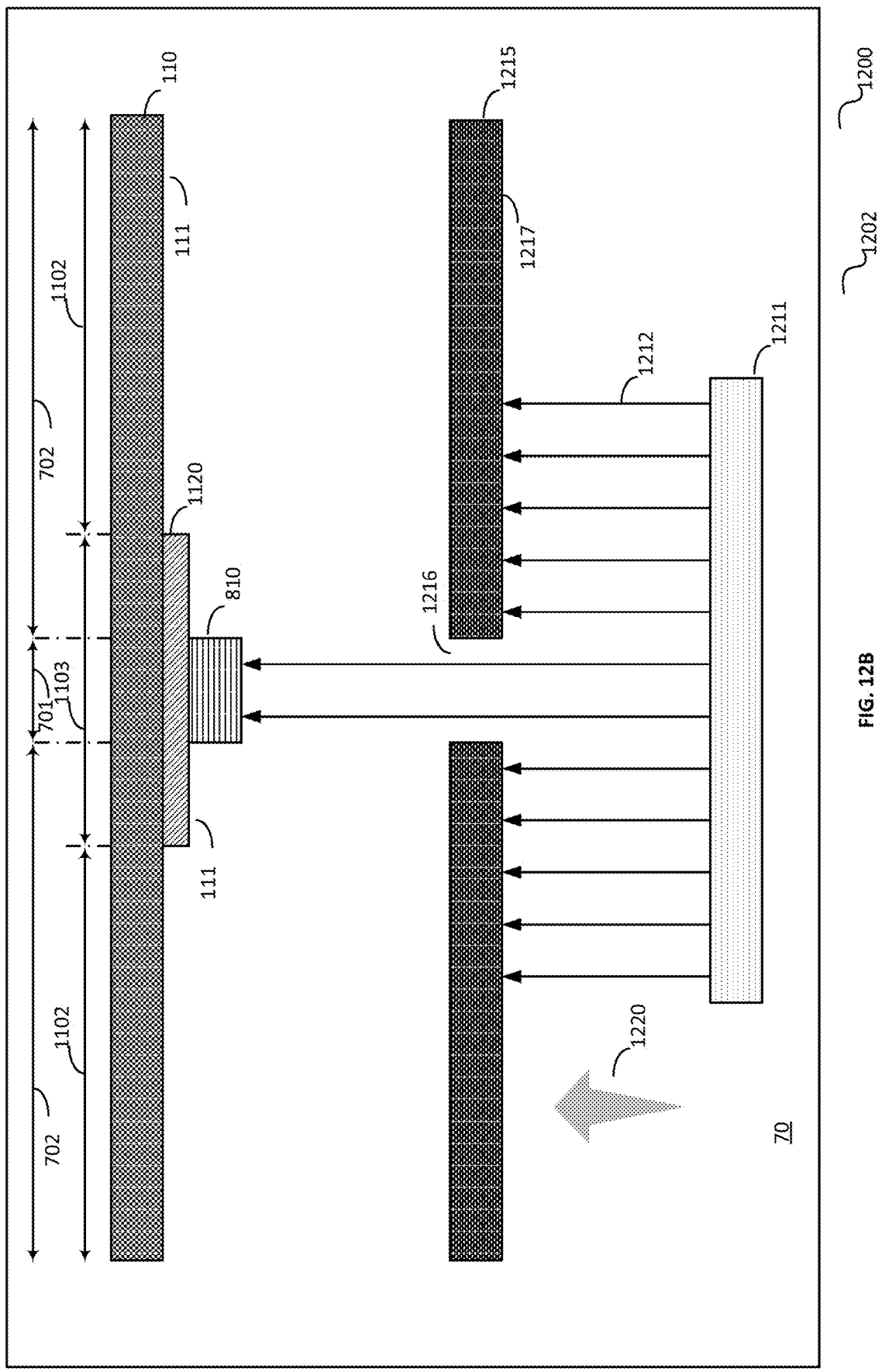
FIG. 12B is a schematic diagram showing an example process of depositing an NIC in a pattern on an exposed layer surface that comprises the deposited pattern of the NPC of FIG. 12A.
Figure 12C:
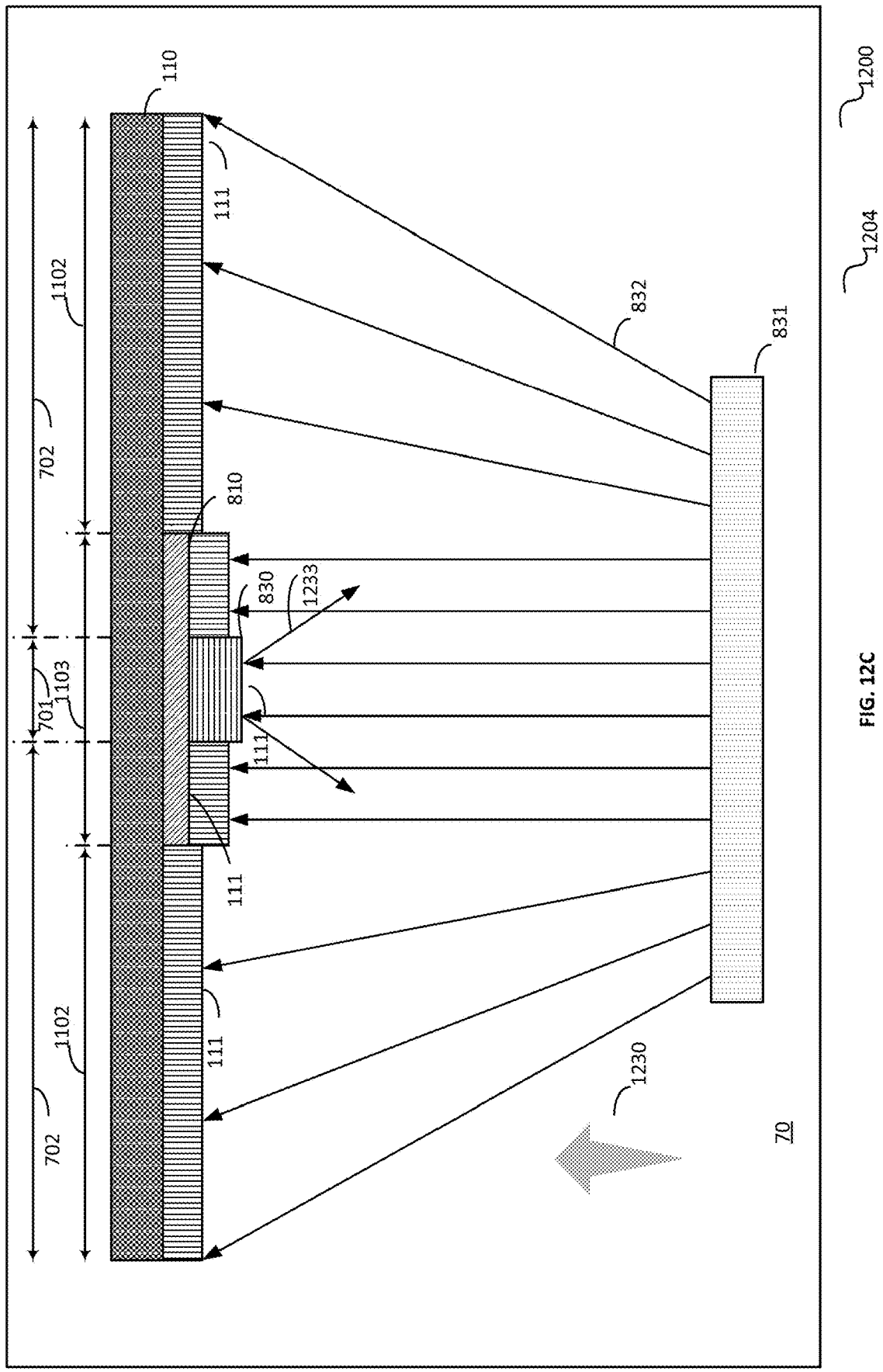
FIG. 12C is a schematic diagram showing an example process for depositing a conductive coating in a pattern on an exposed layer surface that comprises the deposited pattern of the NIC of FIG. 12B.

FIGS. 12A-12C illustrate a non-limiting example of an evaporative process, shown generally at 1200, in a chamber 70, for selectively depositing a conductive coating 830 onto a second portion 1202 (FIG. 12C) of an exposed layer surface 111 of an underlying material.

FIG. 12A describes a stage 1201 of the process 1200, in which, a quantity of an NPC material 1121, is heated under vacuum, to evaporate and/or sublime 1122 the NPC material 1121. In some non-limiting examples, the NPC material 1121 comprises entirely, and/or substantially, a material used to form the NPC 1120. Evaporated NPC material 1122 is directed through the chamber 70, including in a direction indicated by arrow 1210, toward the exposed layer surface 111 (in the figure, the substrate 110).

In some non-limiting examples, deposition of the NPC material 1121 may be performed using an open mask and/or mask-free deposition process, such that the NPC 1120 is formed substantially across the entire exposed layer surface 111 of the underlying material (in the figure, the substrate 110) to produce a treated surface (of the NPC 1120).

In some non-limiting examples, as shown in the figure for the stage 1201, the NPC 1120 may be selectively deposited only onto a portion, in the example illustrated, the NPC portion 1103, of the exposed layer surface 111, by the interposition, between the NPC material 1121 and the exposed layer surface 111, of the shadow mask 1125, which in some non-limiting examples, may be an FMM. The shadow mask 1125 has at least one aperture 1126 extending therethrough such that a part of the evaporated NPC material 1122 passes through the aperture 1126 and is incident on the exposed layer surface 111 to form the NPC 1120 in the NPC portion 1103. Where the evaporated NPC material 1122 does not pass through the aperture 1126 but is incident on the surface 1127 of the shadow mask 1125, it is precluded from being disposed on the exposed layer surface 111 to form the NPC 1120 within the portion 1102 of the exposed layer surface 111 that lies beyond the NPC portion 1103. The portion 1102 is thus substantially devoid of the NPC 1120. In some non-limiting examples (not shown), the NPC material 1121 that is incident on the shadow mask 1125 may be deposited on the surface 1127 thereof.

When the evaporated NPC material 1122 is incident on the exposed layer surface 111, that is, in the NPC portion 1103, the NPC 1120 is formed thereon.

Accordingly, a patterned surface is produced upon completion of the deposition of the NPC 1120.

FIG. 12B describes a stage 1202 of the process 1200, in which, once the NPC 1120 has been deposited on the NPC portion 1103 of an exposed layer surface 111 of an underlying material (in the figure, the substrate 110), the NIC 810 may be deposited on a first portion 701 of the exposed layer surface 111. In the figure, by way of non-limiting example, the first portion 701 extends completely within the NPC portion 1103. As a result, in the figure, by way of non-limiting example, the portion 1102 comprises that portion of the exposed layer surface 111 that lies beyond the first portion 701.

In the stage 1202, a quantity of an NIC material 1211, is heated under vacuum, to evaporate and/or sublime 1212 the NIC material 1211. In some non-limiting examples, the NIC material 1121 comprises entirely, and/or substantially, a material used to form the NIC 810. Evaporated NIC material 1212 is directed through the chamber 70, including in a direction indicated by arrow 1220, toward the exposed layer surface 111 of the first portion 701, of the NPC portion 1103 that extends beyond the first portion 701 and of the portion 1102. When the evaporated NIC material 1212 is incident on the first portion 701 of the exposed layer surface 111, the NIC 810 is formed thereon.

In some non-limiting examples, deposition of the NIC material 1211 may be performed using an open mask and/or mask-free deposition process, such that the NIC 810 is formed substantially across the entire exposed layer surface 111 of the underlying material to produce a treated surface (of the NIC 810).

In some non-limiting examples, as shown in the figure for the stage 1202, the NIC 810 may be selectively deposited only onto a portion, in the example illustrated, the first portion 701, of the exposed layer surface 111 (in the figure, of the NPC 1120), by the interposition, between the NIC material 1211 and the exposed layer surface 111, of a shadow mask 1215, which in some non-limiting examples, may be an FMM. The shadow mask 1215 has at least one aperture 1216 extending therethrough such that a part of the evaporated NIC material 1212 passes through the aperture 1216 and is incident on the exposed layer surface 111 (in the figure, by way of non-limiting example, of the NPC 1120) to form the NIC 810. Where the evaporated NIC material 1212 does not pass through the aperture 1216 but is incident on the surface 1217 of the shadow mask 1215, it is precluded from being disposed on the exposed layer surface 111 to form the NIC 810 within the second portion 702 beyond the first portion 701. The second portion 702 of the exposed layer surface 111 that lies beyond the first portion 701, is thus substantially devoid of the NIC 810. In some non-limiting examples (not shown), the evaporated NIC material 1212 that is incident on the shadow mask 1215 may be deposited on the surface 1217 thereof.

While the exposed layer surface 111 of the NPC 1120 in the NPC portion 1103 exhibits a relatively high initial sticking probability $S_0$ for the conductive coating 830, in some non-limiting examples, this may not necessarily be the case for the NIC coating 810. Even so, in some non-limiting examples such affinity for the NIC coating 810 may be such that the NIC coating 810 is still selectively deposited on the exposed layer surface 111 (in the figure, of the NPC 1120) in the first portion 701.

Accordingly, a patterned surface is produced upon completion of the deposition of the NIC 810.

FIG. 12C describes a stage 1204 of the process 1200, in which, once the NIC 810 has been deposited on the first portion 701 of an exposed layer surface 111 of an underlying material (in the figure, the NPC 1120), the conductive coating 830 may be deposited on a second portion 702 of the exposed layer surface 111 (in the figure, of the substrate 110 across the portion 1102 beyond the NPC portion 1103 and of the NPC 1120 across the NPC portion 1103 beyond the first portion 701).

In the stage 1204, a quantity of a conductive coating material 831, is heated under vacuum, to evaporate and/or sublime 832 the conductive coating material 831. In some non-limiting examples, the conductive coating material 831 comprises entirely, and/or substantially, a material used to form the conductive coating 830. Evaporated conductive coating material 832 is directed through the chamber 70, including in a direction indicated by arrow 1230, toward the exposed layer surface 111 of the first portion 701, of the NPC portion 1103 and of the portion 1102 beyond the NPC portion 1103. When the evaporated conductive coating material 832 is incident on the NPC portion 1103 of the exposed layer surface 111 (of the NPC 1120) beyond the first portion 701 and on the portion 1102 beyond the NPC portion 1103 of the exposed layer surface 111 (of the substrate 110), that is, on the second portion 702 other than on the exposed layer surface 111 of the NIC 810, the conductive coating 830 is formed thereon.

In some non-limiting examples, as shown in the figure for the stage 1204, deposition of the conductive coating 830 may be performed using an open mask and/or mask-free deposition process, such that the conductive coating 830 is formed substantially across the entire exposed layer surface 111 of the underlying material (other than where the underlying material is the NIC 810) to produce a treated surface (of the conductive coating 830).

Indeed, as shown in FIG. 12C, the evaporated conductive coating material 832 is incident both on an exposed layer surface 111 of NIC 810 across the first portion 701 that lies within the NPC portion 1103, as well as the exposed layer surface 111 of the NPC 1120 across the NPC portion 1103 that lies beyond the first portion 701 and the exposed layer surface 111 of the substrate 110 across the portion 1102 that lies beyond the NPC portion 1103.

Since the exposed layer surface 111 of the NIC 810 in the first portion 701 exhibits a relatively low initial sticking probability $S_0$ for the conductive coating 830 compared to the exposed layer surface 111 of the substrate 110 in the second portion 702 that lies beyond the NPC portion 1103, and/or since the exposed layer surface 111 of the NPC 1120 in the NPC portion 1103 that lies beyond the first portion 701 exhibits a relatively high initial sticking probability $S_0$ for the conductive coating 830 compared to both the exposed layer surface 111 of the NIC 810 in the first portion 701 and the exposed layer surface 111 of the substrate 110 in the portion 1102 that lies beyond the NPC portion 1103, the conductive coating 830 is selectively deposited substantially only on the exposed layer surface 111 of the substrate 110 in the NPC portion 1103 that lies beyond the first portion 701 and on the portion 1102 that lies beyond the NPC portion 1103, both of which are substantially devoid of the NIC 810. By contrast, the evaporated conductive coating material 832 incident on the exposed layer surface 111 of NIC 810 across the first portion 701, tends not to be deposited, as shown (1233) and the exposed layer surface 111 of NIC 810 across the first portion 701 is substantially devoid of the conductive coating 830.

Accordingly, a patterned surface is produced upon completion of the deposition of the conductive coating 830.

In some non-limiting examples, an initial deposition rate of the evaporated conductive coating material 832 on the exposed layer surface 111 in the second portion 702 may be at least and/or greater than about 200 times, at least and/or greater than about 550 times, at least and/or greater than about 900 times, at least and/or greater than about 1,000 times, at least and/or greater than about 1,500 times, at least and/or greater than about 1,900 times and/or at least and/or greater than about 2,000 times an initial deposition rate of the evaporated conductive coating material 832 on the exposed layer surface 111 of the NIC 810 in the first portion 701.

Figure 13A:
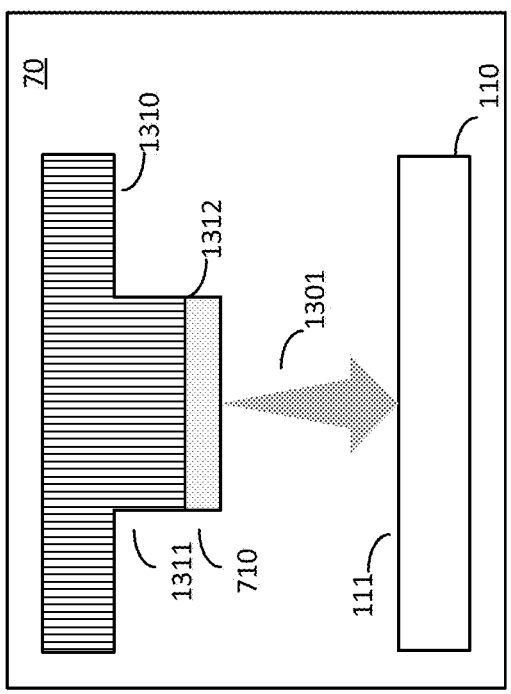
FIGS. 13A-13C are schematic diagrams that show example stages of an example printing process for depositing a selective coating in a pattern on an exposed layer surface in an example version of the device of FIG. 1, according to an example in the present disclosure.
Figure 13B:
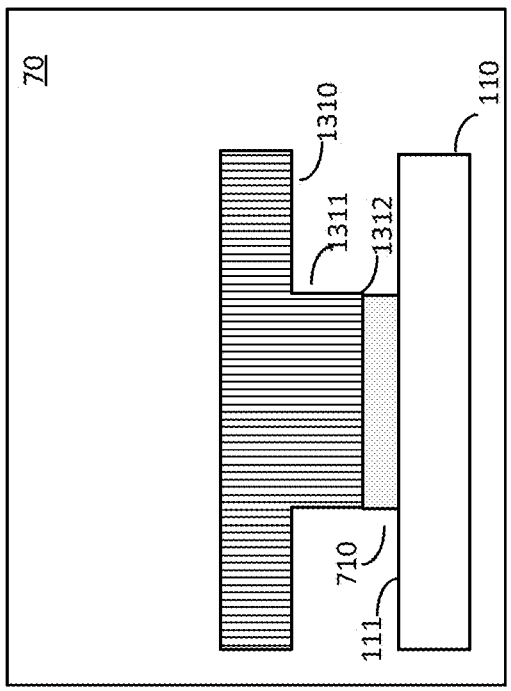
Figure 13C:
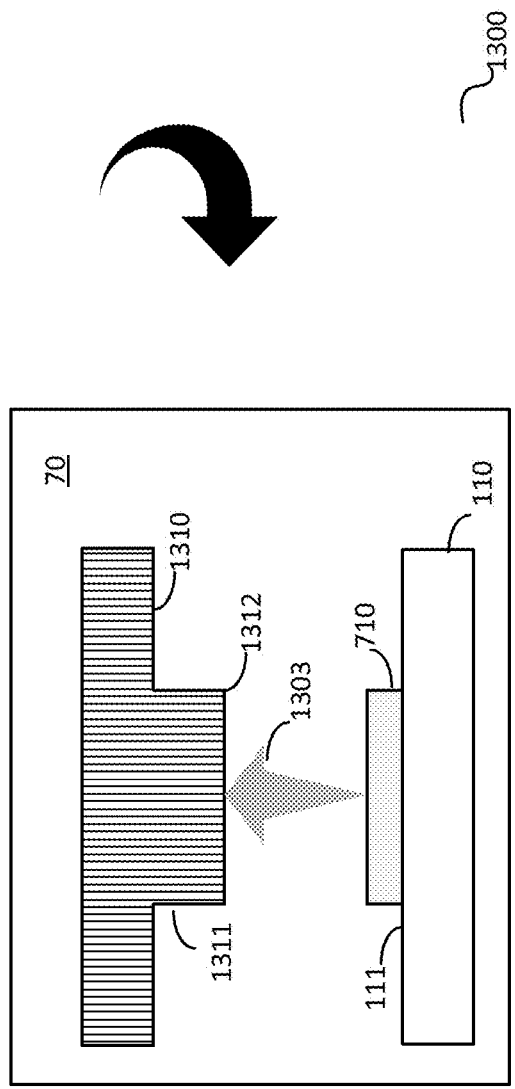

FIGS. 13A-13C illustrate a non-limiting example of a printing process, shown generally at 1300, for selectively depositing a selective coating 710, which in some non-limiting examples may be an NIC 810 and/or an NPC 1120, onto an exposed layer surface 111 of an underlying material (in the figure, for purposes of simplicity of illustration only, the substrate 110).

FIG. 13A describes a stage of the process 1300, in which a stamp 1310 having a protrusion 1311 thereon is provided with the selective coating 710 on an exposed layer surface 1312 of the protrusion 1311. Those having ordinary skill in the relevant art will appreciate that the selective coating 710 may be deposited and/or deposited on the protrusion surface 1312 using a variety of suitable mechanisms.

FIG. 13B describes a stage of the process 1300, in which the stamp 1310 is brought into proximity 1301 with the exposed layer surface 111, such that the selective coating 710 comes into contact with the exposed layer surface 111 and adheres thereto.

FIG. 13C describes a stage of the process 1300, in which the stamp 1310 is moved away 1303 from the exposed layer surface 111, leaving the selective coating 710 deposited on the exposed layer surface 111.

Selective Deposition of a Patterned Electrode

The foregoing may be combined in order to effect the selective deposition of at least one conductive coating 830 to form a patterned electrode 120, 140, 1750, 4150, which may, in some non-limiting examples, may be the second electrode 140 and/or an auxiliary electrode 1750, without employing an FMM within the high-temperature conductive coating 830 deposition process. In some non-limiting examples, such patterning may permit and/or enhance the transmissivity of the device 100.

Figure 14:
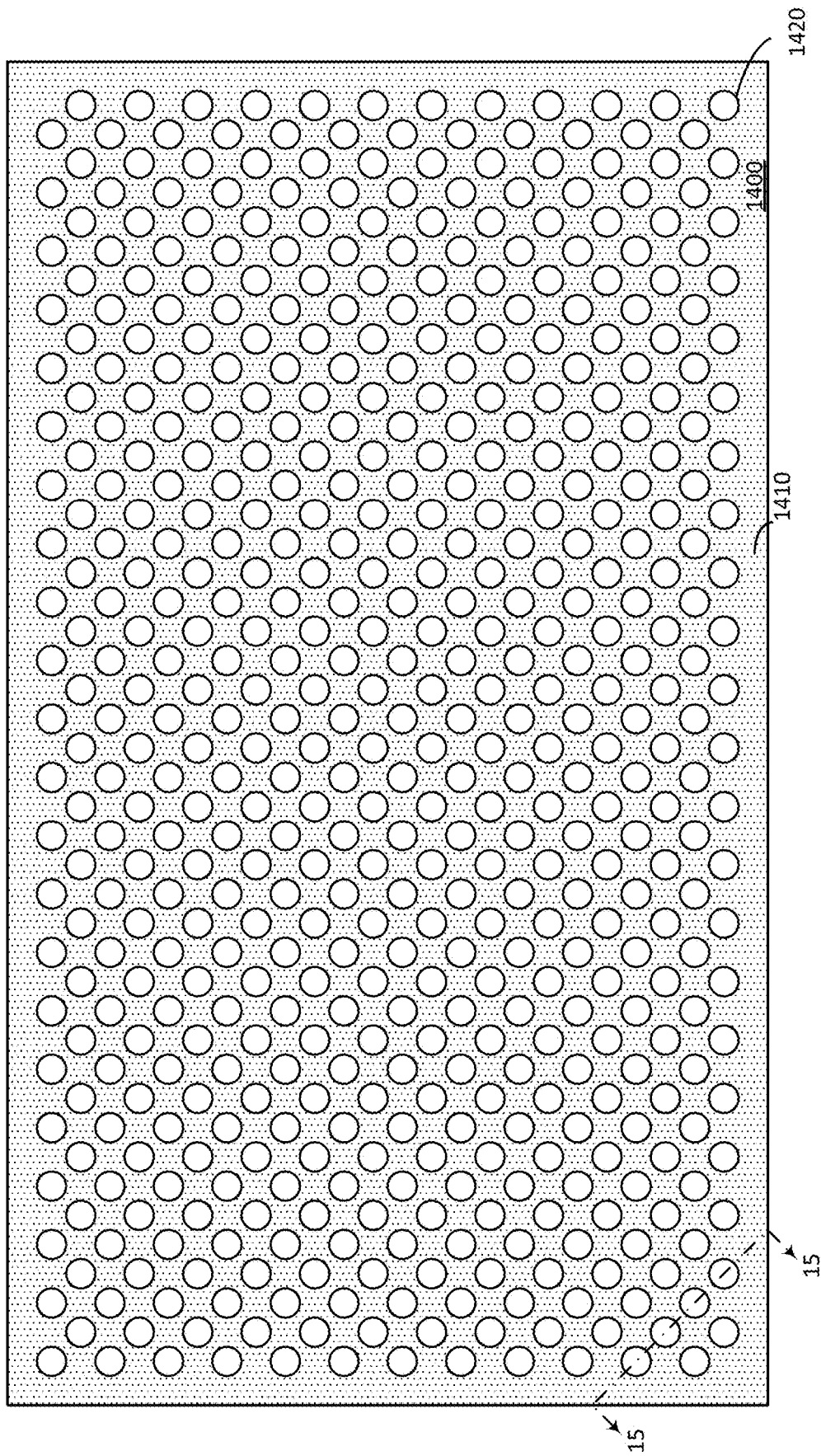
FIG. 14 is a schematic diagram illustrating, in plan view, an example patterned electrode suitable for use in a version of the device of FIG. 1, according to an example in the present disclosure.

FIG. 14 shows an example patterned electrode 1400 in plan view, in the figure, the second electrode 140 suitable for use in an example version 1500 (FIG. 15) of the device 100. The electrode 1400 is formed in a pattern 1410 that comprises a single continuous structure, having or defining a patterned plurality of apertures 1420 therewithin, in which the apertures 1420 correspond to regions of the device 100 where there is no cathode 342.

In the figure, by way of non-limiting example, the pattern 1410 is disposed across the entire lateral extent of the device 1500, without differentiation between the lateral aspect(s) 410 of emissive region(s) 1910 corresponding to (sub-) pixel(s) 340/264x and the lateral aspect(s) 420 of non-emissive region(s) 1920 surrounding such emissive region(s) 1910. Thus, the example illustrated may correspond to a device 1500 that is substantially transmissive relative to light incident on an external surface thereof, such that a substantial part of such externally-incident light may be transmitted through the device 1500, in addition to the emission (in a top-emission, bottom-emission and/or double-sided emission) of photons generated internally within the device 1500 as disclosed herein.

The transmittivity of the device 1500 may be adjusted and/or modified by altering the pattern 1410 employed, including without limitation, an average size of the apertures 1420, and/or a spacing and/or density of the apertures 1420.

Figure 15:
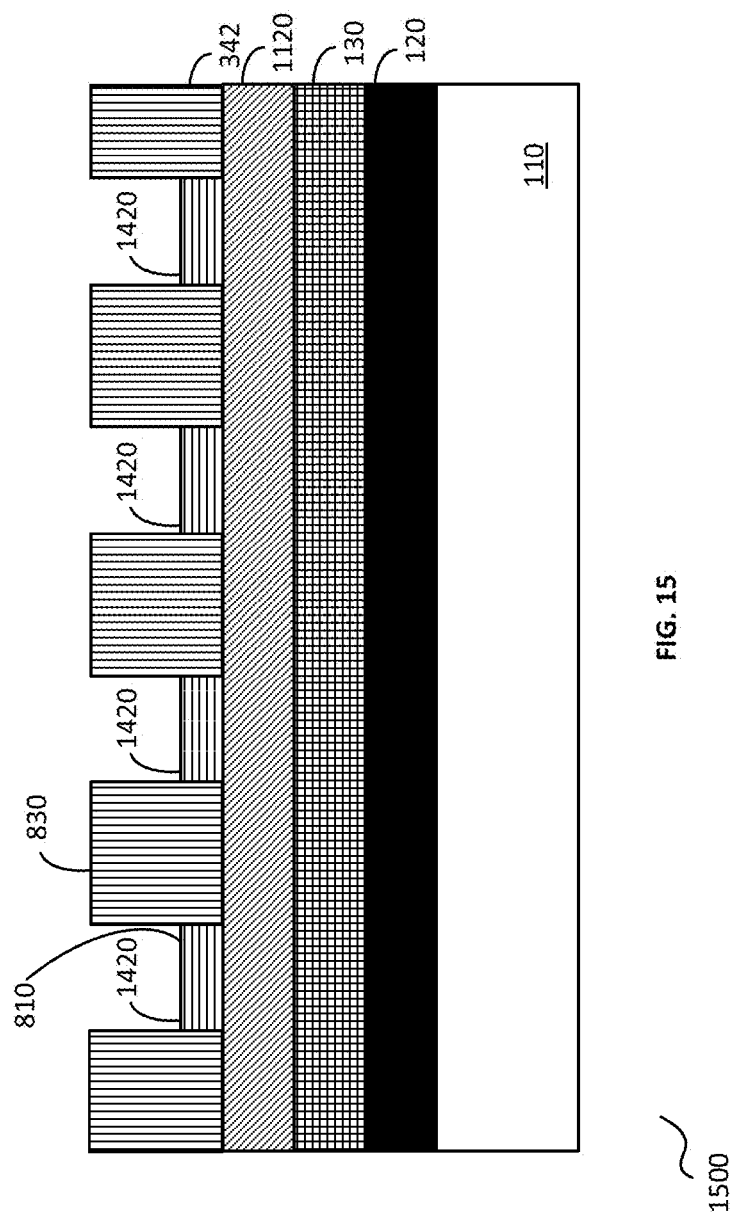
FIG. 15 is a schematic diagram illustrating an example cross-sectional view of the device of FIG. 14 taken along line 15-15.

Turning now to FIG. 15, there is shown a cross-sectional view of the device 1500, taken along line 15-15 in FIG. 14. In the figure, the device 1500 is shown as comprising the substrate 110, the first electrode 120 and the at least one semiconducting layer 130. In some non-limiting examples, an NPC 1120 is disposed on substantially all of the exposed layer surface 111 of the at least one semiconducting layer 130. In some non-limiting examples, the NPC 1120 could be omitted.

An NIC 810 is selectively disposed in a pattern substantially corresponding to the pattern 1410 on the exposed layer surface 111 of the underlying material, which, as shown in the figure, is the NPC 1120 (but, in some non-limiting examples, could be the at least one semiconducting layer 130 if the NPC 1120 has been omitted).

A conductive coating 830 suitable for forming the patterned electrode 1400, which in the figure is the second electrode 140, is disposed on substantially all of the exposed layer surface 111 of the underlying material, using an open mask and/or a mask-free deposition process, neither of which employs any FMM during the high-temperature conductive coating deposition process. The underlying material comprises both regions of the NIC 810, disposed in the pattern 1410, and regions of NPC 1120, in the pattern 1410 where the NIC 810 has not been deposited. In some non-limiting examples, the regions of the NIC 810 may correspond substantially to a first portion comprising the apertures 1420 shown in the pattern 1410.

Because of the nucleation-inhibiting properties of those regions of the pattern 1410 where the NIC 810 was disposed (corresponding to the apertures 1420), the conductive coating 830 disposed on such regions tends not to remain, resulting in a pattern of selective deposition of the conductive coating 830, that corresponds substantially to the remainder of the pattern 1410, leaving those regions of the first portion of the pattern 1410 corresponding to the apertures 1420 substantially devoid of the conductive coating 830.

In other words, the conductive coating 830 that will form the cathode 342 is selectively deposited substantially only on a second portion comprising those regions of the NPC 1120 that surround but do not occupy the apertures 1420 in the pattern 1410.

Figure 16A:
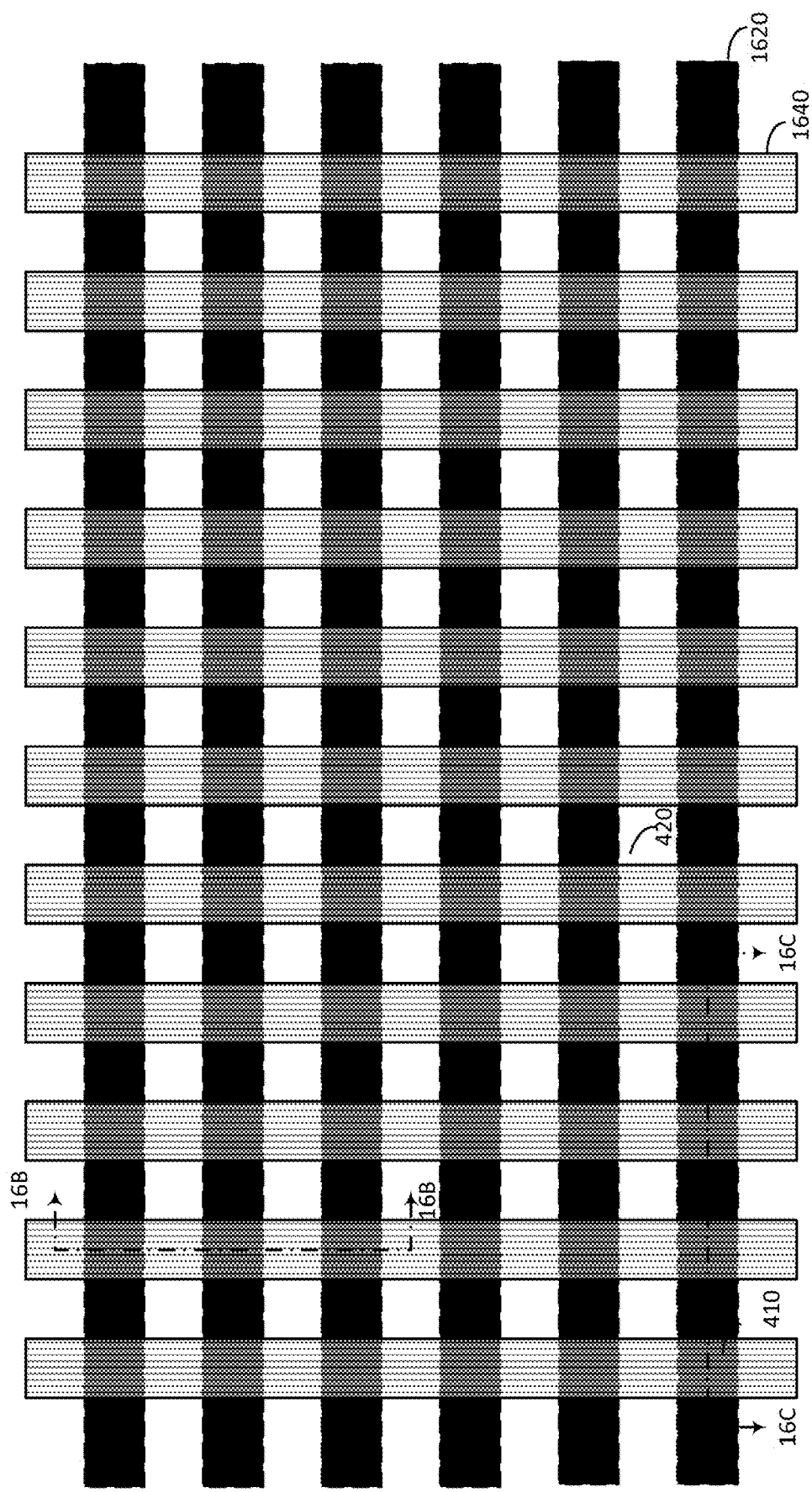
FIG. 16A is a schematic diagram illustrating, in plan view, a plurality of example patterns of electrodes suitable for use in an example version of the device of FIG. 1, according to an example in the present disclosure.

FIG. 16A shows, in plan view, a schematic diagram showing a plurality of patterns 1620, 1640 of electrodes 120, 140, 1750.

In some non-limiting examples, the first pattern 1620 comprises a plurality of elongated, spaced-apart regions that extend in a first lateral direction. In some non-limiting examples, the first pattern 1620 may comprise a plurality of first electrodes 120. In some non-limiting examples, a plurality of the regions that comprise the first pattern 1620 may be electrically coupled.

In some non-limiting examples, the second pattern 1640 comprises a plurality of elongated, spaced-apart regions that extend in a second lateral direction. In some non-limiting examples, the second lateral direction may be substantially normal to the first lateral direction. In some non-limiting examples, the second pattern 1640 may comprise a plurality of second electrodes 140. In some non-limiting examples, a plurality of the regions that comprise the second pattern 1640 may be electrically coupled.

In some non-limiting examples, the first pattern 1620 and the second pattern 1640 may form part of an example version, shown generally at 1600 (FIG. 16C) of the device 100, which may comprise a plurality of PMOLED elements.

In some non-limiting examples, the lateral aspect(s) 410 of emissive region(s) 1910 corresponding to (sub-) pixel(s) 340/264x are formed where the first pattern 1620 overlaps the second pattern 1640. In some non-limiting examples, the lateral aspect(s) 420 of non-emissive region 1920 correspond to any lateral aspect other than the lateral aspect(s) 410.

In some non-limiting examples, a first terminal, which, in some non-limiting examples, may be a positive terminal, of the power source 15, is electrically coupled to at least one electrode 120, 140, 1750 of the first pattern 1620. In some non-limiting examples, the first terminal is coupled to the at least one electrode 120, 140, 1750 of the first pattern 1620 through at least one driving circuit 300. In some non-limiting examples, a second terminal, which, in some non-limiting examples, may be a negative terminal, of the power source 15, is electrically coupled to at least one electrode 120, 140, 1750 of the second pattern 1640. In some non-limiting examples, the second terminal is coupled to the at least one electrode 120, 140, 1750 of the second pattern 1740 through the at least one driving circuit 300.

Figure 16B:
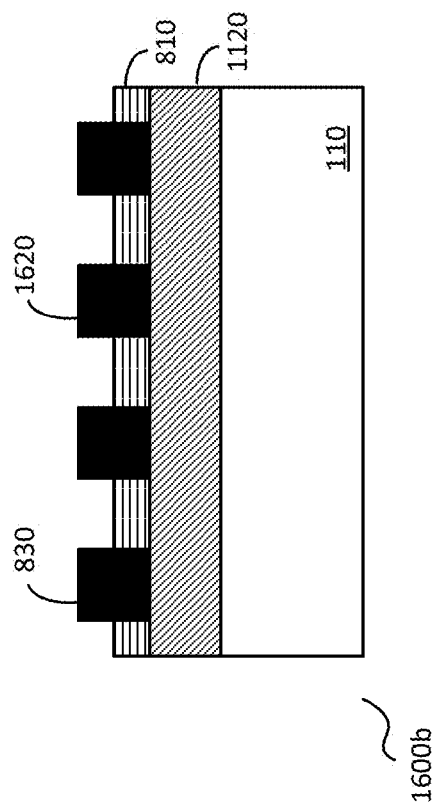
FIG. 16B is a schematic diagram illustrating an example cross-sectional view, at an intermediate stage, of the device of FIG. 16A taken along line 16B-16B.

Turning now to FIG. 16B, there is shown a cross-sectional view of the device 1600, at a deposition stage 1600b, taken along line 16B-16B in FIG. 16A. In the figure, the device 1600 at the stage 1600b is shown as comprising the substrate 110. In some non-limiting examples, an NPC 1120 is disposed on the exposed layer surface 111 of the substrate 110. In some non-limiting examples, the NPC 1120 could be omitted.

An NIC 810 is selectively disposed in a pattern substantially corresponding to the inverse of the first pattern 1620 on the exposed layer surface 111 of the underlying material, which, as shown in the figure, is the NPC 1120.

A conductive coating 830 suitable for forming the first pattern 1620 of electrodes 120, 140, 1750, which in the figure is the first electrode 120, is disposed on substantially all of the exposed layer surface 111 of the underlying material, using an open mask and/or a mask-free deposition process, neither of which employs any FMM during the high-temperature conductive coating deposition process. The underlying material comprises both regions of the NIC 810, disposed in the inverse of the first pattern 1620, and regions of NPC 1120, disposed in the first pattern 1620 where the NIC 810 has not been deposited. In some non-limiting examples, the regions of the NPC 1120 may correspond substantially to the elongated spaced-apart regions of the first pattern 1620, while the regions of the NIC 810 may correspond substantially to a first portion comprising the gaps therebetween.

Because of the nucleation-inhibiting properties of those regions of the first pattern 1620 where the NIC 810 was disposed (corresponding to the gaps therebetween), the conductive coating 830 disposed on such regions tends not to remain, resulting in a pattern of selective deposition of the conductive coating 830, that corresponds substantially to elongated spaced-apart regions of the first pattern 1620, leaving a first portion comprising the gaps therebetween substantially devoid of the conductive coating 830.

In other words, the conductive coating 830 that will form the first pattern 1620 of electrodes 120, 140, 1750 is selectively deposited substantially only on a second portion comprising those regions of the NPC 1120 (or in some non-limiting examples, the substrate 110 if the NPC 1120 has been omitted), that define the elongated spaced-apart regions of the first pattern 1620.

Figure 16C:
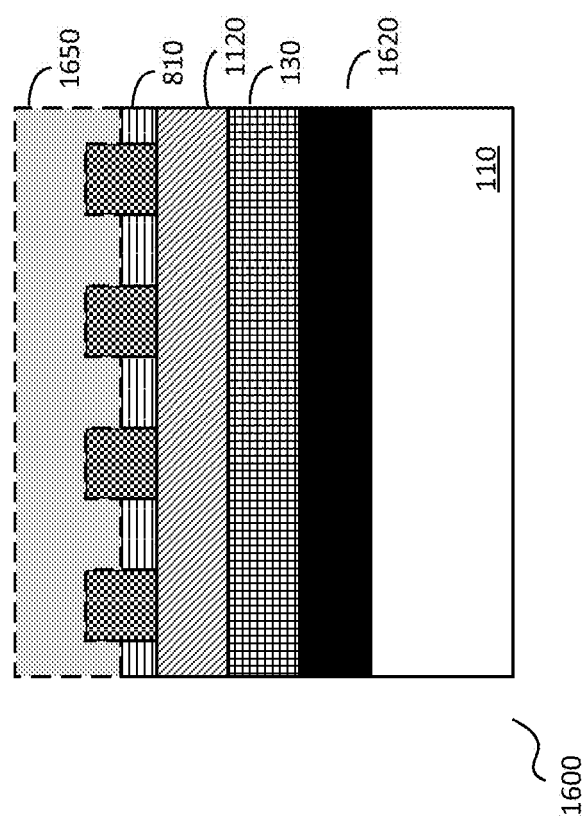
FIG. 16C is a schematic diagram illustrating an example cross-sectional view of the device of FIG. 16A taken along line 16C-16C.

Turning now to FIG. 16C, there is shown a cross-sectional view of the device 1600, taken along line 16C-16C in FIG. 16A. In the figure, the device 1600 is shown as comprising the substrate 110; the first pattern 1620 of electrodes 120 deposited as shown in FIG. 16B, and the at least one semiconducting layer(s) 130.

In some non-limiting examples, the at least one semiconducting layer(s) 130 may be provided as a common layer across substantially all of the lateral aspect(s) of the device 1600.

In some non-limiting examples, an NPC 1120 is disposed on substantially all of the exposed layer surface 111 of the at least one semiconducting layer 130. In some non-limiting examples, the NPC 1120 could be omitted.

An NIC 810 is selectively disposed in a pattern substantially corresponding to the second pattern 1640 on the exposed layer surface 111 of the underlying material, which, as shown in the figure, is the NPC 1120 (but, in some non-limiting examples, could be the at least one semiconducting layer 130 if the NPC 1120 has been omitted).

A conductive coating 830 suitable for forming the second pattern 1640 of electrodes 120, 140, 1750, which in the figure is the second electrode 140, is disposed on substantially all of the exposed layer surface 111 of the underlying material, using an open mask and/or a mask-free deposition process, neither of which employs any FMM during the high-temperature conductive coating deposition process. The underlying material comprises both regions of the NIC 810, disposed in the inverse of the second pattern 1640, and regions of NPC 1120, in the second pattern 1640 where the NIC 810 has not been deposited. In some non-limiting examples, the regions of the NPC 1120 may correspond substantially to a first portion comprising the elongated spaced-apart regions of the second pattern 1640, while the regions of the NIC 810 may correspond substantially to the gaps therebetween.

Because of the nucleation-inhibiting properties of those regions of the second pattern 1640 where the NIC 810 was disposed (corresponding to the gaps therebetween), the conductive coating 830 disposed on such regions tends not to remain, resulting in a pattern of selective deposition of the conductive coating 830, that corresponds substantially to elongated spaced-apart regions of the second pattern 1640, leaving the first portion comprising the gaps therebetween substantially devoid of the conductive coating 830.

In other words, the conductive coating 830 that will form the second pattern 1640 of electrodes 120, 140, 1750 is selectively deposited substantially only on a second portion comprising those regions of the NPC 1120 that define the elongated spaced-apart regions of the second pattern 1640.

In some non-limiting examples, a thickness of the NIC 810 and of the conductive coating 830 deposited thereafter for forming either or both of the first pattern 1620 and/or the second pattern 1640 of electrodes 120, 140, 1750, may be varied according to a variety of parameters, including without limitation, a desired application and desired performance characteristics. In some non-limiting examples, the thickness of the NIC 810 may be comparable to and/or substantially less than a thickness of conductive coating 830 deposited thereafter. Use of a relatively thin NIC 810 to achieve selective patterning of a conductive coating deposited thereafter may be suitable to provide flexible devices 1600, including without limitation, PMOLED devices. In some non-limiting examples, a relatively thin NIC 810 may provide a relatively planar surface on which the barrier coating 1650 or other thin film encapsulation (TFE) layer, may be deposited. In some non-limiting examples, providing such a relatively planar surface for application of the barrier coating 1650 may increase adhesion of the barrier coating 1650 to such surface.

At least one of the first pattern 1620 of electrodes 120, 140, 1750 and at least one of the second pattern 1640 of electrodes 120, 140, 1750 may be electrically coupled to the power source 15, whether directly and/or, in some non-limiting examples, through their respective driving circuit(s) 300 to control photon emission from the lateral aspect(s) 410 of the emissive region(s) 1910 corresponding to (sub-) pixel(s) 340/264x.

Those having ordinary skill in the relevant art will appreciate that the process of forming the second electrode 140 in the second pattern 1640 shown in FIGS. 16A-16C may, in some non-limiting examples, be used in similar fashion to form an auxiliary electrode 1750 for the device 1600. In some non-limiting examples, the second electrode 140 thereof may comprise a common electrode, and the auxiliary electrode 1750 may be deposited in the second pattern 1640, in some non-limiting examples, above or in some non-limiting examples below, the second electrode 140 and electrically coupled thereto. In some non-limiting examples, the second pattern 1640 for such auxiliary electrode 1750 may be such that the elongated spaced-apart regions of the second pattern 1640 lie substantially within the lateral aspect(s) 420 of non-emissive region(s) 1920 surrounding the lateral aspect(s) 410 of emissive region(s) 1910 corresponding to (sub-) pixel(s) 340/264x. In some non-limiting examples, the second pattern 1640 for such auxiliary electrodes 1750 may be such that the elongated spaced-apart regions of the second pattern 1640 lie substantially within the lateral aspect(s) 410 of emissive region(s) 1910 corresponding to (sub-) pixel(s) 340/264x and/or the lateral aspect(s) 420 of non-emissive region(s) 1920 surrounding them.

Figure 17:
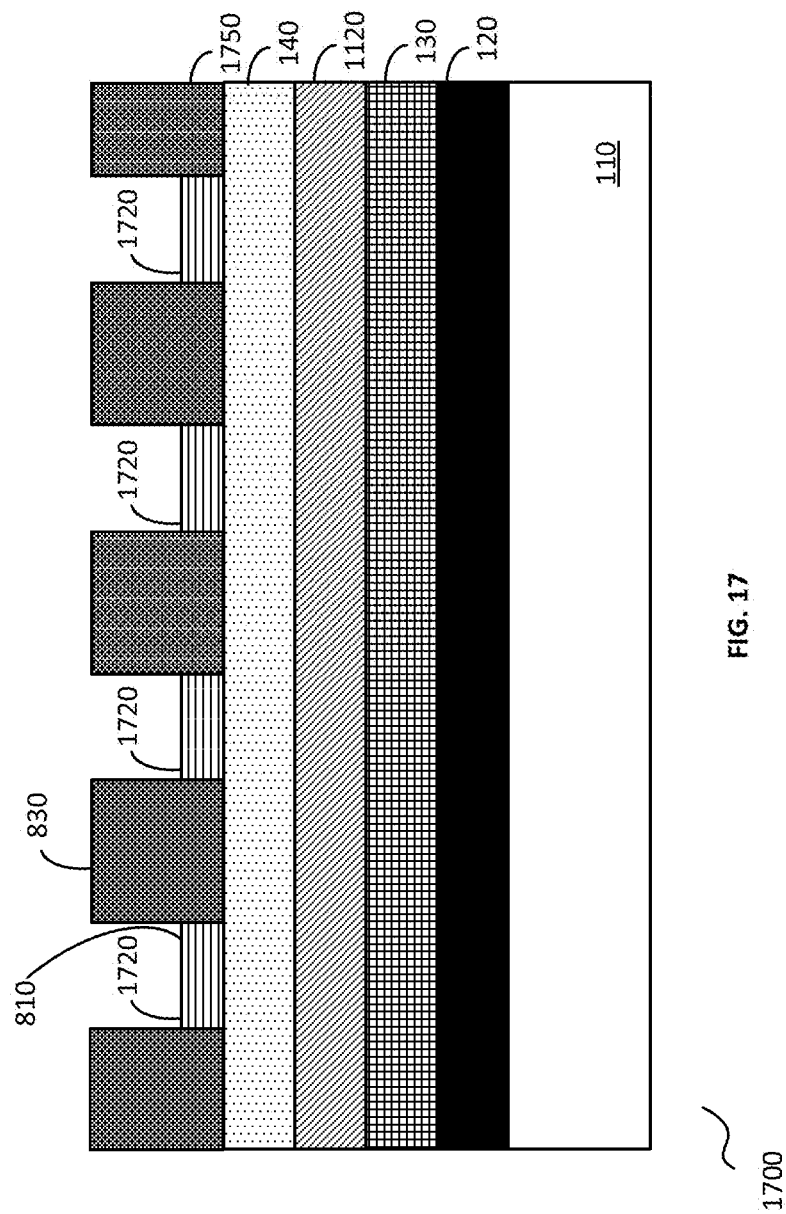
FIG. 17 is a schematic diagram illustrating a cross-sectional view of an example version of the device of FIG. 1, having an example patterned auxiliary electrode according to an example in the present disclosure.

FIG. 17 shows an example cross-sectional view of an example version 1700 of the device 100 that is substantially similar thereto, but further comprises at least one auxiliary electrode 1750 disposed in a pattern above and electrically coupled (not shown) with the second electrode 140.

The auxiliary electrode 1750 is electrically conductive. In some non-limiting examples, the auxiliary electrode 1750 may be formed by at least one metal and/or metal oxide. Non-limiting examples of such metals include Cu, Al, molybdenum (Mo) and/or Ag. By way of non-limiting examples, the auxiliary electrode 1750 may comprise a multi-layer metallic structure, including without limitation, one formed by Mo/Al/Mo. Non-limiting examples of such metal oxides include ITO, ZnO, IZO and/or other oxides containing In and/or Zn. In some non-limiting examples, the auxiliary electrode 1750 may comprise a multi-layer structure formed by a combination of at least one metal and at least one metal oxide, including without limitation, Ag/ITO, Mo/ITO, ITO/Ag/ITO and/or ITO/Mo/ITO. In some non-limiting examples, the auxiliary electrode 1750 comprises a plurality of such electrically conductive materials.

The device 1700 is shown as comprising the substrate 110, the first electrode 120 and the at least one semiconducting layer 130.

In some non-limiting examples, an NPC 1120 is disposed on substantially all of the exposed layer surface 111 of the at least one semiconducting layer 130. In some non-limiting examples, the NPC 1120 could be omitted.

The second electrode 140 is disposed on substantially all of the exposed layer surface 111 of the NPC 1120 (or the at least one semiconducting layer 130, if the NPC 1120 has been omitted).

In some non-limiting examples, particularly in a top-emission device 1700, the second electrode 140 may be formed by depositing a relatively thin conductive film layer (not shown) in order, by way of non-limiting example, to reduce optical interference (including, without limitation, attenuation, reflections and/or diffusion) related to the presence of the second electrode 140. In some non-limiting examples, as discussed elsewhere, a reduced thickness of the second electrode 140, may generally increase a sheet resistance of the second electrode 140, which may, in some non-limiting examples, reduce the performance and/or efficiency of the device 1700. By providing the auxiliary electrode 1750 that is electrically coupled to the second electrode 140, the sheet resistance and thus, the IR drop associated with the second electrode 140, may, in some non-limiting examples, be decreased.

In some non-limiting examples, the device 1700 may be a bottom-emission and/or double-sided emission device 1700. In such examples, the second electrode 140 may be formed as a relatively thick conductive layer without substantially affecting optical characteristics of such a device 1700. Nevertheless, even in such scenarios, the second electrode 140 may nevertheless be formed as a relatively thin conductive film layer (not shown), by way of non-limiting example, so that the device 1700 may be substantially transmissive relative to light incident on an external surface thereof, such that a substantial part such externally-incident light may be transmitted through the device 1700, in addition to the emission of photons generated internally within the device 1700 as disclosed herein.

An NIC 810 is selectively disposed in a pattern on the exposed layer surface 111 of the underlying material, which, as shown in the figure, is the NPC 1120. In some non-limiting examples, as shown in the figure, the NIC 810 may be disposed, in a first portion of the pattern, as a series of parallel rows 1720.

A conductive coating 830 suitable for forming the patterned auxiliary electrode 1750, is disposed on substantially all of the exposed layer surface 111 of the underlying material, using an open mask and/or a mask-free deposition process, neither of which employs any FMM during the high-temperature conductive coating deposition process. The underlying material comprises both regions of the NIC 810, disposed in the pattern of rows 1720, and regions of NPC 1120 where the NIC 810 has not been deposited.

Because of the nucleation-inhibiting properties of those rows 1720 where the NIC 810 was disposed, the conductive coating 830 disposed on such rows 1720 tends not to remain, resulting in a pattern of selective deposition of the conductive coating 830, that corresponds substantially to at least one second portion of the pattern, leaving the first portion comprising the rows 1720 substantially devoid of the conductive coating 830.

In other words, the conductive coating 830 that will form the auxiliary electrode 1750 is selectively deposited substantially only on a second portion comprising those regions of the NPC 1120, that surround but do not occupy the rows 1720.

In some non-limiting examples, selectively depositing the auxiliary electrode 1750 to cover only certain rows 1720 of the lateral aspect of the device 1700, while other regions thereof remain uncovered, may control and/or reduce optical interference related to the presence of the auxiliary electrode 1750.

In some non-limiting examples, the auxiliary electrode 1750 may be selectively deposited in a pattern that cannot be readily detected by the naked eye from a typical viewing distance.

In some non-limiting examples, the auxiliary electrode 1750 may be formed in devices other than OLED devices, including for decreasing an effective resistance of the electrodes of such devices.

Auxiliary Electrode

The ability to pattern electrodes 120, 140, 1750, 4150 including without limitation, the second electrode 140 and/or the auxiliary electrode 1750 without employing FMMs during the high-temperature conductive coating 830 deposition process by employing a selective coating 710, including without limitation, the process depicted in FIG. 17, allows numerous configurations of auxiliary electrodes 1750 to be deployed.

Figure 18B:
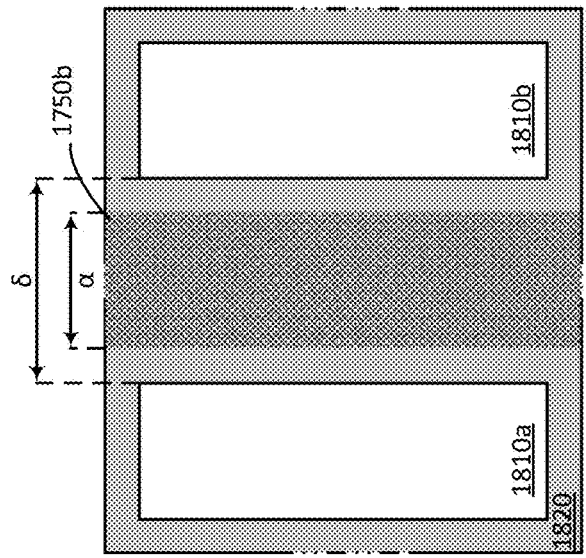
FIGS. 18B-18D are schematic diagrams each illustrating a segment of a part of FIG. 18A, showing an example auxiliary electrode overlaying a non-emissive region according to an example in the present disclosure.
Figure 18D:
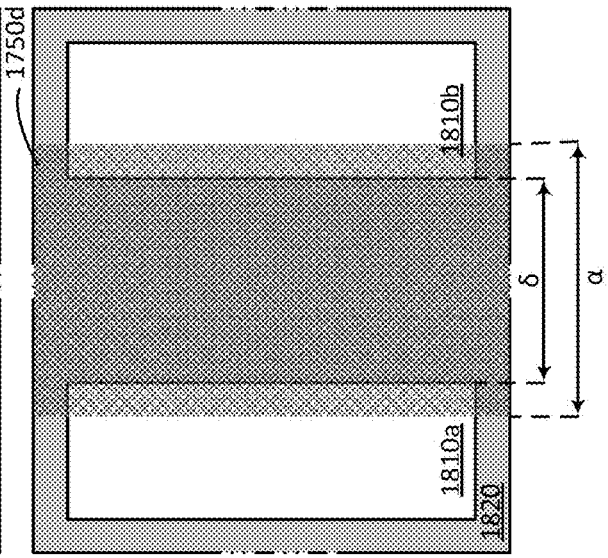
Figure 18A:
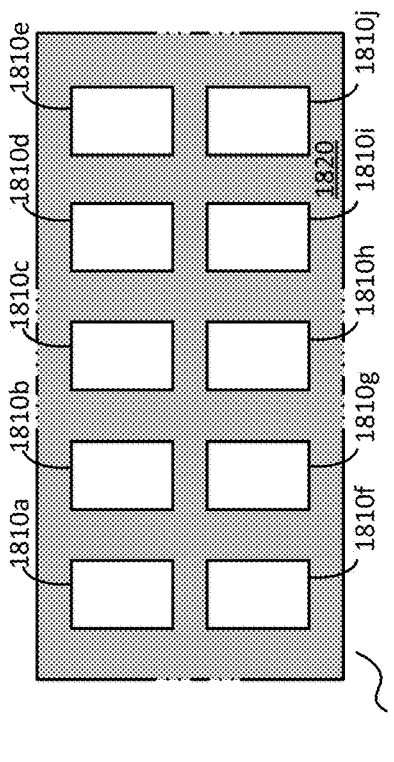
FIG. 18A is a schematic diagram illustrating, in plan view, an example arrangement of emissive region(s) and/or non-emissive region(s) in an example version of the device of FIG. 1, according to an example in the present disclosure.

FIG. 18A shows, in plan view, a part of an example version 1800 of the device 100 having a plurality of emissive regions 1910a-1910j and at least one non-emissive region 1820 surrounding them. In some non-limiting examples, the device 1800 may be an AMOLED device in which each of the emissive regions 1910a-1910j corresponds to a (sub-) pixel 340/264x thereof.

Figure 18C:
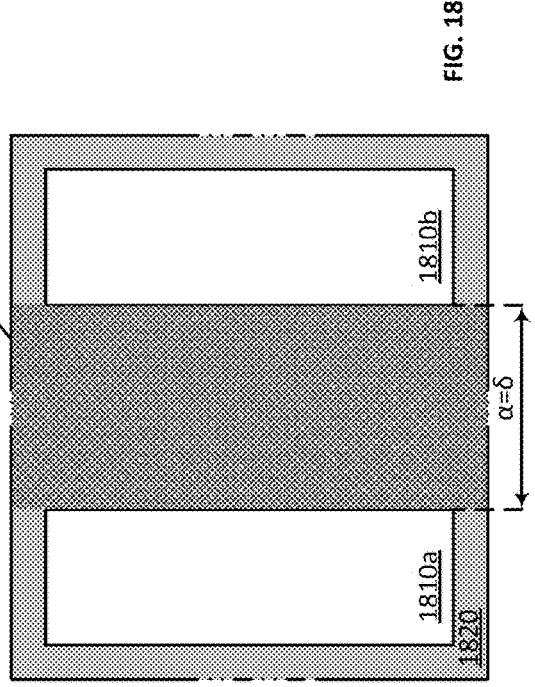

FIGS. 18B-18D show examples of a part of the device 1800 corresponding to neighbouring emissive regions 1910a and 1910b thereof and a part of the at least one non-emissive region 1820 therebetween, in conjunction with different configurations 1750b-1750d of an auxiliary electrode 1750 overlaid thereon. In some non-limiting examples, while not expressly illustrated in FIGS. 18B-18D, the second electrode 140 of the device 1800, is understood to substantially cover at least both emissive regions 1910a and 1910b thereof and the part of the at least one non-emissive region 1820 therebetween.

In FIG. 18B, the auxiliary electrode configuration 1750b is disposed between the two neighbouring emissive regions 1910a and 1910b and electrically coupled to the second electrode 140. In this example, a width a of the auxiliary electrode configuration 1750b is less than a separation distance δ between the neighbouring emissive regions 1910a and 1910b. As a result, there exists a gap within the at least one non-emissive region 1820 on each side of the auxiliary electrode configuration 1750b. In some non-limiting examples, such an arrangement may reduce a likelihood that the auxiliary electrode configuration 1750b would interfere with an optical output of the device 1800, in some non-limiting examples, from at least one of the emissive regions 1910a and 1910b. In some non-limiting examples, such an arrangement may be appropriate where the auxiliary electrode configuration 1750b is relatively thick (in some non-limiting examples, greater than several hundred nm and/or on the order of a few microns in thickness). In some non-limiting examples, a ratio of a height (thickness) of the auxiliary electrode configuration 1750b a width thereof ("aspect ratio") may be greater than about 0.05, such as about 0.1 or greater, about 0.2 or greater, about 0.5 or greater, about 0.8 or greater, about 1 or greater, and/or about 2 or greater. By way of non-limiting example, a height (thickness) of the auxiliary electrode configuration 1750b may be greater than about 50 nm, such as about 80 nm or greater, about 100 nm or greater, about 200 nm or greater, about 500 nm or greater, about 700 nm or greater, about 1000 nm or greater, about 1500 nm or greater, about 1700 nm or greater, or about 2000 nm or greater.

In FIG. 18C, the auxiliary electrode configuration 1750c is disposed between the two neighbouring emissive regions 1910a and 1910b and electrically coupled to the second electrode 140. In this example, the width a of the auxiliary electrode configuration 1750c is substantially the same as the separation distance δ between the neighbouring emissive regions 1910a and 1910b. As a result, there is no gap within the at least one non-emissive region 1820 on either side of the auxiliary electrode configuration 1750c. In some non-limiting examples, such an arrangement may be appropriate where the separation distance δ between the neighbouring emissive regions 1910a and 1910b is relatively small, by way of non-limiting example, in a high pixel density device 1800.

In FIG. 18D, the auxiliary electrode 1750d is disposed between the two neighbouring emissive regions 1910a and 1910b and electrically coupled to the second electrode 140. In this example, the width a of the auxiliary electrode configuration 1750d is greater than the separation distance δ between the neighbouring emissive regions 1910a and 1910b. As a result, a part of the auxiliary electrode configuration 1750d overlaps a part of at least one of the neighbouring emissive regions 1910a and/or 1910b. While the figure shows that the extent of overlap of the auxiliary electrode configuration 1750d with each of the neighbouring emissive regions 1910a and 1910b, in some non-limiting examples, the extent of overlap and/or in some non-limiting examples, a profile of overlap between the auxiliary electrode configuration 1750d and at least one of the neighbouring emissive regions 1910a and 1910b may be varied and/or modulated.

FIG. 19 shows, in plan view, a schematic diagram showing an example of a pattern 1950 of the auxiliary electrode 1750 formed as a grid that is overlaid over both the lateral aspects 410 of emissive regions 1910, which may correspond to (sub-) pixel(s) 340/264x of an example version 1900 of device 100, and the lateral aspects 420 of non-emissive regions 1920 surrounding the emissive regions 1910.

In some non-limiting examples, the auxiliary electrode pattern 1950 extends substantially only over some but not all of the lateral aspects 420 of non-emissive regions 1920, so as not to substantially cover any of the lateral aspects 410 of the emissive regions 1910.

Those having ordinary skill in the relevant art will appreciate that while, in the figure, the auxiliary electrode pattern 1950 is shown as being formed as a continuous structure such that all elements thereof are both physically connected and electrically coupled with one another and electrically coupled to at least one electrode 120, 140, 1750, 4150, which in some non-limiting examples may be the first electrode 120 and/or the second electrode 140, in some non-limiting examples, the auxiliary electrode pattern 1950 may be provided as a plurality of discrete elements of the auxiliary electrode pattern 1950 that, while remaining electrically coupled to one another, are not physically connected to one another. Even so, such discrete elements of the auxiliary electrode pattern 1950 may still substantially lower a sheet resistance of the at least one electrode 120, 140, 1750, 4150 with which they are electrically coupled, and consequently of the device 1900, so as to increase an efficiency of the device 1900 without substantially interfering with its optical characteristics.

In some non-limiting examples, auxiliary electrodes 1750 may be employed in devices 100 with a variety of arrangements of (sub-) pixel(s) 340/264x. In some non-limiting examples, the (sub-) pixel 340/264x arrangement may be substantially diamond-shaped.

Figure 20A:
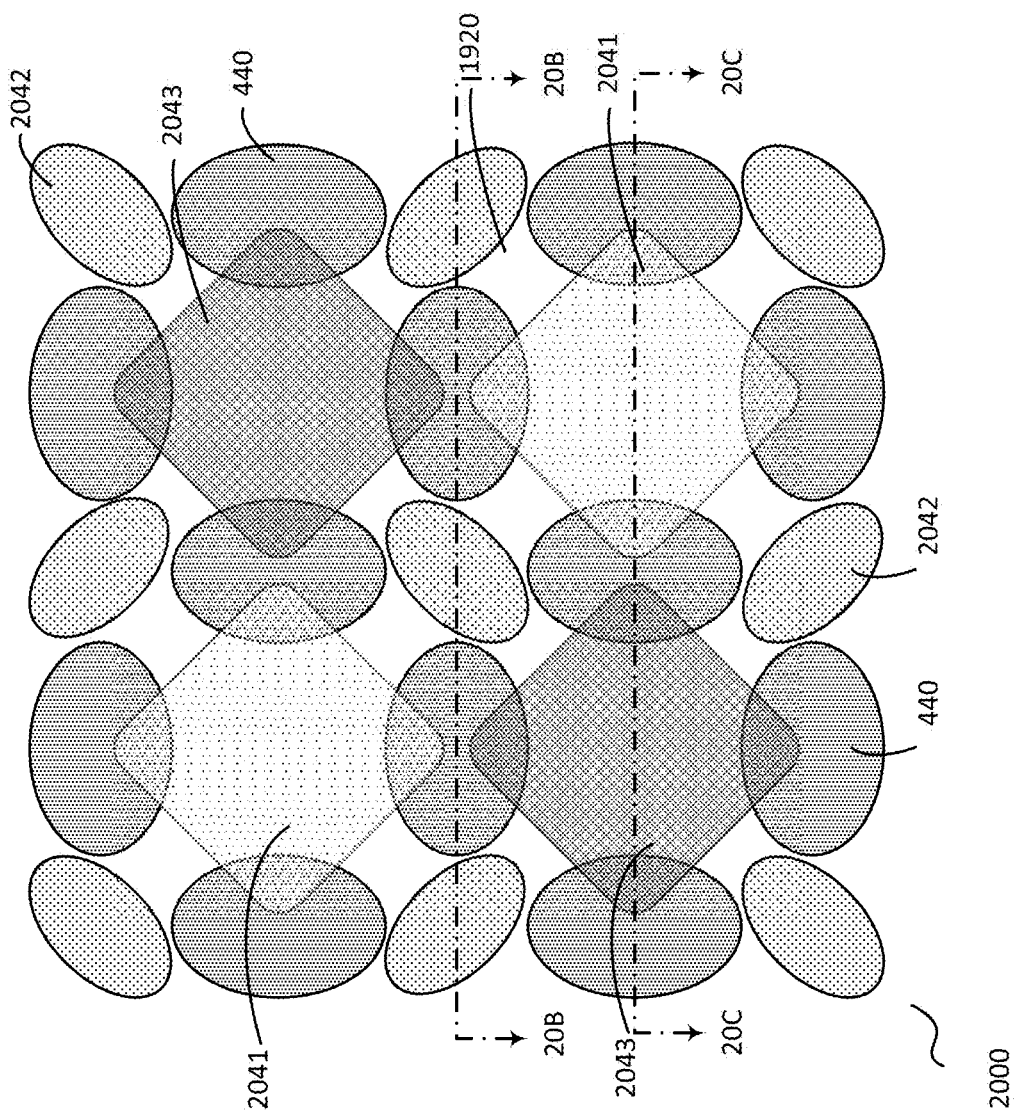
FIG. 20A is a schematic diagram illustrating, in plan view, an example pattern of an example version of the device of FIG. 1, having a plurality of groups of emissive regions in a diamond configuration according to an example in the present disclosure.

By way of non-limiting example, FIG. 20A shows, in plan view, in an example version 2000 of device 100, a plurality of groups 2041-2043 of emissive regions 1910 each corresponding to a sub-pixel 264x, surrounded by the lateral aspects of a plurality of non-emissive regions 1920 comprising PDLs 440 in a diamond configuration. In some non-limiting examples, the configuration is defined by patterns 2041-2043 of emissive regions 1910 and PDLs 440 in an alternating pattern of first and second rows.

In some non-limiting examples, the lateral aspects 420 of the non-emissive regions 1920 comprising PDLs 440 may be substantially elliptically-shaped. In some non-limiting examples, the major axes of the lateral aspects 420 of the non-emissive regions 1920 in the first row are aligned and substantially normal to the major axes of the lateral aspects 420 of the non-emissive regions 1920 in the second row. In some non-limiting examples, the major axes of the lateral aspects 420 of the non-emissive regions 1920 in the first row are substantially parallel to an axis of the first row.

In some non-limiting examples, a first group 2041 of emissive regions 1910 correspond to sub-pixels 264x that emit light at a first wavelength, in some non-limiting examples the sub-pixels 264x of the first group 2041 may correspond to red (R) sub-pixels 2641. In some non-limiting examples, the lateral aspects 410 of the emissive regions 1910 of the first group 2041 may have a substantially diamond-shaped configuration. In some non-limiting examples, the emissive regions 1910 of the first group 2041 lie in the pattern of the first row, preceded and followed by PDLs 440. In some non-limiting examples, the lateral aspects 410 of the emissive regions 1910 of the first group 2041 slightly overlap the lateral aspects 420 of the preceding and following non-emissive regions 1920 comprising PDLs 440 in the same row, as well as of the lateral aspects 420 of adjacent non-emissive regions 1920 comprising PDLs 440 in a preceding and following pattern of the second row.

In some non-limiting examples, a second group 2042 of emissive regions 1910 correspond to sub-pixels 264x that emit light at a second wavelength, in some non-limiting examples the sub-pixels 264x of the second group 2042 may correspond to green (G) sub-pixels 2642. In some non-limiting examples, the lateral aspects 410 of the emissive regions 1910 of the second group 2041 may have a substantially elliptical configuration. In some non-limiting examples, the emissive regions 1910 of the second group 2041 lie in the pattern of the second row, preceded and followed by PDLs 440. In some non-limiting examples, the major axis of some of the lateral aspects 410 of the emissive regions 1910 of the second group 2041 may be at a first angle, which in some non-limiting examples, may be 45° relative to an axis of the second row. In some non-limiting examples, the major axis of others of the lateral aspects 410 of the emissive regions 1910 of the second group 2041 may be at a second angle, which in some non-limiting examples may be substantially normal to the first angle. In some non-limiting examples, the emissive regions 1910 of the first group 2041, whose lateral aspects 410 have a major axis at the first angle, alternate with the emissive regions 1910 of the first group 2041, whose lateral aspects 410 have a major axis at the second angle.

In some non-limiting examples, a third group 2043 of emissive regions 1910 correspond to sub-pixels 264x that emit light at a third wavelength, in some non-limiting examples the sub-pixels 264x of the third group 2043 may correspond to blue (B) sub-pixels 2643. In some non-limiting examples, the lateral aspects 410 of the emissive regions 1910 of the third group 2043 may have a substantially diamond-shaped configuration. In some non-limiting examples, the emissive regions 1910 of the third group 2043 lie in the pattern of the first row, preceded and followed by PDLs 440. In some non-limiting examples, the lateral aspects 410 of the emissive regions 1910 of the third group 2043 slightly overlap the lateral aspects 410 of the preceding and following non-emissive regions 1920 comprising PDLs 440 in the same row, as well as of the lateral aspects 420 of adjacent non-emissive regions 1920 comprising PDLs 440 in a preceding and following pattern of the second row. In some non-limiting examples, the pattern of the second row comprises emissive regions 1910 of the first group 2041 alternating emissive regions 1910 of the third group 2043, each preceded and followed by PDLs 440.

Turning now to FIG. 20B, there is shown an example cross-sectional view of the device 2000, taken along line 20B-20B in FIG. 20A. In the figure, the device 2000 is shown as comprising a substrate 110 and a plurality of elements of a first electrode 120, formed on an exposed layer surface 111 thereof. The substrate 110 may comprise the base substrate 112 (not shown for purposes of simplicity of illustration) and/or at least one TFT structure 200, corresponding to and for driving each sub-pixel 264x. PDLs 440 are formed over the substrate 110 between elements of the first electrode 120, to define emissive region(s) 1910 over each element of the first electrode 120, separated by non-emissive region(s) 1920 comprising the PDL(s) 440. In the figure, the emissive region(s) 1910 all correspond to the second group 2042.

In some non-limiting examples, at least one semiconducting layer 130 is deposited on each element of the first electrode 120, between the surrounding PDLs 440.

In some non-limiting examples, a second electrode 140, which in some non-limiting examples, may be a common cathode, may be deposited over the emissive region(s) 1910 of the second group 2042 to form the G(reen) sub-pixel(s) 2642 thereof and over the surrounding PDLs 440.

In some non-limiting examples, an NIC 810 is selectively deposited over the second electrode 140 across the lateral aspects 410 of the emissive region(s) 1910 of the second group 2042 of G(reen) sub-pixels 2642 to allow selective deposition of a conductive coating 830 over parts of the second electrode 140 that is substantially devoid of the NIC 810, namely across the lateral aspects 420 of the non-emissive region(s) 1920 comprising the PDLs 440. In some non-limiting examples, the conductive coating 830 may tend to accumulate along the substantially planar parts of the PDLs 440, as the conductive coating 830 may not tend to remain on the inclined parts of the PDLs 440, but tends to descend to a base of such inclined parts, which are coated with the NIC 810. In some non-limiting examples, the conductive coating 830 on the substantially planar parts of the PDLs 440 may form at least one auxiliary electrode 1750 that may be electrically coupled to the second electrode 140.

In some non-limiting examples, the device 2000 may comprise a CPL 3610 and/or an outcoupling layer. By way of non-limiting example, such CPL 3610 and/or outcoupling layer may be provided directly on a surface of the second electrode 140 and/or a surface of the NIC 810. In some non-limiting examples, such CPL 3610 and/or outcoupling layer may be provided across the lateral aspect 410 of at least one emissive region 1910 corresponding to a (sub-) pixel 340/264x.

In some non-limiting examples, the NIC 810 may also act as an index-matching coating. In some non-limiting examples, the NIC 810 may also act as an outcoupling layer.

In some non-limiting examples, the device 2000 comprises an encapsulation layer. Non-limiting examples of such encapsulation layer include a glass cap, a barrier film, a barrier adhesive and/or a TFE layer 2050 such as shown in dashed outline in the figure, provided to encapsulate the device 2000. In some non-limiting examples, the TFE layer 2050 may be considered a type of barrier coating 1650.

In some non-limiting examples, the encapsulation layer may be arranged above at least one of the second electrode 140 and/or the NIC 810. In some non-limiting example, the device 2000 comprises additional optical and/or structural layers, coatings and components, including without limitation, a polarizer, a color filter, an anti-reflection coating, an anti-glare coating, cover class and/or an optically-clear adhesive (OCA).

Turning now to FIG. 20C, there is shown an example cross-sectional view of the device 2000, taken along line 20C-20C in FIG. 20A. In the figure, the device 2000 is shown as comprising a substrate 110 and a plurality of elements of a first electrode 120, formed on an exposed layer surface 111 thereof. PDLs 440 are formed over the substrate 110 between elements of the first electrode 120, to define emissive region(s) 1910 over each element of the first electrode 120, separated by non-emissive region(s) 1920 comprising the PDL(s) 440. In the figure, the emissive region(s) 1910 correspond to the first group 2041 and to the third group 2043 in alternating fashion.

In some non-limiting examples, at least one semiconducting layer 130 is deposited on each element of the first electrode 120, between the surrounding PDLs 440.

In some non-limiting examples, a second electrode 140, which in some non-limiting examples, may be a common cathode, may be deposited over the emissive region(s) 1910 of the first group 2041 to form the R(ed) sub-pixel(s) 2641 thereof, over the emissive region(s) 1910 of the third group 2043 to form the B(lue) sub-pixel(s) 2643 thereof, and over the surrounding PDLs 440.

In some non-limiting examples, an NIC 810 is selectively deposited over the second electrode 140 across the lateral aspects 410 of the emissive region(s) 1910 of the first group 2041 of R(ed) sub-pixels 2641 and of the third group of B(lue) sub-pixels 2643 to allow selective deposition of a conductive coating 830 over parts of the second electrode 140 that is substantially devoid of the NIC 810, namely across the lateral aspects 420 of the non-emissive region(s) 1920 comprising the PDLs 440. In some non-limiting examples, the conductive coating 830 may tend to accumulate along the substantially planar parts of the PDLs 440, as the conductive coating 830 may not tend to remain on the inclined parts of the PDLs 440, but tends to descend to a base of such inclined parts, which are coated with the NIC 810. In some non-limiting examples, the conductive coating 830 on the substantially planar parts of the PDLs 440 may form at least one auxiliary electrode 1750 that may be electrically coupled to the second electrode 140.

Figure 21:
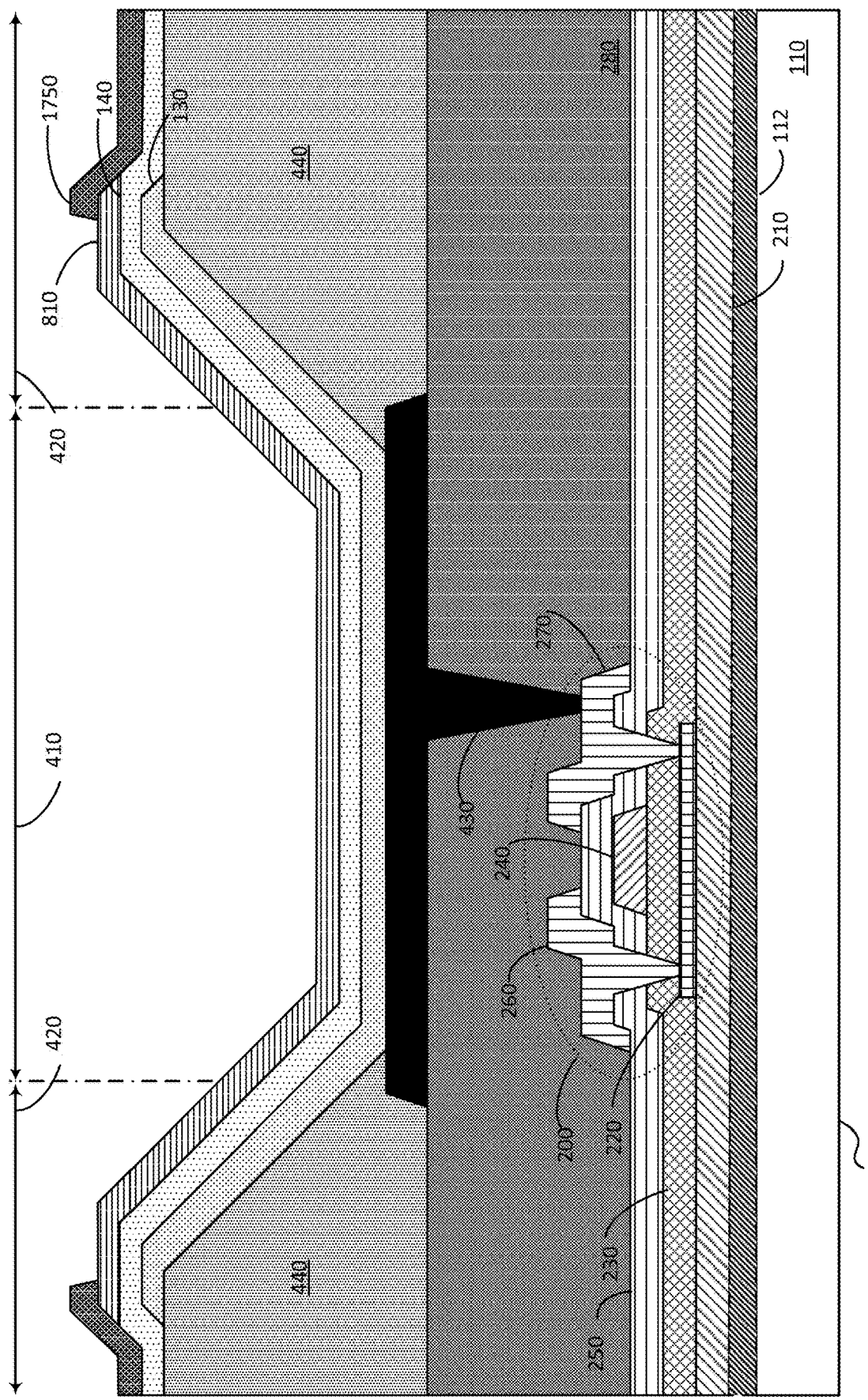
FIG. 21 is a schematic diagram illustrating an example cross-sectional view of an example version of the device of FIG. 4 with additional example deposition steps according to an example in the present disclosure.

Turning now to FIG. 21, there is shown an example version 2100 of the device 100, which encompasses the device 100 shown in cross-sectional view in FIG. 4, but with a number of additional deposition steps that are described herein.

The device 2100 shows an NIC 810 selectively deposited over the exposed layer surface 111 of the underlying material, in the figure, the second electrode 140, within a first portion of the device 2100, corresponding substantially to the lateral aspect 410 of emissive region(s) 1910 corresponding to (sub-) pixel(s) 340/264x and not within a second portion of the device 2100, corresponding substantially to the lateral aspect(s) 420 of non-emissive region(s) 1920 surrounding the first portion.

In some non-limiting examples, the NIC 810 may be selectively deposited using a shadow mask.

The NIC 810 provides, within the first portion, a surface with a relatively low initial sticking probability $S_0$ for a conductive coating 830 to be thereafter deposited on to form an auxiliary electrode 1750.

After selective deposition of the NIC 810, the conductive coating 830 is deposited over the device 2100 but remains substantially only within the second portion, which is substantially devoid of NIC 810, to form the auxiliary electrode 1750.

In some non-limiting examples, the conductive coating 830 may be deposited using an open mask and/or a mask-free deposition process.

The auxiliary electrode 1750 is electrically coupled to the second electrode 140 so as to reduce a sheet resistance of the second electrode 140, including, as shown, by lying above and in physical contact with the second electrode 140 across the second portion that is substantially devoid of NIC 810.

In some non-limiting examples, the conductive coating 830 may comprise substantially the same material as the second electrode 140, to ensure a high initial sticking probability $S_0$ for the conductive coating 830 in the second portion.

In some non-limiting examples, the second electrode 140 may comprise substantially pure Mg and/or an alloy of Mg and another metal, including without limitation, Ag. In some non-limiting examples, an Mg:Ag alloy composition may range from about 1:9 to about 9:1 by volume. In some non-limiting examples, the second electrode 140 may comprise metal oxides, including without limitation, ternary metal oxides, such as, without limitation, ITO and/or IZO, and/or a combination of metals and/or metal oxides.

In some non-limiting examples, the conductive coating 830 used to form the auxiliary electrode 1750 may comprise substantially pure Mg.

Figure 22:
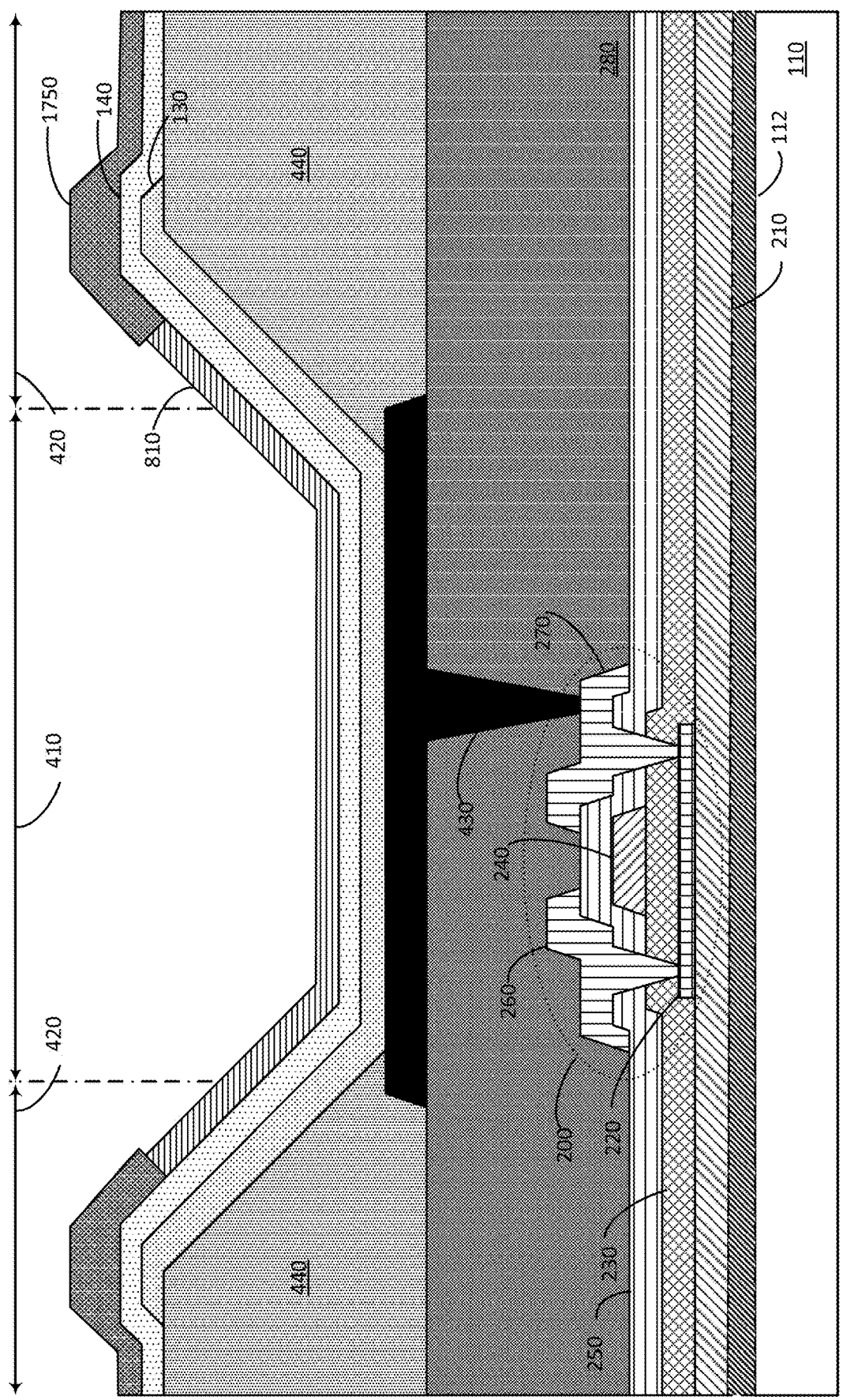
FIG. 22 is a schematic diagram illustrating an example cross-sectional view of an example version of the device of FIG. 4 with additional example deposition steps according to an example in the present disclosure.

Turning now to FIG. 22, there is shown an example version 2200 of the device 100, which encompasses the device 100 shown in cross-sectional view in FIG. 4, but with a number of additional deposition steps that are described herein.

The device 2200 shows an NIC 810 selectively deposited over the exposed layer surface 111 of the underlying material, in the figure, the second electrode 140, within a first portion of the device 2200, corresponding substantially to a part of the lateral aspect 410 of emissive region(s) 1910 corresponding to (sub-) pixel(s) 340/264x, and not within a second portion. In the figure, the first portion extends partially along the extent of an inclined part of the PDLs 440 defining the emissive region(s) 1910.

In some non-limiting examples, the NIC 810 may be selectively deposited using a shadow mask.

The NIC 810 provides, within the first portion, a surface with a relatively low initial sticking probability $S_0$ for a conductive coating 830 to be thereafter deposited on form an auxiliary electrode 1750.

After selective deposition of the NIC 810, the conductive coating 830 is deposited over the device 2200 but remains substantially only within the second portion, which is substantially devoid of NIC 810, to form the auxiliary electrode 1750. As such, in the device 2200, the auxiliary electrode 1750 extends partly across the inclined part of the PDLs 440 defining the emissive region(s) 1910.

In some non-limiting examples, the conductive coating 830 may be deposited using an open mask and/or a mask-free deposition process.

The auxiliary electrode 1750 is electrically coupled to the second electrode 140 so as to reduce a sheet resistance of the second electrode 140, including, as shown, by lying above and in physical contact with the second electrode 140 across the second portion that is substantially devoid of NIC 810.

In some non-limiting examples, the material of which the second electrode 140 may be comprised, may not have a high initial sticking probability $S_0$ for the conductive coating 830.

Figure 23:
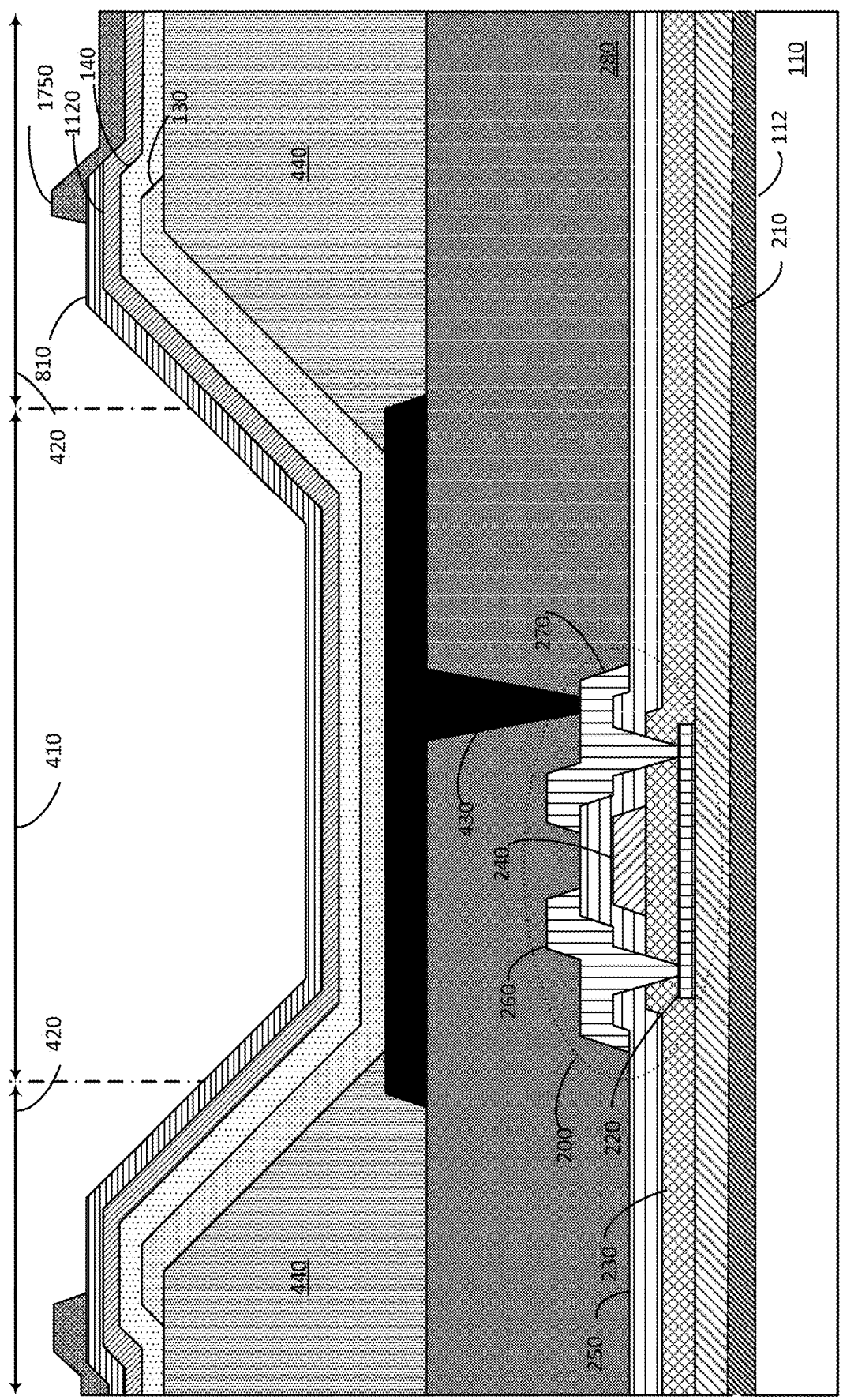
FIG. 23 is a schematic diagram illustrating an example cross-sectional view of an example version of the device of FIG. 4 with additional example deposition steps according to an example in the present disclosure.

FIG. 23 illustrates such a scenario, in which there is shown an example version 2300 of the device 100, which encompasses the device 100 shown in cross-sectional view in FIG. 4, but with a number of additional deposition steps that are described herein.

The device 2300 shows an NPC 1120 deposited over the exposed layer surface 111 of the underlying material, in the figure, the second electrode 140.

In some non-limiting examples, the NPC 1120 may be deposited using an open mask and/or a mask-free deposition process.

Thereafter, an NIC 810 is deposited selectively deposited over the exposed layer surface 111 of the underlying material, in the figure, the NPC 1120, within a first portion of the device 2300, corresponding substantially to a part of the lateral aspect 410 of emissive region(s) 1910 corresponding to (sub-) pixel(s) 340/264x, and not within a second portion of the device 2300, corresponding substantially to the lateral aspect(s) 420 of non-emissive region(s) 1920 surrounding the first portion.

In some non-limiting examples, the NIC 810 may be selectively deposited using a shadow mask.

The NIC 810 provides, within the first portion, a surface with a relatively low initial sticking probability $S_0$ for a conductive coating 830 to be thereafter deposited on form an auxiliary electrode 1750.

After selective deposition of the NIC 810, the conductive coating 830 is deposited over the device 2300 but remains substantially only within the second portion, which is substantially devoid of NIC 810, to form the auxiliary electrode 1750.

In some non-limiting examples, the conductive coating 830 may be deposited using an open mask and/or a mask-free deposition process.

The auxiliary electrode 1750 is electrically coupled to the second electrode 140 so as to reduce a sheet resistance thereof. While, as shown, the auxiliary electrode 1750 is not lying above and in physical contact with the second electrode 140, those having ordinary skill in the relevant art will nevertheless appreciate that the auxiliary electrode 1750 may be electrically coupled to the second electrode 140 by a number of well-understood mechanisms. By way of non-limiting example, the presence of a relatively thin film (in some non-limiting examples, of up to about 50 nm) of an NIC 810 and/or an NPC 1120 may still allow a current to pass therethrough, thus allowing a sheet resistance of the second electrode 140 to be reduced.

Figure 24:
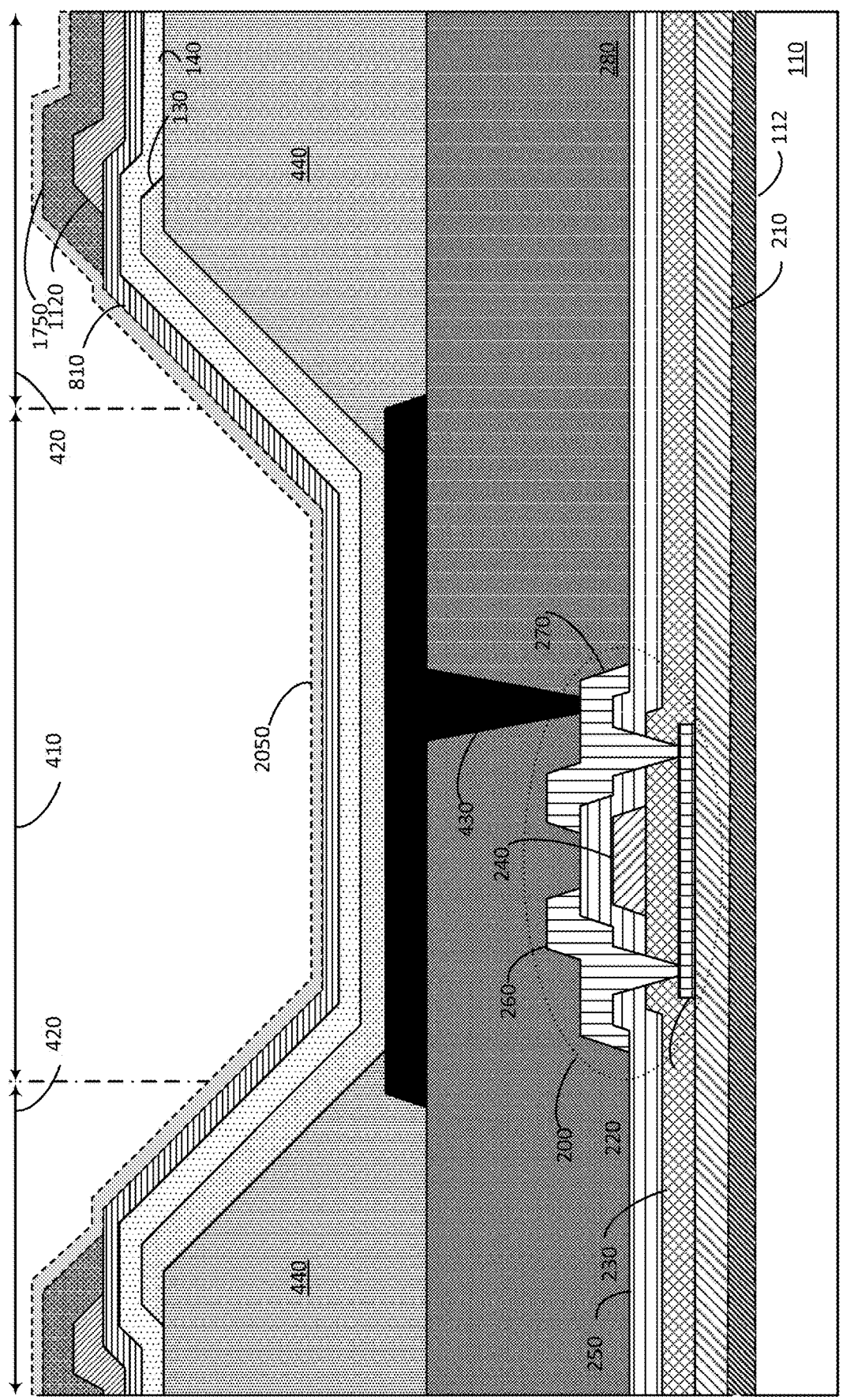
FIG. 24 is a schematic diagram illustrating an example cross-sectional view of an example version of the device of FIG. 4 with additional example deposition steps according to an example in the present disclosure.

Turning now to FIG. 24, there is shown an example version 2400 of the device 100, which encompasses the device 100 shown in cross-sectional view in FIG. 4, but with a number of additional deposition steps that are described herein.

The device 2400 shows an NIC 810 deposited over the exposed layer surface 111 of the underlying material, in the figure, the second electrode 140.

In some non-limiting examples, the NIC 810 may be deposited using an open mask and/or a mask-free deposition process.

The NIC 810 provides a surface with a relatively low initial sticking probability $S_0$ for a conductive coating 830 to be thereafter deposited on form an auxiliary electrode 1750.

After deposition of the NIC 810, an NPC 1120 is selectively deposited over the exposed layer surface 111 of the underlying material, in the figure, the NIC 810, within a NPC portion of the device 2400, corresponding substantially to a part of the lateral aspect 420 of non-emissive region(s) 1920 surrounding a second portion of the device 2400, corresponding substantially to the lateral aspect(s) 410 of emissive region(s) 1910 corresponding to (sub-) pixel(s) 340/264x.

In some non-limiting examples, the NPC 1120 may be selectively deposited using a shadow mask.

The NPC 1120 provides, within the first portion, a surface with a relatively high initial sticking probability $S_0$ for a conductive coating 830 to be thereafter deposited on form an auxiliary electrode 1750.

After selective deposition of the NPC 1120, the conductive coating 830 is deposited over the device 2400 but remains substantially only within the NPC portion, in which the NIC 810 has been overlaid with the NPC 1120, to form the auxiliary electrode 1750.

In some non-limiting examples, the conductive coating 830 may be deposited using an open mask and/or a mask-free deposition process.

The auxiliary electrode 1750 is electrically coupled to the second electrode 140 so as to reduce a sheet resistance of the second electrode 140.

Removal of Selective Coatings

In some non-limiting examples, the NIC 810 may be removed subsequent to deposition of the conductive coating 830, such that at least a part of a previously exposed layer surface 111 of an underlying material covered by the NIC 810 may become exposed once again. In some non-limiting examples, the NIC 810 may be selectively removed by etching and/or dissolving the NIC 810 and/or by employing plasma and/or solvent processing techniques that do not substantially affect or erode the conductive coating 830.

Turning now to FIG. 25A, there is shown an example cross-sectional view of an example version 2500 of the device 100, at a deposition stage 2500a, in which an NIC 810 has been selectively deposited on a first portion of an exposed layer surface 111 of an underlying material. In the figure, the underlying material may be the substrate 110.

In FIG. 25B, the device 2500 is shown at a deposition stage 2500b, in which a conductive coating 830 is deposited on the exposed layer surface 111 of the underlying material, that is, on both the exposed layer surface 111 of NIC 810 where the NIC 810 has been deposited during the stage 2500a, as well as the exposed layer surface 111 of the substrate 110 where that NIC 810 has not been deposited during the stage 2500a. Because of the nucleation-inhibiting properties of the first portion where the NIC 810 was disposed, the conductive coating 830 disposed thereon tends not to remain, resulting in a pattern of selective deposition of the conductive coating 830, that corresponds to a second portion, leaving the first portion substantially devoid of the conductive coating.

In FIG. 25C, the device 2500 is shown at a deposition stage 2500c, in which the NIC 810 has been removed from the first portion of the exposed layer surface 111 of the substrate 110, such that the conductive coating 830 deposited during the stage 2500b remains on the substrate 110 and regions of the substrate 110 on which the NIC 810 had been deposited during the stage 2500a are now exposed or uncovered.

In some non-limiting examples, the removal of the NIC 810 in the stage 2500c may be effected by exposing the device 2500 to a solvent and/or a plasma that reacts with and/or etches away the NIC 810 without substantially impacting the conductive coating 830.

Transparent OLED

Figure 26A:
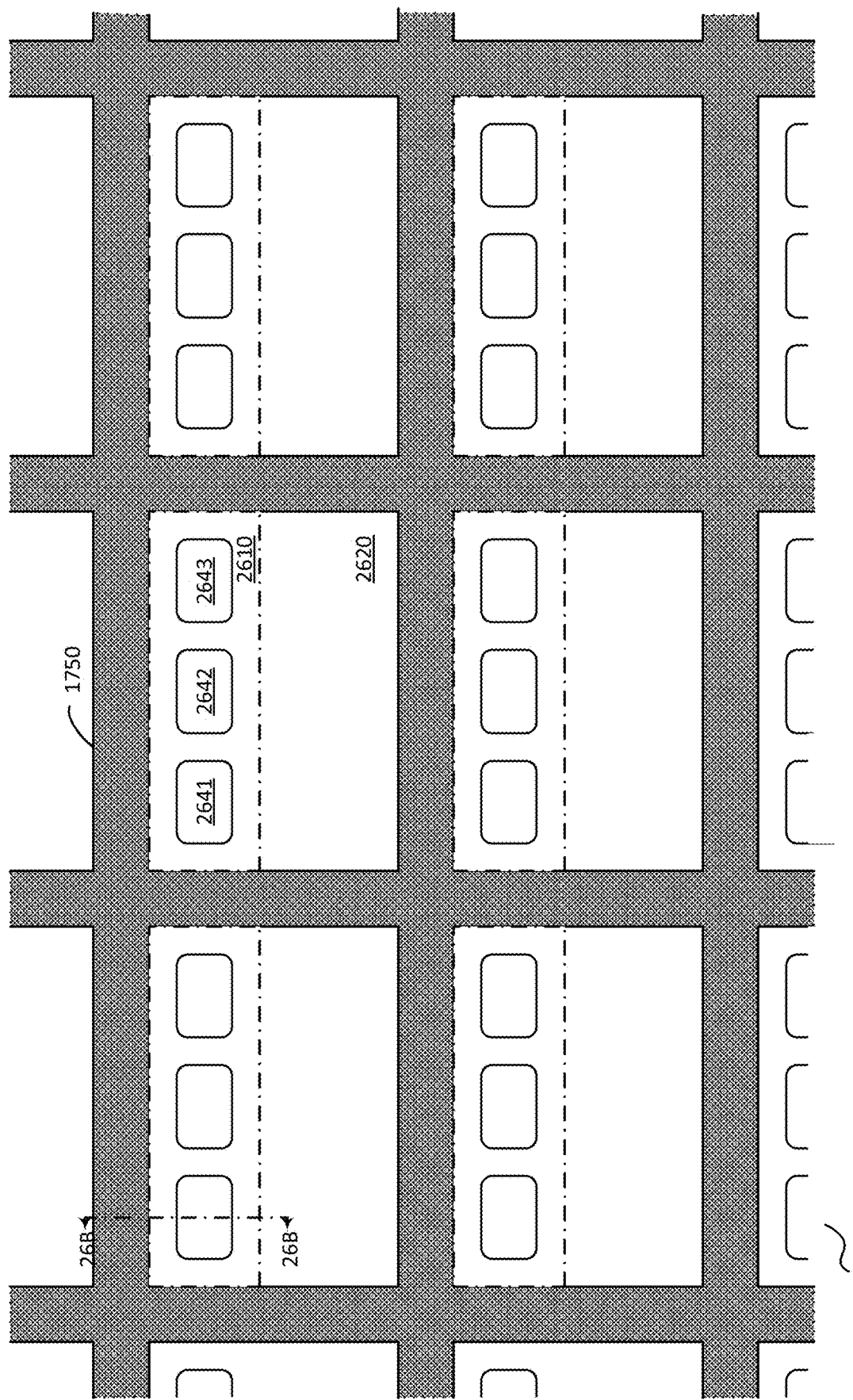
FIG. 26A is a schematic diagram illustrating, in plan view, an example of a transparent version of the device of FIG. 1 comprising at least one example pixel region and at least one example light-transmissive region, with at least one auxiliary electrode according to an example in the present disclosure.

Turning now to FIG. 26A, there is shown an example plan view of a transmissive (transparent) version, shown generally at 2600, of the device 100. In some non-limiting examples, the device 2600 is an AMOLED device having a plurality of pixel regions 2610 and a plurality of transmissive regions 2620. In some non-limiting examples, at least one auxiliary electrode 1750 may be deposited on an exposed layer surface 111 of an underlying material between the pixel region(s) 2610 and/or the transmissive region(s) 2620.

In some non-limiting examples, each pixel region 2610 may comprise a plurality of emissive regions 1910 each corresponding to a sub-pixel 264x. In some non-limiting examples, the sub-pixels 264x may correspond to, respectively, R(ed) sub-pixels 2641, G(reen) sub-pixels 2642 and/or B(lue) sub-pixels 2643.

In some non-limiting examples, each transmissive region 2620 is substantially transparent and allows light to pass through the entirety of a cross-sectional aspect thereof.

Figure 26B:
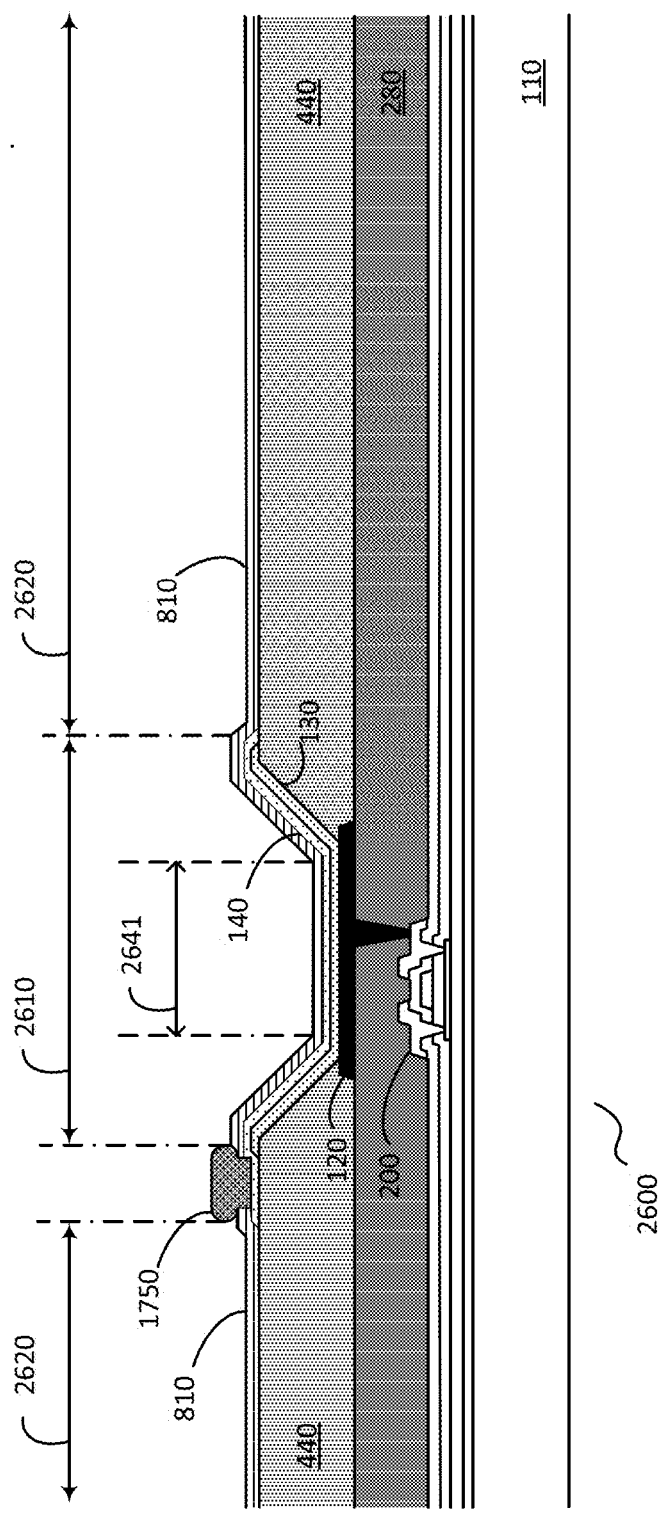
FIG. 26B is a schematic diagram illustrating an example cross-sectional view of the device of FIG. 26A taken along line 26B-26B.

Turning now to FIG. 26B, there is shown an example cross-sectional view of the device 2600, taken along line 26B-26B in FIG. 26A. In the figure, the device 2600 is shown as comprising a substrate 110, a TFT insulating layer 280 and a first electrode 120 formed on a surface of the TFT insulating layer 280. The substrate 110 may comprise the base substrate 112 (not shown for purposes of simplicity of illustration) and/or at least one TFT structure 200, corresponding to and for driving each sub-pixel 264x positioned substantially thereunder and electrically coupled to the first electrode 120 thereof. PDL(s) 440 are formed in non-emissive regions 1920 over the substrate 110, to define emissive region(s) 1910 also corresponding to each sub-pixel 264x, over the first electrode 120 corresponding thereto. The PDL(s) 440 cover edges of the first electrode 120.

In some non-limiting examples, at least one semiconducting layer 130 is deposited over exposed region(s) of the first electrode 120 and, in some non-limiting examples, at least parts of the surrounding PDLs 440.

In some non-limiting examples, a second electrode 140 may be deposited over the at least one semiconducting layer(s) 130, including over the pixel region 2610 to form the sub-pixel(s) 264x thereof and, in some non-limiting examples, at least partially over the surrounding PDLs 440 in the transmissive region 2620.

In some non-limiting examples, an NIC 810 is selectively deposited over first portion(s) of the device 2600, comprising both the pixel region 2610 and the transmissive region 2620 but not the region of the second electrode 140 corresponding to the auxiliary electrode 1750.

In some non-limiting examples, the entire surface of the device 2600 is then exposed to a vapor flux of the conductive coating 830, which in some non-limiting examples may be Mg. The conductive coating 830 is selectively deposited over second portion(s) of the second electrode 140 that is substantially devoid of the NIC 810 to form an auxiliary electrode 1750 that is electrically coupled to and in some non-limiting examples, in physical contact with uncoated parts of the second electrode 140.

At the same time, the transmissive region 2620 of the device 2600 remains substantially devoid of any materials that may substantially affect the transmission of light therethrough. In particular, as shown in the figure, the TFT structure 200 and the first electrode 120 are positioned, in a cross-sectional aspect, below the sub-pixel 264x corresponding thereto, and together with the auxiliary electrode 1750, lie beyond the transmissive region 2620. As a result, these components do not attenuate or impede light from being transmitted through the transmissive region 2620. In some non-limiting examples, such arrangement allows a viewer viewing the device 2600 from a typical viewing distance to see through the device 2600, in some non-limiting examples, when all of the (sub-) pixel(s) 340/264x are not emitting, thus creating a transparent AMOLED device 2600.

While not shown in the figure, in some non-limiting examples, the device 2600 may further comprise an NPC 1120 disposed between the auxiliary electrode 1750 and the second electrode 140. In some non-limiting examples, the NPC 1120 may also be disposed between the NIC 810 and the second electrode 140.

In some non-limiting examples, the NIC 810 may be formed concurrently with the at least one semiconducting layer(s) 130. By way of non-limiting example, at least one material used to form the NIC 810 may also be used to form the at least one semiconducting layer(s) 130. In such non-limiting example, a number of stages for fabricating the device 2600 may be reduced.

Those having ordinary skill in the relevant art will appreciate that in some non-limiting examples, various other layers and/or coatings, including without limitation those forming the at least one semiconducting layer(s) 130 and/or the second electrode 140, may cover a part of the transmissive region 2620, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s) 1910, to further facilitate light transmission through the transmissive region 2620.

Those having ordinary skill in the relevant art will appreciate that (sub-) pixel(s) 340/264x arrangements other than the arrangement shown in FIGS. 26A and 26B may, in some non-limiting examples, be employed.

Those having ordinary skill in the relevant art will appreciate that arrangements of the auxiliary electrode(s) 1750 other than the arrangement shown in FIGS. 26A and 26B may, in some non-limiting examples, be employed. By way of non-limiting example, the auxiliary electrode(s) 1750 may be disposed between the pixel region 2610 and the transmissive region 2620. By way of non-limiting example, the auxiliary electrode(s) 1750 may be disposed between sub-pixel(s) 264x within a pixel region 2610.

Turning now to FIG. 27A, there is shown an example plan view of a transparent version, shown generally at 2700 of the device 100. In some non-limiting examples, the device 2700 is an AMOLED device having a plurality of pixel regions 2610 and a plurality of transmissive regions 2620. The device 2700 differs from device 2600 in that no auxiliary electrode(s) 1750 lie between the pixel region(s) 2610 and/or the transmissive region(s) 2620.

In some non-limiting examples, each pixel region 2610 may comprise a plurality of emissive regions 1910 each corresponding to a sub-pixel 264x. In some non-limiting examples, the sub-pixels 264x may correspond to, respectively, R(ed) sub-pixels 2641, G(reen) sub-pixels 2642 and/or B(lue) sub-pixels 2643.

In some non-limiting examples, each transmissive region 2620 is substantially transparent and allows light to pass through the entirety of a cross-sectional aspect thereof.

Figure 27B:
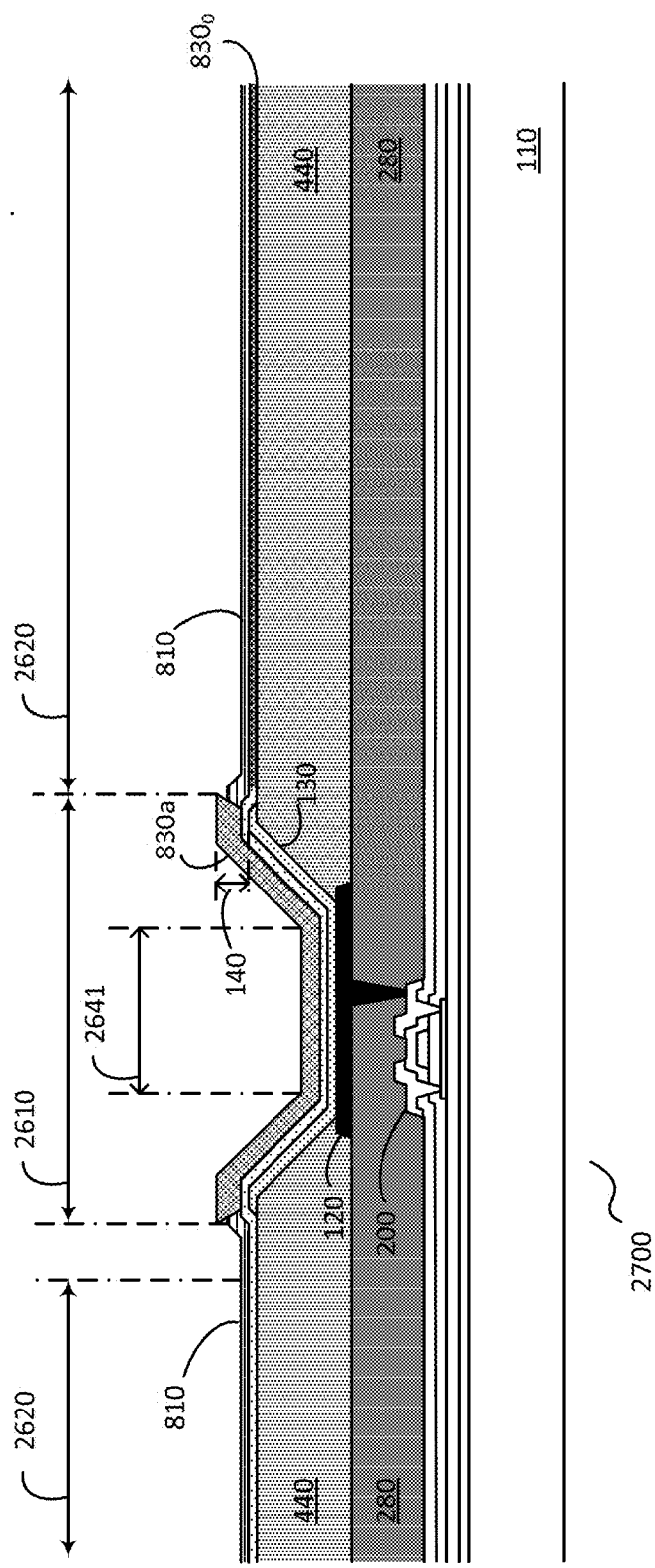
FIG. 27B is a schematic diagram illustrating an example cross-sectional view of the device of FIG. 27A taken along line 27B-27B.

Turning now to FIG. 27B, there is shown an example cross-sectional view of the device 2700, taken along line 27B-27B in FIG. 27A. In the figure, the device 2700 is shown as comprising a substrate 110, a TFT insulating layer 280 and a first electrode 120 formed on a surface of the TFT insulating layer 280. The substrate 110 may comprise the base substrate 112 (not shown for purposes of simplicity of illustration) and/or at least one TFT structure 200 corresponding to and for driving each sub-pixel 264x positioned substantially thereunder and electrically coupled to the first electrode 120 thereof. PDL(s) 440 are formed in non-emissive regions 1920 over the substrate 110, to define emissive region(s) 1910 also corresponding to each sub-pixel 264x, over the first electrode 120 corresponding thereto. The PDL(s) 440 cover edges of the first electrode 120.

In some non-limiting examples, at least one semiconducting layer 130 is deposited over exposed region(s) of the first electrode 120 and, in some non-limiting examples, at least parts of the surrounding PDLs 440.

In some non-limiting examples, an initial conductive coating $830_0$ may be deposited over the at least one semiconducting layer(s) 130, including over the pixel region 2610 to form the sub-pixel(s) 264x thereof and over the surrounding PDLs 440 in the transmissive region 2620. In some non-limiting examples, the thickness of the initial conductive coating $830_0$ may be relatively thin such that the presence of the initial conductive coating $830_0$ across the transmissive region 2620 does not substantially attenuate transmission of light therethrough. In some non-limiting examples, the initial conductive coating $830_O$ may be deposited using an open mask and/or mask-free deposition process.

In some non-limiting examples, an NIC 810 is selectively deposited over first portions of the device 2700, comprising the transmissive region 2620.

In some non-limiting examples, the entire surface of the device 2700 is then exposed to a vapor flux of the conductive coating material 831, which in some non-limiting examples may be Mg, to selectively deposit a first conductive coating 830a over second portion(s) of the initial conductive coating $830_O$ that are substantially devoid of the NIC 810, in some examples, the pixel region 2610, such that the first conductive coating 830a is electrically coupled to and in some non-limiting examples, in physical contact with uncoated parts of the initial conductive coating $830_O$, to form the second electrode 140.

In some non-limiting examples, a thickness of the initial conductive coating $830_O$ may be less than a thickness of the first conductive coating 830a. In this way, relatively high transmittance may be maintained in the transmissive region 2620, over which only the initial conductive coating $830_O$ extends. In some non-limiting examples, the thickness of the initial conductive coating $830_O$ may be less than about 30 nm, less than about 25 nm, less than about 20 nm, less than about 15 nm, less than about 10 nm, less than about 8 nm, and/or less than about 5 nm. In some non-limiting examples, the thickness of the first conductive coating 830a may be less than about 30 nm, less than about 25 nm, less than about 20 nm, less than about 15 nm, less than about 10 nm and/or less than about 8 nm.

Thus, in some non-limiting examples, a thickness of the second electrode 140 may be less than about 40 nm, and/or in some non-limiting examples, between about 5 nm and 30 nm, between about 10 nm and about 25 nm and/or between about 15 nm and about 25 nm.

In some non-limiting examples, the thickness of the initial conductive coating $830_O$ may be greater than the thickness of the first conductive coating 830a. In some non-limiting examples, the thickness of the initial conductive coating $830_O$ and the thickness of the first conductive coating 830a may be substantially the same.

In some non-limiting examples, at least one material used to form the initial conductive coating $830_O$ may be substantially the same as at least one material used to form the first conductive coating 830a. In some non-limiting examples, such at least one material may be substantially as described herein in respect of the first electrode 120, the second electrode 140, the auxiliary electrode 1750 and/or a conductive coating 830 thereof.

In some non-limiting examples, the transmissive region 2620 of the device 2700 remains substantially devoid of any materials that may substantially affect the transmission of light therethrough. In particular, as shown in the figure, the TFT structure 200 and/or the first electrode 120 are positioned, in a cross-sectional aspect below the sub-pixel 264x corresponding thereto and beyond the transmissive region 2620. As a result, these components do not attenuate or impede light from being transmitted through the transmissive region 2620. In some non-limiting examples, such arrangement allows a viewer viewing the device 2700 from a typical viewing distance to see through the device 2700, in some non-limiting examples, when all of the (sub-) pixel(s) 340/264x are not emitting, thus creating a transparent AMO-LED device 2700.

While not shown in the figure, in some non-limiting examples, the device 2700 may further comprise an NPC 1120 disposed between the first conductive coating 830a and the initial conductive coating $830_O$. In some non-limiting examples, the NPC 1120 may also be disposed between the NIC 810 and the initial conductive coating $830_O$.

In some non-limiting examples, the NIC 810 may be formed concurrently with the at least one semiconducting layer(s) 130. By way of non-limiting example, at least one material used to form the NIC 810 may also be used to form the at least one semiconducting layer(s) 130. In such non-limiting example, a number of stages for fabricating the device 2700 may be reduced.

Those having ordinary skill in the relevant art will appreciate that in some non-limiting examples, various other layers and/or coatings, including without limitation those forming the at least one semiconducting layer(s) 130 and/or the initial conductive coating $830_O$, may cover a part of the transmissive region 2620, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s) 1910, to further facilitate light transmission through the transmissive region 2620.

Those having ordinary skill in the relevant art will appreciate that (sub-) pixel(s) 340/264x arrangements other than the arrangement shown in FIGS. 27A and 27B may, in some non-limiting examples, be employed.

Figure 27C:
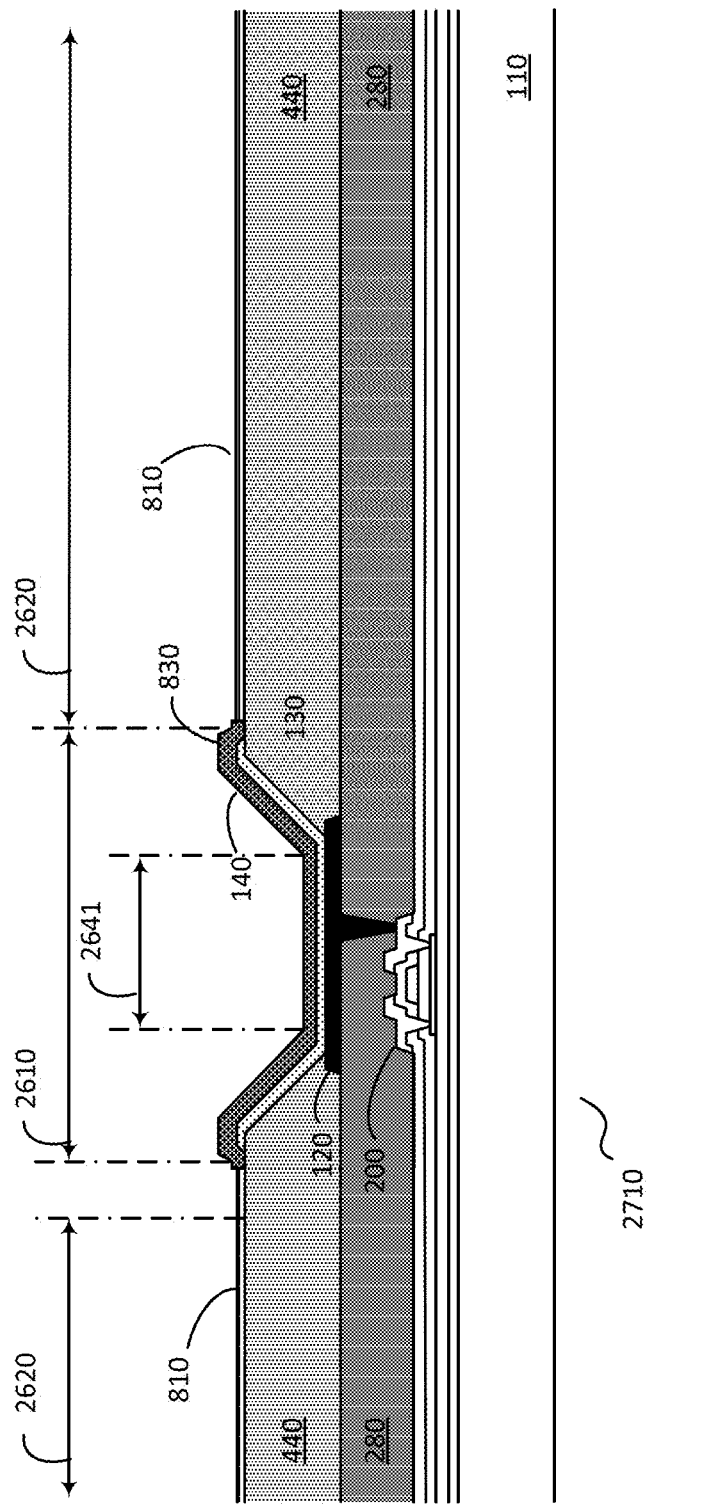
FIG. 27C is a schematic diagram illustrating another example cross-sectional view of the device of FIG. 27A taken along line 27B-27B.

Turning now to FIG. 27C, there is shown an example cross-sectional view of a different version of the device 100, shown as device 2710, taken along the same line 27B-27B in FIG. 27A. In the figure, the device 2710 is shown as comprising a substrate 110, a TFT insulating layer 280 and a first electrode 120 formed on a surface of the TFT insulating layer 280. The substrate 110 may comprise the base substrate 112 (not shown for purposes of simplicity of illustration) and/or at least one TFT structure 200 corresponding to and for driving each sub-pixel 264x positioned substantially thereunder and electrically coupled to the first electrode 120 thereof. PDL(s) 440 are formed in non-emissive regions 1920 over the substrate 110, to define emissive region(s) 1910 also corresponding to each sub-pixel 264x, over the first electrode 120 corresponding thereto. The PDL(s) 440 cover edges of the first electrode 120.

In some non-limiting examples, at least one semiconducting layer 130 is deposited over exposed region(s) of the first electrode 120 and, in some non-limiting examples, at least parts of the surrounding PDLs 440.

In some non-limiting examples, an NIC 810 is selectively deposited over first portions of the device 2710, comprising the transmissive region 2620.

In some non-limiting examples, a conductive coating 830 may be deposited over the at least one semiconducting layer(s) 130, including over the pixel region 2610 to form the sub-pixel(s) 264x thereof but not over the surrounding PDLs 440 in the transmissive region 2620. In some non-limiting examples, the conductive coating 830 may be deposited using an open mask and/or mask-free deposition process. In some non-limiting examples, such deposition may be effected by exposing the entire surface of the device 2710 to a vapour flux of the conductive coating material 831, which in some non-limiting examples may be Mg to selectively deposit the conductive coating 830 over second portions of the at least one semiconducting layer(s) 130 that are substantially devoid of the NIC 810, in some examples, the pixel region 2610, such that the conductive coating 830 is deposited on the at least one semiconducting layer(s) 130 to form the second electrode 140.

In some non-limiting examples, the transmissive region 2620 of the device 2710 remains substantially devoid of any materials that may substantially affect the transmission of light therethrough. In particular, as shown in the figure, the TFT structure 200 and/or the first electrode 120 are positioned, in a cross-sectional aspect below the sub-pixel 264x corresponding thereto and beyond the transmissive region 2620. As a result, these components do not attenuate or impede light from being transmitted through the transmissive region 2620. In some non-limiting examples, such arrangement allows a viewer viewing the device 2710 from a typical viewing distance to see through the device 2700, in some non-limiting examples, when all of the (sub-) pixel(s) 340/264x are not emitting, thus creating a transparent AMOLED device 2710.

By providing a transmissive region 2620 that is free and/or substantially devoid of any conductive coating 830, the transmittance in such region may, in some non-limiting examples, be favorably enhanced, by way of non-limiting example, by comparison to the device 2700 of FIG. 27B.

While not shown in the figure, in some non-limiting examples, the device 2710 may further comprise an NPC 1120 disposed between the conductive coating 830 and the at least one semiconducting layer(s) 130. In some non-limiting examples, the NPC 1120 may also be disposed between the NIC 810 and the PDL(s) 440.

In some non-limiting examples, the NIC 810 may be formed concurrently with the at least one semiconducting layer(s) 130. By way of non-limiting example, at least one material used to form the NIC 810 may also be used to form the at least one semiconducting layer(s) 130. In such non-limiting example, a number of stages for fabricating the device 2710 may be reduced.

Those having ordinary skill in the relevant art will appreciate that in some non-limiting examples, various other layers and/or coatings, including without limitation those forming the at least one semiconducting layer(s) 130 and/or the conductive coating 830, may cover a part of the transmissive region 2620, especially if such layers and/or coatings are substantially transparent. In some non-limiting examples, the PDL(s) 440 may have a reduced thickness, including without limitation, by forming a well therein, which in some non-limiting examples is not dissimilar to the well defined for emissive region(s) 1910, to further facilitate light transmission through the transmissive region 2620.

Those having ordinary skill in the relevant art will appreciate that (sub-) pixel(s) 340/264x arrangements other than the arrangement shown in FIGS. 27A and 27C may, in some non-limiting examples, be employed.

Selective Deposition of a Conductive Coating Over Emissive Region(s)

As discussed above, modulating the thickness of an electrode 120, 140, 1750, 4150 in and across a lateral aspect 410 of emissive region(s) 1910 of a (sub-) pixel 340/264x may impact the microcavity effect observable. In some non-limiting examples, selective deposition of at least one conductive coating 830 through deposition of at least one selective coating 710, such as an NIC 810 and/or an NPC 1120, in the lateral aspects 410 of emissive region(s) 1910 corresponding to different sub-pixel(s) 264x in a pixel region 2610 may allow the optical microcavity effect in each emissive region 1910 to be controlled and/or modulated to optimize desirable optical microcavity effects on a sub-pixel 264x basis, including without limitation, an emission spectrum, a luminous intensity and/or an angular dependence of a brightness and/or a color shift of emitted light.

Such effects may be controlled by modulating the thickness of the selective coating 710, such as an NIC 810 and/or an NPC 1120, disposed in each emissive region 1910 of the sub-pixel(s) 264x independently of one another. By way of non-limiting example, the thickness of an NIC 810 disposed over a blue sub-pixel 2643 may be less than the thickness of an NIC 810 disposed over a green sub-pixel 2642, and the thickness of the NIC disposed over a green sub-pixel 2642 may be less than the thickness of an NIC 810 disposed over a red sub-pixel 2641.

In some non-limiting examples, such effects may be controlled to an even greater extent by independently modulating the thickness of not only the selective coating 710, but also the conductive coating 830 deposited in part(s) of each emissive region 1910 of the sub-pixel(s) 264x.

Such a mechanism is illustrated in the schematic diagrams of FIGS. 28A-28D. These diagrams illustrate various stages of manufacturing an example version, shown generally at 2800, of the device 100.

Figure 28A:
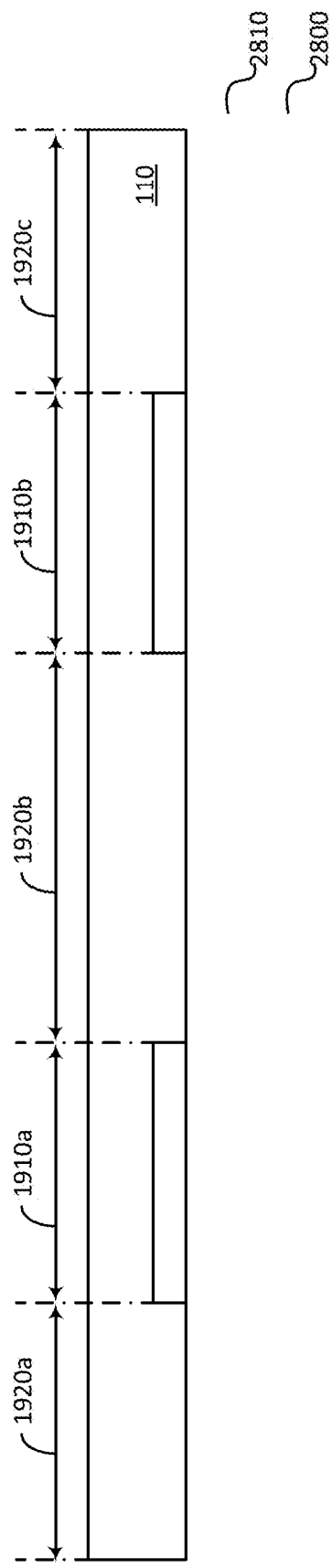
FIGS. 28A-28D are schematic diagrams that show example stages of an example process for manufacturing an example version of the device of FIG. 1 to provide two emissive regions each having a second electrode of different thickness according to an example in the present disclosure.

FIG. 28A shows a stage 2810 of manufacturing the device 2800. In the stage 2810, a substrate 110 is provided. The substrate 110 comprises a first emissive region 1910a and a second emissive region 1910b. In some non-limiting examples, the first emissive region 1910a and/or the second emissive region 1910b may be surrounded and/or spaced-apart by at least one non-emissive region 1920a-1920c. In some non-limiting examples, the first emissive region 1910a and/or the second emissive region 1910b may each correspond to a (sub-) pixel 340/264x.

Figure 28B:
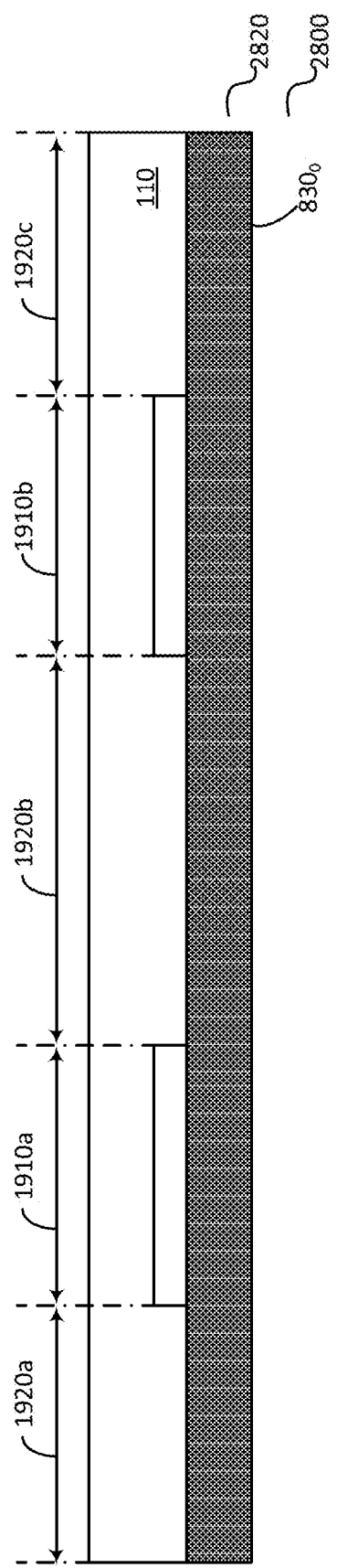

FIG. 28B shows a stage 2820 of manufacturing the device 2800. In the stage 2820, an initial conductive coating $830_0$ is deposited on an exposed layer surface 111 of an underlying material, in this case the substrate 110. The initial conductive coating $830_0$ is deposited across the first emissive region 1910a and the second emissive region 1910b. In some non-limiting examples, the initial conductive coating $830_0$ is deposited across at least one of the non-emissive regions 1920a-1920c.

In some non-limiting examples, the initial conductive coating $830_0$ may be deposited using an open mask and/or a mask-free deposition process.

Figure 28C:
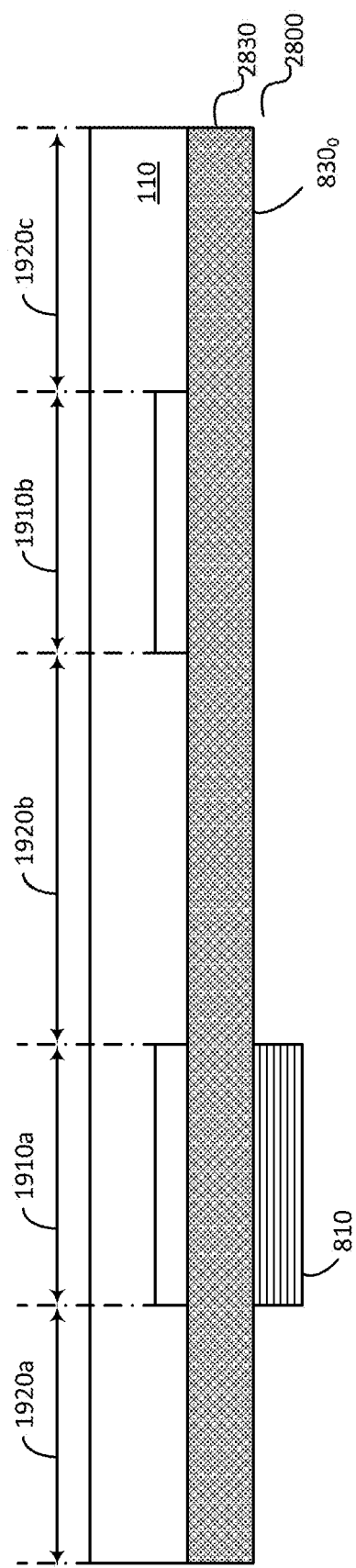

FIG. 28C shows a stage 2830 of manufacturing the device 2800. In the stage 2830, an NIC 810 is selectively deposited over a first portion of the initial conductive coating $830_0$. As shown in the figure, in some non-limiting examples, the NIC 810 is deposited across the first emissive region 1910a, while in some non-limiting examples, the second emissive region 1910b and/or in some non-limiting examples, at least one of the non-emissive regions 1920a-1920c are substantially devoid of the NIC 810.

Figure 28D:
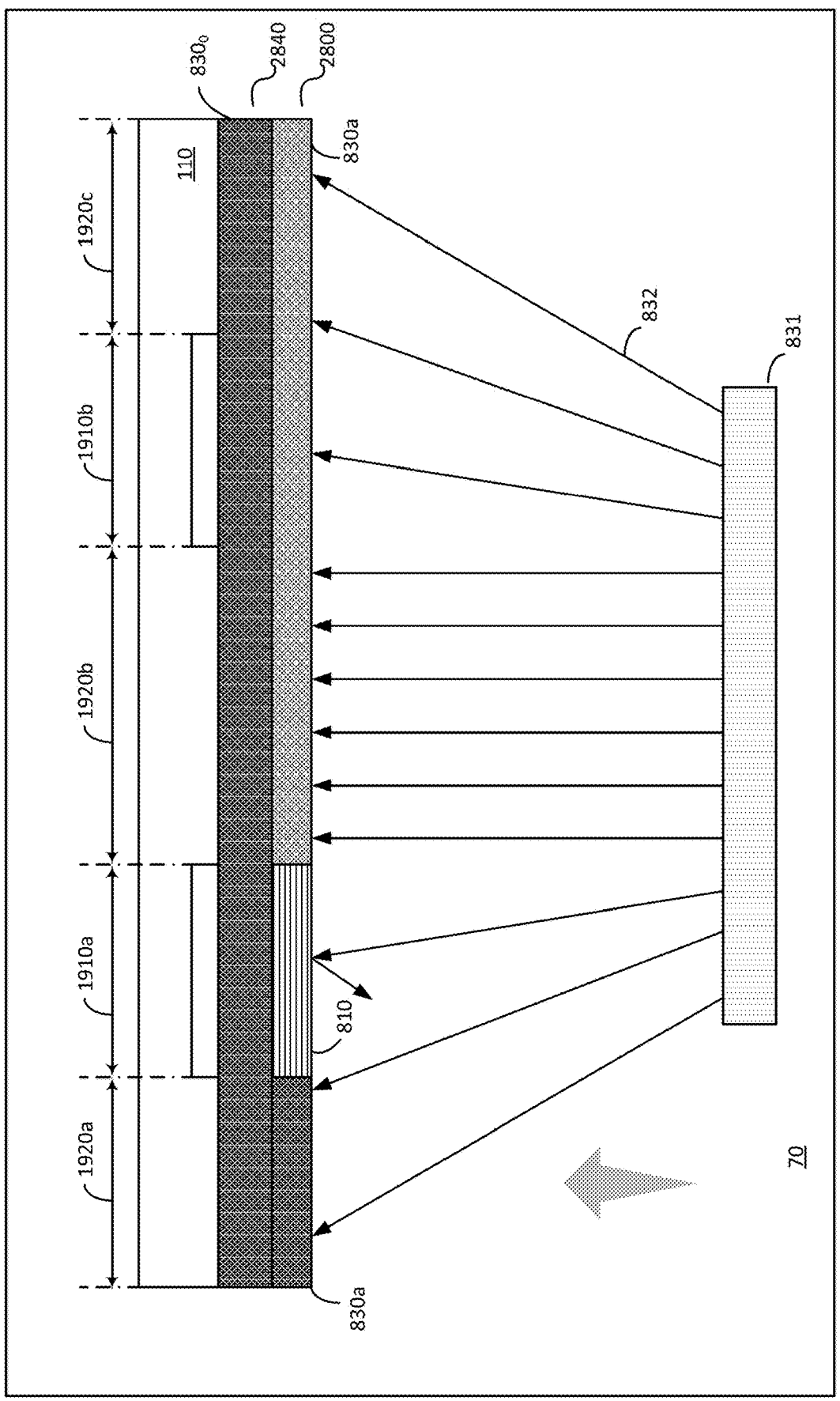

FIG. 28D shows a stage 2840 of manufacturing the device 2800. In the stage 2840, a first conductive coating 830a may be deposited across those second portions of the device 2800 that are substantially devoid of the NIC 810. In some non-limiting examples, the first conductive coating 830a may be deposited across the second emissive region 1910b and/or, in some non-limiting examples, at least one of the non-emissive region 1920a-1920c.

Those having ordinary skill in the relevant art will appreciate that the evaporative process shown in FIG. 28D and described in detail in connection with any one or more of FIGS. 7-8, 11A-11B and/or 12A-12C may, although not shown, for simplicity of illustration, equally be deposited in any one or more of the preceding stages described in FIGS. 28A-28C.

Those having ordinary skill in the relevant art will appreciate that the manufacture of the device 2800 may in some non-limiting examples, encompass additional stages that are not shown for simplicity of illustration. Such additional stages may include, without limitation, depositing one or more NICs 810, depositing one or more NPCs 1120, depositing one or more additional conductive coatings 830, depositing an outcoupling coating and/or encapsulation of the device 2800.

Those having ordinary skill in the relevant art will appreciate that while the manufacture of the device 2800 has been described and illustrated in connection with a first emissive region 1910a and a second emissive region 1910b, in some non-limiting examples, the principles derived therefrom may equally be deposited on the manufacture of devices having more than two emissive regions 1910.

In some non-limiting examples, such principles may be deposited on deposit conductive coating(s) of varying thickness for emissive region(s) 1910 corresponding to sub-pixel(s) 264x, in some non-limiting examples, in an OLED display device 100, having different emission spectra. In some non-limiting examples, the first emissive region 1910a may correspond to a sub-pixel 264x configured to emit light of a first wavelength and/or emission spectrum and/or in some non-limiting examples, the second emissive region 1910b may correspond to a sub-pixel 264x configured to emit light of a second wavelength and/or emission spectrum. In some non-limiting examples, the device 2800 may comprise a third emissive region 1910c (FIG. 29A) that may correspond to a sub-pixel 264x configured to emit light of a third wavelength and/or emission spectrum.

In some non-limiting examples, the first wavelength may be less than, greater than, and/or equal to at least one of the second wavelength and/or the third wavelength. In some non-limiting examples, the second wavelength may be less than, greater than, and/or equal to at least one of the first wavelength and/or the third wavelength. In some non-limiting examples, the third wavelength may be less than, greater than and/or equal to at least one of the first wavelength and/or the second wavelength.

In some non-limiting examples, the device 2800 may also comprise at least one additional emissive region 1910 (not shown) that may in some non-limiting examples be configured to emit light having a wavelength and/or emission spectrum that is substantially identical to at least one of the first emissive region 1910a, the second emissive region 1910b and/or the third emissive region 1910c.

In some non-limiting examples, the NIC 810 may be selectively deposited using a shadow mask that may also have been used to deposit the at least one semiconducting layer 130 of the first emissive region 1910a. In some non-limiting examples, such shared use of a shadow mask may allow the optical microcavity effect(s) to be tuned for each sub-pixel 264x in a cost-effective manner.

The use of such mechanism to create an example version 2900 of the device 100 having sub-pixel(s) 264x of a given pixel 340 with modulated micro-cavity effects is described in FIGS. 29A-29D.

Figure 29A:
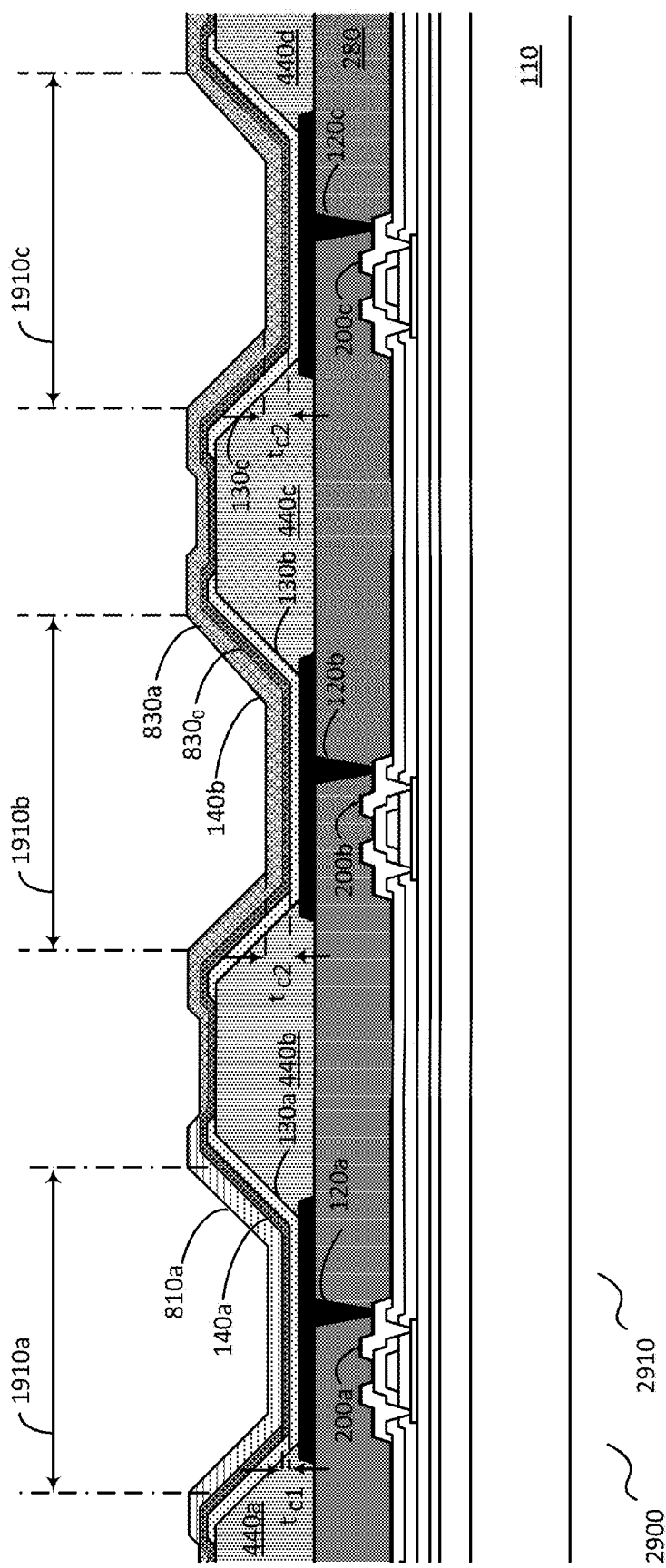
FIGS. 29A-29D are schematic diagrams that show example stages of an example process for manufacturing an example version of the device of FIG. 1 having sub-pixel regions having a second electrode of different thickness according to an example in the present disclosure.

In FIG. 29A, a stage 2810 of manufacture of the device 2900 is shown as comprising a substrate 110, a TFT insulating layer 280 and a plurality of first electrodes 120a-120c, formed on a surface of the TFT insulating layer 280.

The substrate 110 may comprise the base substrate 112 (not shown for purposes of simplicity of illustration) and/or at least one TFT structure 200a-200c corresponding to and for driving an emissive region 1910a-1910c each having a corresponding sub-pixel 264x, positioned substantially thereunder and electrically coupled to its associated first electrode 120a-120c. PDL(s) 440a-440d are formed over the substrate 110, to define emissive region(s) 1910a-1910c. The PDL(s) 440a-440d cover edges of their respective first electrodes 120a-120c.

In some non-limiting examples, at least one semiconducting layer 130a-130c is deposited over exposed region(s) of their respective first electrodes 120a-120c and, in some non-limiting examples, at least parts of the surrounding PDLs 440a-440d.

In some non-limiting examples, an initial conductive coating $830_0$ may be deposited over the at least one semiconducting layer(s) 130a-130c. In some non-limiting examples, the initial conductive coating $830_0$ may be deposited using an open mask and/or mask-free deposition process. In some non-limiting examples, such deposition may be effected by exposing the entire exposed layer surface 111 of the device 2900 to a vapor flux of the initial conductive coating $830_0$, which in some non-limiting examples may be Mg, to deposit the initial conductive coating $830_0$ over the at least one semiconducting layer(s) 130a-130c to form a first layer of the second electrode 140a (not shown), which in some non-limiting examples may be a common electrode, at least for the first emissive region 1910a. Such common electrode has a first thickness $t_{c1}$ in the first emissive region 1910a. The first thickness $t_{c1}$ may correspond to a thickness of the initial conductive coating $830_0$.

In some non-limiting examples, a first NIC 810a is selectively deposited over first portions of the device 2810, comprising the first emissive region 1910a.

In some non-limiting examples, a first conductive coating 830a may be deposited over the device 2900. In some non-limiting examples, the first conductive coating 830a may be deposited using an open mask and/or mask-free deposition process. In some non-limiting examples, such deposition may be effected by exposing the entire exposed layer surface 111 of the device 2810 to a vapour flux of the first conductive coating 830a, which in some non-limiting examples may be Mg, to deposit the first conductive coating 830a over the initial conductive coating $830_0$ that is substantially devoid of the first NIC 810a, in some examples, the second and third emissive region 1910b, 1910c and/or at least part(s) of the non-emissive region(s) 1920 in which the PDLs 440a-440d lie, such that the first conductive coating 830a is deposited on the second portion(s) of the initial conductive coating $830_0$ that are substantially devoid of the first NIC 810a to form a second layer of the second electrode 140b (not shown), which in some non-limiting examples, may be a common electrode, at least for the second emissive region 1910b. Such common electrode has a second thickness $t_{c2}$ in the second emissive region 1910b. The second thickness $t_{c2}$ may correspond to a combined thickness of the initial conductive coating $830_0$ and of the first conductive coating 830a and may in some non-limiting examples be greater than the first thickness $t_{c1}$.

Figure 29B:
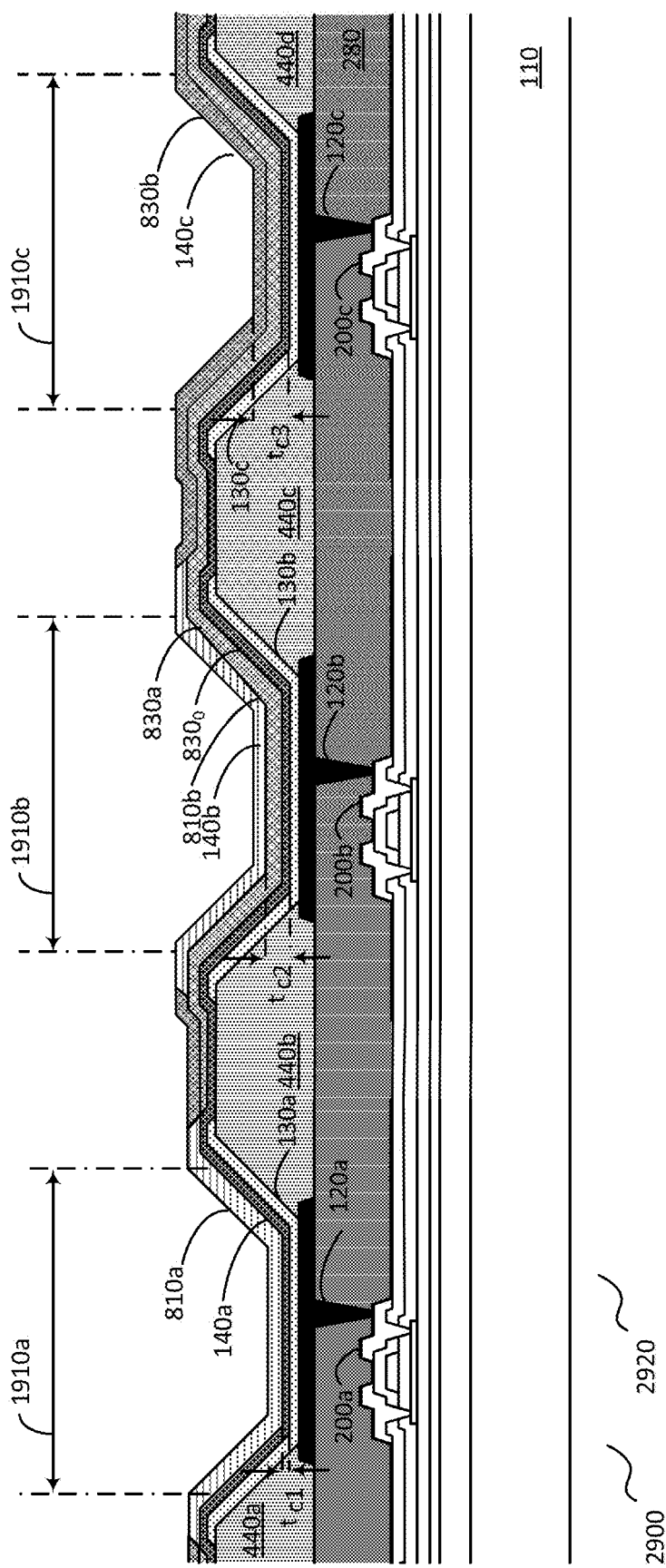

In FIG. 29B, a stage 2920 of manufacture of the device 2900 is shown.

In some non-limiting examples, a second NIC 810b is selectively deposited over further first portions of the device 2900, comprising the second emissive region 1910b.

In some non-limiting examples, a second conductive coating 830b may be deposited over the device 2900. In some non-limiting examples, the second conductive coating 830b may be deposited using an open mask and/or mask-free deposition process. In some non-limiting examples, such deposition may be effected by exposing the entire exposed layer surface 111 of the device 2900 to a vapour flux of the second conductive coating 830b, which in some non-limiting examples may be Mg, to deposit the second conductive coating 830b over the first conductive coating 830a that is substantially devoid of either the first NIC 810a or the second NIC 810b, in some examples, the third emissive region 1910c and/or at least part(s) of the non-emissive region 1920 in which the PDLs 440a-440d lie, such that the second conductive coating 830b is deposited on the further second portion(s) of the first conductive coating 830a that are substantially devoid of the second NIC 810b to form a third layer of the second electrode 140c (not shown), which in some non-limiting examples, may be a common electrode, at least for the third emissive region 1910c. Such common electrode has a third thickness $t_{c3}$ in the third emissive region 1910c. The third thickness $t_{c3}$ may correspond to a combined thickness of the initial conductive coating $830_0$, the first conductive coating 830a and the second conductive coating 830b and may in some non-limiting examples be greater than either or both of the first thickness $t_{c1}$ and the second thickness $t_{c2}$.

Figure 29C:
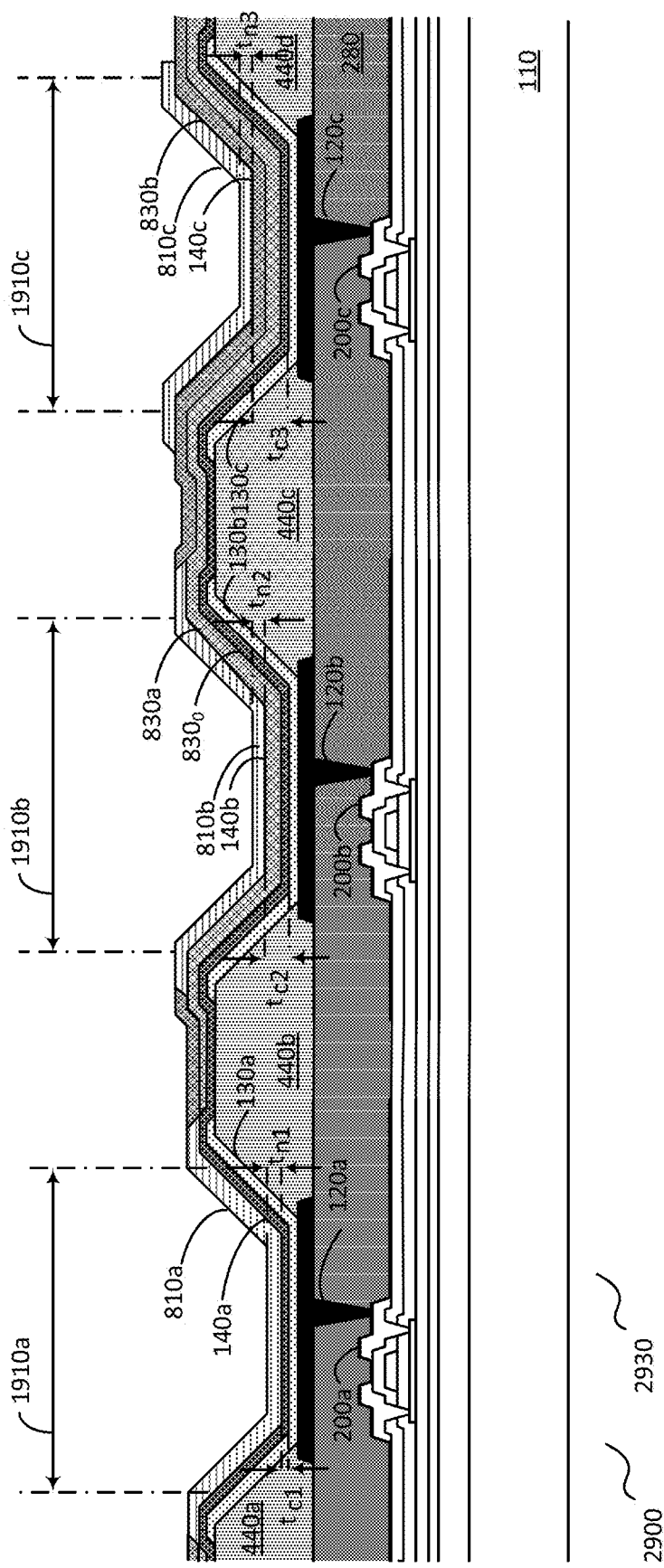

In FIG. 29C, a stage 2930 of manufacture of the device 2900 is shown.

In some non-limiting examples, a third NIC 810c is selectively deposited over additional first portions of the device 2900, comprising the third emissive region 1910b.

Figure 29D:
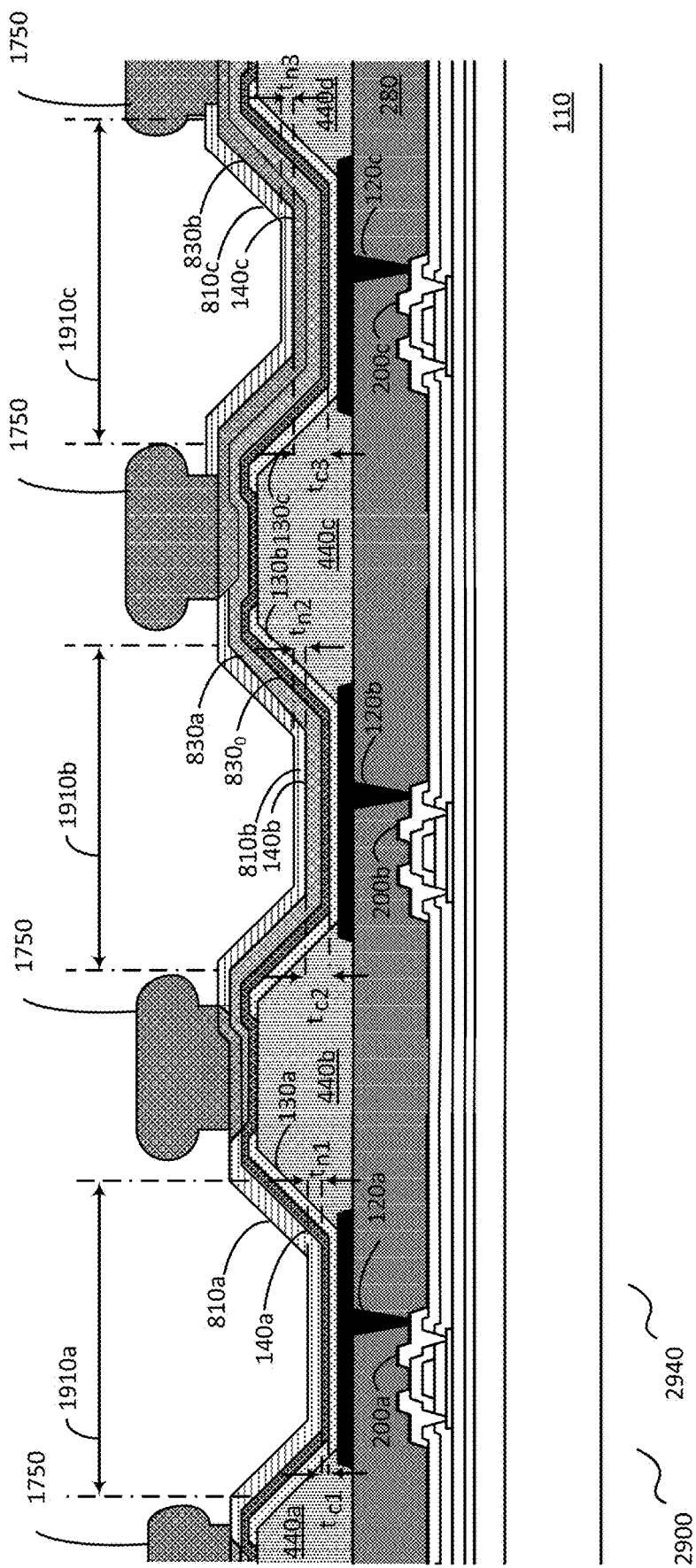

In FIG. 29D, a stage 2940 of manufacture of the device 2900 is shown.

In some non-limiting examples, at least one auxiliary electrode 1750 is disposed in the non-emissive region(s) 1920 of the device 2900 between neighbouring emissive region 1910a-1910c thereof and in some non-limiting examples, over the PDLs 440a-440d. In some non-limiting examples, the conductive coating 830 used to deposit the at least one auxiliary electrode 1750 may be deposited using an open mask and/or mask-free deposition process. In some non-limiting examples, such deposition may be effected by exposing the entire exposed layer surface 111 of the device 2900 to a vapour flux of the conductive coating material 831, which in some non-limiting examples may be Mg, to deposit the conductive coating 830 over the exposed parts of the initial conductive coating $830_0$, the first conductive coating 830a and the second conductive coating 830b that is substantially devoid of any of the first NIC 810a the second NIC 810b and/or the third NIC 810c, such that the conductive coating 830 is deposited on an additional second portion comprising the exposed part(s) of the initial conductive coating $830_0$, the first conductive coating 830a and/or the second conductive coating 830b that are substantially devoid of any of the first NIC 810a, the second NIC 810b and/or the third NIC 810c to form the at least one auxiliary electrode 1750. Each of the at least one auxiliary electrode 1750 is electrically coupled to a respective one of the second electrodes 140a-140c. In some non-limiting examples, each of the at least one auxiliary electrode 1750 is in physical contact with such second electrode 140a-140c.

In some non-limiting examples, the first emissive region 1910a, the second emissive region 1910b and the third emissive region 1910c may be substantially devoid of the material used to form the at least one auxiliary electrode 1750.

In some non-limiting examples, at least one of the initial conductive coating $830_0$, the first conductive coating 830a and/or the second conductive coating 830b may be transmissive and/or substantially transparent in at least a part of the visible wavelength range of the electromagnetic spectrum. Thus, if the first conductive coating 830a and/or the second conductive coating 830b (and/or any additional conductive coating(s) 830) is disposed on top of the initial conductive coating $830_0$ to form a multi-coating electrode 120, 140, 1750 that may also be transmissive and/or substantially transparent in at least a part of the visible wavelength range of the electromagnetic spectrum. In some non-limiting examples, the transmittance of any one or more of the initial conductive coating $830_0$, the first conductive coating 830a, the second conductive coating 830b, any additional conductive coating(s) 830, and/or the multi-coating electrode 120, 140, 1750 may be greater than about 30%, greater than about 40% greater than about 45%, greater than about 50%, greater than about 60%, greater than about 70%, greater than about 75%, and/or greater than about 80% in at least a part of the visible wavelength range of the electromagnetic spectrum.

In some non-limiting examples, a thickness of the initial conductive coating $830_0$, the first conductive coating 830a and/or the second conductive coating 830b may be made relatively thin to maintain a relatively high transmittance. In some non-limiting examples, the thickness of the initial conductive coating $830_0$ may be about 5 to 30 nm, about 8 to 25 nm, and/or about 10 to 20 nm. In some non-limiting examples, the thickness of the first conductive coating 830a may be about 1 to 25 nm, about 1 to 20 nm, about 1 to 15 nm, about 1 to 10 nm, and/or about 3 to 6 nm. In some non-limiting examples, the thickness of the second conductive coating 830b may be about 1 to 25 nm, about 1 to 20 nm, about 1 to 15 nm, about 1 to 10 nm, and/or about 3 to 6 nm. In some non-limiting examples, the thickness of a multi-coating electrode formed by a combination of the initial conductive coating $830_0$, the first conductive coating 830a, the second conductive coating 830b and/or any additional conductive coating(s) 830 may be about 6 to 35 nm, about 10 to 30 nm, about 10 to 25 nm and/or about 12 to 18 nm.

In some non-limiting examples, a thickness of the at least one auxiliary electrode 1750 may be greater than the thickness of the initial conductive coating $830_0$, the first conductive coating 830a, the second conductive coating 830b and/or a common electrode. In some non-limiting examples, the thickness of the at least one auxiliary electrode 1750 may be greater than about 50 nm, greater than about 80 nm, greater than about 100 nm, greater than about 150 nm, greater than about 200 nm, greater than about 300 nm, greater than about 400 nm, greater than about 500 nm, greater than about 700 nm, greater than about 800 nm, greater than about 1 μm, greater than about 1.2 μm, greater than about 1.5 μm, greater than about 2 μm, greater than about 2.5 μm, and/or greater than about 3 μm.

In some non-limiting examples, the at least one auxiliary electrode 1750 may be substantially non-transparent and/or opaque. However, since the at least one auxiliary electrode 1750 may be in some non-limiting examples provided in a non-emissive region 1920 of the device 2900, the at least one auxiliary electrode 1750 may not cause or contribute to significant optical interference. In some non-limiting examples, the transmittance of the at least one auxiliary electrode 1750 may be less than about 50%, less than about 70%, less than about 80%, less than about 85%, less than about 90%, and/or less than about 95% in at least a part of the visible wavelength range of the electromagnetic spectrum.

In some non-limiting examples, the at least one auxiliary electrode 1750 may absorb light in at least a part of the visible wavelength range of the electromagnetic spectrum.

In some non-limiting examples, a thickness of the first NIC 810a, the second NIC 810b, and/or the third NIC 810c disposed in the first emissive region 1910a, the second emissive region 1910*b* and/or the third emissive region 1910*c* respectively, may be varied according to a colour and/or emission spectrum of light emitted by each emissive region 1910*a*-1910*c*. As shown in FIGS. 29C-29D, the first NIC 810*a* may have a first NIC thickness $t_{n1}$, the second NIC 810*b* may have a second NIC thickness $t_{n2}$ and/or the third NIC 810*c* may have a third NIC thickness $t_{n3}$. In some non-limiting examples, the first NIC thickness $t_{n1}$, the second NIC thickness $t_{n2}$ and/or the third NIC thickness $t_{n3}$ may be substantially the same as one another. In some non-limiting examples, the first NIC thickness $t_{n1}$, the second NIC thickness $t_{n2}$ and/or the third NIC thickness $t_{n3}$ may be different from one another.

In some non-limiting examples, the device 2900 may also comprise any number of emissive regions 1910*a*-1910*c* and/or (sub-) pixel(s) 340/264*x* thereof. In some non-limiting examples, a device may comprise a plurality of pixels 340, wherein each pixel 340 comprises two, three or more sub-pixel(s) 264*x*.

Those having ordinary skill in the relevant art will appreciate that the specific arrangement of (sub-) pixel(s) 340/264*x* may be varied depending on the device design. In some non-limiting examples, the sub-pixel(s) 264*x* may be arranged according to known arrangement schemes, including without limitation, RGB side-by-side, diamond and/or PenTile®.

Figure 30:
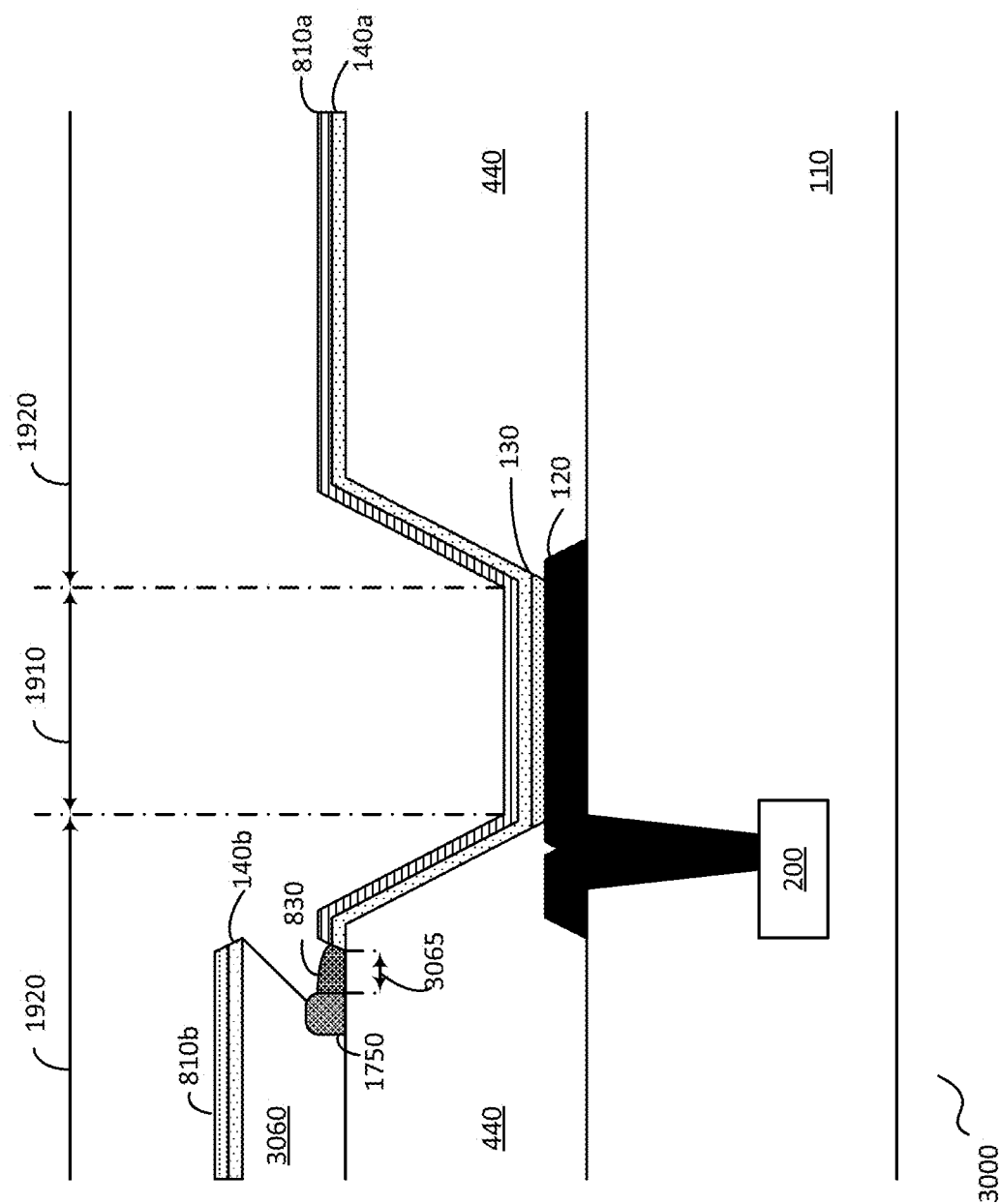
FIG. 30 is a schematic diagram illustrating an example cross-sectional view of an example version of the device of FIG. 1 in which a second electrode is coupled to an auxiliary electrode according to an example in the present disclosure.

Conductive Coating for Electrically Coupling an Electrode to an Auxiliary Electrode Turning to FIG. 30, there is shown a cross-sectional view of an example version 3000 of the device 100. The device 3000 comprises in a lateral aspect, an emissive region 1910 and an adjacent non-emissive region 1920.

In some non-limiting examples, the emissive region 1910 corresponds to a sub-pixel 264*x* of the device 3000. The emissive region 1910 has a substrate 110, a first electrode 120, a second electrode 140 and at least one semiconducting layer 130 arranged therebetween.

The first electrode 120 is disposed on an exposed layer surface 111 of the substrate 110. The substrate 110 comprises a TFT structure 200, that is electrically coupled to the first electrode 120. The edges and/or perimeter of the first electrode 120 is generally covered by at least one PDL 440.

The non-emissive region 1920 has an auxiliary electrode 1750 and a first part of the non-emissive region 1920 has a projecting structure 3060 arranged to project over and overlap a lateral aspect of the auxiliary electrode 1750. The projecting structure 3060 extends laterally to provide a sheltered region 3065. By way of non-limiting example, the projecting structure 3060 may be recessed at and/or near the auxiliary electrode 1750 on at least one side to provide the sheltered region 3065. As shown, the sheltered region 3065 may in some non-limiting examples, correspond to a region on a surface of the PDL 440 that overlaps with a lateral projection of the projecting structure 3060. The non-emissive region 1920 further comprises a conductive coating 830 disposed in the sheltered region 3065. The conductive coating 830 electrically couples the auxiliary electrode 1750 with the second electrode 140.

An NIC 810*a* is disposed in the emissive region 1910 over the exposed layer surface 111 of the second electrode 140. In some non-limiting examples, an exposed layer surface 111 of the projecting structure 3060 is coated with a residual thin conductive film 3040 from deposition of a thin conductive film to form the second electrode 140. In some non-limiting examples, a surface of the residual thin conductive film 3040 is coated with a residual NIC 810*b* from deposition of the NIC 810.

However, because of the lateral projection of the projecting structure 3060 over the sheltered region 3065, the sheltered region 3065 is substantially devoid of NIC 810. Thus, when a conductive coating 830 is deposited on the device 3000 after deposition of the NIC 810, the conductive coating 830 is deposited on and/or migrates to the sheltered region 3065 to couple the auxiliary electrode 1750 to the second electrode 140.

Those having ordinary skill in the relevant art will appreciate that a non-limiting example has been shown in FIG. 30 and that various modifications may be apparent. By way of non-limiting example, the projecting structure 3060 may provide a sheltered region 3065 along at least two of its sides. In some non-limiting examples, the projecting structure 3060 may be omitted and the auxiliary electrode 1750 may include a recessed portion that defines the sheltered region 3065. In some non-limiting examples, the auxiliary electrode 1750 and the conductive coating 830 may be disposed directly on a surface of the substrate 110, instead of the PDL 440.

Selective Deposition of Optical Coating

In some non-limiting examples, a device 100 (not shown), which in some non-limiting examples may be an optoelectronic device, comprises a substrate 110, an NIC 810 and an optical coating. The NIC 810 covers a first lateral portion of the substrate 110. The optical coating covers a second lateral portion of the substrate. At least a part of the NIC 810 is substantially devoid of the optical coating.

In some non-limiting examples, the optical coating may be used to modulate optical properties of light being transmitted, emitted and/or absorbed by the device 100, including without limitation, plasmon modes. By way of non-limiting example, the optical coating may be used as an optical filter, index-matching coating, optical out-coupling coating, scattering layer, diffraction grating, and/or parts thereof.

In some non-limiting examples, the optical coating may be used to modulate at least one optical microcavity effect in the device 100 by, without limitation, tuning the total optical path length and/or the refractive index thereof. At least one optical property of the device 100 may be affected by modulating at least one optical microcavity effect including without limitation, the output light, including without limitation, an angular dependence of a brightness and/or a color shift thereof. In some non-limiting examples, the optical coating may be a non-electrical component, that is, the optical coating may not be configured to conduct and/or transmit electrical current during normal device operations.

In some non-limiting examples, the optical coating may be formed of any material used as a conductive coating 830 and/or employing any mechanism of depositing a conductive coating 830 as described herein.

Edge Effects of NICs and Conductive Coatings

FIGS. 31A-31I describe various potential behaviours of NICs 810 at a deposition interface with conductive coatings 830.

Figure 31A:
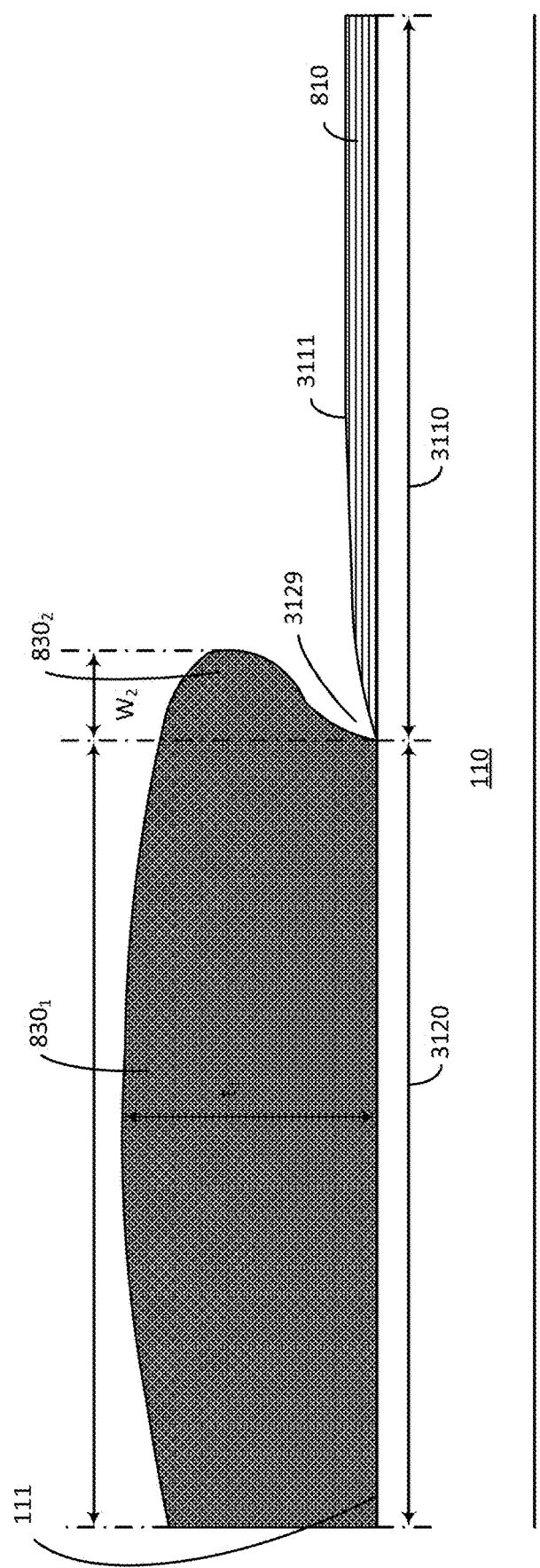
FIGS. 31A-31I are schematic diagrams that show various potential behaviours of an NIC at a deposition interface with a conductive coating in an example version of the device of FIG. 1, according to various examples in the present disclosure.

Turning to FIG. 31A, there is shown a first example of a part of an example version 3100 of the device 100 at an NIC deposition boundary. The device 3100 comprises a substrate 110 having a layer surface 111. An NIC 810 is deposited over a first portion 3110 of the layer surface 111. A conductive coating 830 is deposited over a second portion 3120 of the layer surface 111. As shown, by way of non-limiting example, the first portion 3110 and the second portion 3120 are distinct and non-overlapping portions of the layer surface 111.

The conductive coating 830 comprises a first part 830$_1$ and a remaining part 830$_2$. As shown, by way of non-limiting example, the first part $830_1$ of the conductive coating 830 substantially covers the second portion 3120 and the second part $830_2$ of the conductive coating 830 partially projects over and/or overlaps a first part of the NIC 810.

In some non-limiting examples, since the NIC 810 is formed such that its surface 3111 exhibits a relatively low affinity or initial sticking probability $S_0$ for a material used to form the conductive coating 830, there is a gap 3129 formed between the projecting and/or overlapping second part $830_2$ of the conductive coating 830 and the surface 3111 of the NIC 810. As a result, the second part $830_2$ is not in physical contact with the NIC 810 but is spaced-apart therefrom by the gap 3129 in a cross-sectional aspect. In some non-limiting examples, the first part $830_1$ of the conductive coating 830 may be in physical contact with the NIC 810 at an interface and/or boundary between the first portion 3110 and the second portion 3120.

In some non-limiting examples, the projecting and/or overlapping second part $830_2$ of the conductive coating 830 may extend laterally over the NIC 810 by a comparable extent as a thickness $t_1$ of the conductive coating 830. By way of non-limiting example, as shown, a width $w_2$ of the second part $830_2$ may be comparable to the thickness $t_1$. In some non-limiting examples, a ratio of $w_2:t_1$ may be in a range of about 1:1 to about 1:3, about 1:1 to about 1:1.5, and/or about 1:1 to about 1:2. While the thickness $t_1$ may in some non-limiting examples be relatively uniform across the conductive coating 830, in some non-limiting examples, the extent to which the second part $830_2$ projects and/or overlaps with the NIC 810 (namely $w_2$) may vary to some extent across different parts of the layer surface 111.

Figure 31B:
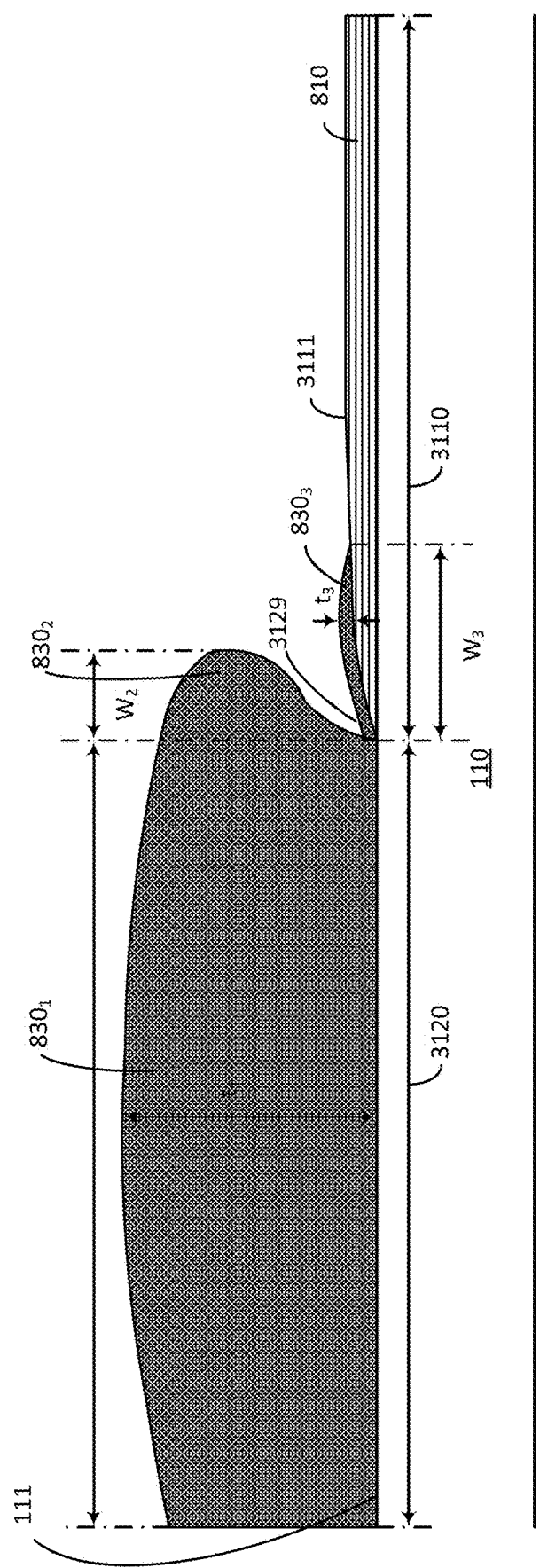

Turning now to FIG. 31B, the conductive coating 830 is shown to include a third part $830_3$ disposed between the second part $830_2$ and the NIC 810. As shown, the second part $830_2$ of the conductive coating 830 extends laterally over and is spaced apart from the third part $830_3$ of the conductive coating 830 and the third part $830_3$ may be in physical contact with the surface 3111 of the NIC 810. A thickness $t_3$ of the third part $830_3$ of the conductive coating 830 may be less and in some non-limiting examples, substantially less than the thickness $t_1$ of the first part $830_1$ thereof. In some non-limiting examples, a width $w_3$ of the third part $830_3$ may be greater than the width $w_2$ of the second part $830_2$. In some non-limiting examples, the third part $830_3$ may extend laterally to overlap the NIC 810 to a greater extent than the second part $830_2$. In some non-limiting examples, a ratio of $w_3:t_1$ may be in a range of about 1:2 to about 3:1 and/or about 1:1.2 to about 2.5:1. While the thickness $t_1$ may in some non-limiting examples be relatively uniform across the conductive coating 830, in some non-limiting examples, the extent to which the third part $830_3$ projects and/or overlaps with the NIC 810 (namely $w_3$) may vary to some extent across different parts of the layer surface 111.

The thickness $t_3$ of the third part $830_3$ may be no greater than and/or less than about 5% of the thickness $t_1$ of the first part $830_1$. By way of non-limiting example, $t_3$ may be no greater than and/or less than about 4%, no greater than and/or less than about 3%, no greater than and/or less than about 2%, no greater than and/or less than about 1%, and/or no greater than and/or less than about 0.5% of $t_1$. Instead of, and/or in addition to, the third part $830_3$ being formed as a thin film, as shown, the material of the conductive coating 830 may form as islands and/or disconnected clusters on a part of the NIC 810. By way of non-limiting example, such islands and/or disconnected clusters may comprise features that are physically separated from one another, such that the islands and/or clusters do not form a continuous layer.

Figure 31C:
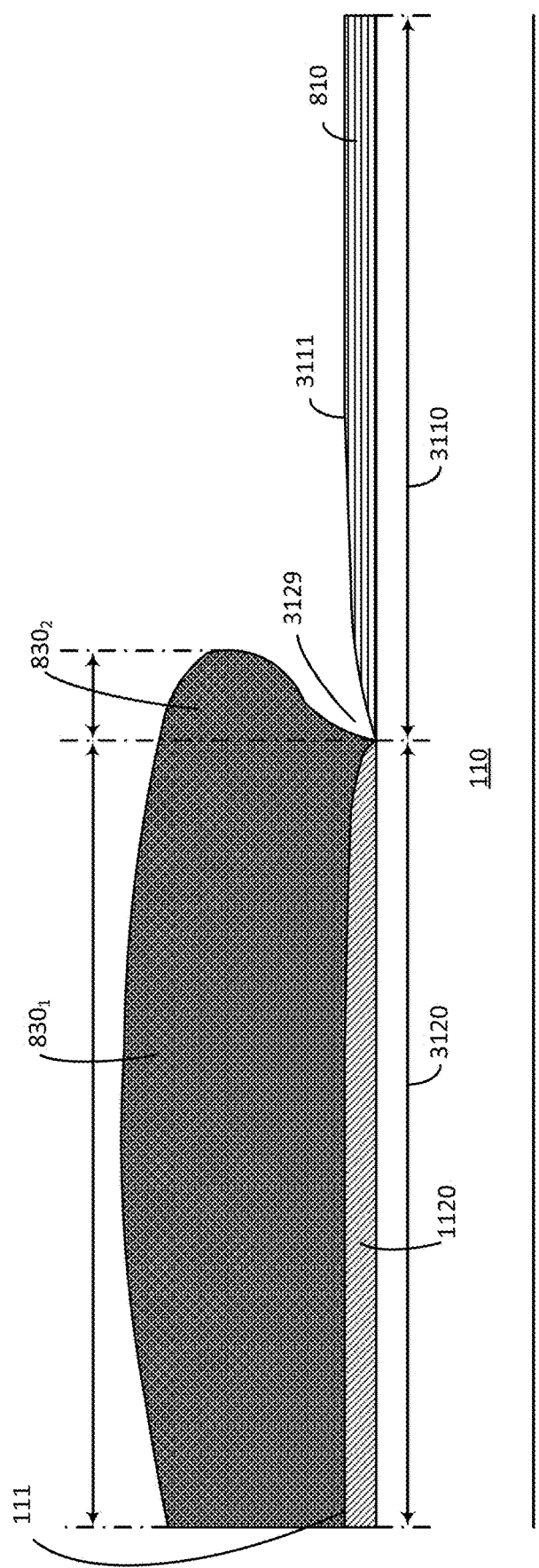

Turning now to FIG. 31C, an NPC 1120 is disposed between the substrate 110 and the conductive coating 830. The NPC 1120 is disposed between the first part $830_1$ of the conductive coating 830 and the second portion 3120 of the substrate 110. The NPC 1120 is illustrated as being disposed on the second portion 3120 and not on the first portion 3110, where the NIC 810 has been deposited. The NPC 1120 may be formed such that, at an interface and/or boundary between the NPC 1120 and the conductive coating 830, a surface of the NPC 1120 exhibits a relatively high affinity or initial sticking probability $S_0$ for the material of the conductive coating 830. As such, the presence of the NPC 1120 may promote the formation and/or growth of the conductive coating 830 during deposition.

Figure 31D:
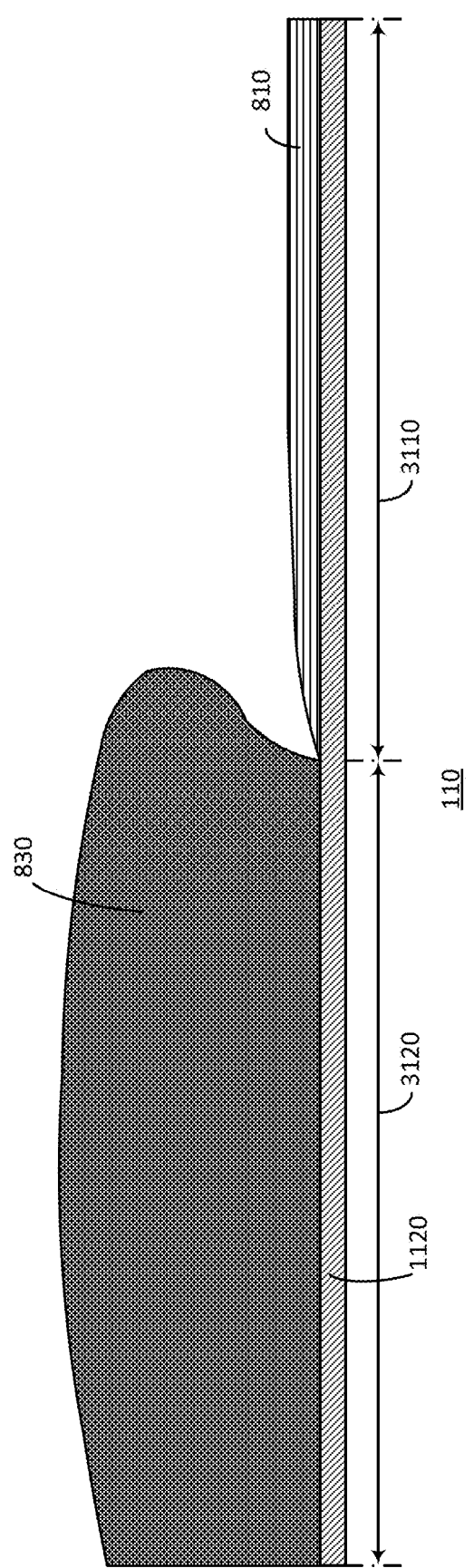

Turning now to FIG. 31D, the NPC 1120 is disposed on both the first portion 3110 and the second portion 3120 of the substrate 110 and the NIC 810 covers a part of the NPC 1120 disposed on the first portion 3110. Another part of the NPC 1120 is substantially devoid of the NIC 810 and the conductive coating 830 covers such part of the NPC 1120.

Figure 31E:
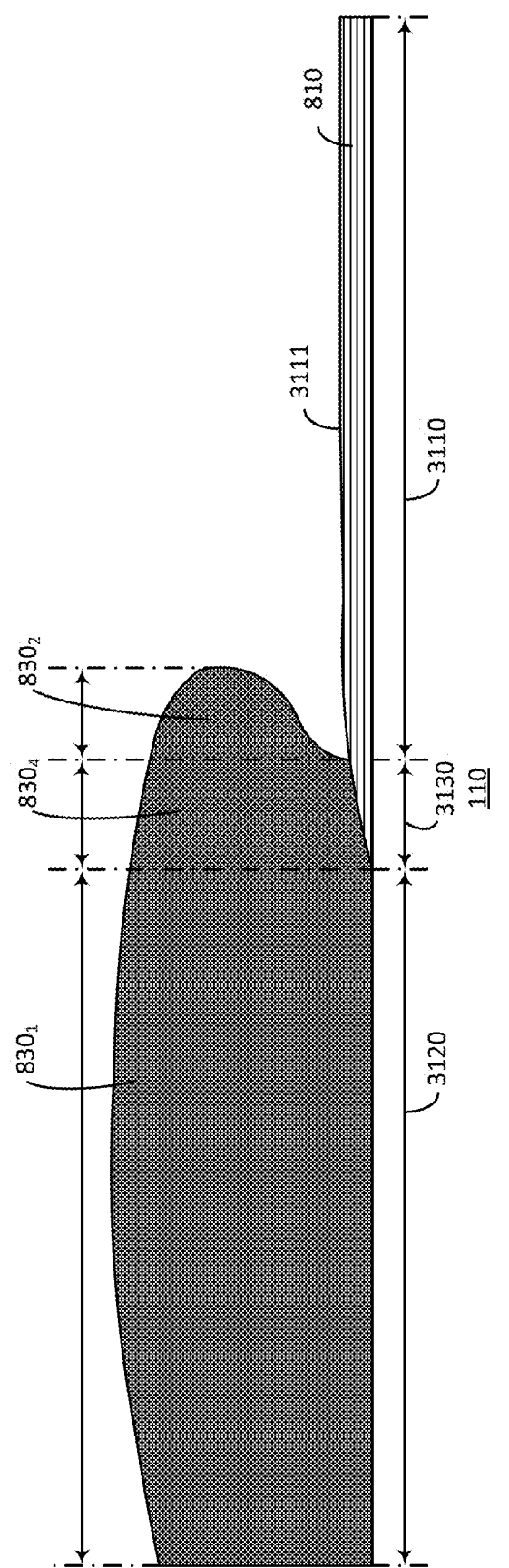

Turning now to FIG. 31E, the conductive coating 830 is shown to partially overlap a part of the NIC 810 in a third portion 3130 of the substrate 110. In some non-limiting examples, in addition to the first part $830_1$ and the second part $830_2$, the conductive coating 830 further includes a fourth part $830_4$. As shown, the fourth part $830_4$ of the conductive coating 830 is disposed between the first part $830_1$ and the second part $830_2$ of the conductive coating 830 and the fourth part $830_4$ may be in physical contact with the layer surface 3111 of the NIC 810. In some non-limiting examples, the overlap in the third portion 3130 may be formed as a result of lateral growth of the conductive coating 830 during an open mask and/or mask-free deposition process. In some non-limiting examples, while the layer surface 3111 of the NIC 810 may exhibit a relatively low initial sticking probability $S_0$ for the material of the conductive coating 830, and thus the probability of the material nucleating the layer surface 3111 is low, as the conductive coating 830 grows in thickness, the conductive coating 830 may also grow laterally and may cover a subset of the NIC 810 as shown.

Figure 31F:
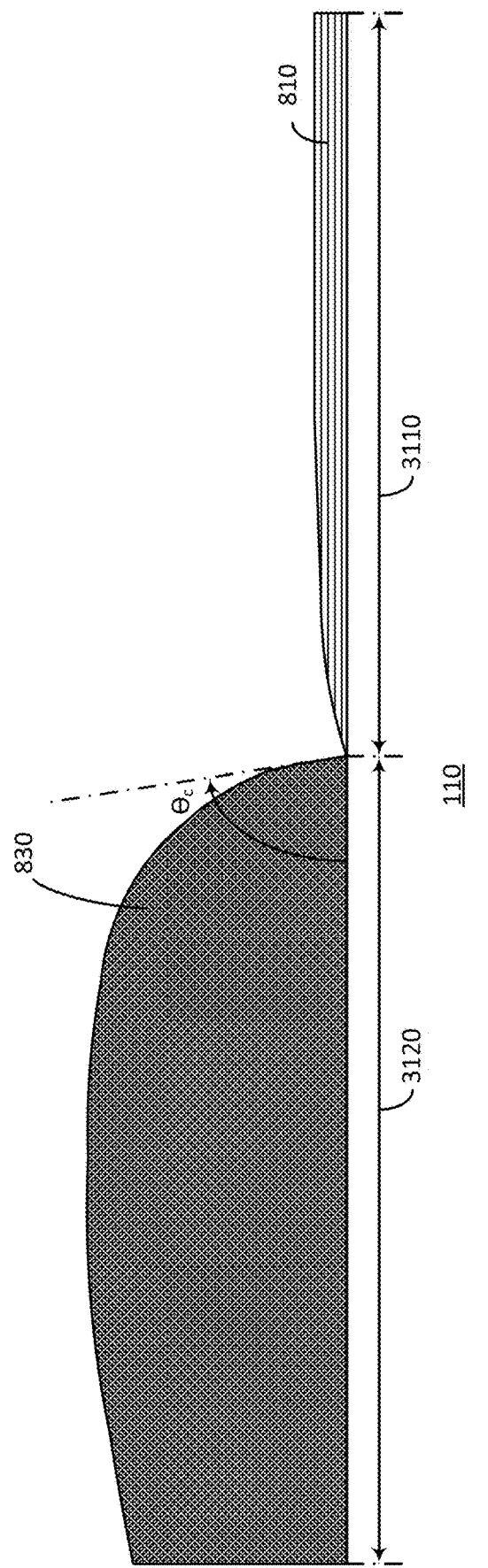

Turning now to FIG. 31F the first portion 3110 of the substrate 110 is coated with the NIC 810 and the second portion 3120 adjacent thereto is coated with the conductive coating 830. In some non-limiting examples, it has been observed that conducting an open mask and/or mask-free deposition of the conductive coating 830 may result in the conductive coating 830 exhibiting a tapered cross-sectional profile at and/or near an interface between the conductive coating 830 and the NIC 810.

In some non-limiting examples, a thickness of the conductive coating 830 at and/or near the interface may be less than an average thickness of the conductive coating 830. While such tapered profile is shown as being curved and/or arched, in some non-limiting examples, the profile may, in some non-limiting examples be substantially linear and/or non-linear. By way of non-limiting example, the thickness of the conductive coating 830 may decrease, without limitation, in a substantially linear, exponential and/or quadratic fashion in a region proximal to the interface.

It has been observed that a contact angle $\theta_c$ of the conductive coating 830 at and/or near the interface between the conductive coating 830 and the NIC 810 may vary, depending on properties of the NIC 810, such as a relative affinity and/or an initial sticking probability $S_0$. It is further postulated that the contact angle $\theta_c$ of the nuclei may in some non-limiting examples, dictate the thin film contact angle of the conductive coating 830 formed by deposition. Referring to FIG. 31F by way of non-limiting example, the contact angle $\theta_c$ may be determined by measuring a slope of a tangent of the conductive coating 830 at or near the interface between the conductive coating 830 and the NIC 810. In some non-limiting examples, where the cross-sectional taper profile of the conductive coating 830 is substantially linear, the contact angle $\theta_c$ may be determined by measuring the slope of the conductive coating 830 at and/or near the interface. As will be appreciated by those having ordinary skill in the relevant art, the contact angle $\theta_c$ may be generally measured relative to an angle of the underlying surface. In the present disclosure, for purposes of simplicity of illustration, the coatings 810, 830 are shown deposited on a planar surface. However, those having ordinary skill in the relevant art will appreciate that such coatings 810, 830 may be deposited on non-planar surfaces.

Figure 31G:
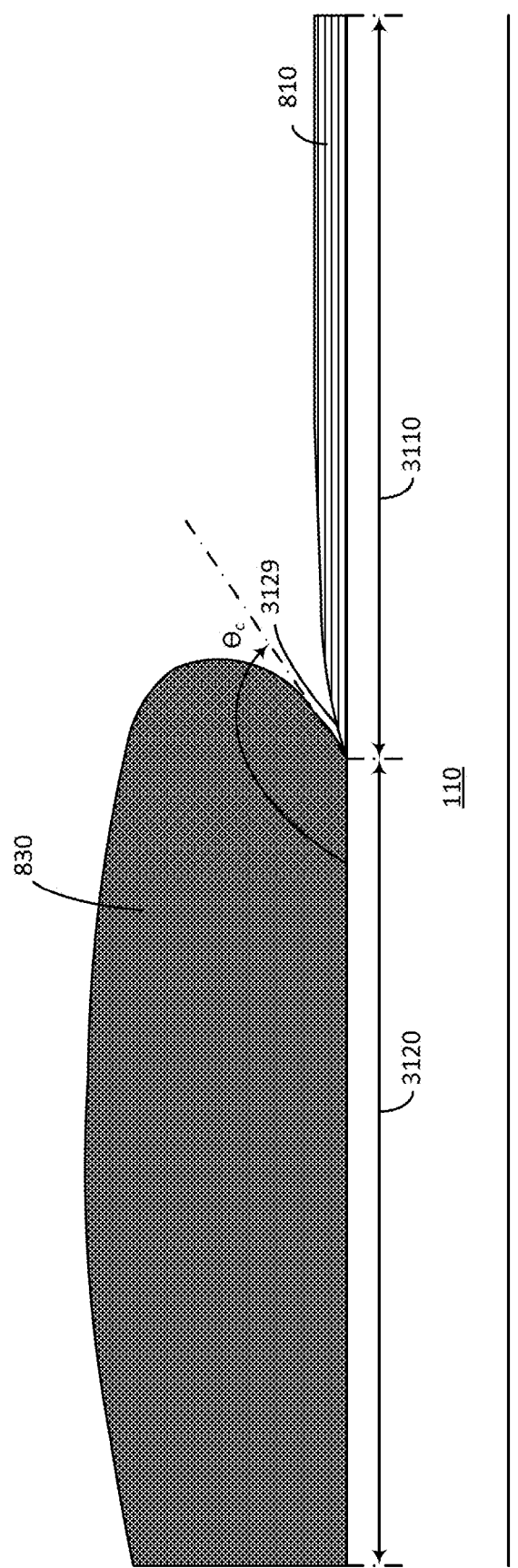

In some non-limiting examples, the contact angle $\theta_c$ of the conductive coating 830 may be greater than about 90°. Referring now to FIG. 31G, by way of non-limiting example, the conductive coating 830 is shown as including a part extending past the interface between the NIC 810 and the conductive coating 830 and is spaced apart from the NIC 810 by a gap 3129. In such non-limiting scenario, the contact angle $\theta_c$ may, in some non-limiting examples, be greater than about 90°.

In some non-limiting examples, it may be advantageous to form a conductive coating 830 exhibiting a relatively high contact angle $\theta_c$. By way of non-limiting example, the contact angle $\theta_c$ may be greater than about 10°, greater than about 15°, greater than about 20°, greater than about 25°, greater than about 30°, greater than about 35°, greater than about 40°, greater than about 50°, greater than about 70°, greater than about 70°, greater than about 75°, and/or greater than about 80°. By way of non-limiting example, a conductive coating 830 having a relatively high contact angle $\theta_c$ may allow for creation of finely patterned features while maintaining a relatively high aspect ratio. By way of non-limiting example, it may be desirable to form a conductive coating 830 exhibiting a contact angle $\theta_c$ greater than about 90°. By way of non-limiting example, the contact angle $\theta_c$ may be greater than about 90°, greater than about 95°, greater than about 100°, greater than about 105°, greater than about 110° greater than about 120°, greater than about 130°, greater than about 135°, greater than about 140°, greater than about 145°, greater than about 150° and/or greater than about 170°.

Figure 31H:
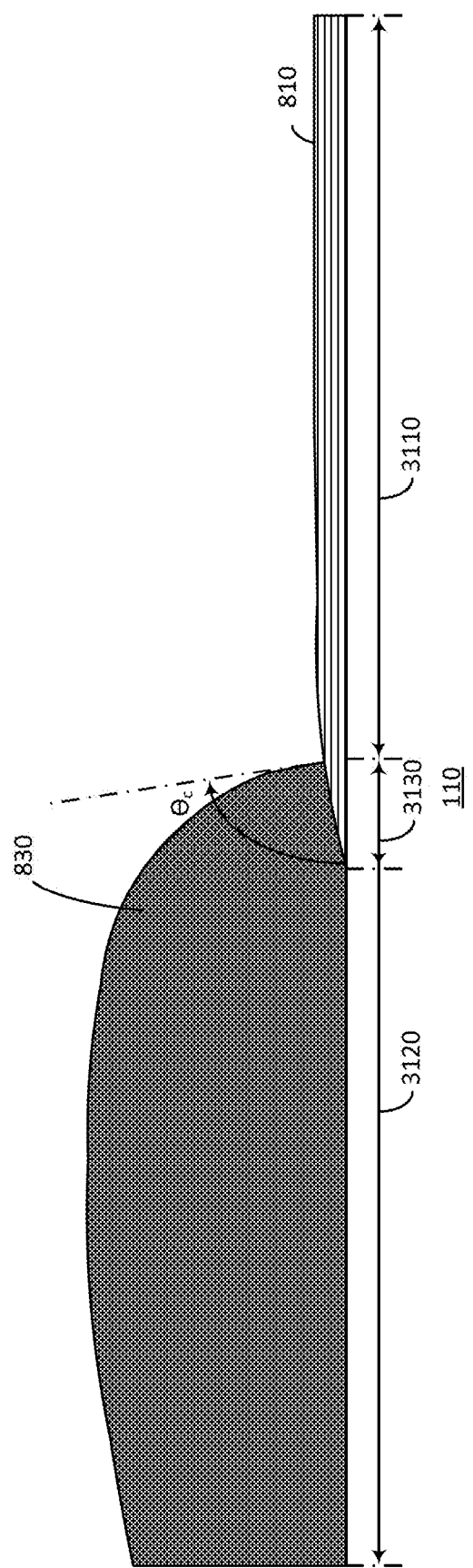
Figure 31I:
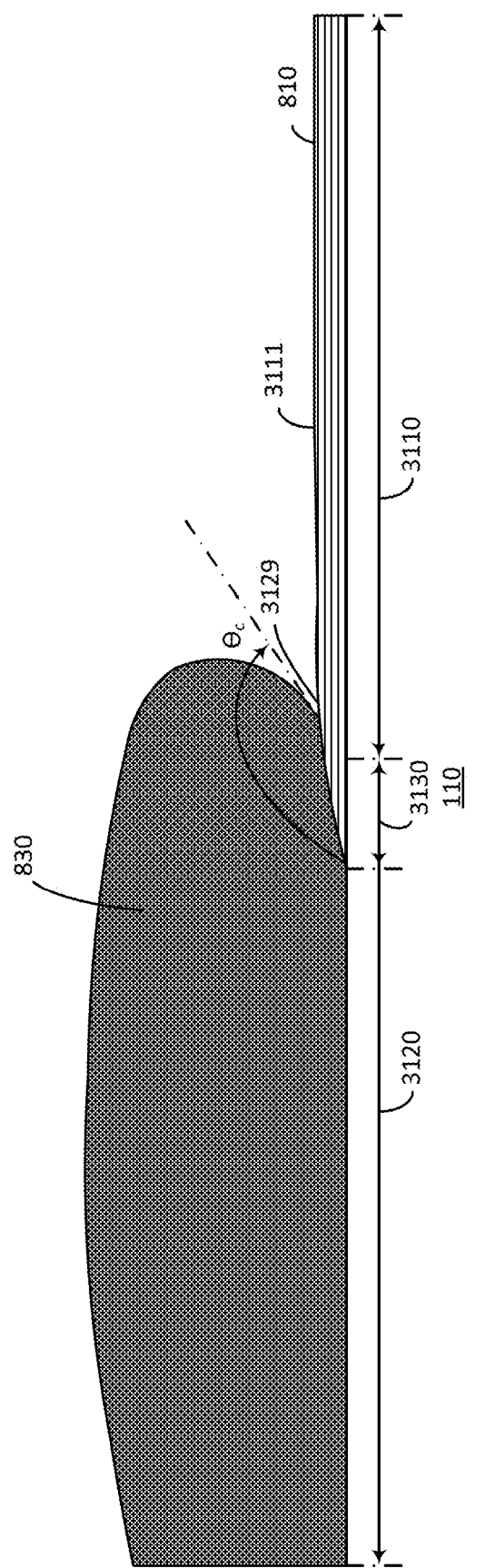

Turning now to FIGS. 31H-31I, the conductive coating 830 partially overlaps a part of the NIC 810 in the third portion 3130 of the substrate 100, which is disposed between the first portion 3110 and the second portion 3120 thereof. As shown, the subset of the conductive coating 830 partially overlapping a subset of the NIC 810 may be in physical contact with the surface 3111 thereof. In some non-limiting examples, the overlap in the third region 3130 may be formed as a result of lateral growth of the conductive coating 830 during an open mask and/or mask-free deposition process. In some non-limiting examples, while the surface 3111 of the NIC 810 may exhibit a relatively low affinity or initial sticking probability $S_0$ for the material of the conductive coating 830 and thus the probability of the material nucleating on the layer surface 3111 is low, as the conductive coating 830 grows in thickness, the conductive coating 830 may also grow laterally and may cover a subset of the NIC 810.

In the case of FIGS. 31H-31I, the contact angle $\theta_c$ of the conductive coating 830 may be measured at an edge thereof near the interface between it and the NIC 810, as shown. In FIG. 31I, the contact angle $\theta_c$ may be greater than about 90°, which may in some non-limiting examples result in a subset of the conductive coating 830 being spaced apart from the NIC 810 by a gap 3129.

Capping Layer Tuned to Individual Emissive Region

In some non-limiting examples, an opto-electronic device 100 may comprise a CPL 3610 to promote outcoupling of light emitted by the device 100, which may thus enhance an EQE thereof, including without limitation, by enhancing emissions and/or adjust the angular spectral distributions. Typically, such a CPL 3610 comprises a layer that extends across substantially all of the lateral aspect of the device 100, including without limitation, across all emissive regions 1910 therein.

Since, in some non-limiting examples, such CPLs 3610 are typically formed of a common CPL material and in some non-limiting examples, have a substantially common thickness, the use of such CPLs 3610 to tune the optical characteristics of an individual emissive region 1910 and to a emission wavelength spectrum associated therewith may be substantially limited.

It will be understood by those having ordinary skill in the relevant art that such CPL 3610 may be (at least) one of the plurality of layers of the device 100. Those having ordinary skill in the relevant art will appreciate that the CPL 3610 and the CPL material of which it is comprised, especially when disposed as a film and under conditions and/or by mechanisms substantially similar to those employed in depositing the CPL 3610, may exhibit largely similar optical and/or other properties.

For purposes of simplicity of description, in the present disclosure, the CPL 3610 and the CPL material of which it is comprised, may be referred to collectively as a CPL(m), and such term may have appended thereto, a character denoting a specific instance thereof.

Figure 36A:
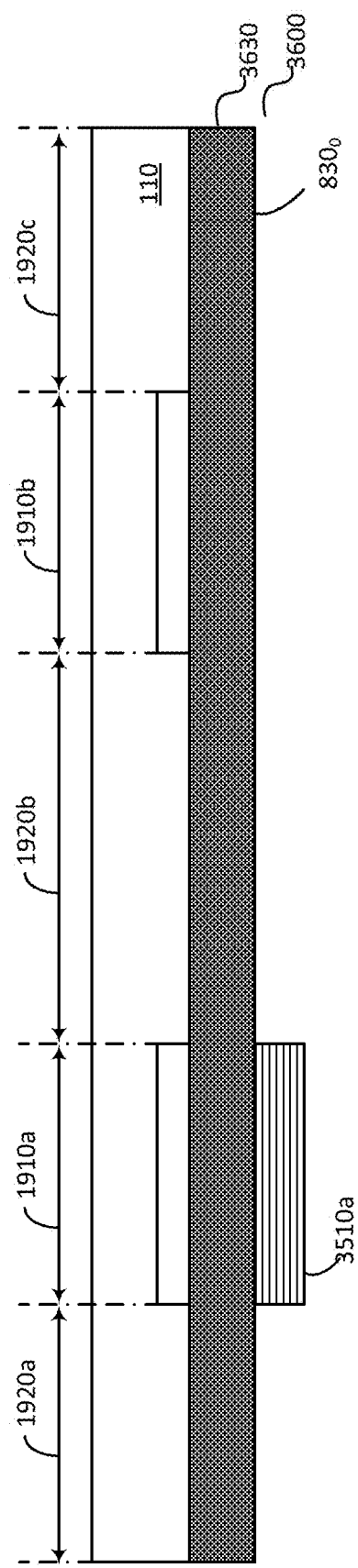
FIGS. 36A-36B are schematic diagrams that show example stages of an example process for manufacturing an example version of the device of FIG. 1 subsequent to the stages of FIGS. 28A-28B.

Turning now to FIG. 36A, which roughly corresponds to FIG. 28C, there is shown a stage 3630 of manufacturing an example version 3600 of the device 2800.

In some non-limiting examples, the device 3600 comprises a plurality of emissive regions 1910, comprising a first emissive region 1910a and a second emissive region 1910b, each configured to emit light having a respective emission spectrum in a corresponding wavelength range, which may be characterized by an associated onset wavelength $\lambda_{onset}$ and/or an associated peak wavelength $\lambda_{max}$.

In some non-limiting examples, an emission spectrum that lies in the R(ed) portion of the visible light spectrum may be characterized by a peak wavelength $\lambda_{max}$ that may lie in a wavelength range of 600 nm to about 640 nm and in some non-limiting examples, may be substantially about 620 nm.

In some non-limiting examples, an emission spectrum that lies in the G(reen) portion of the visible light spectrum may be characterized by a peak wavelength $\lambda_{max}$ that may lie in a wavelength range of 510 nm to about 540 nm and in some non-limiting examples, may be substantially about 530 nm.

In some non-limiting examples, an emission spectrum that lies in the B(lue) portion of the visible light spectrum may be characterized by a peak wavelength $\lambda_{max}$ that may lie in a wavelength range of 450 nm to about 460 nm and in some non-limiting examples, may be substantially about 455 nm.

Those having ordinary skill in the relevant art will appreciate that in some non-limiting examples, the first emissive region 1910a and/or the second emissive region 1910b may correspond to any one of a R(ed) sub-pixel 2641 that emits photons having an emission spectrum that lies in the R(ed) portion of the visible light spectrum, a G(reen) sub-pixel 2642 that emits photons having an emission spectrum that lies in the G(reen) portion of the visible light spectrum, or a B(lue) sub-pixel 2643 that emits photons having an emission spectrum that lies in the B(lue) portion of the visible light spectrum.

In the stage 3630, a first CPL 3610a is selectively deposited over a first portion of the exposed layer surface 111 of an underlying material. In some non-limiting examples, the underlying material may be an initial conductive coating $830_0$. As shown in the figure, in some non-limiting examples, a CPL material for depositing the first CPL 3610a is deposited across the first emissive region 1910a, while in some non-limiting examples, the second emissive region 1910b and/or in some non-limiting examples, at least one of the non-emissive regions 1920a-1920c are substantially devoid of the first CPL 3610a. In some non-limiting examples, the first CPL 3610a may be deposited over at least one of the non-emissive regions 1920a-1920c.

In some non-limiting examples, the first CPL 3610a has optical characteristics tuned to the first emission spectrum. In some non-limiting examples, a thickness, a morphology, and/or a material composition, of the first CPL 3610a are tuned to provide a high refractive index across at least a portion of the first emission spectrum, including without limitation, at least one of the first onset wavelength $\lambda_{onset\ a}$ and/or the first peak wavelength $\lambda_{max\ a}$.

In some non-limiting examples, the first CPL 3610a has a refractive index that is greater than or equal to about 1.9, greater than or equal to about 1.95, greater than or equal to about 2.0, greater than or equal to about 2.05, greater than or equal to about 2.1, greater than or equal to about 2.2, greater than or equal to about 2.3, and/or greater than or equal to about 2.5, in at least a part of the first emission spectrum, which in some non-limiting examples, may comprise the first peak wavelength $\lambda_{max\ a}$.

In some non-limiting examples, there may be, at and/or proximate to the absorption edge, a generally positive correlation between refractive index and transmittance, or in other words, a generally negative correlation between refractive index and absorption at or near the absorption edge. As a result, in some non-limiting examples, the optical characteristics of the first CPL 3610a are tuned such that the absorption edge of the first CPL 3610a is slightly lower than the first onset wavelength $\lambda_{onset\ a}$.

In some non-limiting examples, the absorption edge of a substance may correspond to a wavelength at which the extinction coefficient k decreases and approaches a threshold value near 0. As a result, in some non-limiting examples, tuning the optical characteristics of the first CPL 3610a with reference to the absorption edge of the first CPL 3610a as disclosed herein, may serve as an approximate mechanism to provide a high refractive index across at least a portion of the first emission spectrum as disclosed herein.

As a result, in some non-limiting examples, the first CPL 3610a may have a first extinction coefficient $k_a$ that is high at a wavelength shorter than the first onset wavelength $\lambda_{onset\ a}$. In some non-limiting examples, the first CPL 3610a may have a first extinction coefficient $k_a$ that is greater than or equal to about 0.1, greater than or equal to about 0.3, greater than or equal to about 0.5, greater than or equal to about 0.75, greater than or equal to about 0.8, and/or greater than or equal to about 0.9, at a wavelength below the first onset wavelength $\lambda_{onset\ a}$.

In some non-limiting examples, the first CPL 3610a may additionally act as a patterning coating 810, in that it exhibits a relatively low initial sticking coefficient for the conductive coating material 831 relative to the exposed layer surface 111 of the underlying material, including without limitation, the initial conductive coating $830_0$, and be selectively deposited over first portions of the initial conductive coating $830_0$ in the example device 2800, comprising the first emissive region 1910a, to inhibit deposition of a first conductive coating 830a thereon.

Figure 36B:
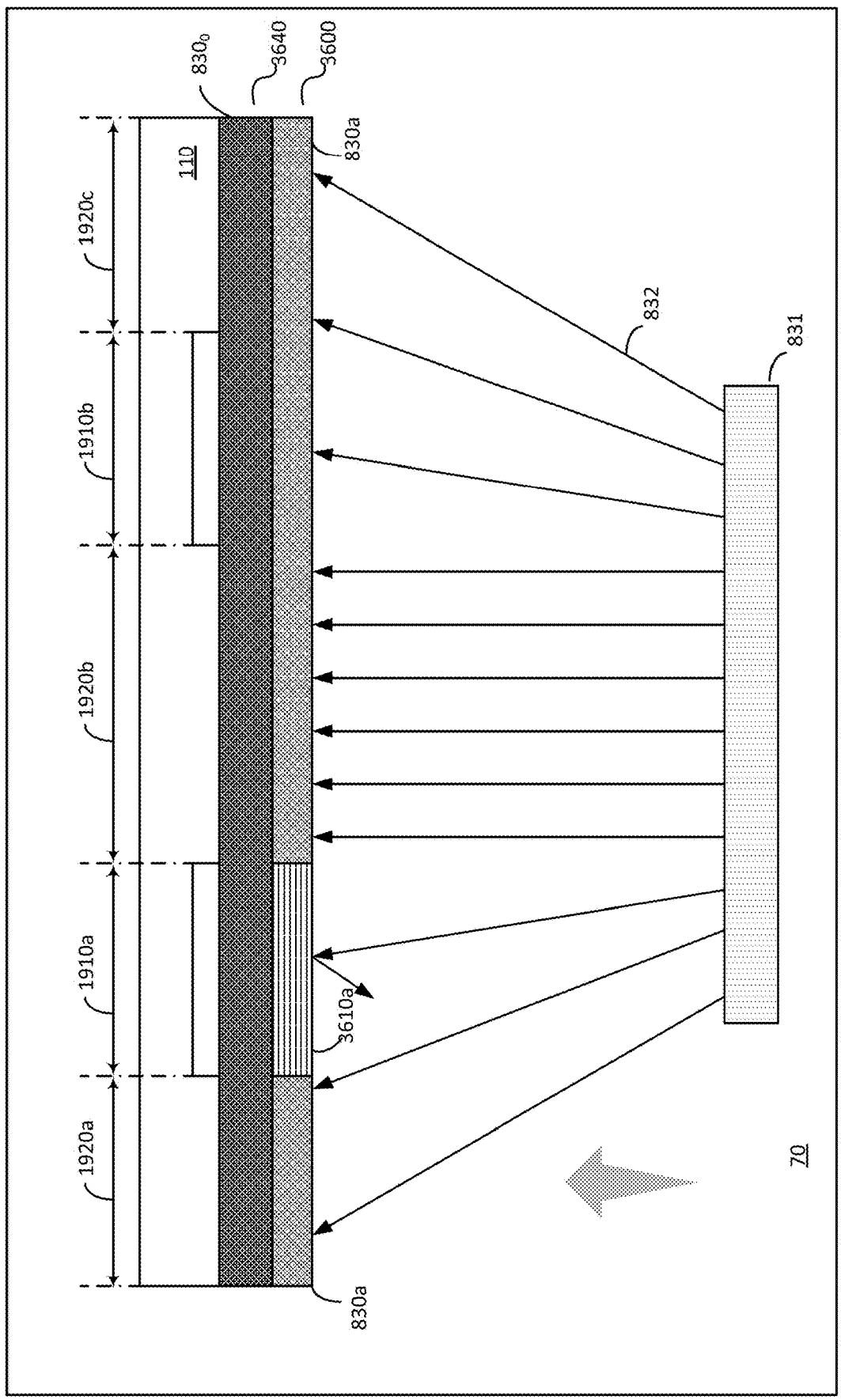

FIG. 36B shows a stage 3640 of manufacturing the device 3600. In the stage 3620, a first conductive coating 830a may be deposited, by exposing the entire surface of the device 3600 to a vapour flux of the conductive coating material 831 to selectively deposit it as the first conductive coating 830a over those second portions of the device 3600 that are substantially devoid of the first CPL 3610a.

In some non-limiting examples, the first conductive coating 830a may be deposited across the second emissive region 1910b and/or, in some non-limiting examples, at least one of the non-emissive regions 1920a-1920c. In some non-limiting examples, the first conductive coating 830a may be deposited over at least one of the non-emissive regions 1920a-1920c.

In some non-limiting examples, the first conductive coating 830a may be deposited using an open mask and/or a mask-free deposition process.

Those having ordinary skill in the relevant art will appreciate that, in some non-limiting examples, where the first CPL 3610a does not act as a patterning coating 810, a further patterning coating 810 (not shown) may be disposed where and when appropriate to allow patterning of the first conductive coating 830a to be deposited in desired locations, even in the absence of a FMM.

In some non-limiting examples, the conductive coating material 831 used to form the first conductive coating 830a may comprise various materials used to form light-transmissive conductive layers and/or coatings, including without limitation, TCOs (including without limitation, ITO, FTO), non-metallic thin films, metal thin films, including without limitation Mg, Al, Yb, Ag, Zn, and/or Cd, and/or combinations thereof, including without limitation, alloys containing any of these, including without limitation, Mg:Ag, Mg:Yb, and/or combinations thereof in an alloy composition ranging from about 1:10 to about 10:1 by volume, and/or combinations thereof. The first conductive coating 830a may comprise a plurality of layers and/or coatings in a multi-layer coating.

In some non-limiting examples, the conductive coating material 831 used to form the first conductive coating 830a may be the same and/or different from the conductive coating material 831 used to form the initial conductive coating $830_0$, if any.

Those having ordinary skill in the relevant art will appreciate that the evaporative process shown in FIG. 36B and described in detail in connection with any one or more of FIGS. 7-8, 11A-11B and/or 12A-12C may, although not shown, for simplicity of illustration, equally be deposited in any one or more of the preceding stages described in FIGS. 28A-28B and/or 36A.

Those having ordinary skill in the relevant art will appreciate that the manufacture of the device 3600 may, in some non-limiting examples, encompass additional stages that are not shown for simplicity of illustration. Such additional stages may include, without limitation, depositing one or more patterning coatings 810, 1120, depositing one or more CPLs 3610, depositing one or more additional conductive coatings 830, depositing an outcoupling coating and/or encapsulation of the device 2800.

Those having ordinary skill in the relevant art will appreciate that, in some non-limiting examples, the plurality of emissive regions 1910 may comprise more than just the first emissive region 1910*a* and the second emissive region 1910*b* as shown in the device 3600. In some non-limiting examples, there may be three or more emissive regions 1910, each configured to emit light having a respective emission spectrum in a corresponding wavelength range, which may be characterized by an associated onset wavelength $\lambda_{onset}$ and/or an associated peak wavelength $\lambda_{max}$. In some non-limiting examples, there may be three emissive regions 1910*a*, 1910*b*, 1910*c*, corresponding to (in no particular order) respective ones of a R(ed) sub-pixel 2641 that emits photons having an emission spectrum that lies in the R(ed) portion of the visible light spectrum, a G(reen) sub-pixel 2642 that emits photons having an emission spectrum that lies in the G(reen) portion of the visible light spectrum, or a B(lue) sub-pixel 2643 that emits photons having an emission spectrum that lies in the B(lue) portion of the visible light spectrum.

Figure 37A:
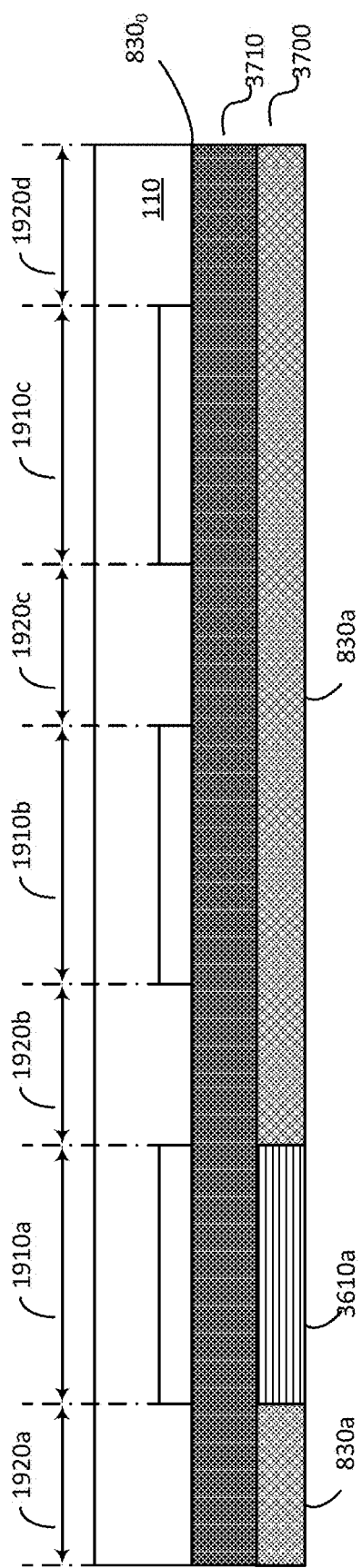

Turning now to FIG. 37A, there is shown a stage 3710 of manufacturing an example version 3700 of the device 3600 that roughly corresponds to FIG. 36B, but with three emissive regions 1910*a*, 1910*b*, 1910*c*, surrounded by non-emissive regions 1920*a*, 1920*b*, 1920*c*, 1920*d*.

As shown in the figure, the first conductive coating 830*a* may be deposited, by exposing the entire surface of the device 3700 to a vapour flux of the conductive coating material 831 to selectively deposit it as the first conductive coating 830*a* over those second portions of the device 3700 that are substantially devoid of the first CPL 3610*a*. In some non-limiting examples, the first conductive coating 830*a* may be deposited across the second emissive region 1910*b* and/or the third emissive region 1910*c* and/or, in some non-limiting examples, at least one of the non-emissive region 1920*a*-1920*d*. In some non-limiting examples, the first conductive coating 830*a* may be deposited over at least one of the non-emissive regions 1920*a*-1920*d*.

Figure 37B:
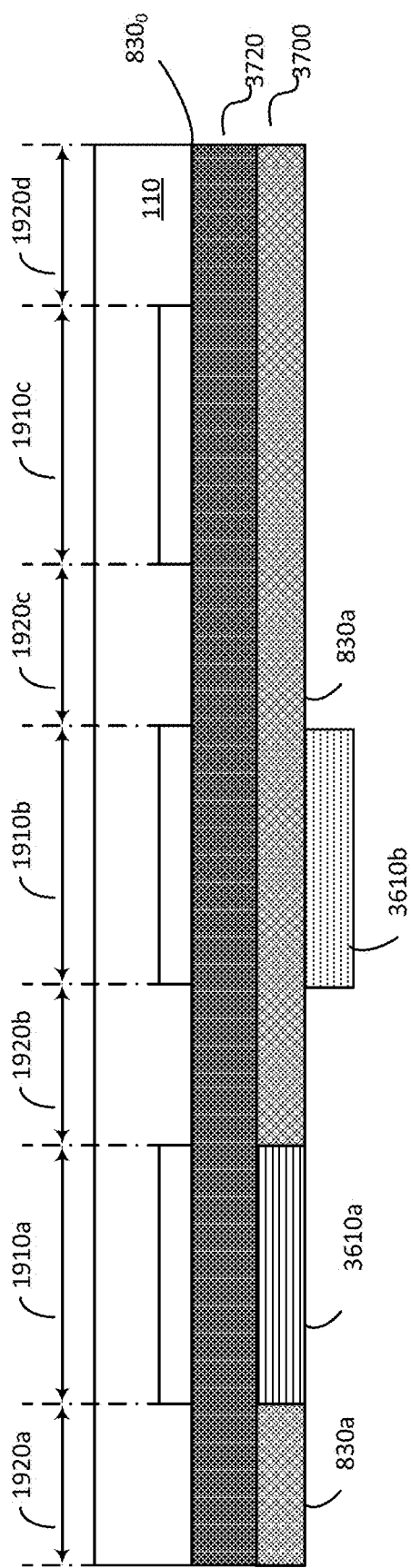

FIG. 37B shows a stage 3720 of manufacturing the device 3700. In the stage 3720, a second CPL 3610*b* is selectively deposited over a first portion of the first conductive coating 830*a*. As shown in the figure, in some non-limiting examples, a CPL material for depositing the second CPL 3610*b* is deposited across the second emissive region 1910*b*, while in some non-limiting examples, the third emissive region 1910*c* and/or in some non-limiting examples, at least one of the non-emissive regions 1920*a*-1920*d* are substantially devoid of the second CPL 3610*b*. In some non-limiting examples, the second CPL 3610*b* may be deposited over at least one of the non-emissive regions 1920*a*-1920*d*.

In some non-limiting examples, a thickness, a morphology, and/or a material composition, of the second CPL 3610*b* are tuned to provide a high refractive index across at least a portion of the second emission spectrum, including without limitation, at least one of the second onset wavelength $\lambda_{onset\ b}$ and/or the second peak wavelength $\lambda_{max\ b}$.

In some non-limiting examples, the second CPL 3610*b* has a refractive index that is greater than or equal to about 1.9, greater than or equal to about 1.95, greater than or equal to about 2.0, greater than or equal to about 2.05, greater than or equal to about 2.1, greater than or equal to about 2.2, greater than or equal to about 2.3, and/or greater than or equal to about 2.5, in at least a part of the second emission spectrum, which in some non-limiting examples, may comprise the second peak wavelength $\lambda_{max\ b}$.

In some non-limiting examples, the optical characteristics of the second CPL 3610*b* are tuned such that the absorption edge of the second CPL 3610*b* is slightly lower than the second onset wavelength $\lambda_{onset\ b}$.

In some non-limiting examples, the absorption edge of a substance may correspond to a wavelength at which the extinction coefficient k approaches a threshold value near 0. As a result, in some non-limiting examples, tuning the optical characteristics of the second CPL 3610*b* with reference to the absorption edge of the second CPL 3610*b* as disclosed herein, may serve as an approximate mechanism to provide a high refractive index across at least a portion of the second emission spectrum as disclosed herein.

As a result, in some non-limiting examples, the second CPL 3610*b* may have a second extinction coefficient $k_b$ that is low at a wavelength below the second onset wavelength $\lambda_{onset\ b}$. In some non-limiting examples, the second CPL 3610*b* may have a second extinction coefficient $k_b$ that is greater than or equal to about 0.1, greater than or equal to 0.3, greater than or equal to about 0.5, greater than or equal to about 0.75, greater than or equal to about 0.8, and/or greater than or equal to about 0.9, at a wavelength below the second onset wavelength $\lambda_{onset\ b}$.

In some non-limiting examples, the second CPL 3610*b* may additionally act as a patterning coating 810, in that it exhibits a relatively low initial sticking coefficient for the conductive coating material 831 relative to the exposed layer surface 111 of the first conductive coating 830*a*, and be selectively deposited over first portions of the first conductive coating 830*a* in the example device 3700, comprising the second emissive region 1910*b*, to inhibit deposition of a second conductive coating 830*b* thereon.

In some non-limiting examples, the CPL material for depositing the second CPL 3610*b* may be the same and/or different from the CPL material for depositing the first CPL 3610*a*.

FIG. 37C shows a stage 3730 of manufacturing the device 3700. In the stage 3730, a second conductive coating 830*b* may be deposited, by exposing the entire surface of the device 3700 to a vapour flux of the conductive coating material 831 to selectively deposit it as the second conductive coating 830*b* over those second portions of the device 3700 that are substantially devoid of at least one of the first CPL 3610*a* and the second CPL 3610*b*. In some non-limiting examples, the second conductive coating 830*b* may be deposited across the third emissive region 1910*c* and/or, in some non-limiting examples, at least one of the non-emissive regions 1920*a*-1920*d*. In some non-limiting examples, the second conductive coating 830*b* may be deposited over at least one of the non-emissive regions 1920*a*-1920*d*.

In some non-limiting examples, the second conductive coating 830*b* may be deposited using an open mask and/or a mask-free deposition process.

Those having ordinary skill in the relevant art will appreciate that, in some non-limiting examples, where the second CPL 3610*b* does not act as a patterning coating 810, a patterning coating 810 (not shown) may be disposed where and when appropriate to allow patterning of the second conductive coating 830*b* to be deposited in desired locations, even in the absence of a FMM.

In some non-limiting examples, the conductive coating material 831 used to form the second conductive coating 830*b* may be the same and/or different from the conductive coating material 831 used to form the initial conductive coating 830₀, if any, and/or may be the same and/or different from the conductive coating material 831 used to form the first conductive coating 830a.

Figure 37D:
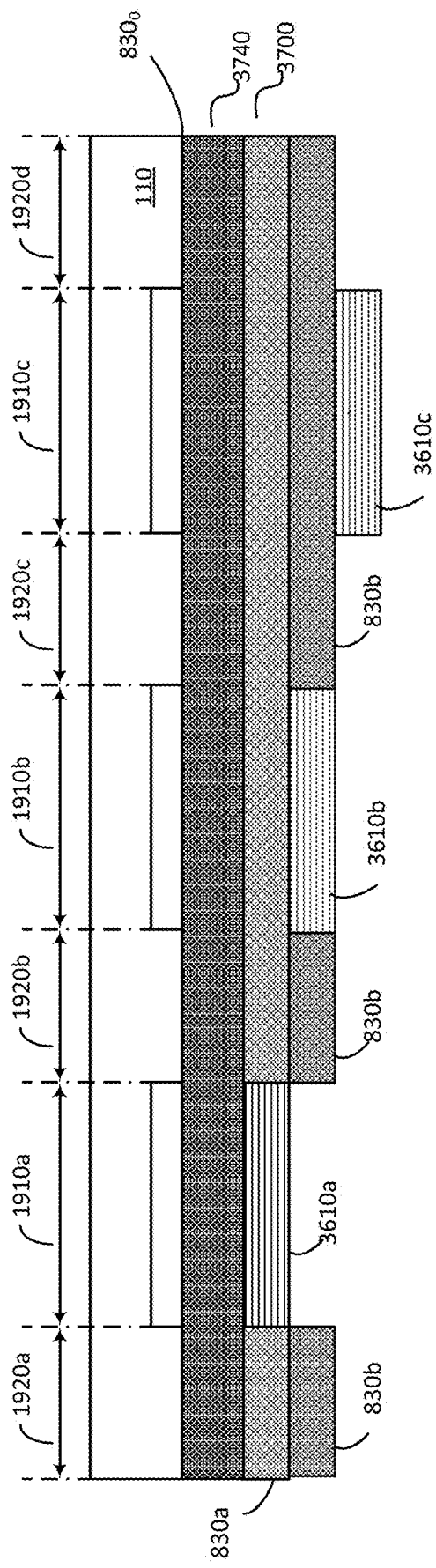

FIG. 37D shows a stage 3740 of manufacturing the device 3700. In the stage 3740, a third CPL 3610c is selectively deposited over a first portion of the second conductive coating 830b. As shown in the figure, in some non-limiting examples, a CPL material for depositing the third CPL 3610c is deposited across the third emissive region 1910c, while in some non-limiting examples, at least one of the non-emissive regions 1920a-1920d are substantially devoid of the second CPL 3610b. In some non-limiting examples, the third CPL 3610c may be deposited over at least one of the non-emissive regions 1920a-1920d.

In some non-limiting examples, a thickness, a morphology, and/or a material composition, of the third CPL 3610c are tuned to provide a high refractive index across at least a portion of the third emission spectrum, including without limitation, at least one of the third onset wavelength $\lambda_{onset\ c}$ and/or the third peak wavelength $\lambda_{max\ c}$.

In some non-limiting examples, the third CPL 3610c has a refractive index that is greater than or equal to about 1.9, greater than or equal to about 1.95, greater than or equal to about 2.0, greater than or equal to about 2.05, greater than or equal to about 2.1, greater than or equal to about 2.2, greater than or equal to about 2.3, and/or greater than or equal to about 2.5, in at least a part of the third emission spectrum, which in some non-limiting examples, may comprise the third peak wavelength $\lambda_{max\ c}$.

In some non-limiting examples, the optical characteristics of the third CPL 3610c are tuned such that the absorption edge of the third CPL 3610c is slightly lower than the third onset wavelength $\lambda_{onset\ c}$.

In some non-limiting examples, the absorption edge of a substance may correspond to a wavelength at which the extinction coefficient k approaches a threshold value near 0. As a result, in some non-limiting examples, tuning the optical characteristics of the third CPL 3610c with reference to the absorption edge of the third CPL 3610c as disclosed herein, may serve as an approximate mechanism to provide a high refractive index across at least a portion of the third emission spectrum as disclosed herein.

As a result, in some non-limiting examples, the third CPL 3610c may have a third extinction coefficient $k_c$ that is low at a wavelength below the third onset wavelength $\lambda_{onset\ c}$. In some non-limiting examples, the third CPL 3610c may have a third extinction coefficient $k_c$ that is greater than or equal to about 0.1, greater than or equal to about 0.3, greater than or equal to about 0.5, greater than or equal to about 0.75, greater than or equal to about 0.8, and/or greater than or equal to about 0.9, at a wavelength below the third onset wavelength $\lambda_{onset\ c}$.

In some non-limiting examples, the third CPL 3610c may additionally act as a patterning coating 810, in that it exhibits a relatively low initial sticking coefficient for the conductive coating material 831 relative to the exposed layer surface 111 of the second conductive coating 830b, and be selectively deposited over first portions of the second conductive coating 830b in the example device 3700, comprising the third emissive region 1910c, to inhibit deposition of a conductive coating material 831 thereon for forming an auxiliary electrode 1750.

In some non-limiting examples, the CPL material for forming the third CPL 3610c may be the same and/or different from: the CPL material for forming the first CPL 3610a and/or the CPL material for forming the second CPL 3610b.

FIG. 37E shows a stage 3750 of manufacturing the device 3700. In the stage 3750, a conductive coating material 831 may be deposited, by exposing the entire surface of the device 3700 to a vapour flux thereof to selectively deposit it as at least one auxiliary electrode 1750 over those second portions of the device 3700 that are substantially devoid of the third CPL 3610c. In some non-limiting examples, the at least one auxiliary electrode 1750 may be deposited across at least one of the non-emissive regions 1920a-1920d.

In some non-limiting examples, the at least one auxiliary electrode 1750 may be deposited using an open mask and/or a mask-free deposition process.

Those having ordinary skill in the relevant art will appreciate that, in some non-limiting examples, where the third CPL 3610c does not act as a patterning coating 810, a patterning coating 810 (not shown) may be disposed where and when appropriate to allow patterning of the at least one auxiliary electrode 1750 to be deposited in desired locations, even in the absence of a FMM.

In some non-limiting examples, the conductive coating material 831 used to form the at least one auxiliary electrode 1750 may be the same and/or different from: the conductive coating material 831 used to form the initial conductive coating 830₀, if any, the conductive coating material 831 used to form the first conductive coating 830a, and/or the conductive coating 831 used to form the second conductive coating 830b.

As previously discussed in connection with FIGS. 29A-29D, such a mechanism may create an example version 3800 of the device 100 having sub-pixel(s) 264x of a given pixel 340 with modulated micro-cavity effects as described in FIGS. 38A-38f.

Figure 38A:
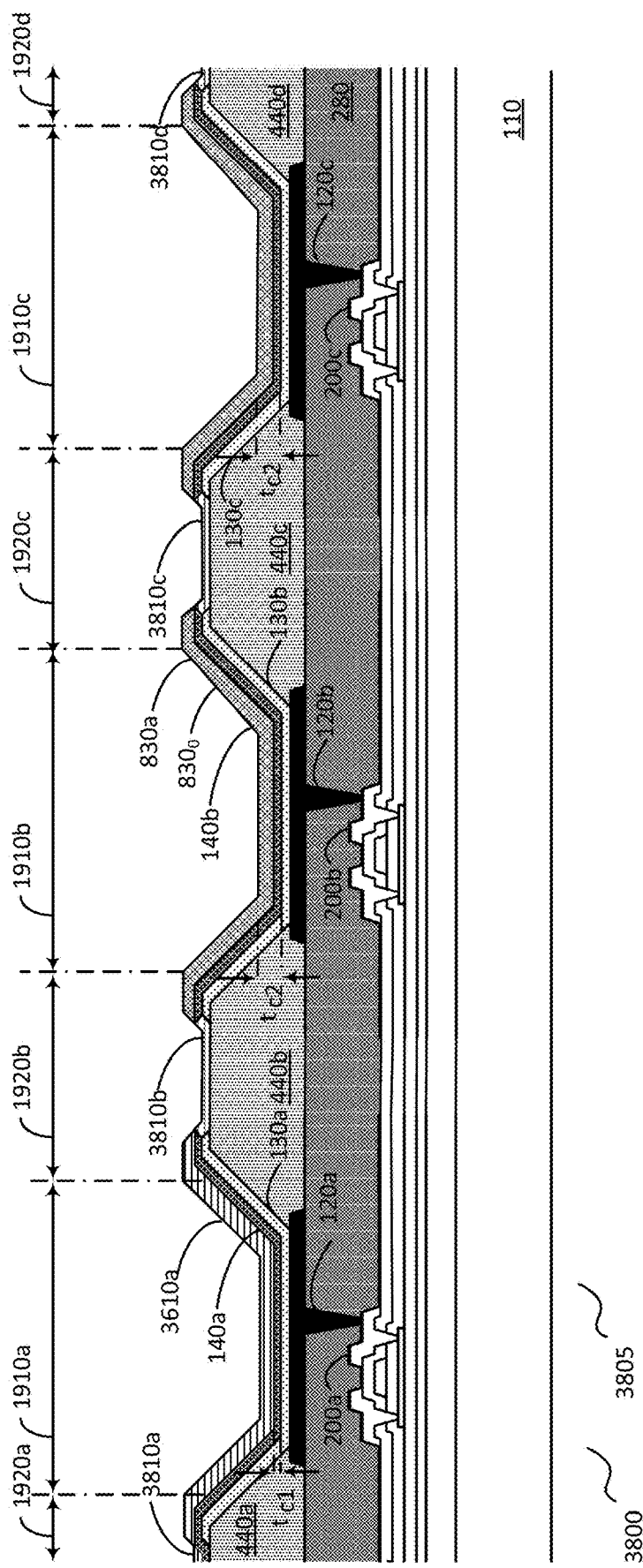
FIGS. 38A-38F are schematic diagrams that show example stages of an example process for manufacturing an example version of the device of FIG. 1 having sub-pixel regions having a second electrode of different thickness according to an example in the present disclosure.

In FIG. 38A, a stage 3805 of manufacture of the device 3800 is shown as comprising a substrate 110, a TFT insulating layer 280 and a plurality of first electrodes 120a-120c, formed on a surface of the TFT insulating layer 280.

The substrate 110 may comprise the base substrate 112 (not shown for purposes of simplicity of illustration), at least one TFT structure 200a-200c corresponding to and for driving an emissive region 1910a-1910c each having a corresponding sub-pixel 264x, positioned substantially thereunder and electrically coupled to its associated first electrode 120a-120c, PDL(s) 440a-440d formed over the substrate 110, to define emissive region(s) 1910a-1910c that cover edges of their respective first electrodes 120a-120c, and at least one semiconducting layer 130a-130c deposited over exposed region(s) of their respective first electrodes 120a-120c and, in some non-limiting examples, at least parts of the surrounding PDLs 440a-440d.

In the example stage 3805 of FIG. 38A, the emissive regions 1910a, 1910b, 1910c may comprise separate structures that are not electrically coupled together. This may be achieved by depositing at least one PDL patterning coating, which in some non-limiting examples, may comprise a PDL CPL 3810a, 3810b, 3810c, 3810d acting as a patterning coating 810 across at least a part of the lateral aspect 420 of the non-emissive regions 1920a, 1920b, 1920c, 1920c, including without limitation, in some non-limiting examples, an elevated portion of the corresponding PDLs 440a, 440b, 440c, 440d.

In some non-limiting examples, a CPL material for depositing the at least one PDL CPL 3810a, 3810b, 3810c, and/or 3810d may be the same and/or different from: the CPL material for depositing the first CPL 3610a, the CPL material for depositing the second CPL 3610b, and/or the CPL material for depositing the third CPL 3610c.

Figure 38B:
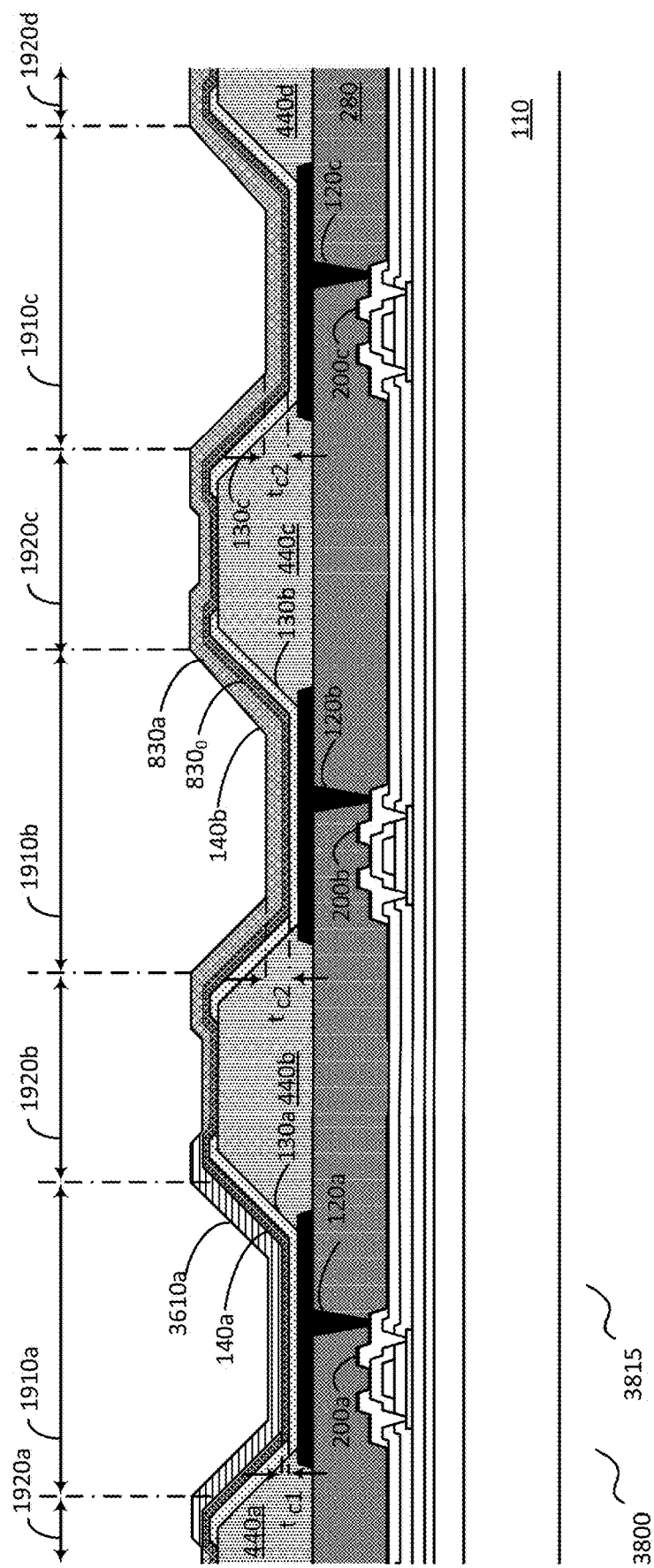

An alternate stage 3810 of the device 3800 is shown in FIG. 38B. In the stage 3810, the step of depositing a patterning coating 810, which may, in some non-limiting examples, comprise the at least one PDL CPLs 3810a, 3810b, 3810c, 3810d, has been omitted. In this regard, FIG. 38B roughly corresponds to FIG. 29A.

In either stage 3805, 3810, in some non-limiting examples, an initial conductive coating $830_0$ may be deposited over the at least one semiconducting layer(s) 130a-130c. In some non-limiting examples, the initial conductive coating $830_0$ may be deposited using an open mask and/or mask-free deposition process. In some non-limiting examples, such deposition may be effected by exposing the entire exposed layer surface 111 of the device 2900 to a vapor flux of the initial conductive coating material 831, to deposit the initial conductive coating $830_0$ over the at least one semiconducting layer(s) 130a-130c to form a first layer of the at least one second electrode 140.

In the stage 3805 of FIG. 38A, the at least one second electrode 140 in the first emissive region 1910a has a first thickness that, in some non-limiting examples, may be a common thickness $t_{c1}$ in the first emissive region 1910a. The first thickness $t_{c1}$ may correspond to a thickness of the initial conductive coating $830_0$.

In the stage 3810 of FIG. 38B, the at least one second electrode 140 may be a common electrode. The second electrode 140a has a first thickness $t_{c1}$ in the first emissive region 1910a. The first thickness $t_{c1}$ may correspond to a thickness of the initial conductive coating $830_0$.

In either stage 3805, 3810, in some non-limiting examples, a first CPL 3610a is selectively deposited over first portions of the device 3800, comprising the first emissive region 1910a.

In either stage 3805, 3810, in some non-limiting examples, a first conductive coating 830a may be deposited over the device 3800. In some non-limiting examples, the first conductive coating 830a may be deposited using an open mask and/or mask-free deposition process. In some non-limiting examples, such deposition may be effected by exposing the entire exposed layer surface 111 of the device 3800 to a vapour flux of the first conductive coating material 831, to deposit the first conductive coating 830a over the initial conductive coating $830_0$ that is substantially devoid of the first CPL 3610a, and in the case of stage 3805 of FIG. 38A, of the at least one PDL patterning coating 810, which in some non-limiting examples, comprises the at least one PDL CPLs 3810a, 3810b, 3810c, 3810d.

In either stage 3805, 3810, in some examples, the first conductive coating 830a covers the lateral aspects 410 of the second and third emissive region 1910b, 1910c, such that the first conductive coating 830a forms a second layer of the second electrodes 140b, 140c. Additionally, in stage 3810, the first conductive coating 830a may, in some non-limiting examples, also cover at least part(s) of the non-emissive region(s) 1920 in which the PDLs 440a-440d lie, to form a common electrode, at least for the second emissive region 1910b. Such second electrode 140b has a second thickness $t_{c2}$ in the second emissive region 1910b. The second thickness $t_{c2}$ may correspond to a combined thickness of the initial conductive coating $830_0$ and of the first conductive coating 830a and may in some non-limiting examples be greater than the first thickness $t_{c1}$.

Those having ordinary skill in the relevant art will appreciate that, in some non-limiting examples, where the first CPL 3610a and/or the at least one PDL CPL 3810a, 3810b, 3810c, 3810d do not act as a patterning coating 810, a patterning coating 810 (not shown) may be disposed where and when appropriate to allow patterning of the first conductive coating 830a to be deposited in desired locations, even in the absence of a FMM.

Figure 38C:
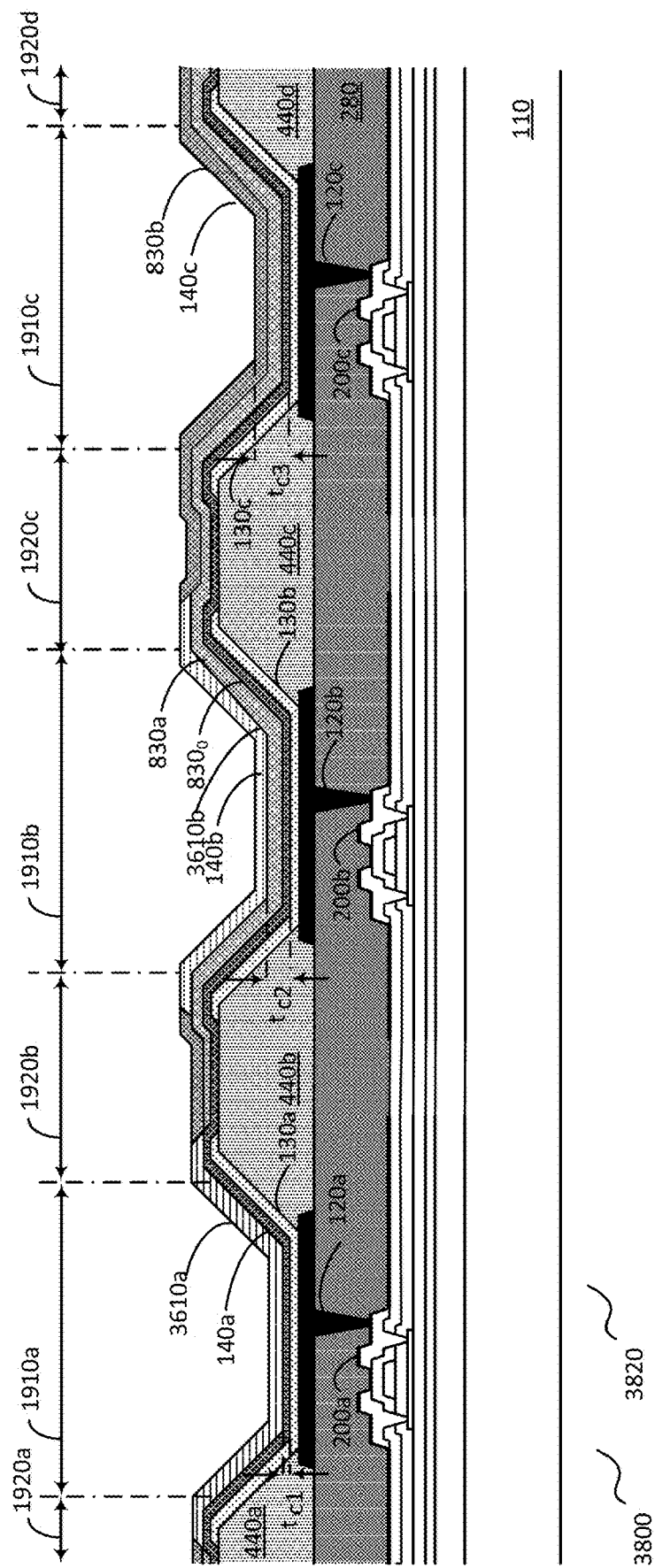

In FIG. 38C, a stage 3820 of manufacture of the device 3800 is shown that roughly corresponds to FIG. 29B and assumes that stage 3810 and not stage 3805 has occurred, although those having ordinary skill in the relevant art will appreciate that a corresponding stage could be described based on stage 3805 instead of stage 3810.

In some non-limiting examples, a second CPL 3610b is selectively deposited over further first portions of the device 3800, comprising the second emissive region 1910b.

In some non-limiting examples, a second conductive coating 830b may be deposited over the device 3800. In some non-limiting examples, the second conductive coating 830b may be deposited using an open mask and/or mask-free deposition process. In some non-limiting examples, such deposition may be effected by exposing the entire exposed layer surface 111 of the device 3800 to a vapour flux of a conductive coating material 831, to deposit the second conductive coating 830b over the first conductive coating 830a that is substantially devoid of either the first CPL 3610a or the second CPL 3610b (and/or the at least one patterning coating 810, which in some non-limiting examples may comprise the at least one PDL CPL 3810a, 3810b, 3810c, 3810d), in some examples, the third emissive region 1910c and/or in some non-limiting examples, at least part(s) of the non-emissive region 1920 in which the PDLs 440a-440d lie, such that the second conductive coating 830b is deposited on the further second portion(s) of the first conductive coating 830a that are substantially devoid of the second CPL 3610b (and/or the at least one patterning coating 810, which in some non-limiting examples may comprise the at least one PDL CPL 3810a, 3810b, 3810c, 3810d) to form a third layer of the second electrode 140c.

Such second electrode 140c has a third thickness $t_{c3}$ in the third emissive region 1910c. The third thickness $t_{c3}$ may correspond to a combined thickness of the initial conductive coating $830_0$, the first conductive coating 830a and the second conductive coating 830b and may in some non-limiting examples be greater than either or both of the first thickness $t_{c1}$ and the second thickness $t_{c2}$.

Those having ordinary skill in the relevant art will appreciate that, in some non-limiting examples, where the first CPL 3610a, the second CPL 3610b, and/or the at least one PDL CPL 3810a, 3810b, 3810c, 3810d do not act as a patterning coating 810, a patterning coating 810 (not shown) may be disposed where and when appropriate to allow patterning of the third conductive coating 830c to be deposited in desired locations, even in the absence of a FMM.

Figure 38D:
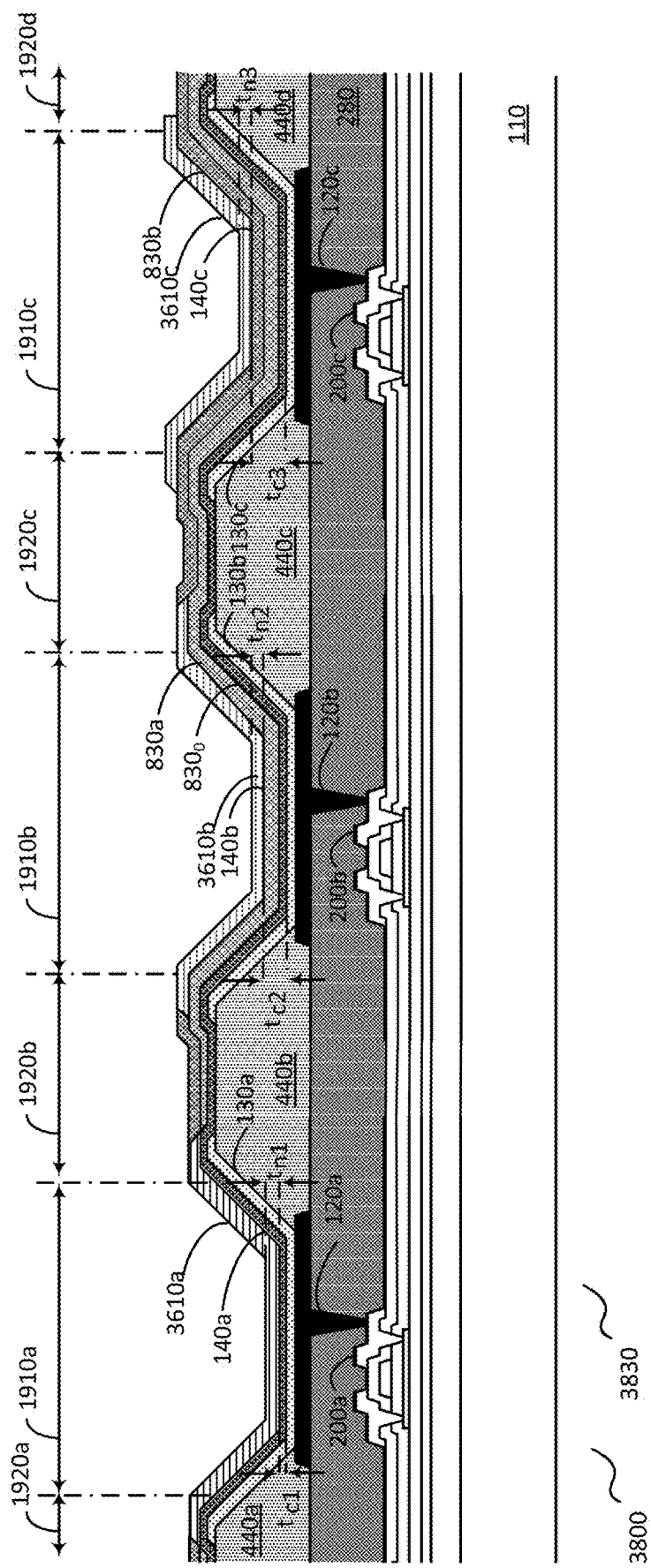

In FIG. 38D, a stage 3830 of manufacture of the device 3800 is shown that roughly corresponds to FIG. 29C and assumes that stage 3810 and not stage 3805 has occurred, although those having ordinary skill in the relevant art will appreciate that a corresponding stage could be described based on stage 3805 instead of stage 3810.

In some non-limiting examples, a third CPL 3810c is selectively deposited over additional first portions of the device 3800, comprising the third emissive region 1910b.

Figure 38E:
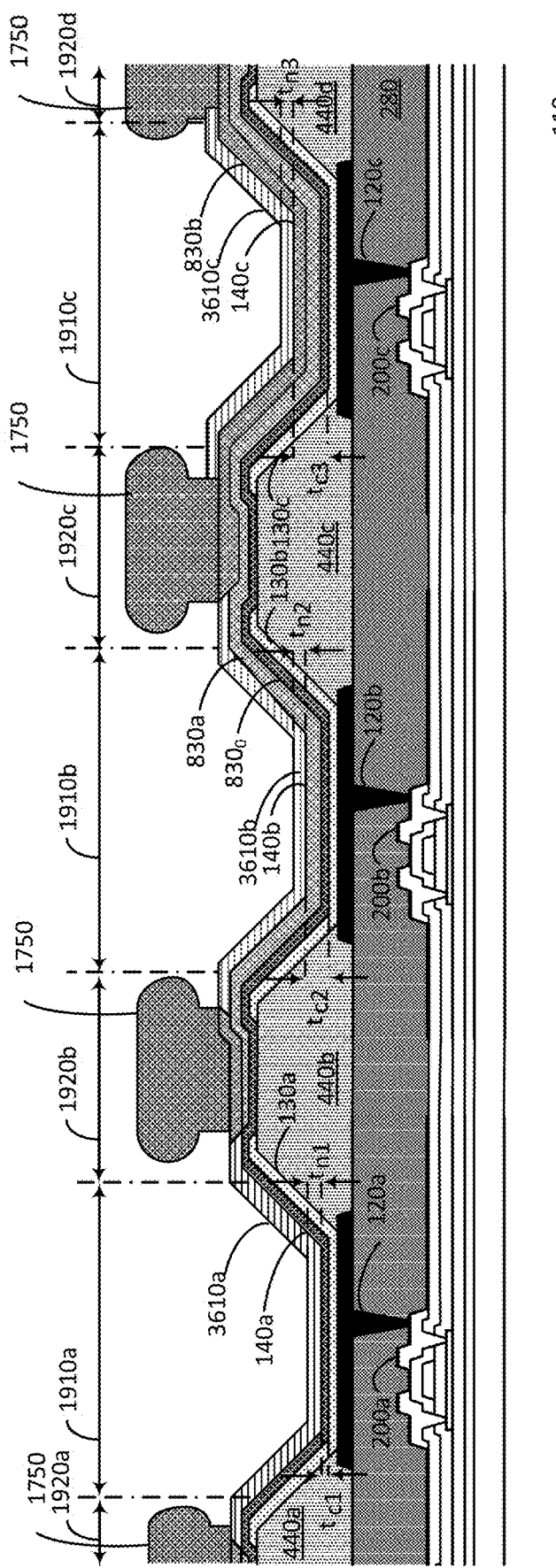

In FIG. 38E, a stage 3840 of manufacture of the device 3800 is shown that roughly corresponds to FIG. 29D and assumes that stage 3810 and not 3805 has occurred, although those having ordinary skill in the relevant art will appreciate that a corresponding stage could be described based on stage 3805 instead of stage 3810.

In some non-limiting examples, at least one auxiliary electrode 1750 is disposed in the non-emissive region(s) 1920a, 1920b, 1920c, 1920d of the device 3800 between neighbouring emissive region 1910a, 1910b, 1910c thereof and in some non-limiting examples, over the PDLs 440a, 440b, 440c, 440d. In some non-limiting examples, a conductive coating material 831 used to deposit the at least one auxiliary electrode 1750 may be deposited using an open mask and/or mask-free deposition process. In some non-limiting examples, such deposition may be effected by exposing the entire exposed layer surface 111 of the device 3800 to a vapour flux of the conductive coating material 831, to deposit the conductive coating material 831 over the exposed parts of the initial conductive coating $830_0$, the first conductive coating 830a and the second conductive coating 830b that is substantially devoid of any of the first CPL 3610a, the second CPL 3610b and/or the third CPL 3610c (and/or the at least one patterning coating 810, which in some non-limiting examples may comprise the at least one PDL CPL 3810a, 3810b, 3810c, 3810d), such that the conductive coating material 831 is deposited on an additional second portion comprising the exposed part(s) of the initial conductive coating $830_0$, the first conductive coating 830a and/or the second conductive coating 830b that are substantially devoid of any of the first CPL 3610a, the second CPL 3610b and/or the third CPL 3610c (and/or the at least one patterning coating 810, which in some non-limiting examples may comprise the at least one PDL CPL 3810a, 3810b, 3810c, 3810d) to form the at least one auxiliary electrode 1750. Each of the at least one auxiliary electrodes 1750 is electrically coupled to a respective one of the second electrodes 140a-140c. In some non-limiting examples, each of the at least one auxiliary electrodes 1750 is in physical contact with such second electrode 140a-140c.

In some non-limiting examples, the first emissive region 1910a, the second emissive region 1910b and the third emissive region 1910c may be substantially devoid of the conductive coating material 831 used to form the at least one auxiliary electrode 1750.

In some non-limiting examples, at least one of the initial conductive coating $830_0$, the first conductive coating 830a and/or the second conductive coating 830b may be transmissive and/or substantially transparent in at least a part of the visible wavelength range of the electromagnetic spectrum. Thus, the first conductive coating 830a and/or the second conductive coating 830b (and/or any additional conductive coating(s) 830) is disposed on top of the initial conductive coating $830_0$ to form a multi-coating electrode 120, 140, 1750 that may also be transmissive and/or substantially transparent in at least a part of the visible wavelength range of the electromagnetic spectrum. In some non-limiting examples, the transmittance of any one or more of the initial conductive coating $830_0$, the first conductive coating 830a, the second conductive coating 830b, any additional conductive coating(s) 830, and/or the multi-coating electrode 120, 140, 1750 may be greater than about 30%, greater than about 40% greater than about 45%, greater than about 50%, greater than about 60%, greater than about 70%, greater than about 75%, and/or greater than about 80% in at least a part of the visible wavelength range of the electromagnetic spectrum.

In some non-limiting examples, a thickness of the initial conductive coating $830_0$, the first conductive coating 830a and/or the second conductive coating 830b may be made relatively thin to maintain a relatively high transmittance. In some non-limiting examples, the thickness of the initial conductive coating $830_0$ may be about 5 to 30 nm, about 8 to 25 nm, and/or about 10 to 20 nm. In some non-limiting examples, the thickness of the first conductive coating 830a may be about 1 to 25 nm, about 1 to 20 nm, about 1 to 15 nm, about 1 to 10 nm, and/or about 3 to 6 nm. In some non-limiting examples, the thickness of the second conductive coating 830b may be about 1 to 25 nm, about 1 to 20 nm, about 1 to 15 nm, about 1 to 10 nm, and/or about 3 to 6 nm. In some non-limiting examples, the thickness of a multi-coating electrode formed by a combination of the initial conductive coating $830_0$, the first conductive coating 830a, the second conductive coating 830b and/or any additional conductive coating(s) 830 may be about 6 to 35 nm, about 10 to 30 nm, about 10 to 25 nm and/or about 12 to 18 nm.

In some non-limiting examples, a thickness of the at least one auxiliary electrode 1750 may be greater than the thickness of the initial conductive coating $830_0$, the first conductive coating 830a, the second conductive coating 830b, and/or a common electrode. In some non-limiting examples, the thickness of the at least one auxiliary electrode 1750 may be greater than about 50 nm, greater than about 80 nm, greater than about 100 nm, greater than about 150 nm, greater than about 200 nm, greater than about 300 nm, greater than about 400 nm, greater than about 500 nm, greater than about 700 nm, greater than about 800 nm, greater than about 1 µm, greater than about 1.2 µm, greater than about 1.5 µm, greater than about 2 µm, greater than about 2.5 µm, and/or greater than about 3 µm.

In some non-limiting examples, the at least one auxiliary electrode 1750 may be substantially non-transparent and/or opaque. However, since the at least one auxiliary electrode 1750 may be in some non-limiting examples provided in a non-emissive region 1920 of the device 2900, the at least one auxiliary electrode 1750 may not cause or contribute to significant optical interference. In some non-limiting examples, the transmittance of the at least one auxiliary electrode 1750 may be less than about 50%, less than about 70%, less than about 80%, less than about 85%, less than about 90%, and/or less than about 95% in at least a part of the visible wavelength range of the electromagnetic spectrum.

In some non-limiting examples, the at least one auxiliary electrode 1750 may absorb light in at least a part of the visible wavelength range of the electromagnetic spectrum.

In some non-limiting examples, at least one optical property, including without limitation, a thickness, a composition, a total optical path length, and/or a refractive index, of the first CPL 3610a, the second CPL 3610b, and/or the third CPL 3610c disposed in the first emissive region 1910a, the second emissive region 1910b and/or the third emissive region 1910c respectively (and/or the at least one patterning coating 810, which in some non-limiting examples may comprise the at least one PDL CPL 3810a, 3810b, 3810c, 3810d disposed in the non-emissive regions 1920a, 1920b, 1920c, 1920d) may be varied according to a colour and/or emission spectrum of light emitted by each emissive region 1910a-1910c. As shown in FIGS. 38D-38E, the first CPL 3610a may have a first CPL thickness $t_{n1}$, the second CPL 3610b may have a second CPL thickness $t_{n2}$ and/or the third CPL 3610c may have a third CPL thickness $t_{n3}$. In some non-limiting examples, the first CPL thickness $t_{n1}$ may be the same as, greater than, and/or less than, the second CPL thickness $t_{n2}$. In some non-limiting examples, the first CPL thickness $t_{n1}$ may be the same as, greater than, and/or less than the third CPL thickness $t_{n3}$. In some non-limiting examples, the second CPL thickness $t_{n2}$ may be the same as, greater than, and/or less than, the third CPL thickness $t_{n3}$.

In some non-limiting examples, it may be advantageous to vary the first CPL thickness $t_{n1}$, the second CPL thickness $t_{n2}$, and/or the third CPL thickness $t_{n3}$ deposited over, respectively, the first emissive region 1910a, the second emissive region 1910b, and/or the third emissive region 1910c, especially, where the first CPL 3610a, the second CPL 3610b, and/or the third CPL 3610c act as a patterning coating 810.

By adjusting the first CPL thickness $t_{n1}$, the second CPL thickness $t_{n2}$, and/or the third CPL thickness $t_{n3}$ deposited over, respectively, the first emissive region 1910a, the second emissive region 1910b, and/or the third emissive region 1910c, in addition to the first thickness $t_{c1}$, the second thickness $t_{c2}$, and/or the third thickness $t_{c3}$ of, respectively, the second electrode 140a in the first emissive region 1910a, the second electrode 140b in the second emissive region 1910b, and/or the second electrode 140c in the third emissive region 1910c, optical microcavity effects of, respectively, the first emissive region 1910a, the second emissive region 1910b, and/or the third emissive region 1910c may be modulated on a sub-pixel to sub-pixel basis. By way of non-limiting example, a thickness of a CPL 3610a, 3610b, 3610c disposed over a B(lue) sub-pixel 2643 may be less than a thickness of a CPL 3610a, 3610b, 3610c disposed over a G(reen) sub-pixel 2642. By way of non-limiting examples, a thickness of a CPL 3610a, 3610b, 3610c disposed over a G(reen) sub-pixel 2642 may be less than a thickness of a CPL 3610a, 3610b, 3610c disposed over a R(ed) sub-pixel 2641.

Those having ordinary skill in the relevant art will appreciate that optical microcavity effects of, respectively, the first emissive region 1910a, the second emissive region 1910b, and/or the third emissive region 1910c, may be controlled to an even greater extent by modulating at least one optical property, including without limitation, a thickness, a composition, a total optical path length, and/or a refractive index, of the initial conductive coating $830_0$, the first conductive coating 830a, and/or the second conductive coating 830b, in order to modulate at least one optical property, including without limitation, a thickness, a composition, a total optical path length, and/or a refractive index, of the second electrode 140a, 140b, 140c of one emissive region 1910a, 1910b, 1910c of a given sub-pixel 264x relative to the at least one optical property, including without limitation, a thickness, a composition, a total optical path length, and/or a refractive index, of the second electrode 140a, 140b, 140c of another emissive region 1910a, 1910b, 1910c of another sub-pixel 264x, in addition to modulating at least one optical property, including without limitation, a thickness, a composition, a total optical path length, and/or a refractive index, of a CPL 3610a, 3610b, 3610c of the one emissive region 1910a, 1910b, 1910c of the given sub-pixel 264x relative to at least one optical property, including without limitation, a thickness, a composition, a total optical path length, and/or a refractive index, of a CPL 3610a, 3610b, 3610c of the other emissive region 1910a, 1910b, 1910c of the other sub-pixel 264x.

In some non-limiting examples, the device 3800 may also comprise any number of emissive regions 1910a-1910c and/or (sub-) pixel(s) 340/264x thereof. In some non-limiting examples, a device may comprise a plurality of pixels 340, wherein each pixel 340 comprises two, three or more sub-pixel(s) 264x.

Those having ordinary skill in the relevant art will appreciate that the specific arrangement of (sub-) pixel(s) 340/264x may be varied depending on the device design. In some non-limiting examples, the sub-pixel(s) 264x may be arranged according to known arrangement schemes, including without limitation, RGB side-by-side, diamond and/or PenTile®.

Figure 38F:
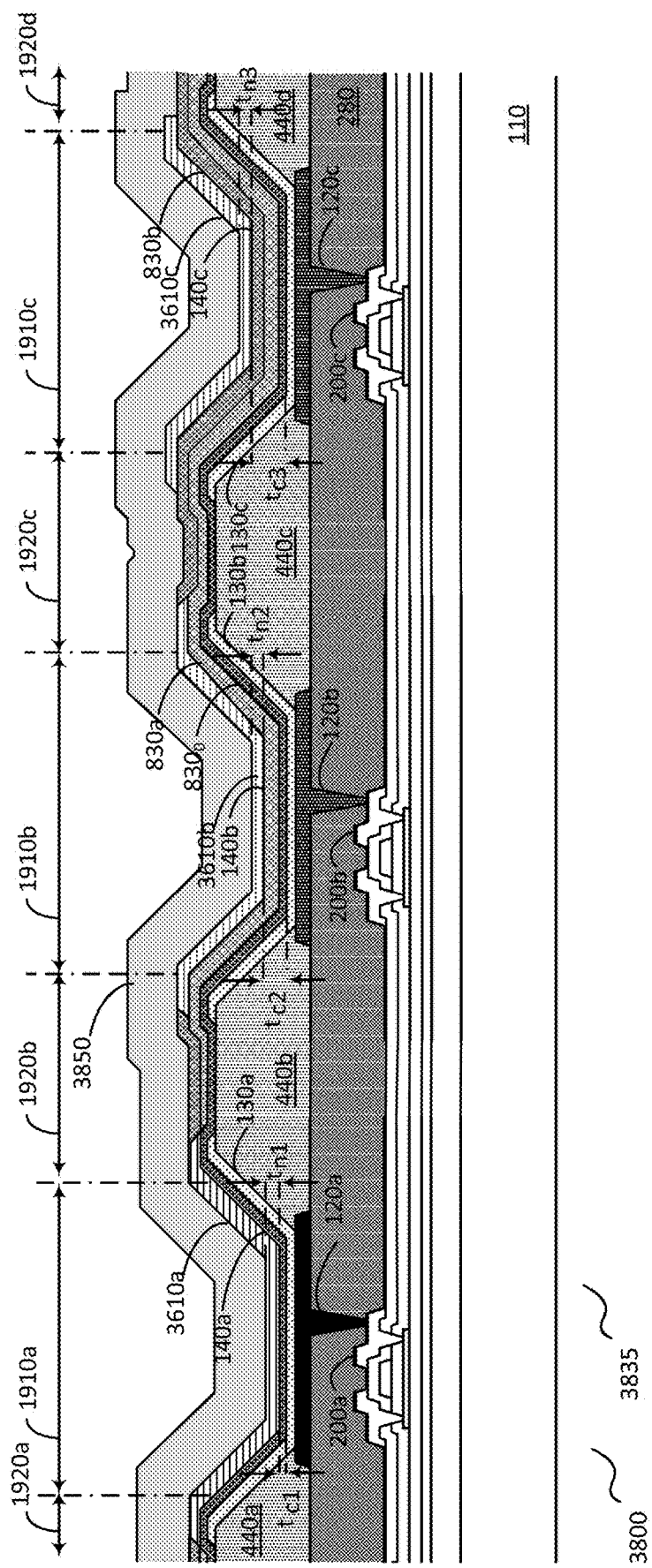

Turning now to FIG. 38F, a stage 3835 of manufacture of the device 3800 is shown that assumes that stage 3830 has just occurred.

After stage 3835, a further layer, including without limitation, a further CPL 3850, a TFE, and/or a glass cap, may be deposited over the device 3800. In some non-limiting examples, the CPL 3850 may be deposited using an open mask and/or mask-free deposition process. In some non-limiting examples, such deposition may be effected by exposing the entire exposed layer surface 111 of the device 3800 to a vapour flux of a CPL material to deposit the CPL 3850 across substantially all of the exposed layer surface 111 of the device 3800.

In some non-limiting examples, the CPL 3850 is similar to conventional CPLs that comprises a layer, typically formed of a common CPL material and in some non-limiting examples, having a substantially common thickness, that extends across substantially all of the lateral aspect of the device 100, including without limitation, across all emissive regions 1910 therein.

In some non-limiting examples, the CPL material for depositing the CPL 3850 may be the same and/or different from: the CPL material for depositing the first CPL 3810a, the CPL material for depositing the second CPL 3810b, the CPL material for depositing the third CPL 3810c and/or the CPL material for depositing the at least one PDL CPL 3810a, 3810b, 3810c, and/or 3810d.

In some non-limiting examples, the CPL 3850 may additionally act as a patterning coating 810, in that it exhibits a relatively low initial sticking coefficient for a further conductive coating material 831 (not shown) relative to the exposed layer surface 111 of the underlying surface, and be selectively deposited over first portions of the exposed layer surface 111 of such underlying surface in the example device 3800, to inhibit deposition of a further conductive coating material 831 thereon.

In some non-limiting examples, there may be a scenario in which it is contemplated to deposit a conductive coating 830 having specific material properties onto an exposed layer surface 110 of a substrate 110 on which such conductive coating 830 is not readily deposited. By way of non-limiting example, pure and/or substantially pure Mg is not typically readily deposited onto an organic surface since there is a low sticking coefficient of Mg on various organic surfaces. Accordingly, in some non-limiting examples, an exposed layer surface 111 on which the initial conductive coating $830_0$, the first conductive coating 830a, the second conductive coating 830b, and/or the at least one auxiliary electrode 1750 is to be deposited may be treated, prior to deposition of the conductive coating material 831 to form the initial conductive coating $830_0$, the first conductive coating 830a, the second conductive coating 830b, and/or the at least one auxiliary electrode 1750, by depositing a patterning coating 1120, which in some non-limiting examples, may be an NPC 1120.

In some non-limiting examples, deposition of a patterning coating 1120 for facilitating deposition of a conductive coating material 831 for a conducting coating 830, including without limitation, at least one of the initial conductive coating $830_0$, the first conductive coating 830a, the second conductive coating 830b, and/or the at least one auxiliary electrode 1750, may occur before and/or after, respectively, a prior deposition of a PDL 3610, including without limitation, the at least one PDL CPL 3810a, 3810b, 3810c, 3810d, the first CPL 3610a, the second CPL 3610b, and/or the third CPL 3610c.

In some non-limiting examples, such a patterning coating 1120 may deposited over portions of an underlying exposed layer surface 111 of, without limitation, the substrate 110, the at least one semiconducting layer 130, the at least one PDL 440a, 440b, 440c, 440d, the initial conductive coating $830_0$, the first conductive coating 830a, and/or the second conductive coating 830b, that is substantially devoid of a CPL 3610, including without limitation, the at least one PDL CPL 3810a, 3810b, 3810c, 3810d, the first CPL 3610a, the second CPL 3610b, and/or the third CPL 3610c.

In some non-limiting examples, such a patterning coating 1120 may be deposited at an interface between a CPL 3610, including without limitation, the first CPL 3610a, the second CPL 3610b, and/or the third CPL 3610c, and an underlying conductive coating 830, including without limitation, the first conductive coating 830a, the second conductive coating 830b, and/or the third conductive coating 830c.

In FIGS. 38A-38F, the CPLs 3610 are shown as extending substantially only across the lateral extent 410 of one emissive region 1910. Such a configuration permits one or more conductive coatings 830 to be deposited in regions that, at the time of deposition, are substantially devoid of a CPL 3610, resulting in a patterned deposition of the conductive coating 830, without employing an FMM. In some non-limiting examples, again as shown in FIGS. 38A-38F, the deposition of a subsequent CPL 3610 in turn is deposited across the lateral extent 410 of a different emissive region 1910 from that of a previous CPL 3610, such that the CPL 3610 layers do not overlap.

Figure 39A:
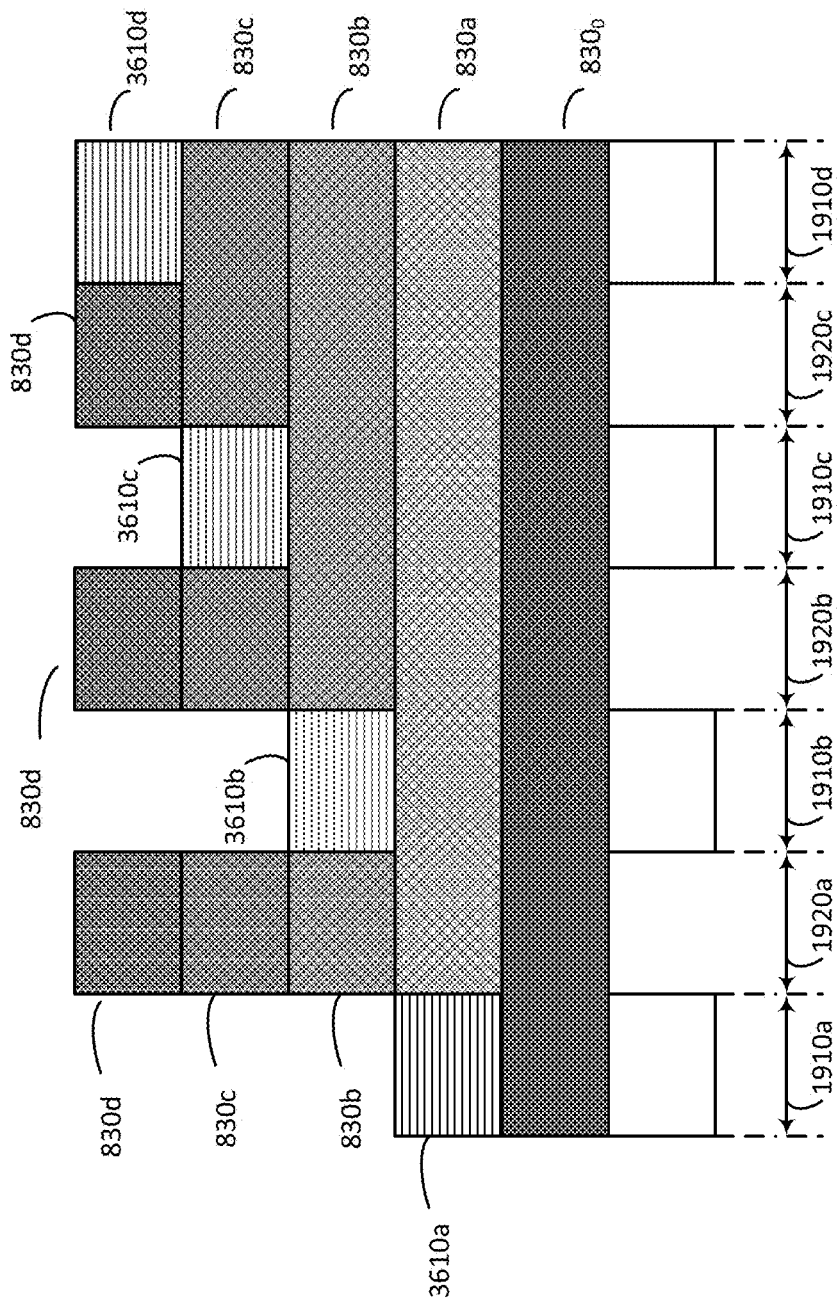
FIGS. 39A-39C are schematic diagrams that show example versions of the device of FIG. 1 according to an example in the present disclosure.

Such configuration is shown in a simplified example diagram in FIG. 39A.

A first CPL 3610a is deposited on the exposed layer surface 111 of an underlying material, which may, in some non-limiting examples, be an initial conductive coating $830_0$, (substantially only) across the lateral extent 410 of a first emissive region 1910a.

A first conductive coating 830a is deposited, subsequent to the deposition of the first CPL 3610a, and patterned thereby, on the rest of the exposed layer surface 111 of the initial conductive coating $830_0$.

A second CPL 3610b is deposited on the exposed layer surface 111 of the first conductive coating 830a (substantially only) across the lateral extent 410 of a second emissive region 1910b.

A second conductive coating 830b is deposited, subsequent to the deposition of the second CPL 3610b, and patterned thereby, on the rest of the exposed layer surface 111 of the first conductive coating 830a.

A third CPL 3610c is deposited on the exposed layer surface 111 of the second conductive coating 830b (substantially only) across the lateral extent 410 of a third emissive region 1910c.

A third conductive coating 830c is deposited, subsequent to the deposition of the third CPL 3610c, and patterned thereby, on the exposed layer surface 111 of the second conductive coating 830b.

A fourth CPL 3610d is deposited on the exposed layer surface 111 of the third conductive coating 830c (substantially only) across the lateral extent 410 of a fourth emissive region 1910d.

A fourth conductive coating 830d is deposited, subsequent to the deposition of the fourth CPL 3610d, and patterned thereby, on the exposed layer surface 111 of the third conductive coating 830c.

Thus, each of the non-emissive regions 1920a, 1920b, 1930c extending respectively, between the first emissive region 1910a and the second emissive region 1910b, the second emissive region 1910b and the third emissive region 1910c, and the third emissive region 1910c and the fourth emissive region 1910d, are shown with five layers of conductive coating 830 thereon, comprising the initial conductive coating $830_0$, the first conductive coating 830a, the second conductive coating 830b, the third conductive coating 830c, and the fourth conductive coating 830d, while each of the fourth emissive region 1910d, the third emissive region 1910c, the second emissive region 1910b, and the first emissive region 1910a each have progressively fewer layers of conductive coating 830, the uppermost of which is covered by a single CPL 3610.

Those having ordinary skill in the relevant art will appreciate that other configurations involving the deposition of CPLs 3610 may also be employed. By way of non-limiting example, in some non-limiting examples, a subsequent CPL 3610 may be deposited over, and fully overlap, a previous CPL 3610 across the lateral extent 410 of the corresponding emissive region, as well as across the lateral extent 410 of a subsequent emissive region 1910, and, in some non-limiting examples, over at least a part of the lateral extent 420 of a non-emissive region 1920 extending therebetween.

Figure 39B:
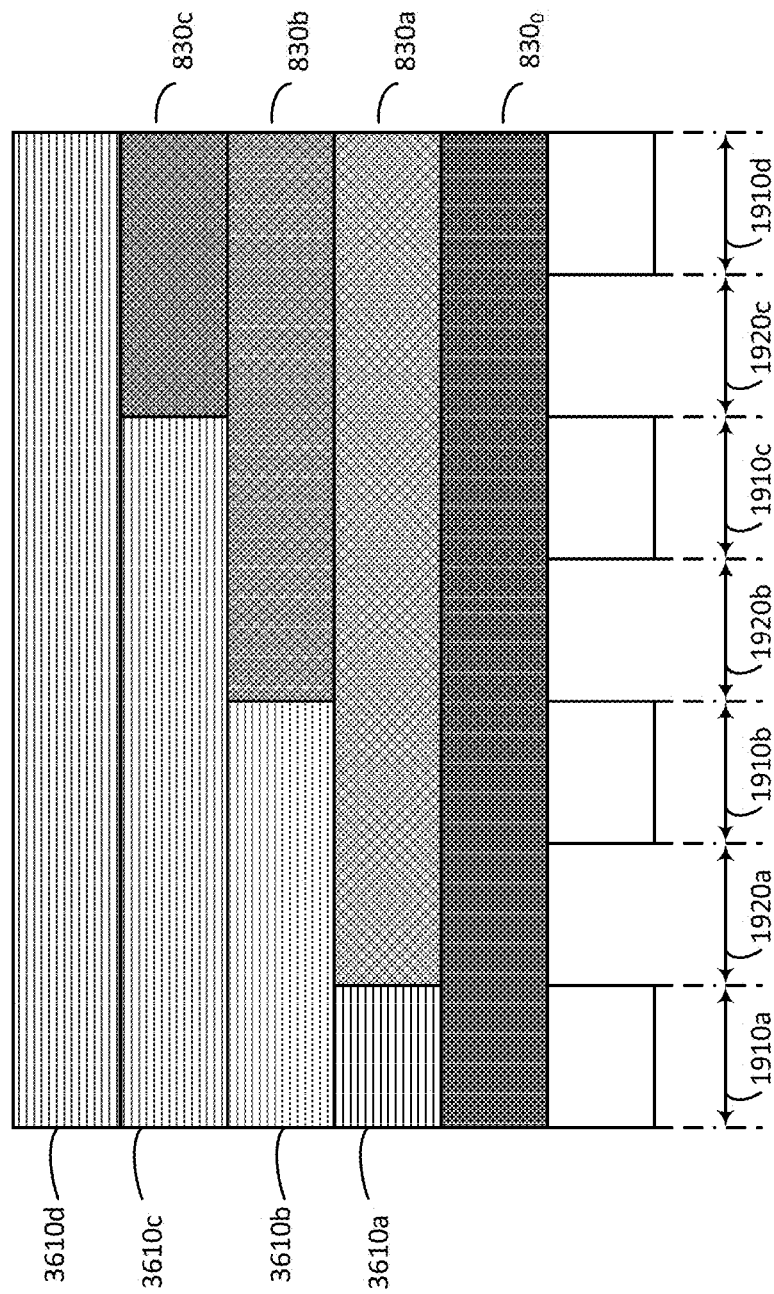

Such configuration is shown in a simplified example diagram in FIG. 39B.

A first CPL 3610a is deposited on the exposed layer surface 111 of an underlying material, which may, in some non-limiting examples be an initial conductive coating $830_0$, (substantially only) across the lateral extent 410 of a first emissive region 1910a.

A first conductive coating 830a is deposited, subsequent to the deposition of the first CPL 3610a, and patterned thereby, on the rest of the exposed layer surface 111 of the first conductive coating 830a.

A second CPL 3610b is deposited on the exposed layer surface 111 of the first conductive coating 830a across the lateral extent 410 of a second emissive region 1910b. However, in addition, the second CPL 3610b is deposited on the exposed layer surface 111 of the first conductive coating 830a across (at least a part of) the lateral extent 420 of a first non-emissive region 1920a extending between the first emissive region 1910a and the second emissive region 1910b, as well as on the exposed layer surface 111 of the first CPL 3610a.

A second conductive coating 830b is deposited, subsequent to the deposition of the second CPL 3610b, and patterned thereby, on the rest of the exposed layer surface 111 of the first conductive coating 830a.

A third CPL 3610c is deposited on the exposed layer surface 111 of the second conductive coating 830b across the lateral extent of a third emissive region 1910c. However, in addition, the third CPL 3610c is deposited on the exposed layer surface 111 of the second conductive coating 830b across (at least a part of) the lateral extent 420 of a second non-emissive region 1920b extending between the second emissive region 1910b and the third emissive region 1910c, as well as on the exposed layer surface 111 of the second CPL 3610b, which extends across the lateral extent 410 of the first emissive region 1910a, the second emissive region 1910b, and the lateral extent 420 of the first non-emissive region 1920a therebetween.

A third conductive coating 830c is deposited, subsequent to the deposition of the third CPL 3910c, and patterned thereby, on the rest of the exposed layer surface 111 of the second conductive coating 830b.

A fourth CPL 3610d is deposited on the exposed layer surface 111 of the third conductive coating 830c across the lateral extent of a fourth emissive region 1910d. However, in addition, the fourth CPL 3610d is deposited on the exposed layer surface 111 of the third conductive coating 830c across (at least a part of) the lateral extent 420 of a third non-emissive region 1920c extending between the third emissive region 1910c and the fourth emissive region 1910d, as well as on the exposed layer surface 111 of the third CPL 3610c, which extends across the lateral extent 410 of the first emissive region 1910, the second emissive region 1910b, and the lateral extent 420 of the first non-emissive region 1920a between the first emissive region 1910a and the second emissive region 1910b and of the second non-emissive region 1920b between the second emissive region 1910b and the third emissive region 19

Thus, each of the fourth emissive region 1910d, the third emissive region 1910c, the second emissive region, and the first emissive region 1910a, as well as the third non-emissive region 1920c, the second non-emissive region 1920b, and the first non-emissive region 1920a, have progressively fewer layers of conductive coating 830, the uppermost of which is covered by a progressively larger number of layers of CPL 3610, so that each region has the same number of layers thereon, whether of a conductive coating 830 or of a CPL 3610.

In some non-limiting examples, a subsequent CPL 3610 may be deposited over, but only partially overlap, a previous CPL 3610. In some non-limiting examples, each CPL 3610 may extend across the lateral extent 410 of a plurality of emissive regions 1910, and the lateral aspect 420 of at least one non-emissive region 1920 therebetween.

Figure 39C:
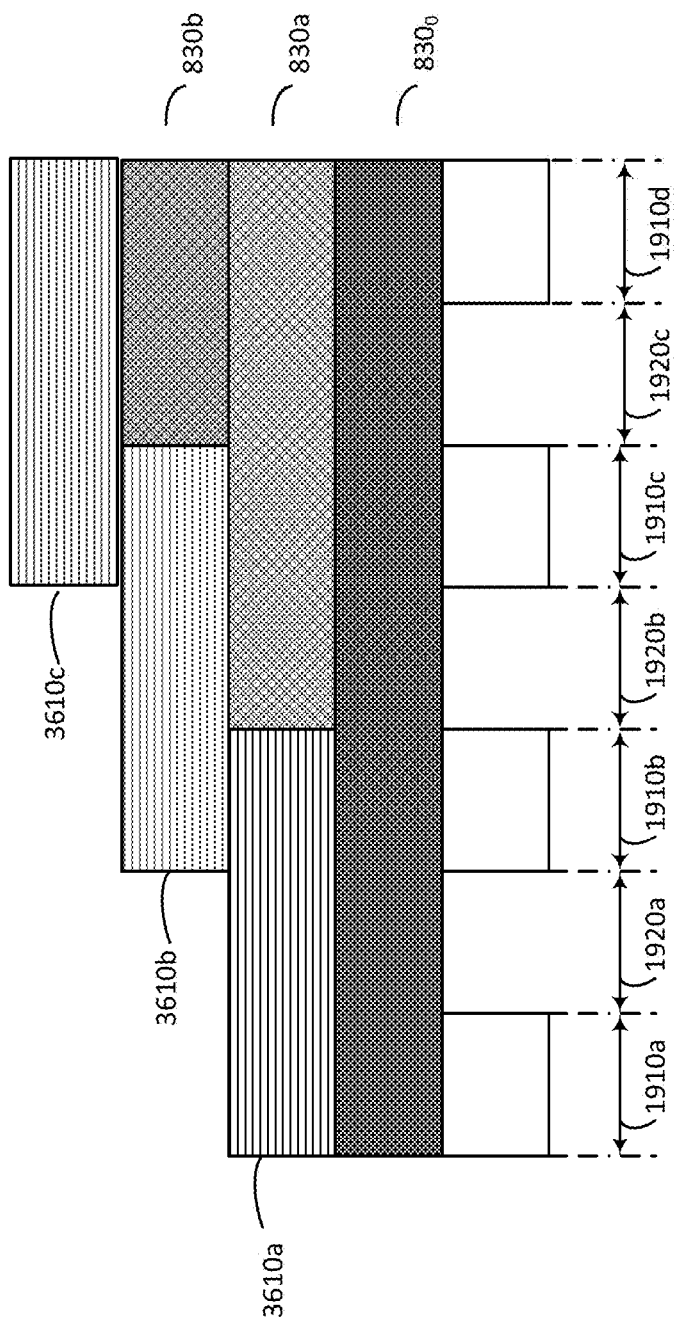

Such configuration is shown in a simplified example diagram in FIG. 39C.

A first CPL 3610a is deposited on the exposed layer surface 111 of an underlying material, which may, in some non-limiting examples, be an initial conductive coating $830_0$, across, and in some non-limiting examples, extending beyond the lateral extent 410 of a first emissive region 1910a. In the example shown, the first CPL 3610a extends across the lateral extent 410 of both the first emissive region 1910a and of a second emissive region 1910b, as well as the lateral extent 420 of a first non-emissive region 1920a therebetween.

A first conductive coating 830a is deposited, subsequent to the deposition of the first CPL 3610a, and patterned thereby, on the rest of the exposed layer surface 111 of the initial conductive coating $830_0$.

A second CPL 3610b is deposited on the exposed layer surface 111 of a part of both the first conductive coating 830a and the first CPL 3610a, across, and in some non-limiting examples, extending beyond the lateral extent 410 of the second emissive region 1910b. In the example shown, the second CPL 3610b extends across the lateral extent 410 of both the second emissive region 1910b and of a third emissive region 1910c, as well as the lateral extent 420 of a second non-emissive region 1920b therebetween.

A second conductive coating 830c is deposited, subsequent to the deposition of the second CPL 3610b, and patterned thereby, on the rest of the exposed layer surface 111 of the first conductive coating 830a.

A third CPL 3610c is deposited on the exposed layer surface 111 of a part of both the second conductive coating 830b and the second CPL 3610b, across, and in some non-limiting examples, extending beyond the lateral extent 410 of the third emissive region 1910c. In the example shown, the third CPL 3610c extends across the lateral extent 410 of both the third emissive region 1910c and of a fourth emissive region 1910d, as well as the lateral extent 420 of a third non-emissive region 1920c therebetween.

Thus, some of the emissive regions 1910, including without limitation, the second emissive region 1910b and the third emissive region 1910c each have a plurality of layers of CPL 3610 covering a progressively larger number of layers of conductive coating 830.

NPCs

Without wishing to be bound by a particular theory, it is postulated that providing an NPC 1120 may facilitate deposition of the conductive coating 830 onto certain surfaces.

Non-limiting examples of suitable materials for forming an NPC 1120 include without limitation, at least one of metals, including without limitation, alkali metals, alkaline earth metals, transition metals and/or post-transition metals, metal fluorides, metal oxides and/or fullerene.

In the present disclosure, the term "fullerene" may refer generally to a material including carbon molecules. Non-limiting examples of fullerene molecules include carbon cage molecules, including without limitation, a three-dimensional skeleton that includes multiple carbon atoms that form a closed shell and which may be, without limitation, spherical and/or semi-spherical in shape. In some non-limiting examples, a fullerene molecule can be designated as $C_n$, where n is an integer corresponding to a number of carbon atoms included in a carbon skeleton of the fullerene molecule. Non-limiting examples of fullerene molecules include where n is in the range of 50 to 250, such as, without limitation, $C_{70}$, $C_{70}$, $C_{72}$, $C_{74}$, $C_{76}$, $C_{78}$, $C_{80}$, $C_{82}$, and $C_{84}$. Additional non-limiting examples of fullerene molecules include carbon molecules in a tube and/or a cylindrical shape, including without limitation, single-walled carbon nanotubes and/or multi-walled carbon nanotubes.

Non-limiting examples of such materials include Ca, Ag, Mg, Yb, ITO, IZO, ZnO, ytterbium fluoride ($YbF_3$), magnesium fluoride ($MgF_2$) and/or cesium fluoride (CsF).

Based on findings and experimental observations, it is postulated that nucleation promoting materials, including without limitation, fullerenes, metals, including without limitation, Ag and/or Yb, and/or metal oxides, including without limitation, ITO and/or IZO, as discussed further herein, may act as nucleation sites for the deposition of a conductive coating 830, including without limitation Mg.

In some non-limiting examples, the NPC 1120 may be provided by a part of the at least one semiconducting layer 130. By way of non-limiting example, a material for forming the EIL 139 may be deposited using an open mask and/or mask-free deposition process to result in deposition of such material in both an emissive region 1910 and/or a non-emissive region 1920 of the device 100. In some non-limiting examples, a part of the at least one semiconducting layer 130, including without limitation the EIL 139, may be deposited to coat one or more surfaces in the sheltered region 3065. Non-limiting examples of such materials for forming the EIL 139 include at least one or more of alkali metals, including without limitation, Li, alkaline earth metals, fluorides of alkaline earth metals, including without limitation, $MgF_2$, fullerene, Yb, $YbF_3$, and/or CsF.

In some non-limiting examples, the NPC 1120 may be provided by the second electrode 140 and/or a portion, layer and/or material thereof. In some non-limiting examples, the second electrode 140 may extend laterally to cover the layer surface 3111 arranged in the sheltered region 3065. In some non-limiting examples, the second electrode 140 may comprise a lower layer thereof and a second layer thereof, wherein the second layer thereof is deposited on the lower layer thereof. In some non-limiting examples, the lower layer of the second electrode 140 may comprise an oxide such as, without limitation, ITO, IZO and/or ZnO. In some non-limiting examples, the upper layer of the second electrode 140 may comprise a metal such as, without limitation, at least one of Ag, Mg, Mg:Ag, Yb/Ag, other alkali metals and/or other alkali earth metals.

In some non-limiting examples, the lower layer of the second electrode 140 may extend laterally to cover a surface of the sheltered region 3065, such that it forms the NPC 1120. In some non-limiting examples, one or more surfaces defining the sheltered region 3065 may be treated to form the NPC 1120. In some non-limiting examples, such NPC 1120 may be formed by chemical and/or physical treatment, including without limitation, subjecting the surface(s) of the sheltered region 3065 to a plasma, UV and/or UV-ozone treatment.

Without wishing to be bound to any particular theory, it is postulated that such treatment may chemically and/or physically alter such surface(s) to modify at least one property thereof. By way of non-limiting example, such treatment of the surface(s) may increase a concentration of C—O and/or C—OH bonds on such surface(s), increase a roughness of such surface(s) and/or increase a concentration of certain species and/or functional groups, including without limitation, halogens, nitrogen-containing functional groups and/or oxygen-containing functional groups to thereafter act as an NPC 1120.

In some non-limiting examples, the partition 3221 includes and/or if formed by an NPC 1120. By way of non-limiting examples, the auxiliary electrode 1750 may act as an NPC 1120.

In some non-limiting examples, suitable materials for use to form an NPC 1120, may include those exhibiting or characterized as having an initial sticking probability $S_0$ for a material of a conductive coating 830 of at least about 0.4 (or 40%), at least about 0.5, at least about 0.6, at least about 0.7, at least about 0.75, at least about 0.8, at least about 0.9, at least about 0.93, at least about 0.95, at least about 0.98, and/or at least about 0.99.

By way of non-limiting example, in scenarios where Mg is deposited using without limitation, an evaporation process on a fullerene-treated surface, in some non-limiting examples, the fullerene molecules may act as nucleation sites that may promote formation of stable nuclei for Mg deposition.

In some non-limiting examples, less than a monolayer of an NPC 1120, including without limitation, fullerene, may be provided on the treated surface to act as nucleation sites for deposition of Mg.

In some non-limiting examples, treating a surface by depositing several monolayers of an NPC 1120 thereon may result in a higher number of nucleation sites and accordingly, a higher initial sticking probability $S_0$.

Those having ordinary skill in the relevant art will appreciate than an amount of material, including without limitation, fullerene, deposited on a surface, may be more, or less than one monolayer. By way of non-limiting example, such surface may be treated by depositing 0.1 monolayer, 1 monolayer, 10 monolayers, or more of a nucleation promoting material and/or a nucleation inhibiting material.

In some non-limiting examples, a thickness of the NPC 1120 deposited on an exposed layer surface 111 of underlying material(s) may be between about 1 nm and about 5 nm and/or between about 1 nm and about 3 nm.

While the present disclosure discusses thin film formation, in reference to at least one layer and/or coating, in terms of vapor deposition, those having ordinary skill in the relevant art will appreciate that, in some non-limiting examples, various components of the electro-luminescent device 100 may be deposited using a wide variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating), and/or combinations of any two or more thereof. Such processes may be used in combination with a shadow mask to achieve various patterns.

NICs

Without wishing to be bound by a particular theory, it is postulated that, during thin film nucleation and growth at and/or near an interface between the exposed layer surface 111 of the substrate 110 and the NIC 810, a relatively high contact angle θ, between the edge of the film and the substrate 110 be observed due to "dewetting" of the solid surface of the thin film by the NIC 810. Such dewetting property may be driven by minimization of surface energy between the substrate 110, thin film, vapor 7 and the NIC 810 layer. Accordingly, it may be postulated that the presence of the NIC 810 and the properties thereof may have, in some non-limiting examples, an effect on nuclei formation and a growth mode of the edge of the conductive coating 830.

Without wishing to be bound by a particular theory, it is postulated that, in some non-limiting examples, the contact angle $θ_c$ of the conductive coating 830 may be determined, based at least partially on the properties (including, without limitation, initial sticking probability $S_0$) of the NIC 810 disposed adjacent to the area onto which the conductive coating 830 is formed. Accordingly, NIC 810 material that allow selective deposition of conductive coatings 830 exhibiting relatively high contact angles $θ_c$ may provide some benefit.

Figure 40:
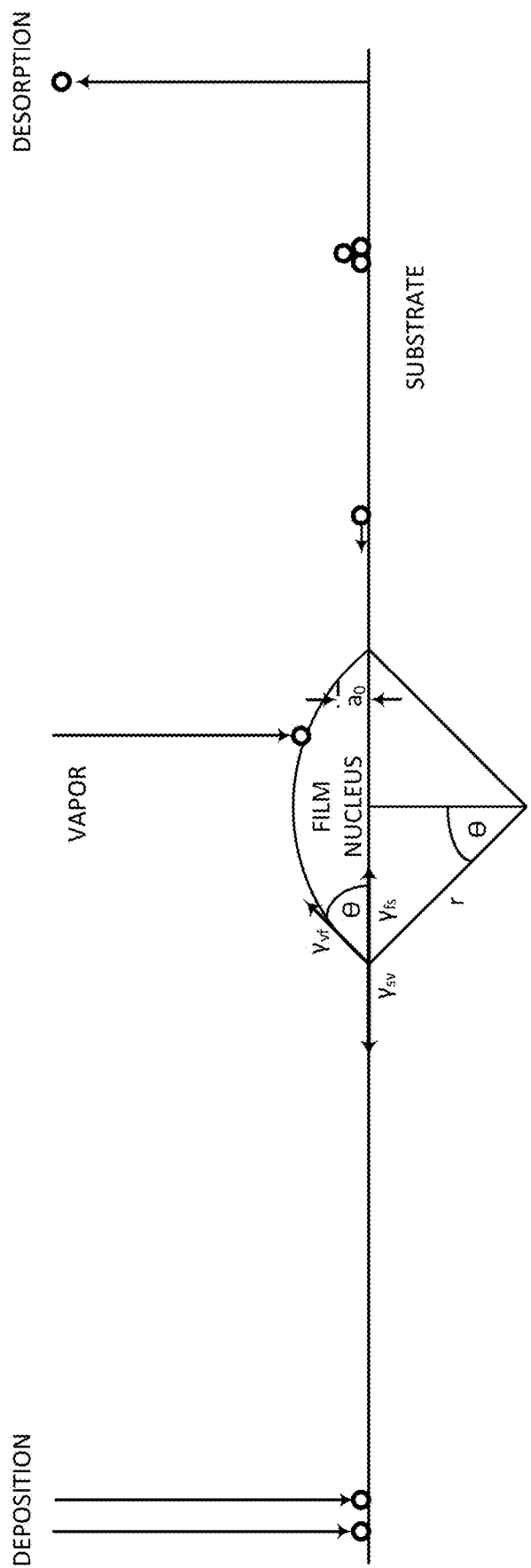
FIG. 40 is a schematic diagram illustrating the formation of a film nucleus according to an example in the present disclosure.

Without wishing to be bound by a particular theory, it is postulated that, in some non-limiting examples, the relationship between various interfacial tensions present during nucleation and growth may be dictated according to Young's equation in capillarity theory:

$$\gamma_{sv} = \gamma_{fs} + \gamma_{vf} \cos θ$$

wherein $\gamma_{sv}$ corresponds to the interfacial tension between substrate 110 and vapor, $\gamma_{fs}$ corresponds to the interfacial tension between the thin film and the substrate 110, $\gamma_{vf}$ corresponds to the interfacial tension between the vapor and the film, and θ is the film nucleus contact angle. FIG. 40 illustrates the relationship between the various parameters represented in this equation.

On the basis of Young's equation, it may be derived that, for island growth, the film nucleus contact angle θ is greater than 0 and therefore $\gamma_{sv} < \gamma_{fs} + \gamma_{vf}$.

For layer growth, where the deposited film "wets" the substrate 110, the nucleus contact angle θ=0, and therefore $\gamma_{sv} = \gamma_{fs} + \gamma_{vf}$.

For Stranski-Krastanov (S-K) growth, where the strain energy per unit area of the film overgrowth is large with respect to the interfacial tension between the vapor and the film, $\gamma_{sv} > \gamma_{fs} + \gamma_{vf}$.

It may be postulated that the nucleation and growth mode of the conductive coating 830 at an interface between the NIC 810 and the exposed layer surface 111 of the substrate 110 may follow the island growth model, where θ>0. Particularly in cases where the NIC 810 exhibits a relatively low affinity and/or low initial sticking probability $S_0$ (i.e. dewetting) towards the material used to form the conductive coating 830, resulting in a relatively high thin film contact angle of the conductive coating 830. On the contrary, when a conductive coating 830 is selectively deposited on a surface without the use of an NIC 810, by way of non-limiting example, by employing a shadow mask, the nucleation and growth mode of the conductive coating 830 may differ. In particular, it has been observed that the conductive coating 830 formed using a shadow mask patterning process may, at least in some non-limiting examples, exhibit relatively low thin film contact angle of less than about 10°.

Those having ordinary skill in the relevant art will appreciate that, while not explicitly illustrated, a material used to form the NIC 810 may also be present to some extent at an interface between the conductive coating 830 and an underlying surface (including without limitation, a surface of a NPC 1120 layer and/or the substrate 110). Such material may be deposited as a result of a shadowing effect, in which a deposited pattern is not identical to a pattern of a mask and may, in some non-limiting examples, result in some evaporated material being deposited on a masked part of a target surface 111. By way of non-limiting examples, such material may form as islands and/or disconnected clusters, and/or as a thin film having a thickness that may be substantially less than an average thickness of the NIC 810.

In some non-limiting examples, it may be desirable for the activation energy for desorption ($E_{des}$ 631) to be less than about 2 times the thermal energy ($k_BT$), less than about 1.5 times the thermal energy ($k_BT$), less than about 1.3 times the thermal energy ($k_BT$), less than about 1.2 times the thermal energy ($k_BT$), less than the thermal energy ($k_BT$), less than about 0.8 times the thermal energy ($k_BT$), and/or less than about 0.5 times the thermal energy ($k_BT$). In some non-limiting examples, it may be desirable for the activation energy for surface diffusion ($E_s$ 621) to be greater than the thermal energy ($k_BT$), greater than about 1.5 times the thermal energy ($k_BT$), greater than about 1.8 times the thermal energy ($k_BT$), greater than about 2 times the thermal energy ($k_BT$), greater than about 3 times the thermal energy ($k_BT$), greater than about 5 times the thermal energy ($k_BT$), greater than about 7 times the thermal energy ($k_BT$), and/or greater than about 10 times the thermal energy ($k_BT$).

In some non-limiting examples, suitable materials for use to form an NIC 810, may include those exhibiting and/or characterized as having an initial sticking probability $S_0$ for a material of a conductive coating 830 of no greater than and/or less than about 0.3 (or 30%), no greater than and/or less than about 0.2, no greater than and/or less than about 0.1, no greater than and/or less than about 0.05, no greater than and/or less than 0.03, no greater than and/or less than 0.02, no greater than and/or less than 0.01, no greater than and/or less than about 0.08, no greater than and/or less than about 0.005, no greater than and/or less that about 0.003, no greater than and/or less than about 0.001, no greater than and/or less than about 0.0008, no greater than and/or less than about 0.0005, and/or no greater than and/or less than about 0.0001.

In some non-limiting examples, suitable materials for use to form an NIC 810 include those exhibiting and/or characterized has having initial sticking probability $S_0$ for a material of a conductive coating 830 of between about 0.03 and about 0.0001, between about 0.03 and about 0.0003, between about 0.03 and about 0.0005, between about 0.03 and about 0.0008, between about 0.03 and about 0.001, between about 0.03 and about 0.005, between about 0.03 and about 0.008, between about 0.03 and about 0.01, between about 0.02 and about 0.0001, between about 0.02 and about 0.0003, between about 0.02 and about 0.0005, between about 0.02 and about 0.0008, between about 0.02 and about 0.0005, between about 0.02 and about 0.0008, between about 0.02 and about 0.001, between about 0.02 and about 0.005, between about 0.02 and about 0.008, between about 0.02 and about 0.01, between about 0.01 and about 0.0001, between about 0.01 and about 0.0003, between about 0.01 and about 0.0005, between about 0.01 and about 0.0008, between about 0.01 and about 0.001, between about 0.01 and about 0.005, between about 0.01 and about 0.008, between about 0.008 and about 0.0001, between about 0.008 and about 0.0003, between about 0.008 and about 0.0005, between about 0.008 and about 0.0008, between about 0.008 and about 0.001, between about 0.008 and about 0.005, between about 0.005 and about 0.0001, between about 0.005 and about 0.0003, between about 0.005 and about 0.0005, between about 0.005 and about 0.0008, and/or between about 0.005 and about 0.001.

In some non-limiting examples, suitable materials for use to form an NIC 810, may include organic materials, such as small molecule organic materials and/or organic polymers. Non-limiting examples of suitable organic materials include without limitation polycyclic aromatic compounds including without limitation organic molecules, including without limitation, optionally one or more heteroatoms, including without limitation, nitrogen (N), sulfur (S), oxygen (O), phosphorus (P) and/or Al. In some non-limiting examples, a polycyclic aromatic compound may include, without limitation, organic molecules each including a core moiety and at least one terminal moiety bonded to the core moiety. A non-limiting number of terminal moieties may be 1 or more, 2 or more, 3 or more, and/or 4 or more. Without limiting the generality of the foregoing, in the case of 2 or more terminal moieties, the terminal moieties may be the same and/or different, and/or a subset of the terminal moieties may be the same but different from at least one remaining moiety.

Suitable nucleation inhibiting materials include organic materials, such as small molecule organic materials and organic polymers.

Non-limiting examples of suitable materials for use to form an NIC 810 include at least one material described in at least one of U.S. Pat. No. 10,270,033, PCT International Application No. PCT/IB2018/052881, PCT International Application No. PCT/IB2019/053706 and/or PCT International Application No. PCT/IB2019/050839. In some non-limiting examples, materials that may be used to form a nucleation inhibiting coating include polymeric materials, including without limitation: fluoropolymers, including but not limited to perfluorinated polymers and polytetrafluoroethylene (PTFE); polyvinylbiphenyl; polyvinylcarbazole (PVK); and polymers formed by polymerizing a plurality of the polycyclic aromatic compounds as described above. In some non-limiting examples, materials that may be sued to form a nucleation inhibiting coating include, without limitation, TAZ, BAlq, and any mixture thereof.

In some non-limiting examples, the NIC 810 may act as an optical coating. In some non-limiting examples, the NIC 810 may modify at least property and/or characteristic of the light emitted from at least one emissive region 1910 of the device 100. In some non-limiting examples, the NIC 810 may exhibit a degree of haze, causing emitted light to be scattered. In some non-limiting examples, the NIC 810 may comprise a crystalline material for causing light transmitted therethrough to be scattered. Such scattering of light may facilitate enhancement of the outcoupling of light from the device in some non-limiting examples, In some non-limiting examples, the NIC 810 may initially be deposited as a substantially non-crystalline, including without limitation, substantially amorphous, coating, whereupon, after deposition thereof, the NIC 810 may become crystallized and thereafter serve as an optical coupling.

As discussed previously, in some non-limiting examples, one or more of the CPLs 3610 may act as an NIC 810, and may, in some non-limiting examples, exhibit behaviour described herein.

Where features or aspects of the present disclosure are described in terms of Markush groups, it will be appreciated by those having ordinary skill in the relevant art that the present disclosure is also thereby described in terms of any individual member of sub-group of members of such Markush group.

Terminology

References in the singular form include the plural and vice versa, unless otherwise noted.

As used herein, relational terms, such as "first" and "second", and numbering devices such as "a", "b" and the like, may be used solely to distinguish one entity or element from another entity or element, without necessarily requiring or implying any physical or logical relationship or order between such entities or elements.

The terms "including" and "comprising" are used expansively and in an open-ended fashion, and thus should be interpreted to mean "including, but not limited to". The terms "example" and "exemplary" are used simply to identify instances for illustrative purposes and should not be interpreted as limiting the scope of the invention to the stated instances. In particular, the term "exemplary" should not be interpreted to denote or confer any laudatory, beneficial or other quality to the expression with which it is used, whether in terms of design, performance or otherwise.

The terms "couple" and "communicate" in any form are intended to mean either a direct connection or indirect connection through some interface, device, intermediate component or connection, whether optically, electrically, mechanically, chemically, or otherwise.

The terms "on" or "over" when used in reference to a first component relative to another component, and/or "covering" or which "covers" another component, may encompass situations where the first component is directly on (including without limitation, in physical contact with) the other component, as well as cases where one or more intervening components are positioned between the first component and the other component.

Amounts, ratios and/or other numerical values are sometimes presented herein in a range format. Such range formats are used for convenience, illustration and brevity and should be understood flexibly to include not only numerical values explicitly specified as limits of a range, but also all individual numerical values and/or sub-ranges encompassed within that range as if each numerical value and/or sub-range had been explicitly specified.

Directional terms such as "upward", "downward", "left" and "right" are used to refer to directions in the drawings to which reference is made unless otherwise stated. Similarly, words such as "inward" and "outward" are used to refer to directions toward and away from, respectively, the geometric center of the device, area or volume or designated parts thereof. Moreover, all dimensions described herein are intended solely to be by way of example of purposes of illustrating certain embodiments and are not intended to limit the scope of the disclosure to any embodiments that may depart from such dimensions as may be specified.

As used herein, the terms "substantially", "substantial", "approximately" and/or "about" are used to denote and account for small variations. When used in conjunction with an event or circumstance, such terms can refer to instances in which the event or circumstance occurs precisely, as well as instances in which the event or circumstance occurs to a close approximation. By way of non-limiting example, when used in conjunction with a numerical value, such terms may refer to a range of variation of less than or equal to ±10% of such numerical value, such as less than or equal to ±5%, less than or equal to ±4%, less than or equal to ±3%, less than or equal to ±2%, less than or equal to ±1%, less than or equal to ±0.5%, less than or equal to ±0.1%, and/or less than equal to ±0.05%.

As used herein, the phrase "consisting substantially of" will be understood to include those elements specifically recited and any additional elements that do not materially affect the basic and novel characteristics of the described technology, while the phrase "consisting of" without the use of any modifier, excludes any element not specifically recited.

As will be understood by those having ordinary skill in the relevant art, for any and all purposes, particularly in terms of providing a written description, all ranges disclosed herein also encompass any and all possible sub-ranges and/or combinations of sub-ranges thereof. Any listed range may be easily recognized as sufficiently describing and/or enabling the same range being broken down at least into equal fractions thereof, including without limitation, halves, thirds, quarters, fifths, tenths etc. As a non-limiting example, each range discussed herein may be readily be broken down into a lower third, middle third and/or upper third, etc.

As will also be understood by those having ordinary skill in the relevant art, all language and/or terminology such as "up to", "at least", "greater than", "less than", and the like, may include and/or refer the recited range(s) and may also refer to ranges that may be subsequently broken down into sub-ranges as discussed herein.

As will be understood by those having ordinary skill in the relevant art, a range includes each individual member of the recited range.

General

The purpose of the Abstract is to enable the relevant patent office or the public generally, and specifically, persons of ordinary skill in the art who are not familiar with patent or legal terms or phraseology, to quickly determine from a cursory inspection, the nature of the technical disclosure. The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are considered to be merely illustrative of the scope of the present disclosure.

It should be appreciated that the present disclosure, which is described by the claims and not by the implementation details provided, and which can be modified by varying, omitting, adding or replacing and/or in the absence of any element(s) and/or limitation(s) with alternatives and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in one or more of the above-described examples, whether or not described an illustrated as discrete or separate, may be combined or integrated in another system without departing from the scope of the present disclosure, to create alternative examples comprised of a combination or sub-combination of features that may not be explicitly described above, or certain features may be omitted, or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects and examples of the disclosure, as well as specific examples thereof, are intended to encompass both structural and functional equivalents thereof and to cover and embrace all suitable changes in technology. Additionally, it is intended that such equivalents include both currently-known equivalents as well as equivalents developed in the future, i.e., any elements developed that perform the same function, regardless of structure.

Accordingly, the specification and the examples disclosed therein are to be considered illustrative only, with a true scope of the disclosure being disclosed by the following numbered claims:

What is claimed is:

1. An opto-electronic device having a plurality of layers, comprising:
   a first capping layer (CPL) comprising a first CPL material and disposed in a first emissive region, the first emissive region configured to emit photons through the first CPL having a first wavelength spectrum that is characterized by a first onset wavelength; and
   a second CPL comprising a second CPL material and disposed in a second emissive region, the second emissive region configured to emit photons through the second CPL having a second wavelength spectrum that is characterized by a second onset wavelength that is different from the first onset wavelength;
   wherein:
      at least one of: the first CPL, and the first CPL material, (CPL(m)1) exhibits a first absorption edge at a first absorption edge wavelength that is shorter than the first onset wavelength; and
      at least one of: the second CPL, and the second CPL material, (CPL(m)2) exhibits a second absorption edge at a second absorption edge wavelength that is shorter than the second onset wavelength.

2. An opto-electronic device having a plurality of layers, comprising:
   a first capping layer (CPL) comprising a first CPL material and disposed in a first emissive region, the first emissive region configured to emit photons through the first CPL having a first wavelength spectrum that is characterized by a first onset wavelength; and
   a second CPL comprising a second CPL material and disposed in a second emissive region, the second emissive region configured to emit photons through the second CPL having a second wavelength spectrum that is characterized by a second onset wavelength that is different from the first onset wavelength;
   wherein at least one of the following is true:
      at least one of: the first CPL, and the first CPL material, (CPL(m)1) exhibits a first refractive index in at least one wavelength in the first wavelength spectrum that is one of at least about: 1.8, 1.9, 1.95, 2.0, 2.05, 2.1, 2.2, 2.3, and 2.5; and
      at least one of: the second CPL, and the second CPL material, (CPL(m)2) exhibits a second refractive index in at least one wavelength in the second wavelength spectrum that is one of at least about: 1.8, 1.9, 1.95, 2.0, 2.05, 2.1, 2.2, 2.3, and 2.5.

3. The opto-electronic device of claim 2, wherein the first onset wavelength is no more than the second onset wavelength.

4. The opto-electronic device of claim 2 wherein the first wavelength spectrum and the second wavelength spectrum lie in the visible spectrum.

5. The opto-electronic device of claim 2, wherein the first wavelength spectrum corresponds to a colour that is one of: B(lue), and G(reen).

6. The opto-electronic device of claim 2, wherein the second wavelength spectrum corresponds to a colour that is one of: G(reen) and R(ed).

7. The opto-electronic device of claim 2, wherein the first wavelength spectrum corresponds to a colour that is B(lue), and the second wavelength spectrum corresponds to a colour that is one of: G(reen) and R(ed).

8. The opto-electronic device of claim 2, wherein the first wavelength spectrum corresponds to a colour that is G(reen), and the second wavelength spectrum corresponds to a colour that is R(ed).

9. The opto-electronic device of claim 2, wherein at least one of the following is true: the at least one wavelength in the first wavelength spectrum is one of: the first onset wavelength, and a first peak wavelength of the first wavelength spectrum, and the at least one wavelength in the second wavelength spectrum is one of: the second onset wavelength and a second peak wavelength of the second wavelength spectrum.

10. The opto-electronic device of claim 9, wherein the first peak wavelength is no more than the second peak wavelength.

11. The opto-electronic device of claim 9, wherein the first onset wavelength is a shortest one of at least one wavelength of the first wavelength spectrum at which an intensity is one of about: 20%, 15%, 10%, 5%, 3%, 1%, and 0.1%, of an intensity at the first peak wavelength.

12. The opto-electronic device of claim 9, wherein the second onset wavelength is a shortest one of at least one wavelength of the second wavelength spectrum at which an intensity is one of about: 20%, 15%, 10%, 5%, 3%, 1%, and 0.1%, of an intensity at the first peak wavelength.

13. The opto-electronic device of claim 9, further comprising a third CPL comprising a third CPL material and disposed in a third emissive region, the third emissive region configured to emit photons through the third CPL having a third wavelength spectrum that is characterized by a third onset wavelength that is characterized by a third onset wavelength that is different from at least one of: the first onset wavelength, and the second onset wavelength, wherein at least one of: the third CPL, and the third CPL material, (CPL(m)3) exhibits a third refractive index in at least one wavelength in the third wavelength spectrum that is one of at least about: 1.8, 1.9, 1.95, 2.0, 2.05, 2.1, 2.2, 2.3, and 2.5.

14. The opto-electronic device of claim 13, wherein the first wavelength spectrum corresponds to a colour that is B(lue), the second wavelength spectrum corresponds to a colour that is G(reen), and the third wavelength spectrum corresponds to a colour that is R(ed).

15. The opto-electronic device of claim 13, wherein the at least one wavelength in the third wavelength spectrum is one of: the third onset wavelength, and a third peak wavelength of the third wavelength spectrum.

16. The opto-electronic device of claim 15, wherein the third peak wavelength is no more than the second peak wavelength and at least that of the first peak wavelength.

17. The opto-electronic device of claim 13, wherein at least one of: a thickness, morphology, and material composition, of the third CPL is tuned to provide the third refractive index.

18. The opto-electronic device of claim 13, wherein the CPL(m)3 exhibits a third absorption edge at a third absorption edge wavelength.

19. The opto-electronic device of claim 18, wherein the refractive index of the CPL(m)3 for at least one wavelength longer than the third absorption edge wavelength is at least the refractive index of the CPL(M)3 for at least one wavelength shorter than the third absorption edge wavelength.

20. The opto-electronic device of claim 18, wherein the third absorption edge wavelength is shorter than the third onset wavelength.

21. The opto-electronic device of claim 18, wherein a difference between the third onset wavelength and the third absorption edge wavelength is one of no more than about: 200 nm, 150 nm, 130 nm, 100 nm, 80 nm, 70 nm, 60 nm, 50 nm, 40 nm, 35 nm, 25 nm, 20 nm, 14 nm, and 10 nm.

22. The opto-electronic device of claim 18, wherein the third absorption edge is characterized by a third extinction wavelength in a third extinction wavelength spectrum at which an extinction coefficient of the CPL(m)3 equals a threshold value.

23. The opto-electronic device of claim 22, wherein the third extinction wavelength is a longest one of at least one wavelength in the third extinction wavelength spectrum at which the extinction coefficient of the CPL(m)3 equals the threshold value.

24. The opto-electronic device of claim 22, wherein a first derivative of the extinction coefficient of the CPL(m)3 as a function of wavelength is negative at the third extinction wavelength.

25. The opto-electronic device of claim 22, wherein the extinction coefficient of the CPL(m)1 at at least one wavelength longer than the third extinction wavelength is no more than the threshold value.

26. The opto-electronic device of claim 22, wherein the extinction coefficient of the CPL(m)3 at a wavelength longer than the third onset wavelength is one of no more than about; 0.1, 0.09, 0.08, 0.06, 0.05, 0.03, 0.01, 0.005, and 0.0001.

27. The opto-electronic device of claim 22, wherein the extinction coefficient of the CPL(m)3 at a wavelength shorter than the third absorption edge wavelength is one of at least about: 0.1, 0.12, 0.13, 0.15, 0.18, 0.2, 0.25, 0.3, 0.5, 0.7, 0.75, 0.8, 0.9, and 1.0.

28. The opto-electronic device of claim 13, wherein the third CPL acts as a patterning coating having an initial sticking coefficient of a conductive coating material for an exposed layer surface thereof that is low relative to the initial sticking coefficient for an exposed layer surface of an underlying surface on which the patterning coating has been deposited.

29. The opto-electronic device of claim 2, wherein at least one of the following is true: at least one of: a thickness, morphology, and material composition, of the first CPL is tuned to provide the first refractive index, and at least one of: a thickness, morphology, and material composition, of the second CPL is tuned to provide the second refractive index.

30. The opto-electronic device of claim 2, wherein a refractive index of the CPL(m)1 for at least one wavelength in the first wavelength spectrum exceeds the refractive index of the CPL(m)1 for at least one wavelength in the second wavelength spectrum.

31. The opto-electronic device of claim 2, wherein a refractive index of the CPL(m)2 for at least one wavelength in the second wavelength spectrum exceeds the refractive index of the CPL(m)2 for at least one wavelength in the first wavelength spectrum.

32. The opto-electronic device of claim 2, wherein a refractive index of at least one of: the CPL(m)1 for at least one wavelength of the second wavelength spectrum, and the CPL(m)2 for at least one wavelength of the first wavelength spectrum, is one of no more than about: 1.8 1.7, 1.65, 1.6, 1.5, 1.45, 1.4, and 1.3.

33. The opto-electronic device of claim 2, wherein the CPL(m)1 exhibits a first absorption edge at a first absorption edge wavelength and the CPL(m)2 exhibits a second absorption edge at a second absorption edge wavelength.

34. The opto-electronic device of claim 33, wherein at least one of the following is true: the refractive index of the CPL(m)1 for at least one wavelength longer than the first absorption edge wavelength is at least the refractive index of the CPL(m)1 for at least one wavelength shorter than the first absorption edge wavelength; and the refractive index of the CPL(m)2 for at least one wavelength longer than the second absorption edge wavelength is at least the refractive index of the CPL(m)2 for at least one wavelength shorter than the second absorption edge wavelength.

35. The opto-electronic device of claim 33, wherein at least one of the following is true: the first absorption edge wavelength is shorter than the first onset wavelength, and the second absorption edge wavelength is shorter than the second onset wavelength.

36. The opto-electronic device of claim 33, wherein a difference between the first onset wavelength and the first absorption edge wavelength is one of no more than about; 50 nm, 40 nm, 35 nm, 30 nm, 25 nm, 20 nm, 15 nm, 10 nm, 5 nm, and 3 nm.

37. The opto-electronic device of claim 33, wherein a difference between the second onset wavelength and the second absorption edge wavelength is one of no more than about: 200 nm, 150 nm, 130 nm, 100 nm, 80 nm, 70 nm, 60 nm, 50 nm, 40 nm, 35 nm, 25 nm, 20 nm, 14 nm, and 10 nm.

38. The opto-electronic device of claim 33, wherein the first absorption edge wavelength is shorter than the second absorption edge wavelength.

39. The opto-electronic device of claim 33, wherein at least one of the following is true: the first absorption edge is characterized by a first extinction wavelength in a first extinction wavelength spectrum at which an extinction coefficient of the CPL(m)1 equals a threshold value and the second absorption edge is characterized by a second extinction wavelength in a second extinction wavelength spectrum at which an extinction coefficient of the CPL(m)2 equals the threshold value.

40. The opto-electronic device of claim 39, wherein the threshold value is near 0.

41. The opto-electronic device of claim 39, wherein the threshold value is one of at least about: 0.10, 0.09, 0.08, 0.06, 0.05, 0.03, 0.01, 0.005, and 0.001.

42. The opto-electronic device of claim 39, wherein at least one of the following is true: the first extinction wavelength is a longest one of at least one wavelength in the first extinction wavelength spectrum at which the extinction coefficient of the CPL(m)1 equals the threshold value, and the second extinction wavelength is a longest one of at least one wavelength in the second extinction wavelength spectrum at which the extinction coefficient of the CPL(m)2 equals the threshold value.

43. The opto-electronic device of claim 39, wherein at least one of the following is true: a first derivative of the extinction coefficient of the CPL(m)1 as a function of wavelength is negative at the first extinction wavelength, and a first derivative of the extinction coefficient of the CPL(m)2 as a function of wavelength is negative at the second extinction wavelength.

44. The opto-electronic device of claim 39, wherein at least one of the following is true: the extinction coefficient of the CPL(m)1 at at least one wavelength longer than the first extinction wavelength is no more than the threshold value; and the extinction coefficient of the CPL(m)2 at at least one wavelength longer than the second extinction wavelength is no more than the threshold value.

45. The opto-electronic device of claim 39, wherein at least one of: the extinction coefficient of the CPL(m)1 at a wavelength longer than the first onset wavelength, and the extinction coefficient of the CPL(m)2 at a wavelength longer than the second onset wavelength, is one of no more than about; 0.1, 0.09, 0.08, 0.06, 0.05, 0.03, 0.01, 0.005, and 0.0001.

46. The opto-electronic device of claim 39, wherein at least one of: the extinction coefficient of the CPL(m)1 at a wavelength shorter than the first absorption edge wavelength, and the extinction coefficient of the CPL(m)2 at a wavelength shorter than the second absorption edge wavelength is one of at least about: 0.1, 0.12, 0.13, 0.15, 0.18, 0.2, 0.25, 0.3, 0.5, 0.7, 0.75, 0.8, 0.9, and 1.0.

47. The opto-electronic device of claim 39, wherein the extinction coefficient of the CPL(m)2 exceeds the extinction coefficient of the CPL(m)1 for at least one wavelength in the first wavelength spectrum.

48. The opto-electronic device of claim 39, wherein the extinction coefficient of the CPL(m)2 exceeds the extinction coefficient of the CPL(m)1 for every wavelength in the first wavelength spectrum.

49. The opto-electronic device of claim 39, wherein the extinction coefficient of the CPL(m)1 at any wavelength is no more than the threshold value at the second onset wavelength.

50. The opto-electronic device of claim 39, wherein the extinction coefficient of the CPL(m)1 is no more than the threshold value at all wavelengths in the second wavelength spectrum.

51. The opto-electronic device of claim 39, wherein the extinction coefficient of the CPL(m)1 at any wavelength in the second wavelength spectrum is one of no more than about: 0.1, 0.09, 0.08, 0.06, 0.05, 0.03, 0.01, 0.005, and 0.0001.

52. The opto-electronic device of claim 2, wherein at least one of: the first CPL, and the second CPL, acts as a patterning coating having an initial sticking coefficient of a conductive coating material for an exposed layer surface thereof that is low relative to the initial sticking coefficient for an exposed layer surface of an underlying surface on which the patterning coating has been deposited.

53. The opto-electronic device of claim 2, wherein the first CPL material has a different composition from the second CPL material.

54. The opto-electronic device of claim 2, further comprising at least one electrode coating in the first emissive region and the second emissive region.

55. The opto-electronic device of claim 54, wherein the first CPL is disposed on an exposed layer surface of the at least one electrode coating.

56. The opto-electronic device of claim 55, wherein the at least one electrode coating comprises a metallic coating and a conductive coating disposed on an exposed layer surface of the metallic coating.

57. The opto-electronic device of claim 56, further comprising at least one semiconducting layer, wherein the at least one electrode coating lies between the at least one semiconducting layer and the first CPL in the first emissive region, and between the at least one semiconducting layer and the second CPL in the second emissive region.

* * * * *